(12) United States Patent
Gemelli et al.

(10) Patent No.: US 6,970,966 B2
(45) Date of Patent: Nov. 29, 2005

(54) SYSTEM OF DISTRIBUTED MICROPROCESSOR INTERFACES TOWARD MACRO-CELL BASED DESIGNS IMPLEMENTED AS ASIC OR FPGA BREAD BOARDING AND RELATIVE COMMON BUS PROTOCOL

(75) Inventors: Riccardo Gemelli, Milan (IT); Marco Pavesi, Pavia (IT); Giuseppe De Blasio, Rome (IT)

(73) Assignee: Italtel S.p.A., Milan (IT)

( * ) Notice: Subject to any disclaimer, the term of this patent is extended or adjusted under 35 U.S.C. 154(b) by 545 days.

(21) Appl. No.: 10/091,530

(22) Filed: Mar. 7, 2002

(65) Prior Publication Data
US 2003/0101307 A1 May 29, 2003

(30) Foreign Application Priority Data
Mar. 15, 2001 (GB) .............................. 0106407

(51) Int. Cl.$^7$ .............................. G06F 1/24; G06F 13/14
(52) U.S. Cl. ...................................... 710/305; 712/242
(58) Field of Search ................................. 710/305, 300, 710/22, 52; 370/423, 463, 465, 257; 326/37–41, 62; 713/501, 502; 712/10, 11, 13, 15, 32, 242; 709/253; 711/104; 361/729, 737

(56) References Cited

U.S. PATENT DOCUMENTS 4,963,768 A * 10/1990 Agrawal et al. .............. 326/38
6,122,747 A 9/2000 Krening et al.
6,272,151 B1 * 8/2001 Gupta et al. ................ 370/489

FOREIGN PATENT DOCUMENTS

EP  0 994 418 A1  4/2000
GB  2 349 487  11/2000

* cited by examiner

Primary Examiner—Gopal C. Ray
(74) Attorney, Agent, or Firm—Birch, Stewart, Kolasch & Birch, LLP

(57) ABSTRACT

A distributed interface between a microprocessor or a standard bus and user macro-cells belonging to an ASIC, or FPGA, or similar silicon devices includes a main module connected to the microprocessor bus on one side and to a COMMON-BUS inside the interface on which a cluster of peripheral modules is appended on the other side. Peripheral modules are also connected to the user macro-cells through as multiple point-to-point buses to transfer signals two directions. A set of hardware and firmware resources such as registers, counters, synchronizers, dual port memories (e.g. RAM, FIFO) either synchronous or asynchronous with respect to macro-cells clock is encompassed in each peripheral module. Subsets of the standard resources are diversely configured in each peripheral module in accordance with specific needs of the user macro-cells.

36 Claims, 55 Drawing Sheets

Figure 2 — Prior Art — BUS BASED MULTI BOARD ARCHITECTURE

IC WITH uP INTERFACE AND LOCAL BUS INTERFACE

Board hosting FPGA bread-boarding implementation of a DMI for microprocessor interface and a DMI for local bus interface NOTE referred to Counter Register:
DATA_FROM_CB[31:0] is THRESHOLD[31:0]
DATA2CB[31:0] is COUNTER[31:0]

Pulse to Pulse Synchronization Unit

Timing Diagram of Pulse to Pulse Synchronization Unit

Prior Art Figure 33

DMI Master Mode Overall Algorithm Representation
Read Transaction from DMI PERIPHERAL + Write Transaction to EXTERNAL BUS AGENT

SYSTEM OF DISTRIBUTED MICROPROCESSOR INTERFACES TOWARD MACRO-CELL BASED DESIGNS IMPLEMENTED AS ASIC OR FPGA BREAD BOARDING AND RELATIVE COMMON BUS PROTOCOL

FIELD OF THE INVENTION

The present invention is referred to the field of the microprocessor interfacing and more precisely to a system of distributed microprocessor interfaces toward macro-cells based designs implemented as ASIC or FPGA bread boarding and relative COMMON-BUS protocol.

BACKGROUND OF THE INVENTION

Nowadays the huge grown in performances and density of gates in modern gate arrays has made possible very complex design implementations. The resulting challenge is to develop fully verified complex designs granting at the same time a short time to market. The nowadays tendency is to manage complexity by exploiting CAD (Computer Aided Design) tools made available on the market to the designer for promoting large net-list integration directly on a silicon die, i.e. Field Programmable Gate Arrays (FPGA), or Application Specific Integrated Circuit (ASIC). A parallel way to dominate the increasing complexity of designs and to allow an easier verification is the nowadays tendency of splitting them in macro-cells which are self consistent and pre-verified design elements that connected as "virtual components" build the system.

Macro-cells can be either developed by the user or bought on the market as Intellectual Properties (IP). The IP are sold as both hard macro and soft macro. Hard macros or hard cores are predefined logic blocks referring to a specific technology (geometric boundaries for logic functions are part of the description) with accurate timing specification that a user can simply drop into a chip. Soft macros or soft cores are predefined portable logic blocks (geometric boundaries for logic functions are not part of the description) not bounded to a specific technology. Soft macros are almost always described using a Hardware Description Language (HDL). The user has to use a synthesis tool to create the gate level representation of the soft core and to target it to a specific technology. Technology vendors sell both hard macros and soft macros while third party vendors are forced to propose soft macros.

At soft-core level a macro-cell can be defined as a self-consistent design element with the following properties:
1. it is able to implement a well defined behavior (macro-cell function);
2. its behavior is generally described by means of Hardware Description Language (HDL) as Very High speed integrated circuits Description Language (VHDL) and Verilog;
3. it can be composed by several primitives (e.g. memories, etc.);
4. it is linked to other components by means of a limited well specified series of interfaces;
5. it is suitable to be technologically remapped without ANY changes in the description;
6. it is pre-verified at logical (no timing) level, that is verified by simulations that it effectively performs the macro-cell function.

A generic known Macro-Cell (MC) is shown in FIG. 1. Primary Inputs (PI) are located on the left side while Primary Outputs (PO) are located on the right side. Those inputs and outputs have to deal with the function performed by the macro-cell, which is the reason why the macro-cell has been designed.

At the topside are present Configuration and Control inputs and outputs used to: configure the macro-cell for proper operation, receive commands indicating operations to perform, monitor the status of the macro-cell to verify proper operation.

All these inputs and outputs need support registers (flip-flops): this means that configurations are memorized into configuration registers, commands are evaluated in command registers, status are memorized into status registers. These support registers are implemented in a portion of the macro-cell named MACRO-CELL LOGIC which hosts the so-called "glue logic" (generic combinatorial and/or sequential logic networks) plus control FSM (Finite States Machines).

A set of memory based devices (pure memory and FIFO (First In First Out) buffers) are located at the bottom side: WRITE FIFO (WFi), READ FIFO (RFi) and MEMORY (Mi). These devices are mainly used to buffer data stream flows transmitted/received from the macro-cell via microprocessor interface or local bus interface. In most of cases these stream data flows are constituted by functional data (data which have to deal with macro-cell function). To control these memory based devices some control FSM are needed, in particular: an FSM based control block for the WRITE FIFO named WRITE FIFO CONTROLLER, an FSM based control block for READ FIFO named READ FIFO CONTROLLER and an FSM based control block for the MEMORY named MEMORY CONTROLLER. These control machines are embedded into the MACRO-CELL LOGIC block. The MEMORY LMj (LOCAL MEMORY j), shown at the topside, is local to the macro-cell. It is used as storage resource for the algorithm performed by the macro-cell; alternatively it implements a FIFO charged to exchange data with another macro-cell or with Primary Inputs or Primary Outputs of the device which hosts the macro-cell. An FSM based memory control block also exists for each LOCAL MEMORY block but is not drawn in FIG. 1.

Is necessary to introduce an implementation note about FIFO controllers. Usually FIFOs are realized by using dual port memories. The circular buffer realized by a FIFO is obtained by means of a circuit named FIFO CONTROLLER that manipulates the memory addresses to implement the circular list. This is the most general situation, in fact built-in FIFOs (FIFO not based on dual port memories with embedded controller) are not diffused, especially in microelectronics. By this reason FIFO CONTROLLERs are very used and also provided as cores from IP vendors. Moreover, several types of FIFO CONTROLLERs exist. A SYNCHRONOUS FIFO (a FIFO where read port and write port are operated with the same clock) can be realized using a SYNCHRONOUS FIFO CONTROLLER. An ASYNCHRONOUS FIFO (a FIFO where read port and write port are operated with different, not synchronous, clocks) needs to be realized an ASYNCHRONOUS FIFO CONTROLLER. Referring to FIG. 1, even if (as we said) in most of cases FIFO are based on dual port memories, by the sake of simplicity, they are not represented as dual port memories plus a FIFO controller but as a FIFO buffer plus a FIFO controller. Even if not represented in the generic known Macro-Cell of FIG. 1 a LOCAL READ FIFO and a LOCAL WRITE FIFO and relative controllers, which can be present.

A macro-cell based design is a design developed by the user as: a set of user developed Macro-Cells, macro-cells bought as intellectual properties IPi, MEMORY resources Mi or LMj, READ FIFO RFi and WRITE FIFO WFi (First In First Out buffers), connected together. This design constitutes a system or subsystem that can be physically implemented either on a board of FPGA or an ASIC.

If short design time and high reliability are possible due to macro-cell oriented design the flexibility of implemented systems is still due to the widespread diffused microprocessor. Microprocessors are employed as both configuration and control processors or also as elaboration processors. Elaboration processors are used in the system to process functional data executing the system software (the elaboration processors belong to several categories: general purpose, micro-controllers, Digital Signal Processor (DSP), coprocessors, etc.). On the contrary configuration and control processor is the microprocessor charged to configure and control the system; it may either be coincident, partially coincident or distinct from other elaboration processors used in the system.

The developed system consisting in a macro-cell based design implemented on a set of ASIC or FPGA is generally placed on a board with at least one microprocessor acting as configuration and control processor. Here a first need arises. To make possible communication between microprocessor and developed components those components need a microprocessor interface. The microprocessor interface is generally build as a macro-cell and embedded in one of the user developed components on the boards; it can either be a user developed or bought on the market. If the developed system is complex, and/or it needs to be modular, and/or easy to maintain, it is split on a set boards. In the simplest implementation one of the boards hosts the main processor while other boards do not. On the contrary, in multiprocessor systems, more boards host a microprocessor. One or more boards grouped constitute a subsystem of the whole system.

In the described case the system is generally constituted by a rack which is a case hosting all the boards and connecting them by a back-plane. A back-plane is a physical media on which is implemented a bus, which is a shared interconnection resource accessed in parallel that allows great modularity. On the back-plane a back-plane bus is implemented. To promote a common design criteria standard back-plane buses are specified; a widely diffused standard is the so-called VME bus (Versa Module European—IEEE-P 1014). Generally boards directly connected to the back-plane are "intelligent", that is each of them hosts a microprocessor. Back-plane buses allows very long buses with slow/medium throughput but the microprocessor is generally required to control data exchange.

In very complex cases further bus based interconnection resources are present. Two main cases arises: each board either has an internal hierarchy consisting in more devices connected by a local bus lied on the board itself, or more boards are connected together by means of a local bus engraved on a back-plane parallel to the one which hosts the back-plane bus. Generally, in the latter case, one of the boards connected together by said local bus is also connected to the back-plane bus and hosts a microprocessor ("intelligent" board) while other boards do not.

Some peculiar, but very diffused architectures, also exists. In small systems, that nevertheless need to be modular and/or easy to maintain, like personal computers, the architecture is based on a main-board and the back-plane bus is not present. The main-board is characterized in that it hosts a main microprocessor and a set of cards (small peripheral boards, generally without processor) connected together and to the main microprocessor by means of a local bus lied on said main-board.

In the large variety of system implementations, another recurrent architecture, based on local bus is present. It is based on a "limited" number boards connected by a local bus lied on a "short" back-plane. If the number of boards to connect exceeds the maximum allowed local bus length and capacitive load then different local buses can be connected by means of local bus bridges.

While back-plane buses are used to connect "intelligent" modules (e.g. boards hosting microprocessors), local buses are generally used to allow communication between peripherals. Generally speaking a peripheral is a "stupid" device, that is, a device which does not embed a microprocessor; peripherals is usually lodged on each board or on the cards which are in turn hosted by a main-board. Again, to promote a common design criteria standard local buses are specified; a widely diffused standard is the so-called Peripheral Components Interface bus (PCI). PCI bus offers a processor-independent data path among peripherals and between the microprocessor and peripherals; said peripherals can be directly hosted on a board, hosted on different boards or on cards hosted in turn on a main-board. Local buses allow very short buses with very high throughput and do not require the microprocessor to control the data exchange (microprocessor independence).

Due to the microprocessor independence, local buses are generally more complex than back-plane buses in terms of protocol and more sophisticated in terms of features. Moreover, several reasons spanning from the historical ones to the implementation complexity, to the convenience of integrating a local bus interface into a peripheral device, promoted the development of several "virtual components" for local buses. Nowadays, master interfaces, slave interfaces and bridges are available on the market as IP (Intellectual Property) in form of hard and soft cores.

Here a second need arises. To make possible communication between different boards (cards) connected to the local bus each card needs a local bus interface; this local bus interface can either be a physical component or a macro-cell embedded into a component developed by the user. In the latter case the macro-cell can either be user developed or bought on the market (IP).

The basic architecture described above is present in a large variety of electronics systems belonging to almost all areas of design: Information Technology, Communication, System Automation, Space and Military Electronics and Automotive. In control area numerical axles control systems are characterized in that each axle has a dedicated control card and all the cards are hosted into the same board. In communication area telephone network switches are characterized in that each end-user has an its own line termination card and a set of line termination cards are hosted by the same module. In information technology area a computer motherboard has several equivalent slots to host cards.

FIG. 2 shows an example of complex bus based multi board architecture. Five boards are present: Board00, Board01, Board02, Board10 and Board11. Boards Board00, Board01 and Board02 are connected together by a local bus named LB0 while other two boards Board10 and Board11 are connected together by a local bus named LB1. LB0 and LB1 are physically separated, that is no communication can take place between them. A back-plane bus BB spanning over all the boards is present. To the back-plane bus BB are directly connected Board02 and Board10. As a consequence boards Board02 and Board10 can communicate directly by means of BB while other boards do not. If boards Board00 and Board01 want to communicate with boards placed on local bus LB1 have to pass through Board02. In the same manner if Board11 wants to communicate with boards placed on local bus LB0 has to pass through Board10.

The architecture of boards is now examined. Board02 hosts a microprocessor MuP02 and a memory bank MM02 connected together by a bus uPB02 of the microprocessor MuP02. The last is the main processor for the subsystem constituted by the group of boards (Board00, Board01 and Board02) and MM02 is the main memory for the same subsystem. The microprocessor MuP02 is interfaced to the back-plane bus BB by a microprocessor to back-plane bus bridge named uP/BB02, also connected to the bus uPB02. A microprocessor to local bus bridge is a device able to allow communication between different protocols: specific microprocessor protocol from one side and a specific back-plane bus protocol from the other side. This means that a microprocessor to back-plane bus bridge has a microprocessor bus from one side and a back-plane bus from the other side. An integrated circuit IC02 connected to the bus uPB02 embeds a local bus interface and is interfaced to the local bus LB0. Board01 hosts an integrated circuit named IC01 (either an ASIC or an FPGA), but the argument is still valid for a set of integrated circuits, directly interfaced with local bus LB0. Board00 hosts an integrated circuit named IC00 and a microprocessor named uP00 locally interfaced with the IC00 via a bus uPB00 of the microprocessor uP00 (the microprocessor can be a coprocessor). The integrated circuit IC00 is further interfaced with local bus LB0. Board10 hosts a processor MuP10 and a memory MM10 connected together by a bus uPB10 of the microprocessor MuP10. The last is the main processor for the subsystem constituted by the group of boards (Board10 and Board11) and MM10 is the main memory for the same subsystem. The microprocessor MuP10, the memory MM10 and an integrated circuit named IC10 are connected together by a microprocessor bus named uPB10. Devices connected to uPB10 can communicate with local bus LB1 via a microprocessor to local bus bridge uP/LB10 that is connected from one side to the uPB10 bus and from the other side to local bus LB1. Moreover, the same side of the microprocessor to local bus bridge uP/LB10 connected to local bus LB1, is connected to a local bus to back-plane bus bridge named LB/BB10 which in its turn is interfaced with the back-plane bus BB. Board11 hosts an integrated circuit IC11 directly interfaced with local bus LB1; a microprocessor uP11 (which can be a coprocessor) is interfaced with the same local bus via a microprocessor to local bus bridge uP/LB11 connected to a bus uPB11 of the microprocessor uP11.

To summarize: the boards belonging to the same subsystem can communicate via the local bus, while boards belonging to different subsystem can communicate via backplane bus.

Now the detailed architecture of some of the boards shown in FIG. 2 is discussed with the goal to check the needs of each integrated circuit on the boards in terms of microprocessor interface macro-cells or local bus interface macro-cells.

In FIG. 3 the detailed architecture of Board00 (FIG. 2) is shown. With reference to the figure we see that the uP00 processor, with its local ROM (Read Only Memory) and local RAM (Random Access Memory) is directly coupled to the integrated circuit IC00, this imply that the circuit IC00 embeds a microprocessor interface uP INTERFACE block (sketched in the Figure). The macro-cells embedded into the IC00 are configured and controlled by configuration and control processor (the latter for Board00 may be the same local uP00 on the card itself) via said microprocessor interface. Moreover the integrated circuit IC00 can communicate with the rest of the system via local bus LB0, this implies that the IC00 embeds a LOCAL BUS INTERFACE too (sketched in the Figure). Is useful to remind that configuration and control purposes generally do not require long burst transactions (small amount of data are transferred and burst transfers are not required). On the contrary the main purpose of standard local buses is to transfer functional data at high speed (e.g. disk data or video data on a Personal Computer), so data transferred on a local bus generally involves large amount of data in burst mode.

In FIG. 4 the detailed architecture of Board 11 (FIG. 2) is shown. With reference to the figure we see that the uP11 processor, with its local ROM (Read Only Memory) and local RAM (Random Access Memory) is coupled to the circuit IC11, passing trough a microprocessor to local bus bridge uP/LB11. The IC11 is directly coupled with the local bus LB1, this implies that the circuit IC11 embeds a LOCAL BUS INTERFACE (sketched in the Figure). In this case this is the only interface of the IC11 with the rest of the system; as a consequence it has to be used for both configuration and control of macro-cells embedded into IC11 and functional data transfer purposes. This is true in case of configuration and control performed by the main processor on Board10 (Card 10 in this context), or in case of configuration and control performed by local processor on Board11 (Card 11 in this context). Board01 does not have a local processor, so configuration and control of macro-cells embedded into the circuit IC01 hosted by board01 is surely performed by the main processor MuP02 on board02. As a result, as in the case of board11, both configuration and control flow and functional data flow pass through the LOCAL BUS INTERFACE embedded into IC10.

Very often the system clock (the one which clocks macro-cells of the system) and the microprocessor and/or local bus clock differ each others; this especially happens in the communication area. This must be taken in account in both microprocessor interface and local bus interface design. Actually, in that case, said interface has to communicate with different clock domains. As known communication between different clock domains can take place by means of synchronization systems, this argument shall be detailed later.

Another general crucial aspect that involves all kinds of designs involving macro-cells is the availability of drivers. A driver is a small program controlling a specific device based on one or more macro-cells, or part of a macro-cell, on behalf of the Microprocessor Operating System. It constitutes an interface between hardware and high level application software. This argument shall be detailed at the end of the text.

"Classic" Architectures and Related Open Problems

Microprocessor interfaces, local bus interfaces plus FIFOs, synchronizers and some other minor parts, constitutes recurrent solutions. These solutions, characterized from being reusable, are implemented as macro-cells by both end users and companies that sell them as IP (Intellectual Property) macro-cells. In this paragraph "classic" solution in the area of microprocessor interfaces and local bus interfaces will be described and discussed and their drawback evidenced. In current approach microprocessor interfaces and local bus interfaces are realized with different macro-cells. The microprocessor interface interfaces the configuration and control processor from one-side and user macro-cells which need to be configured and controlled from the other side. The number of interfaced user macrocells is generally high. The microprocessor interface is charged to:
1. interface a configuration and control processor;
2. interface user macro-cells performing: configurations setting (on user macro-cells), commands issuing (to user macro-cell) and status retrieving (from user macro-cells).

The purposes listed at point 2 generally do not require burst access. Moreover microprocessor, in general, are not optimized for burst transfers except for the DMA (Direct Memory Access) mode. On the contrary local buses are generally specified for high performance in burst transfers.

Let's consider a board being a subsystem or the system itself. In the "classic" approach, named for simplicity Centralized Microprocessor Interface (CMI), a unique microprocessor interface block, also named CMI in the successive Figures, is present in the hierarchy of the subsystem constituted by the board. Moreover each block of each user macro-cell in the system which need to be operated by the configuration and control processor is directly interfaced with the centralized microprocessor interface. Point 2 can be seen as a set of services offered to the software running on the configuration and control processor in term of primitives able to operate on the interfaced user macro-cells. To implement these services a certain amount of logic, based on registers (flip-flops) and FSM (Finite State Machines) are required, this constitute a set of hardware primitives as: configuration register, command register and status register. Moreover firmware has to be developed to handle the hardware primitives: this constitute the set of firmware (software) primitives named driver. For the sake of simplicity, hereinafter, all the hardware primitives plus memories and FIFOs that can be interfaced with CMI will be referred as resources. Two topology of interconnection between CMI and user macro-cells are used:
1. A so called Centralized Multi-Port Interface (CMPI) to user macro-cells based on a set of ports, each one dedicated to a specific service like configuration, command and status retrieve. The logic implementing said services is embedded into user macro-cells and developed by users;
2. A so called Centralized Bus Based Interface (CBBI) to user macro-cells based on a bus; services like configuration, command and status retrieve are embedded into user macro-cells, have to be developed by the user in such manner to be consistent with bus protocol.

The CMPI is generally implemented by end-users and it is about custom designs implemented on ASIC (Application Specific Integrated Circuit) while the CBBI, is used from IP (Intellectual Property) vendors in realizing microprocessors interfaces.

FIG. 5 shows an ASIC implementation of the unique microprocessor interface block Centralized Microprocessor Interface (CMI) when it assumes the architecture of a Centralized Multi-port Macro-cell Interface CMPI. The ASIC is organized in four clusters of macro-cells plus the CMI. There are four user developed macro-cells: MC1, MC2, MC3 and MC4 and two macro-cells bought on the market respectively IP1 and IP2. The memory resources are constituted by two local memories LM1 and LM2. The rectangles drawn close to each LOCAL MEMORY block represent the MEMORY CONTROLLERS of each LOCAL MEMORY block. The rectangles drawn into the macro-cells MC1, MC2, MC3, MC4, IP1 and IP2 represents register based hardware primitives which implements set of services offered to the software running on the microprocessor interfaced with the CMI. From the Figure it is evident that each interfaced resource is connected point to point with the CMI.

FIG. 6 shows an ASIC implementation of the block CMI when it assumes the architecture of a Centralized Bus Based Macro-cells Interface (CBBI). The situation is the same described in FIG. 5 but all the resources are connected to CMI via a bus CMI_bus: this is a more flexible solution with respect to the Centralized Multi-port Macro-cell Interface (CMPI).

The drawbacks of CMI architecture are:
1. The user is forced to design hardware primitives "ad hoc" for the specific application.
2. In the same way macro-cell drivers are designed as a single unstructured code, this way any new application specific device requires a new relative driver designed from scratch.
3. Being hardware primitives, embedded in user macro-cells, when macro-cells implementing the microprocessor interface CMI change, a certain amount of redesign of hardware primitives embedded in user macro-cells is required to allow interfacing with the new CMI.
4. The unique microprocessor interface, block CMI, is designed ad hoc for the particular microprocessor interfaced and there is not result in the art that effective circuital facilities be provided to simplify a possible change of microprocessor type.
5. A certain redesign of user macro-cell is also required when one of the two different clock domains changes, this is due to the embedding in user macro-cells of their clock domain side of the synchronization circuit.
6. The architecture is feasible in case of chip implementation but not in case of multi-chip board implementation. This is manifest for the CMPI topology of interconnection with user macro-cells. In FIG. 5 is shown the ASIC (Application Specific Integrated Circuit) implementation of a CMI with CMPI topology. An equivalent FPGA bread-boarding implementation of this ASIC is realized replacing each "cluster" of macro-cells and the block CMI itself with an FPGA and all devices are hosted on a board. Being, in case of CMPI topology, the number of ports on the CMI equals to the number of hardware primitives connected to it, the number of pins required by the CMI macro-cells can exceed the number of pads of the FPGA charged to host the CMI.

Points 1 to 4 lengthen the design phase impacting on time to market. Point 5 impacts on portability IC to board and vice versa. Nowadays the last aspect is particularly important for rapid prototyping of systems. Rapid prototyping of systems consists in realizing a prototype of a system via FPGA bread boarding. This is useful to explore the correctness of a system's architecture before the production of the system starts. In general for large productions the system will be finally integrated into an ASIC following a strategy of System On a Chip (SOC). "Classic" architectures very often are not compliant to this requirement of portability between ASIC implementation and an FPGA bread boarding implementation.

The macro-cell which implements local bus interface, interfaces the local bus from one side and user macro-cells which need to transmit and/or receive stream data from the other side. The number of interfaced user macro-cells is generally low. The local bus interface is charged to:
1. interface the local bus;
2. interface user macro-cells performing: transmission and/or reception of stream data flows to/from user macro-cells. The main purpose of local bus interfaces is expressed at point 2 even if in many designs it is also used to perform functions typical of microprocessor interfaces (as in Board01 and Board11 of FIG. 2 or in FIG. 4); by this reason a third point can be added:

3. interface user macro-cells performing: configurations setting (on user macro-cells), commands issuing (to user macro-cells) and status retrieving (from user macro-cells).

Let's consider a board being a subsystem, or the system itself. In the "classic" approach, named for simplicity Centralized Local Bus Interface (CLBI), a unique local bus interface block, also named CLBI in the following Figures, is present in the hierarchy of the subsystem constituted by the board. Moreover each block of each user macro-cell in the system which need to be operated by the local bus is directly interfaced with the block CLBI via a bus named CLBI_bus in the following Figures. As in the case of microprocessor interface, the point 3 above can be seen as a set of services offered to the software running on an agent which controls the local bus, in term of primitives able to operate on the interfaced user macro-cells. All the considerations done in the case of microprocessor interface are still valid, i.e. when a local bus interface is used for configuration and control purposes, the list of drawbacks of "classic" solution is the same described for CMI interface.

Also the latter point 2 can be seen as a set of services offered to the software running on the agent which controls the local bus, in term of primitives able to operate on the interfaced user macro-cells. To implement these services a certain amount of logic, based on memory and FSM (Finite State Machine) are required: this constitutes the set of hardware primitives (READ FIFO CONTROLLER, WRITE FIFO CONTROLLER, and MEMORY CONTROLLER). Moreover firmware has to be developed to handle the hardware primitives: this constitute the set of firmware primitives named drivers. As in the case of block CMI, for the sake of simplicity, hereinafter, all the hardware primitives plus memories and FIFOs that can be interfaced with block CLBI will be referred as resources.

The following solutions present on the market are consistent with the CLBI architecture but differs in the topology of interconnection between CLBI block and user macro-cells:

1. A so called Centralized Multi-Port Interface to user macro-cells (CMPI) based on a set of ports, each one dedicated to a specific service. The services are embedded into user macro-cells and developed by users. Several different implementations are possible;
2. A so called Centralized Bus Based Interface (CBBI) to user macro-cells based on a bus; services, embedded into user macro-cells, have to be developed by the user in such manner to be consistent with bus protocol.

FIG. 7 shows an ASIC implementation of the unique local bus interface Centralized Local Bus Interface (CLBI) when it assumes the architecture of a Centralized Bus Based Interface (CBBI). The ASIC is organized in four clusters of macro-cells plus the block CLBI. There are four user developed macro-cells: MC1, MC2, MC3 and MC4 and two macro-cells bought on the market, respectively IP1 and IP2. The memory resources are constituted from two local memories LM1 and LM2, a READ FIFO RF1, a WRITE FIFO WF1 and a MEMORY M1. The rectangles close to each memory resource represent as many controllers of respective memory resources. The READ FIFO CONTROLLER drawn closed to RF1, the WRITE FIFO CONTROLLER drawn closed to WF1, and the MEMORY CONTROLLER drawn closed to M1 represent FSM based hardware primitives which implement a set of services offered to the software running on the agent which controls the local bus. The rectangles drawn into the macro-cells MC1, MC2, MC3, MC4, IP1 and IP2 represent register based hardware primitives which implements set of services offered to the software running on the agent which controls the local bus. From the Figure it is evident that each interfaced resource is connected to the bus CLBI_bus.

On the market are present several IP interfaces that exhibit the CMPI topology of the point 1, they are listed in the following points 1a, 1b and 1c. Point 1a concerns a centralized interface to user macro-cells based on a read port (FIFO based) and a write port (FIFO based) and no address bus available, like in a bridge. Point 1b concerns centralized interface to user macro-cells based on a memory mapped i/o. Two dual port RAM are used to exchange data to and from user macro-cells which are mapped to the memories. Point 1c concerns a more structured solution combining solution 1a or 1b for burst transactions with a bussed interface like CBBI for configuration and control purposes.

FIG. 8 shows an ASIC implementation of the architecture presented at point 1c. The CMPI (Centralized Multi-Port Interface) interconnection topology is used for a burst read port and a burst write port, while the CBBI (Centralized Bus Based Interface) interconnection topology is used for a bussed port (no burst capable) devoted to configuration and control of macro-cells. The ASIC is organized in four clusters of macro-cells plus the CLBI (Centralized Local Bus Interface). There are four user developed macro-cells: MC1, MC2, MC3 and MC4 and two macro-cells bought on the market respectively IP1 and IP2. The memory resources are constituted from two LOCAL MEMORIES LM1 and LM2, a READ FIFO RF1 and a WRITE FIFO WF1. RF1 and WF1 are respectively connected to the burst read port and to the burst write port. The rectangles close to each memory resource represent the controllers of each memory resource. The READ FIFO CONTROLLER drawn closed to RF1, the WRITE FIFO CONTROLLER drawn closed to WF1 represent FSM based hardware primitives which implement a set of services offered to the software running on the agent which controls the local bus. In their turn, the rectangles drawn into the macro-cells MC1, MC2, MC3, MC4, IP1 and IP2 represent register based hardware primitives which implements set of services offered to the software running on the agent which controls the local bus. All the register based hardware primitives are connected to the bus CLBI_bus.

In conclusion, architecture CMPI (Centralized Multi-Port Interface) of the point 1 is related to specific applications (like a bridge). On the contrary architecture CBBI (Centralized Bus Based Interface) of the point 2, even if more complex, is the most general and versatile, especially if many user macro-cells have to be interfaced.

The architectures at the points 1a, 1b and 1c are oriented to interface up to two applications capable of burst (one in read and one in write). When more burst capable applications are involved, the application's designer has to grant the contended access to the unique interface.

The architectural drawbacks of CLBI (Centralized Local Bus Interface) topology are the same exposed in the case of CMI (Centralized Microprocessor Interface). The only difference is that in this case resources interfaced with CLBI may be different from the ones interfaced with CMI. More precisely, when CLBI is employed for the goals exposed at point 3 the interfaced resources embedded in the macro-cells are the same as in case of CMI, while when CLBI is employed for the goals exposed at point 2 the interfaced resources are FIFOs and memories.

All the architectures discussed above can be used combined in applications; for instance IC00 of FIG. 3 (on Board00 of FIG. 2) uses a CMI macro-cell and a CLBI macro-cell, while IC111 of FIG. 4 (on Board11 of FIG. 2) uses only a CLBI macro-cell.

Until now drawbacks of the known interfacing architectures have been outlined concerning hardware implementation of the macro-cells; these architectural drawbacks also reflect into restrictions on the hardware-related protocol which governs the transaction on the CLBI_bus. In particular the interfacing of resources in the known architectures at the points 1a, 1b and 1c seems to be quite rigid. To say that transactions from the unique block CLBI toward the complex of interfaced macro-cells, and vice versa, requires a great deal of design dedicated to the FSMs embedded in the macro-cells to cope with the various interfacing transactions, this makes the interfacing protocol design very cumbersome and not portable.

The lack of a modular structure in the known interfacing architectures also reflects into a similar lack in the software design of drivers for specific devices based on macro-cells. In fact drivers of the known art are generally designed as single unstructured codes in the same way as the code of the respective applications (macro-cell devices), which are historically designed as belonging to a single entity (CMI). This way any new device requires a new driver designed from scratch. Contemporary hardware project style, oriented to the use of reusable functional blocks (macro-cells) should permit a more rational project style for device drivers too. Nevertheless, nowadays device drivers are written again in the traditional way. A plausible explanation is the absence in the art of a modular and well-structured microprocessor-to-macro-cells interface able to stimulate a new software design for drivers.

A serious attempt to reduce time-to-market and allows maximum subsystem re-use in systems that span a wide range of performance characteristics, is disclosed in U.S. Pat. No. 5,948,089 (Sonics, Inc.). The relevant claim 1 recites textually: "A computer bus system comprising:

a synchronous bus operative during a number of bus cycles, said number of bus cycles divided into recurring frames, each frame further divided into packets comprising at least one clock cycle;

at least one initiator subsystem coupled to the bus, the at least one initiator subsystem configured to have at least one packet pre-allocated to the at least one initiator subsystem, said initiator subsystem configured to send out a request during a clock cycle within the at least one pre-allocated packet, said request comprising a command and further comprising an address of a target subsystem;

at least one target subsystem, said target subsystem configured to receive the address of the request and determine if the address corresponds to an address of the target subsystem, wherein if the address of the request corresponds to an address of the target subsystem, said target subsystem responds to the request on a second clock cycle."

In the introductory part of the cited patent document it is clearly said the computer bus to work in such a way to de-couple the frequency of the bus from the operating frequencies of the various client subsystems. In such a way each subsystem may operate based on its own requirement, and the subsystem interface modules needn't to be redesigned when the operating frequency of the bus is increased. To meet said requirements, the system visible in FIG. 1 of the citation substantially discloses a fully pipelined fixed-latency communication system based on a computer bus. Said computer bus is shared among various initiator/target subsystems in which initiators have the capability to act, in turn, like a master (or slave) while targets are always slaves. Because of the shared resources, the problem of subdividing transmission bandwidth among various initiator and target subsystems arises. Sonics' invention solves the outlined problem by importing in the computer bus world some solutions well known from ATM (Asynchronous Transfer Mode) networks. Those networks implement a protocol suitable to asynchronously transfer serial packets (cells) to/from various nodes of a telecommunication network. Packets are made of fixed number of serial octets of bits queued into relevant sending/receiving buffers, respectively locate at the two sides of a switching matrix that provides for routing. At this purpose packets have a header for the relative identification by means of a label, other than an information field available for the user need. The header also includes further information that pertains to the ATM layer functionality itself, for example for bandwidth control. A communication computer inside each node manages the packet consumption at the various queues by implementing a policy which takes into account the bandwidth requirements of the different users, in term of bit-rate. To do so an protocol negotiation phase is foreseen in which the guaranteed bandwidth is set at first, then the residual bandwidth is distributed among the various requesters by means of a token mechanism. Communication media supporting serial ATM packets are either physical carriers, like optical fibers or coaxial cables, or radio connections for digitally modulated serial data. As known from techniques concerning serial transmission, a framed timing structure of the bit-stream is needed for synchronization aims. So in synchronous transport layers for ATM, such as STM-n streams (Synchronous Transfer Mode-n) belonging to SDH (Synchronous Digital Hierarchies) links, the ATM asynchronous cells are fitted into SDH frames and therein synchronized by exploiting cell multiplexing/de-multiplexing provisions. The framed packet feature is also reproduced in the Sonics' invention, as clearly recited in the claim 1.

From the above arguments it can be argued that Sonics' on-chip computer bus system is something more than a computer interface: it seems to include all the relevant features of a truly communication network interface (ATM, LAN, Token Ring, etc). The only difference between Sonics' invention and classic communication network interfaces is that in the second case interfaces are connected to a physical media suitable for serial transport (coaxial cable, optical fiber), while in the first case the interface uses a modified computer bus made of parallel metallic paths inside a chip or, at most, extended in the boundary of a board. In conclusion, Sonics' computer bus adopts a distributed architecture managed by a mixed criteria pertains both to the token ring and ATM networks, for the precise aim of promoting re-use of the silicon subsystem designs and reduce on-chip devices time-to-market.

In the Applicant's opinion different solutions are possible to reach the same goals (i.e. reuse and lower time-to-market), without forcing a designer to implement complex features typical of a communication system interface instead the simpler features of a processor interface, in case only the last is needed. Framing and packetization of bus cycles, successive storing of information concerning bandwidth requirements of the multiple subsystems and respective selection by two arbitration levels, turn out to be additional demanding features whether only a processor interface towards a plurality of target subsystems is really implemented.

From a logic point of view a boundary should anyway exist between a true communication system interface, more suitable for a computer network, and a simpler processor interface. A processor interface generally deals with transactions between a single microprocessor and a plurality of target devices appended to the processor bus. Target devices interface the processor either directly or preferably indirectly by means of a common module connected to a standard processor bus, at one side, and to a proprietor bus and/or point-to-point link towards all the target devices, at the other side. Many examples have been already discussed above speaking about the prior art architectures.

By comparison communication network interfaces (as per the Applicant opinion the Sonics' computer bus) exploit communication media in order to extend communication facilities to a plurality of processors and devices. In the framework of communication networks the most relevant problem to be solved at the interface level is that of how to regulate multiple accesses to the common media from the various contenders, in order to both avoid conflicts and meeting different bandwidth requirements. This problem, anyway important, is not as much pressing in a simpler processor interface and can be solved by means of traditional arbitration methods like round-robin one, in case modified as per a variant of the present invention to improve performances with a distributed architecture. Contrarily to Sonics' communication system and to computer network interfaces in gender, a processor interface takes great advantage from burst transactions. Burst is a sequence of bus transactions occurring on consecutive bus cycles and implying address increment or decrement. Resort to burst transactions in processor interfaces having a distributed architecture needs the solution of some incoming problems. The Applicant's invention solves these problems by means of a so-called "PREFETCHABLE FIFO" which extends burst opportunities to the distributed resources embedded in the processor interface. Bursts transactions are quite inapplicable in communication systems like the Sonics' invention, for the reason that the mechanism that supports bursts is inconsistent with mechanisms for distributing bandwidth through a particular policy of the accesses. More precisely the more bursts are long the more they are profitable for reducing subsequent latency (this argument will be detailed later); so by using long bursts or by frequent recourse to shorter bursts the TDMA (Time Division Multiple Access) method taken to fair distributing bandwidth is paralyzed. It's useful to remind that Sonics' invention implements two level arbitration scheme where the first level of arbitration is a framed time-division-multiplexing arbitration scheme and the second level is a fairly-allocated round-robin scheme implemented using a token-passing mechanism: to say two TDMA methods.

The main shortcoming of the Sonics' communication system has been outlined, that is to be unable to improve designs reuse and reduce time-to-market of relevant on-chip devices without introducing technical features typical of computer network interfaces. In application addressed to usual microprocessor interfaces those features should appear like additional and too binding ones.

PURPOSES OF THE INVENTION

The main purpose of the present invention is that to indicate a microprocessor, or local bus, interface having a modular distributed architecture towards user macro-cells encompassing a standardizable set of resources variously configurable in accordance with the needs of the macro-cells.

Strictly related purpose of the invention is that to indicate a PREFETCHABLE FIFO which exhibits to a certain extent a prefetchable behavior in order to allow anticipative reading for speed up burst transaction in the distributed interface even when it is interfaced to not prefetchable resources.

Consequent main purpose of the invention is that to indicate an interface bus protocol able to manage in a transparent way the round-trip latency of communication between microprocessor and resources in order to avoid subsequent latency other than the initial delay and optimize burst transactions through a bus of the interface continuously shared among distributed resources. Moreover said protocol is able to manage the PREFETCHABLE FIFO in order to allow anticipative read also when not prefetchable resources are involved.

Derived purpose of the invention is that to further specialize a main block of the distributed architecture in order to de-couple, as far as possible, the main block of the interface towards changes in the external microprocessor.

Another purpose of the invention is that to exploit in a profitable way a two clock domains synchronizer circuit, developed by the same Applicant, in the new context of the distributed interface.

Further purpose of the invention is that to indicate a software facility for writing driver code of devices based on user macro-cells interfaced with the distributed microprocessor interface in subject. Major benefits are driver reusability when a certain macro-cell has to be reused in a different context and easiness of development of new drivers starting from a driver skeleton referencing the standardizable set of resources indicated above.

Accordingly, the present invention overcomes all the restrictions of the prior art interfaces, in particular that concerning the need of a large "ad hoc" design or redesign of the hardware and firmware resources embedded in the user developed macro-cells for the only purpose to interface the configuration and control microprocessor and not to the specific application of the macro-cell.

SUMMARY AND ADVANTAGES OF THE INVENTION

To achieve said purposes the subject of the present invention is an interface between a microprocessor, or local bus, and user developed macro-cells having the modular and distributed architecture described in claim 1.

Main module and peripherals modules of the distributed interface of the present invention may be advantageously implemented like further macro-cells.

The distributed interface of the present invention has a great impact on the new user developed macro-cells. Having in fact removed from the corresponding user developed macro-cell of the prior art the majority of hardware primitives only devoted to interfacing the configuration and control microprocessor, a new simpler macro-cell basic architecture results which not needs the "ad hoc" interfaces design or redesign of the prior art. The transfer of all those above mentioned resources into configurable peripheral modules of the microprocessor distributed interface allows a great uniform design of all genders of macro-cells, indifferently belonging to the user or the interface itself. The development and interfacing of user macro-cells is made easier consequently and the designer can concentrate prevalently on the macro-cell function.

Another advantage of the distributed interface of the invention, due to its high modularity, consists in furnishing a scalable architecture. It is in fact convenient to provide the interface with the only peripheral modules whose resources are effectively exploited by the complex of user macro-cells.

Moreover the distributed interface, thanks to the presence of a COMMON-BUS, has a number of interconnections between the main and peripheral modules not excessively high; that makes the structure suitable for FPGA breadboarding implementation. Because the proposed architecture is the same for both ASIC and FPGA, no changes are necessary changing the implementation technology, a rapid prototyping of an ASIC under development is possible consequently in order to explore the correctness of the design and speed up the time to market.

The distributed interface disclosed in the claim 1, besides the standardizable peripheral resources, includes means expressly designed to optimize the data throughput across the overall interface. Efficient burst transactions are promoted by including in each peripheral module a filling status calculator indicating residual room in the selected resource either for writing or reading, and by introducing in the main module companion means for elaborating the remote filling status received from a selected peripheral resource in order to compensate the subsequent latency other than the initial one. The presence of these means greatly helps the development of an efficient interface bus protocol, as it will be seen in the following.

A peculiarity of the interface in subject, largely derived from the use of filling status dedicated means, is the capability to conjugate a modular distribute architecture with skill in burst transactions, despite the fact that a COMMON-BUS shared among a plurality of resources force the main module to take initial latency whenever a selected resource changes by effect of arbitration. The filling status dedicated means entirely support and prompt the interface bus protocol in the task of optimizing write burst transactions. Concerning the optimization of reading bursts (even when not prefetchable resources are involved), supplementary means are provided, namely a centralized buffer memory and a PREFETCHABLE FIFO, as disclosed in the claims.

The buffer in the main module allows anticipative read of a selected resource, both prefetchable and not, until the buffer is near full. In this way the interface can be profitable employed for interfacing the widely diffused local buses obeying to Information Technology (IT) protocols, which require a backward acknowledge signal at each singular datum read in the buffer by the external processor. At the end of a current transaction the data unread from the external microprocessor or generic bus master are purged from the buffer to assign an empty buffer at the successive requester. Being the buffer a traditional FIFO, the purged data should be definitively lost if also the peripheral resource connected to the buffer were a not prefetchable traditional FIFO. This is not true for a PREFETCHABLE FIFO expressly developed to be used as peripheral in tandem with a centralized buffer inside the main module. This is possible because the PREFETCHABLE FIFO simply rewinds its data unread from the processor or in generic bus master into the buffer, consequently the only overwritten data in the PREFETCHABLE FIFO are those effectively read from the processor.

Thanks to the combination of means like the filling status devoted ones, the centralized buffer, and the PREFETCHABLE FIFO, and a smart protocol able to exploit synergies, the interface of the invention reaches optimum efficiency in burst transactions both in read and write, both with prefetchable and not prefetchable resources. In that the advantage of the distributed architecture of the present interface is fully exploited.

Further advantageous architectural characteristic of the interface is that to have a second level of modularity inside the main module, as disclosed in the dependent claims. To meet the second level of modularity, main module consists of a centralized circuit which controls various specialized circuits largely decoupled each other. The centralized circuit collects most of the relevant events manifested on the two directions of the COMMON-BUS and on the external-bus, also collects the grant signals generated by an internal arbiter and in various significant points of the circuit. This further enhanced architecture of the interface makes easier to change an external microprocessor or generic bus master without affecting the user macro-cells and the distributed interface other than a command decoder dedicated to cope with the new microprocessor and a sequencer acting on the external-bus. Differently in "classic" solutions which admit bus the absence of a centralized circuit which governs separate functional parts force the designer to a large revision of the bus controller at the two side of the interface, to say in the unique block and inside the user macro-cell.

Another subject of the invention is an interface COMMON-BUS protocol which makes operative the interface of the claim 1, as disclosed in the respective independent claims. The protocol of the invention works optimally with burst transaction because of its insensibility versus the subsequent latency, contrarily to the majority of the known protocol. The goal is reached by tracing the filling status of remote peripheral resources locally to the main module. The tracing is performed both at the start and continuously during a read/write burst transaction, at the precise aim of anticipating locally to the main module the filling status as calculated from a remote resource (remote because of the latency). In this way the only latency in the transaction remains the unavoidable initial round trip delay. Advantageously for tracing the filling status the protocol has at its disposal a pure query command to catch the initial delay and read/write command coupled with a query to have returned on COMMON-BUS the remote filling status of the selected resource in the meanwhile read/write operations taken place. This method is necessary because while a microprocessor or generic bus master access to a peripheral resource is immediately known to the main module which manages the interface protocol and executes the filling status algorithms, a macro-cell access to the same resource becomes known to the manager only after the latency between the peripheral and the main module is elapsed.

For correctly anticipating the remote filling status locally to the main module, a first specialized algorithm trace the variation of the remote filling status of a not prefetchable resource due to possible read/write accesses of the interconnected macro-cell independently from the microprocessor master accesses.

A second specialized algorithm currently updates the first remote filling status received after the initial latency is elapsed by summing up the traced variation and subtracting a unity value each time a datum is transferred between the main module and the external bus master and the main module (when the external bus master writes data into the main module) or a read command is issued on the COMMON-BUS (when the external bus master reads data from the main module). In this way the updated filling status is a local image of the remote filling status (as far as possible precise). Said local filling status is put at the disposal of the protocol to take immediate decisions concerning prosecution or termination of a burst transaction, without shortcoming of crossing the boundaries of the not prefetchable resource actually selected.

The precision of the remote filling status anticipated locally to the main module is based on two assumptions. A first one is that the datum written from the external bus master to the main module is considered effectively transferred when the handshake for it has taken place (at the interface between the external bus master and the main module). In a similar way the datum read from a macro-cell connected to a peripheral resource is considered effectively read when the handshake for it has taken place (at the interface between the external bus master and the main module). A second assumption is that the filling status locally anticipated in the main module is equal or pejorative with respect to the real one. This implies that possible variations in the remote filling status of the resource due to the interconnected macro-cell do not produce overflow or underflow of the resource when the datum is on the fly to/from the resource. Both the assumptions are generally satisfied. In fact, firstly, when the command to read/write a datum is put on COMMON-BUS it is executed without suspensive conditions except in case of failure. Secondly, the variations in the remote filling status due to an interconnected macro-cell can only increase its value both in read (more data to read) and write (more room to write data).

Furthermore, for question of convenience, the filling status is saturated at a value greater or equal to the maximum round-trip latency that a transaction kept on COMMON-BUS, being the value of the latency approximated at the upper integer. Advantageously the binary value expressing filling status saturated as indicated above, allows a precise visibility of the residual room on the resources either for writing or reading in the time window of the round trip latency, avoiding to exploit unnecessarily wider buses.

The modularity of the protocol matches the modularity of the hardware, consequently the various algorithms composing the protocol are easily assigned to as many separate circuit parts, both concerning main and peripheral modules, although mostly of the algorithms are charged to the main module. The protocol itself can be seen like a plurality of algorithms able to run concurrently and variously combined together by a supervisor algorithm to cope with different type of transactions arising from different cases of mastership of the external-bus in write or read. This arrangement allows great advantages in terms of reusability of the design. The advantages of the hardware architecture are reflected in the protocol that, contrarily to known ones, charges minimally the macro-cells.

The philosophy of the distributed interface in subject is that to provide interfacing resources externally to the user macro-cells. In line with this philosophy user macro-cells should be discharged also from the synchronization jobs. A synchronization problem arises when macro-cells belong to a clock domain different from that of the interface one. In case a peripheral resource interfacing macro-cells is a dual port RAM, or a FIFO, synchronization is generally carry out by the respective controller in a known way. On the contrary when peripheral resources are registers the known art synchronizers need some ad hock logic embedded in the macro-cells, other than the interface logic. As far as synchronization concerns, the finalities of the distributed interface in subject are achieved with peripheral resources of register type by exploiting a separate invention subjected to a patent application in the name of the same Applicant. A two clock domains synchronization circuit is disclosed in that application. The circuit has been expressly designed to be simply interposed between the two domains to be synchronized. It descends that ad hock logic embedded in the macro-cells is no more necessary. Thanks to the owned peculiarity such a synchronizer becomes part of the distributed interface, from an architectural point of view, that because it offers to an interfaced macro-cell a synchronization service complementary to the service offered from the resource itself. Consequently any possible complication in adapting the disclosed synchronizer to the various type of registers is a matter confined inside the interface. The synchronization circuit can be advantageously seen as an independent element of a HDL list (Hardware Description Language) able to increase any more the modular design of the distributed interfaces when it operates in asynchronous way.

Further subject of the invention is a software facility for writing driver code for devices based on user macro-cells interfaced to a microprocessor through the distributed microprocessor interface of the claim 1, as disclosed in the respective independent claims.

The software facility is directed to a map file for assigning a different physical address to each symbolic address included in a declaration part collecting arguments of all the basic Functions building up the driver macro-cell by macro-cell. The modular architecture of the distributed interface helps in writing absolute addresses of map file when the symbolic driver shall be multiple allocated or relocated. This makes free hardware designers to deliver drivers in symbolic code (no address binding performed) and test it after relocation, increasing the portability of the drivers themselves. Summarizing, advantages of said software facility consist in the independence from the operating system specific calls and in the portability of the same drivers in different hardware (Integration platform of reused macrocells) and software (Operating System) environments. Said features are obtained by writing the low level drivers in terms of O.S. independent calls referencing directly the standardizable peripheral resources introduced above and by providing a separate map file to provide address binding for the selected environment. Then the low level drivers will be incapsulated from calls of the specific O.S. used in the application.

BRIEF DESCRIPTION OF THE DRAWINGS

Further objects and advantages of the present invention will be made clear by the following detailed description of an embodiment thereof and the annexed drawings given for purely non-limiting explanatory purposes and wherein.

Figure 18:
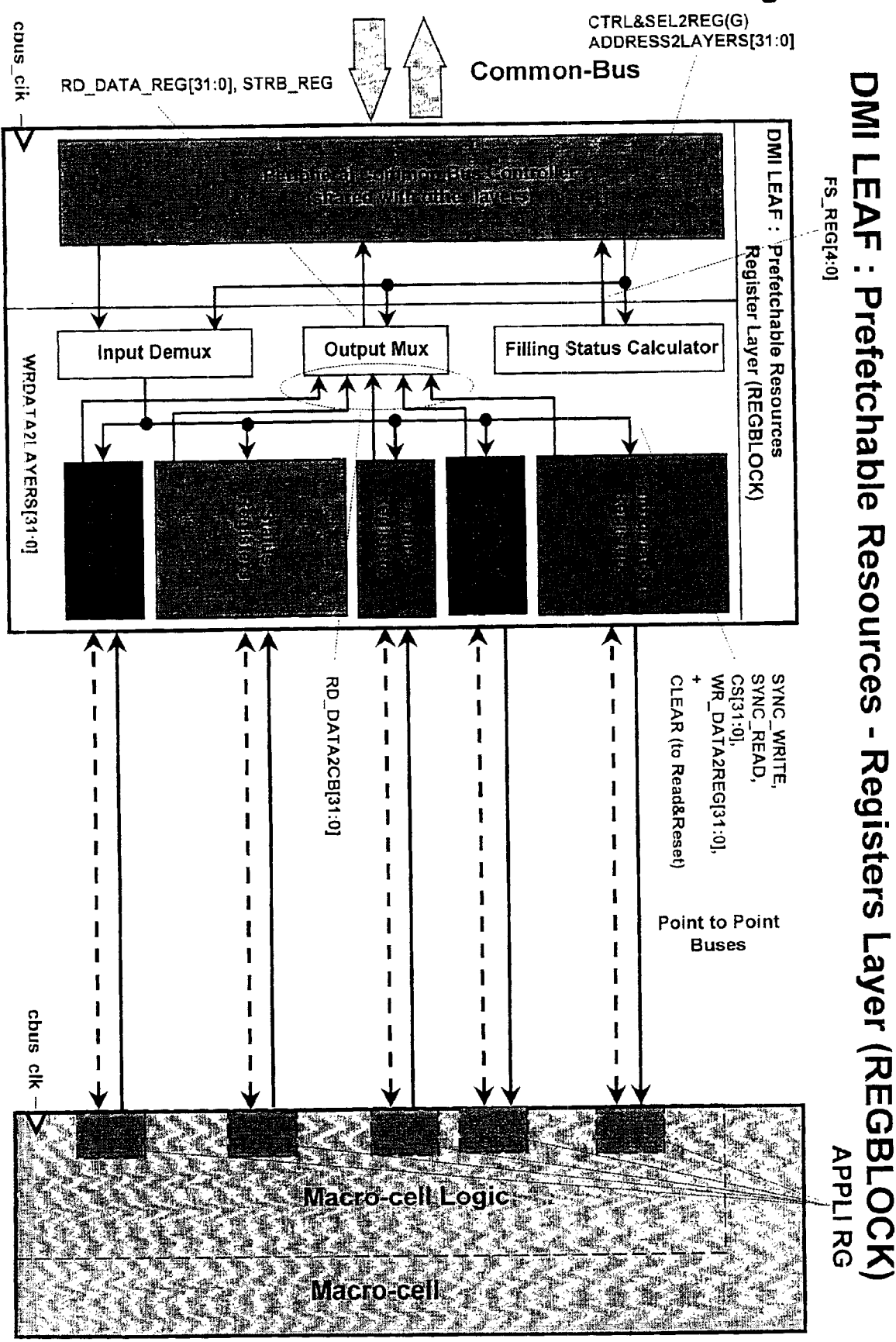
FIG. 18 shows a register block REGBLOCK of FIG. 17 and the relative interconnection to a user macro-cell.
Figure 29:
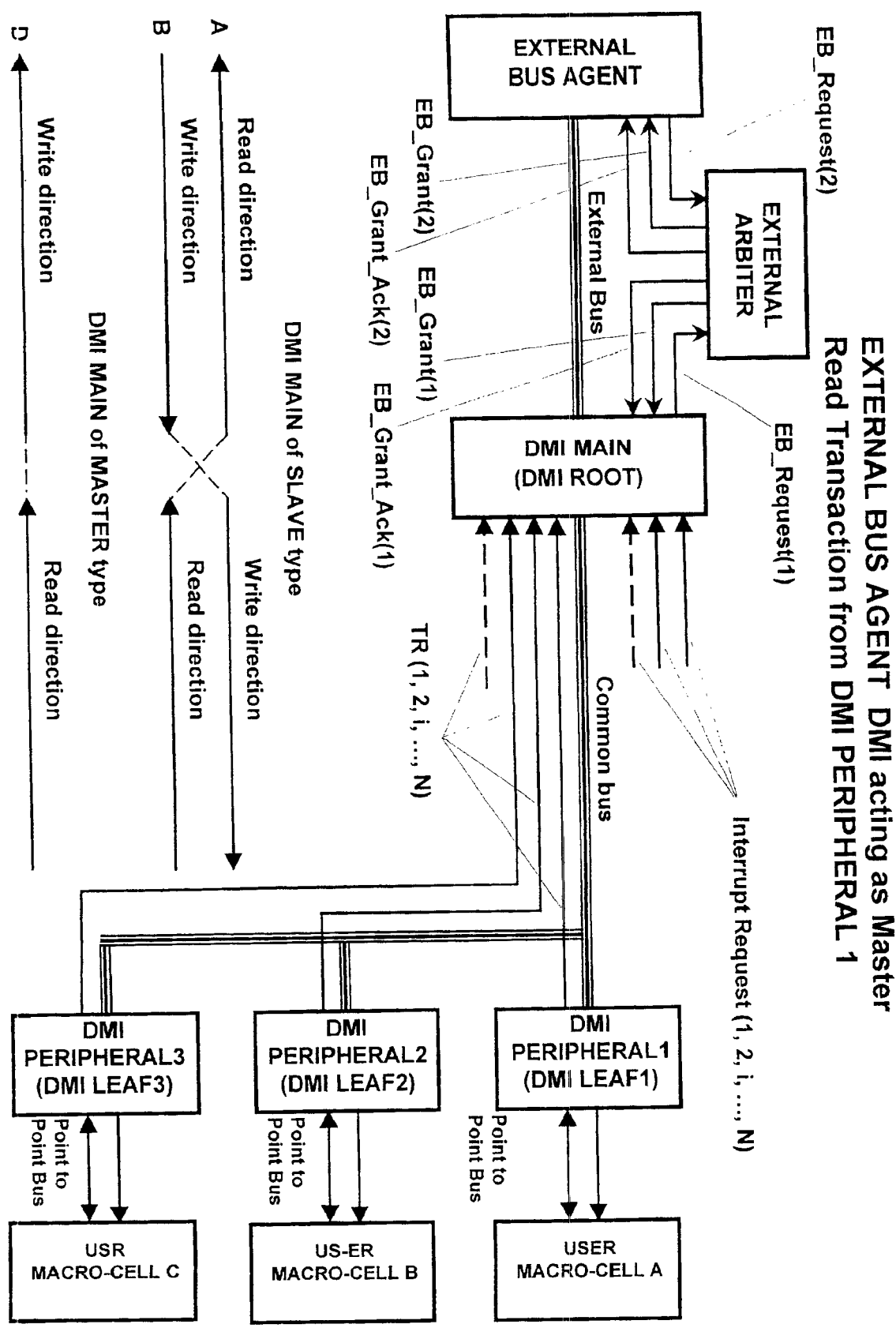
FIG. 29 includes FIG. 13 plus some blocks MACRO-CELL of FIG. 15, at one side, and other new blocks at the opposite side to interface an external microprocessor or local bus master.
Figure 42:
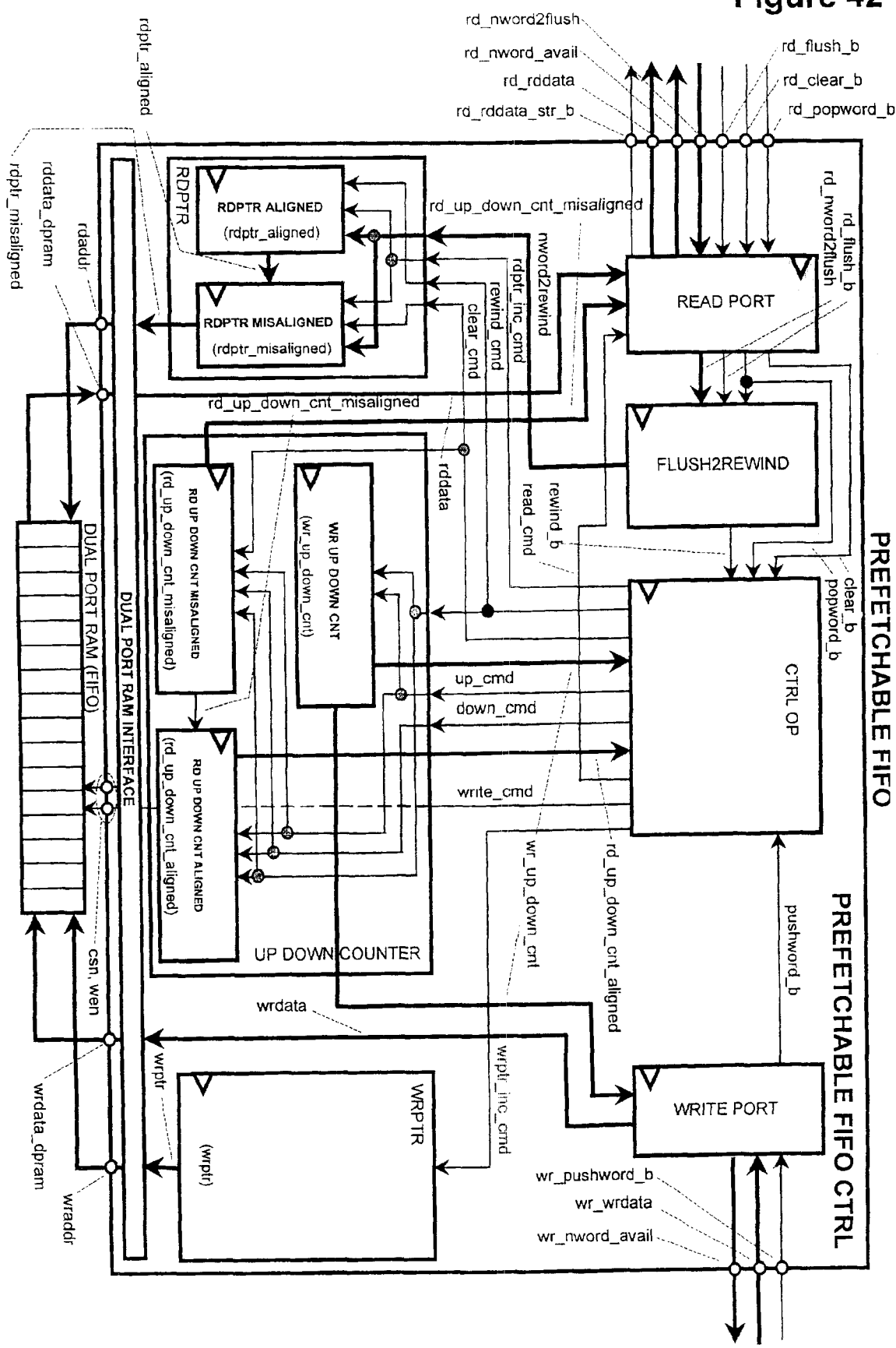
FIG. 42 shows a diagrammatic representation of a block PREFETCHABLE FIFO belonging to the DMI PERIPHERAL of FIG. 23 of the invention.

Appendix A indicates five tables, namely Table A1, Table A2, Table A3 Table A4, and Table A5. Table A1 is used from a block MAX BURST LENGTH TABLE shown in FIGS. 16 and 18. Table A2 is used to characterize signal of FIGS. 20, 21, 24 and 25. Table A3 is used to explain read and write transactions indicated by arrows in FIG. 29. Table A4 describes both the meaning and the mimic of signals used from the two phase handshake algorithm illustrated in FIGS. 30 and 31. Table A5 describes both meaning and the mimic of the reference EXTERNAL BUS AGENT PROTOCOL introduced by FIGS. 32 and 33;

Appendix B indicates a main protocol for governing transactions on COMMON-BUS of FIG. 29, being the protocol further subject of the invention;

Appendix C indicates some Tables, numbered from C1 to C10, including relevant command, peripheral monitoring codes, and meaningful signals managed by the main protocol of Appendix B;

Appendix D which embeds Tables numbered from D1 to D8 indicate as many algorithms building up the main protocol of Appendix B taking into consideration the Tables of Appendix C;

Appendix E which embeds Tables numbered from E1 to E9 describes both the meaning and mimic of signals of PREFETCHABLE FIFO described in FIG. 42 and the algorithms executed by its internal blocks;

Appendix F which embeds Table F1 shows the address offset for each resource embedded into the REG-BLOCK layer of FIG. 18;

Appendix G indicates a variant of an algorithm named CMDRF whose basic version is defined in Appendix D.

DETAILED DESCRIPTION OF AN EMBODIMENT OF THE INVENTION

Figure 9:
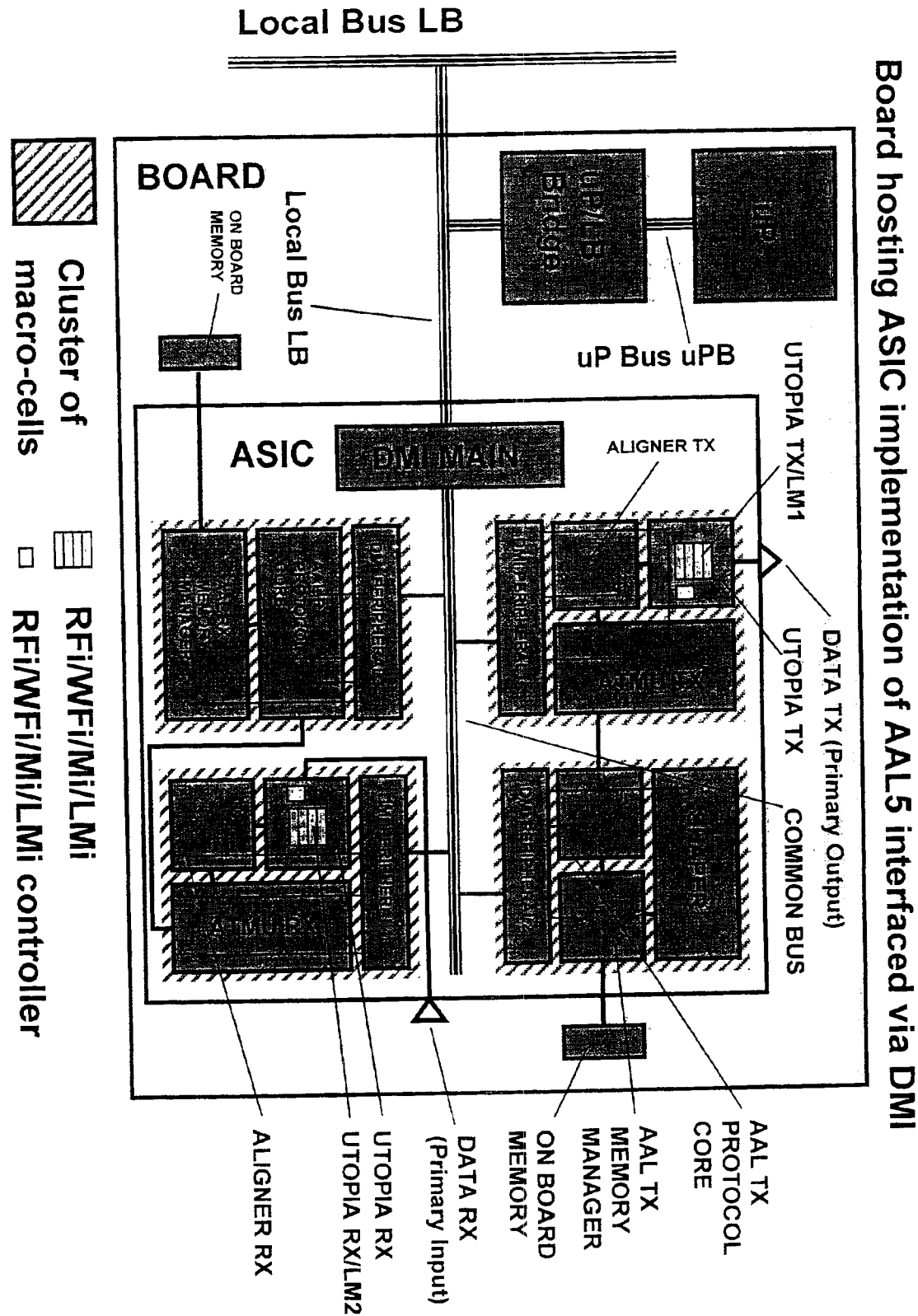
FIGS. 9 to 11 show several general architectures of interfaces between a microprocessor/local bus and clusters of user developed macro-cells according to the object of the present invention.

With reference to FIG. 9 an embodiment of the invention is shown. The embodiment is related to the implementation of a multi-channel segmentation and re-assembly controller, suitable for broadband telecom applications, such us Broad-band ISDN (Integrated Service Digital Network) based on ATM (Asynchronous Transfer Mode) technology. The multi-channel segmentation and re-assembly controller is implemented as ASIC device indicated as ASIC in Figure. The ASIC is hosted on a board indicated as BOARD in Figure. The board BOARD also host a microprocessor uP, a microprocessor to local bus bridge named uP/LB, an on board memory MB1 and an on board MEMORY MB2. The microprocessor uP is connected to the bridge uP/LB via a bus named uPB. The bridge uP/LB and the ASIC are connected by means of a local bus indicated as LB. The ASIC is organized is four cluster of user developed macro-cells plus one block named DMI MAIN. In each of the four clusters an instance of a special block named DMI PERIPHERAL is present: in the first cluster (top-left side) DMI PERIPHERAL1, in the second cluster (top-right side) DMI PERIPHERAL2, in the third cluster (bottom-left side) DMI PERIPHERAL3 and in fourth cluster (bottom-right side) DMI PERIPHERAL4. All the DMI PERIPHERALs are connected to a bus indicated as COMMON-BUS which departs from a side of the block DMI MAIN; the other side of the block DMI MAIN being reached from the local bus LB.

In a first cluster (top-left side) three macro-cells are embedded, other than DMI PERIPHERAL1, precisely: ATMU TX, UTOPIA TX and ALIGNER TX. The macro-cell UTOPIA TX embeds in its turn a LOCAL MEMORY LM1 and the related MEMORY CONTROLLER sketched as a small rectangle closed to LM1. The macro-cell UTOPIA TX is connected to a functional primary output of the ASIC indicated with a small triangle and named DATA_TX. The macro-cell ALIGNER TX is connected to macro-cells UTOPIA TX and ATMU TX. The last macro-cell is connected to a macro-cell AAL TX PROTOCOL CORE belonging to a second cluster. Macro-cell DMI PERIPHERAL1 has two links towards ATMU TX and one towards ALIGNER TX macro-cells.

In a second cluster (top-right side) three macro-cells are embedded other than DMI PERIPHERAL2, precisely: SHAPER, ML TX PROTOCOL CORE and AAL TX MEMORY MANAGER. The macro-cell SHAPER is connected to the macro-cell AAL TX MEMORY MANAGER, which is connected to the macro-cell AAL TX PROTOCOL CORE and to the on board memory MB2. The macro-cell AAL TX PROTOCOL CORE is further connected to the macro-cell ATMU TX located in the first cluster. The macro-cell DMI PERIPHERAL2 is in turn connected with all the three macro-cells of the cluster.

In a third cluster (bottom-left side) two macro-cells are embedded, named AAL RX PROTOCOL CORE and AAL RX MEMORY MANAGER, other than the macro-cell DMI PERIPHERAL3. The macro-cell AAL RX PROTOCOL CORE is connected to the suitable for broadband telecom applications, such us Broad-band ISDN (Integrated Service Digital Network) based on ATM (Asynchronous Transfer Mode) technology. The multi-channel segmentation and re-assembly controller is implemented as ASIC device indicated as ASIC in Figure. The ASIC is hosted on a board indicated as BOARD in Figure. The board BOARD also host a microprocessor uP, a microprocessor to local bus bridge named uP/LB, an on board memory MB1 and an on board MEMORY MB2. The microprocessor uP is connected to the bridge uP/LB via a bus named uPB. The bridge uP/LB and the ASIC are connected by means of a local bus indicated as LB. The ASIC is organized is four cluster of user developed macro-cells plus one block named DMI MAIN. In each of the four clusters an instance of a special block named DMI PERIPHERAL is present: in the first cluster (top-left side) DMI PERIPHERAL1, in the second cluster (top-right side) DMI PERIPHERAL2, in the third cluster (bottom-left side) DMI PERIPHERAL3 and in fourth cluster (bottom-right side) DMI PERIPHERAL4. All the DMI PERIPHERALs are connected to a bus indicated as COMMON-BUS which departs from a side of the block DMI MAIN; the other side of the block DMI MAIN being reached from the local bus LB.

In a first cluster (top-left side) three macro-cells are embedded, other than DMI PERIPHERAL1, precisely: ATMU TX, UTOPIA TX and ALIGNER TX. The macro-cell UTOPIA TX embeds in its turn a LOCAL MEMORY LM1 and the related MEMORY CONTROLLER sketched as a small rectangle closed to LM1. The macro-cell UTOPIA TX is connected to a functional primary output of the ASIC indicated with a small triangle and named DATA_TX. The macro-cell ALIGNER TX is connected to macro-cells UTOPIA TX and ATMU TX. The last macro-cell is connected to a macro-cell AAL TX PROTOCOL CORE belonging to a second cluster. Macro-cell DMI PERIPHERAL1 has two links towards ATMU TX and one towards ALIGNER TX macro-cells.

In a second cluster (top-right side) three macro-cells are embedded other than DMI PERIPHERAL2, precisely: SHAPER, AAL TX PROTOCOL CORE and AAL TX MEMORY MANAGER. The macro-cell SHAPER is connected to the macro-cell AAL TX MEMORY MANAGER, which is connected to the macro-cell AAL TX PROTOCOL CORE and to the on board memory MB2. The macro-cell AAL TX PROTOCOL CORE is further connected to the macro-cell ATMU TX located in the first cluster. The macro-cell DMI PERIPHERAL2 is in turn connected with all the three macro-cells of the cluster.

In a third cluster (bottom-left side) two macro-cells are embedded, named AAL RX PROTOCOL CORE and AAL RX MEMORY MANAGER, other than the macro-cell DMI PERIPHERAL3. The macro-cell AAL RX PROTOCOL CORE is connected to the macro-cells AAL RX MEMORY MANAGER and to a macro-cell ATMU RX belonging to a fourth cluster. The macro-cell, AAL RX MEMORY MANAGER is also connected to the on board memory MB1. The macro-cell DMI PERIPHERAL3 is also connected to all the three macro-cells of the cluster.

In a fourth cluster (bottom-right side) three macro-cells are embedded, other than DMI PERIPHERAL4, precisely: ATMU RX, UTOPIA RX and ALIGNER RX. The macro-cell UTOPIA RX embeds in its turn a LOCAL MEMORY LM2 and the related MEMORY CONTROLLER sketched as a small rectangle closed to LM2. The block UTOPIA RX is connected to a functional primary input of the ASIC indicated with a small triangle and named DATA_RX. The macro-cell ALIGNER RX is connected to the UTOPIA RX and ATMU RX macro-cells. The last block is also connected to the macro-cell AAL RX PROTOCOL CORE embedded in the third cluster. Macro-cell DMI PERIPHERAL4 has two links towards macro-cell ATMU RX and one link towards macro-cell ALIGNER RX.

In operation, the main functions implemented by the BOARD of FIG. 9 are those of ATM Adaptation Layer 5 (AAL5) referred to the standardized protocol OSI (Open System Interconnection), and of various ATM protocol layers. These functions are aggregated in two main sets: TX and RX. The operation is based on a scheduler (block SHAPER) to control the flow of transmitted data, and on a standardized interface (blocks UTOPIA). The transmit part of the board receives packets from the local bus LB, stores and segments them in ATM cells, and sends the cells to the Physical layer embedded by the ASIC. The DATA_TX acts as a primary output for the board. The receiver side of the board gets ATM cells from the primary input RX, authenticates, stores and reassembles them in packets, and sends the packets to the proper destination through the local bus LB.

More precisely, at the TX side the incoming packets are stored by the AAL TX MEMORY MANAGER macro-cell, that provides proper segmentation. The AAL5 protocol fields are calculated by the AAL TX PROTOCOL CORE macro-cell. The AAL segments are sent according to the transmission credits (tokens) provided by the SHAPER macro-cell. The ATMU TX macro-cell processes the AAL segments and prepares the ATM cells, that are re-timed by the ALIGNER TX macro-cell. The signals DATA_TX are then sent to the physical layer by means of the UTOPIA TX macro-cell.

At the RX side the incoming signals DATA_RX are received by the UTOPIA RX macro-cell, re-timed by the ALIGNER RX and processed by the ATMU RX macro-cells, that removes the ATM header and provides proprietary labels to AAL segments. The segments are then processed by the AAL RX PROTOCOL CORE macro-cell and are stored by the AAL RX MEMORY MANAGER macro-cell. The reassembled segments form packets that are sent to the destination.

Each macro-cells needs specific signals in order to be properly configured and controlled, e.g. signals carrying the ATM header of a new channel to be activated. The distributed interface of the present invention made up by DMI MAIN and DMI PERIPHERALs macro-cells, simplifies noticeably the job of providing user macro-cells with these signals. That because DMI MAIN plus its set of DMI PERIPHERALs constitute a substantially application independent interface implementing a plurality of general purpose sub-set of resources available for all gender of user macro-cells, so that the last need not particular arrangements anymore for being connected to this interface. On the contrary to a microprocessor interface of the prior art which need a consistent design embedded in the user macro-cells, because the architecture of the interface is not based on a consistent standardizable design outside the user macro-cells able to operate the interface in a way substantially application independent.

Figure 10:
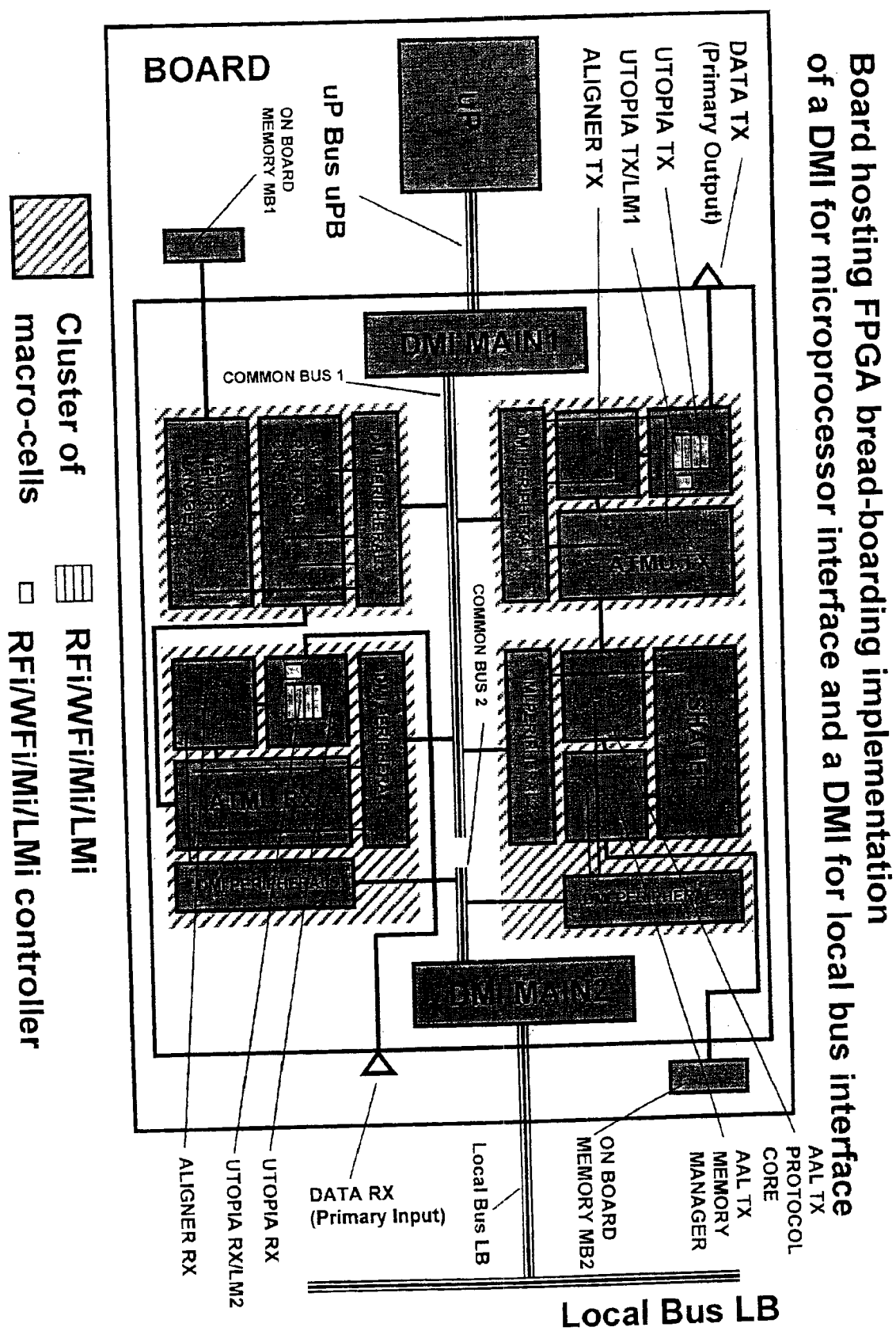

With reference to FIG. 10 a second embodiment of the invention is shown. It differs from the embodiment of FIG. 9 mainly for the absence of the block uP/LB BRIDGE at a left side of the BOARD and for the presence of an additional block DMI MAIN2 at the opposite side of the board. In FIG. 10 the microprocessor uP is directly connected to the block DMI MAIN1 inside the ASIC by means of the microprocessor bus uPB. Block DMI MAIN2 has a first side connected to a local bus LB on the back-plane, and the opposite side connected to a bus COMMON-BUS 2, while the block DMI MAIN1 is interposed between uPB and COMMON-BUS 1 buses, the last bus is the COMMON-BUS of the previous FIG. 9. First and third clusters of macro-cells are unchanged, while the remaining two clusters each includes an additional DMI PERIPHERAL macro-cell, both connected to the COMMON-BUS 2. More precisely, the second cluster includes a DMI PERIPHERAL6 macro-cell connected to AAL TX MEMORY MANAGER and AAL TX PROTOCOL CORE macro-cells instead of the DMI PERIPHERAL2 macro-cell. The fourth cluster includes a DMI PERIPHERAL5 macro-cell connected to the ALIGNER TX macro-cell instead of the DMI PERIPHERAL4 macro-cell.

Figure 11:
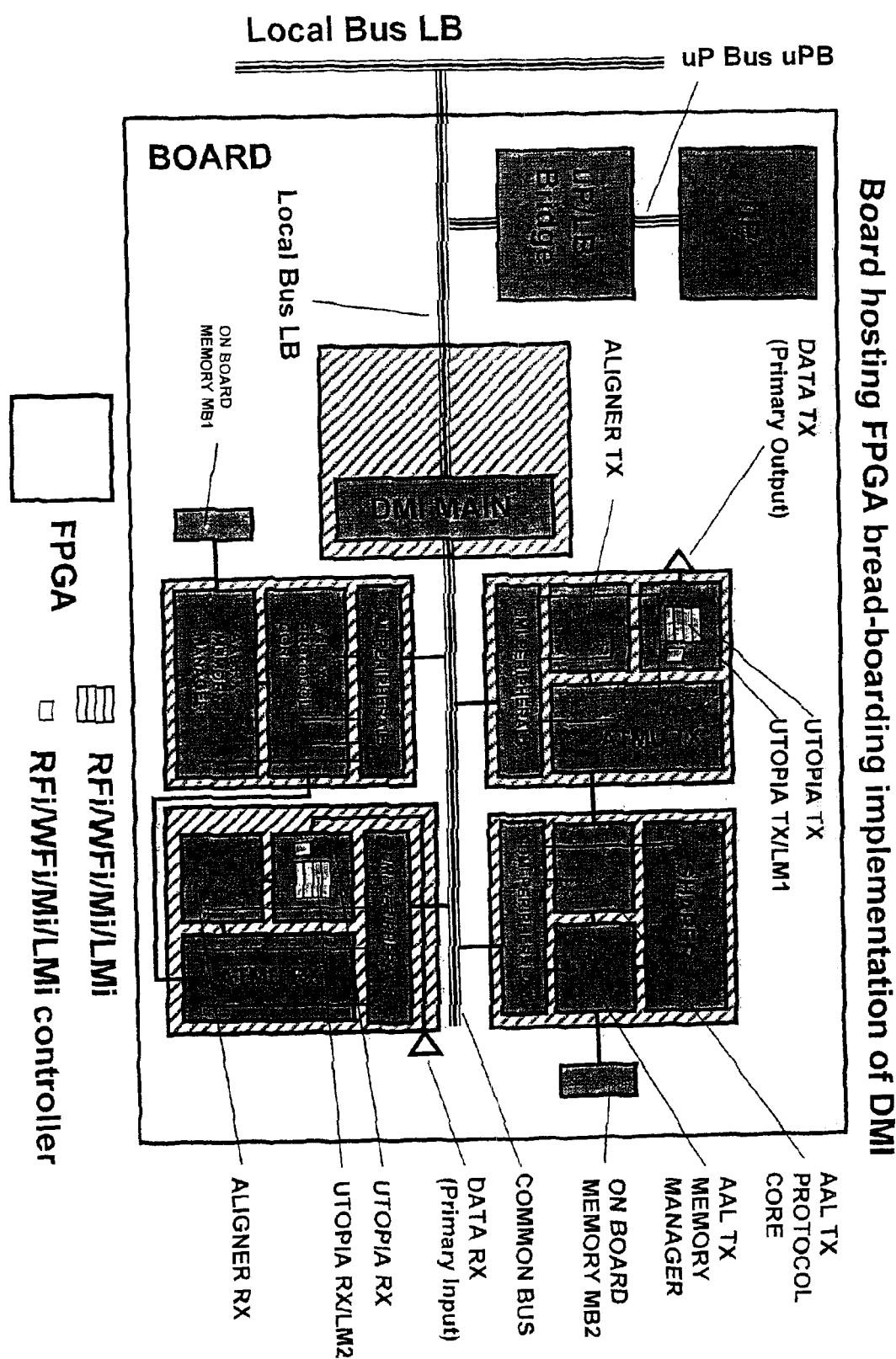

With reference to FIG. 11 a third embodiment of the invention is shown which differs from the embodiment of FIG. 9 only for the particular implementation in which the four clusters of macro-cells and the block DMI MAIN constituting the ASIC of FIG. 9 are implemented as many FPGA. The presence of the COMMON-BUS highly reduces the number of interconnections between DMI PERIPHERALs and relative user developed macro-cells; this makes the new implementation suitable for prototyping the ASIC, being the architecture the same for both ASIC and FPGA bread-boarding, no changes are necessary changing the implementation technology.

Figure 12:
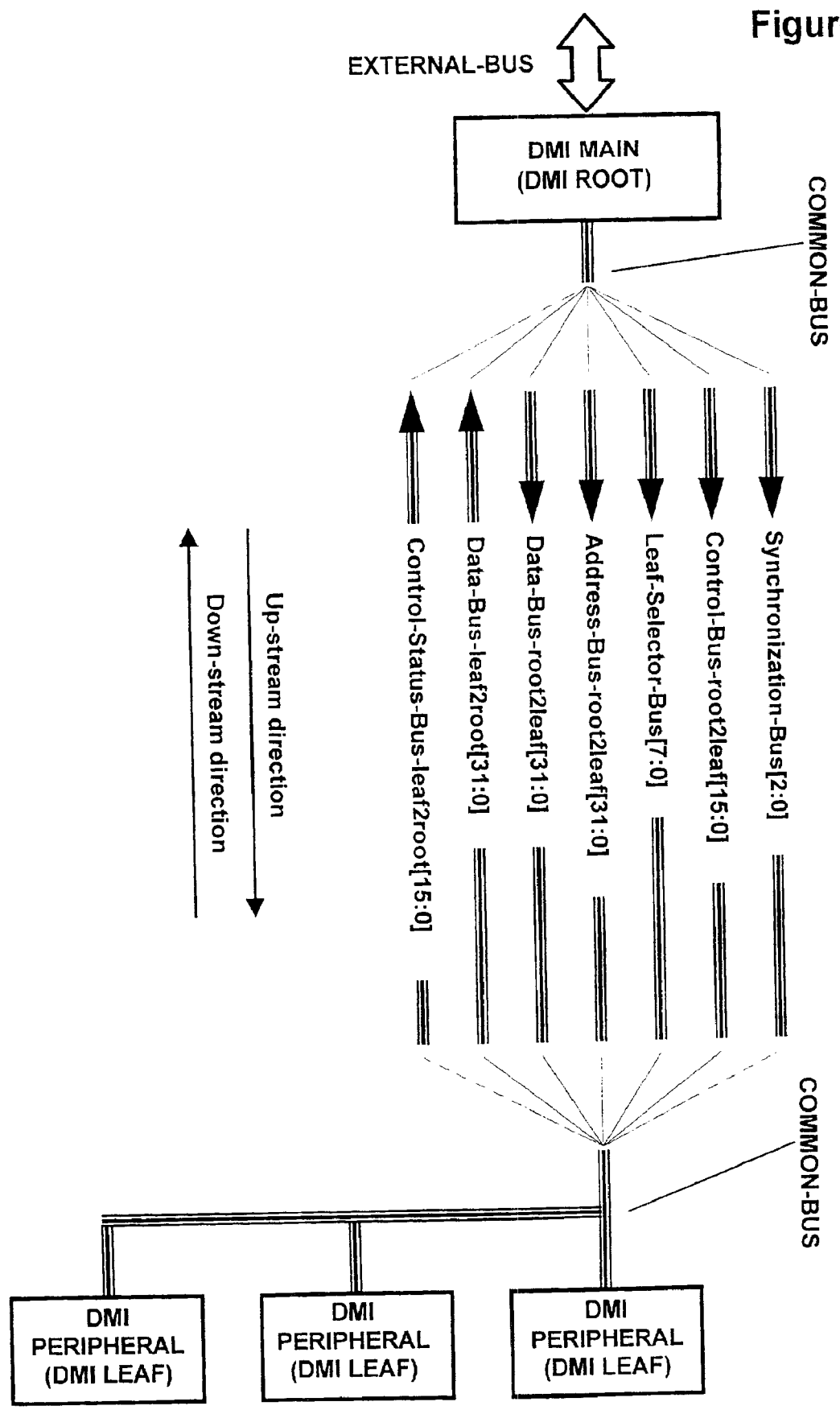
FIGS. 12 and 13 show the detailed structure of the COMMON-BUS visible in FIGS. 9 to 11.

With reference to FIG. 12 the COMMON-BUS of the previous FIGS. 9 to 11 is detailed into functionally structured sub buses. This means that some buses could not be physically present in the implementation but their function must be implemented (e.g. some bus can be multiplexed in time sharing fashion on the same physical support). Each sub bus has either direction upstream or downstream: the upstream direction is from DMI MAIN to DMI PERIPHERALs; the downstream direction is from DMI PERIPHERALs to DMI MAIN. Moreover the upstream buses are of type one2many (one-to-many: only one driver. The term driver in this context is the physical logic gate who drives the bus with voltage levels), that is with only one transmitter (DMI MAIN) and many receivers (DMI PERIPHERALs). On the contrary, downstream buses are of type many2one (many-to-one: many drivers), that is with many transmitters (DMI PERIPHERALs) and only one receiver (DMI MAIN).

Because of the particular tree like configuration of the distributed interface of the invention depicted in FIGS. 9 to 11, in which the block DMI MAIN is similar to the root and the blocks DMI PERIPHERALs to leafs, the two type of blocks are hereinafter also named DMI_ROOT and DMI_LEAFs indifferently. In FIG. 12 is also depicted an EXTERNAL-BUS at the left side of block DMI MAIN, this bi-directional bus is either the microprocessor uPB bus of FIG. 10 or local bus LB of FIG. 11.

Figure 13:
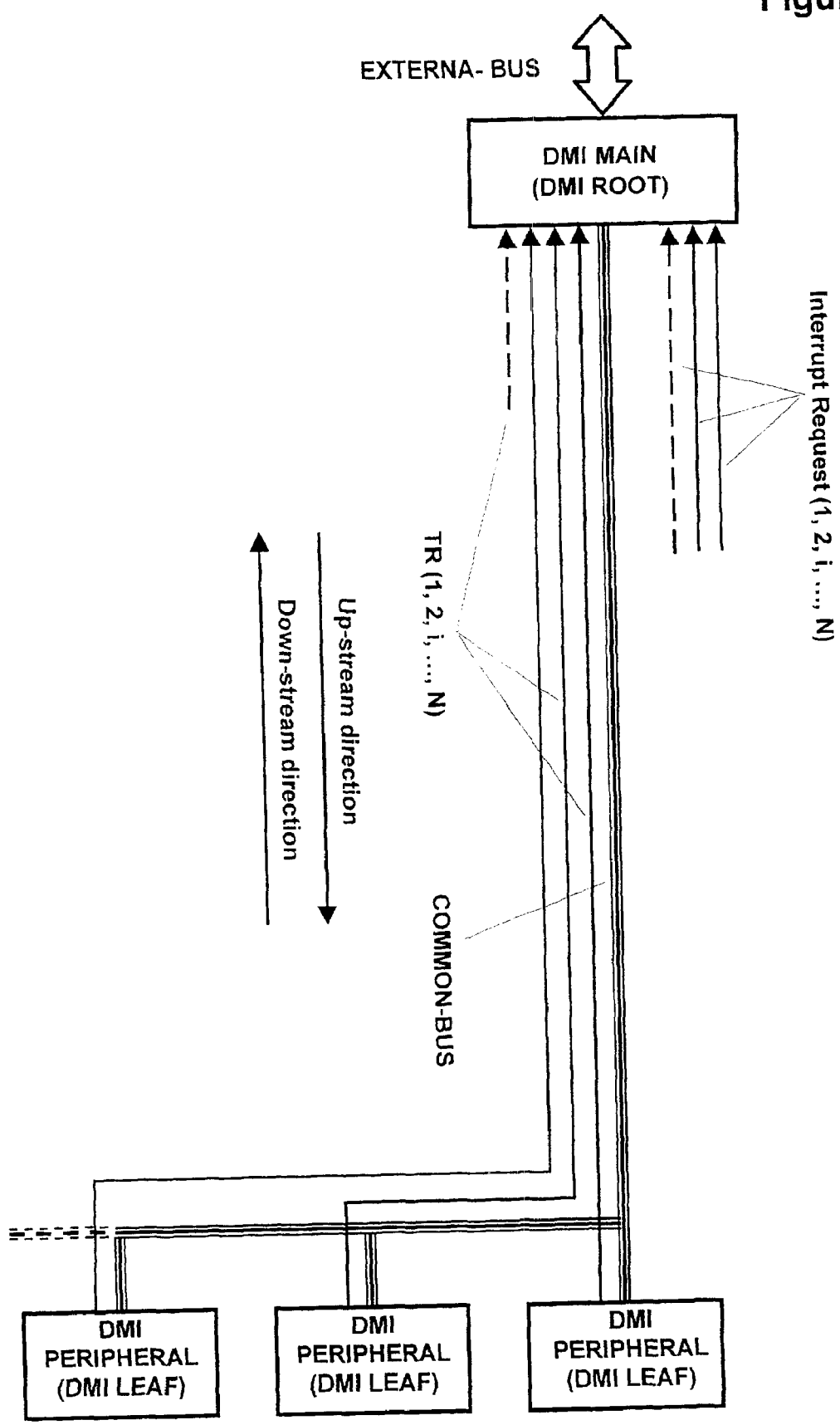

Distributed Microprocessor Interface (DMI) can be master or slave with respect to one EXTERNAL BUS AGENT (EBA) acting on EXTERNAL-BUS. Slave means that only the EXTERNAL BUS AGENT can initiate a transaction and block DMI MAIN can only execute the transaction issued by the EXTERNAL BUS AGENT, issuing proper commands towards the interfaced resources embedded into blocks DMI PERIPHERALs. On the contrary, master means that also block DMI MAIN can initiate a transaction with the EXTERNAL BUS AGENT. Block DMI MAIN initiates a transaction with the EXTERNAL BUS AGENT only when a resource embedded into a block DMI PERIPHERAL requests block DMI MAIN to do it. The EXTERNAL BUS AGENT is supposed to be of master type. In the case of distributed microprocessor interface (DMI) of master type the transaction requester, other than the EXTERNAL BUS AGENT, can be a block DMI PERIPHERAL (more precisely a user macro-cell connected to a DMI PERIPHERAL). This will be explained in details talking about block DMI MAIN operation and COMMON BUS protocol. If the block DMI MAIN is of master type the sub buses are:

Synchronization-Bus. Up-stream direction; carried information: clock, reset and strobe signal (3 wires);

Control-root2leaf-Bus. Up-stream direction; carried information: commands; from main DMI MAIN to peripherals DMI PERIPHERALs (16 bit);

Leaf-Selector-Bus. Up-stream direction; carried information: DMI PERIPHERALs blocks selection information (5 bit), plus chip selects (3 bit) selecting different layers of DMI PERIPHERAL;

Address-Bus-root2leaf. Up-stream direction; carried information: address information to address each resource embedded in a peripheral DMI PERIPHERAL (32 bit). More precisely this bus allows the addressing of each resource inside a specific layer, the layer being identified by chip selects;

Data-Bus-root2leaf. Up-stream direction; carried information: write data to user macro-cells via peripherals DMI PERIPHERALs (32 bit);

Data_Bus_leaf2root. Down-stream direction; carried information: read data from user macro-cells to main DMI MAIN via peripherals DMI PERIPHERALs (32 bit) and address information (source and destination address) and data burst length information when the DMI is working in master mode;

Control-Status-leaf2root-Bus. Down-stream direction; carried information: status information from peripherals DMI PERIPHERALs to main DMI MAIN (16 bit); when the distributed microprocessor interface (DMI) is of master type, blocks DMI PERIPHERALs can also send on this bus commands/flags expected to be executed by the block DMI MAIN;

With reference to FIG. 13 some extra wires for each peripheral DMI PERIPHERAL connected to the COMMON-BUS of FIG. 12 are present. This is required when at least a peripheral DMI PERIPHERAL is allowed to initiate transactions. These wires convey control signals such as TR (which is used by a DMI PERIPHERAL to request a transaction to DMI MAIN) and INTERRUPT REQUEST (interrupt request coming directly from interfaced macro-cells, possibly via a synchronization block if the clock of interfaced macro-cells differs from the one of DMI MAIN).

This is the full implementation of the COMMON-BUS. An alternative implementation designed to reduce the number of bits of said COMMON-BUS is obtained by multiplexing in time Address-Bus-root2leaf with Data-Bus-root2leaf and/or Address-Bus-leaf2root with Data_Bus_leaf2root. This version of the command bus is referred as "multiplexed version" when the distributed microprocessor interface (DMI) is of master type. In this case the bus layout is:

Synchronization-Bus. Up-stream direction; carried information: clock, reset and strobe signal (3 wires);

Control-root2leaf-Bus. Up-stream direction; carried information: commands; from main DMI MAIN to peripherals DMI PERIPHERALs (16 bit);

Leaf-Selector-Bus. Up-stream direction; carried information: peripherals DMI PERIPHERALs selection information (5 bit), plus chip selects (3 bit) selecting different layers of DMI PERIPHERAL;

Multiplexed-Address-Data-Bus-root2leaf. Up-stream direction; carried information: address information to address each function embedded in a peripheral DMI PERIPHERAL and write data to user macro-cells via peripherals DMI PERIPHERALs (32 bit). More precisely this bus allows the addressing of each resource within a specific layer, the layer being identified by chip selects.

Control-Status-leaf2root-Bus. Down-stream direction; carried information: status information from peripherals DMI PERIPHERALs to main DMI MAIN (16 bit); when the distributed microprocessor interface (DMI) is of master type blocks DMI PERIPHERALs can also send on this bus commands expected to be executed by the block DMI MAIN;

Data-Bus-leaf2root. Down-stream direction; carried information: address read data from user macro-cells to main DMI MAIN via peripherals DMI PERIPHERALs (32 bit) and address information (source and destination address) and data burst length information when the DMI is working in master mode;

If block DMI MAIN is of slave type (and the Application is not master), in both the "full version" and the "multiplexed version" of COMMON-BUS the sub bus Control-Status-leaf2root-Bus becomes a Status-leaf2root-Bus and the TR signals are not present.

Generally speaking the upstream buses are simply high fan-out nets driven by a driver embedded in main DMI MAIN. The ASIC implementation of a net of an upstream bus is a net buffered at any branch. The board implementation likely, under the high driving strength of pad and board drivers, does not require buffers. For the downstream buses, all solutions are possible, but the preferred one is the use of the so-called AND-Bus for active low signals and of the so called OR-Bus for active high signals. The use of gate based bus prevents bus contention problems and moreover make portable the bus implementation from board to ASIC and vice-versa.

Figure 14:
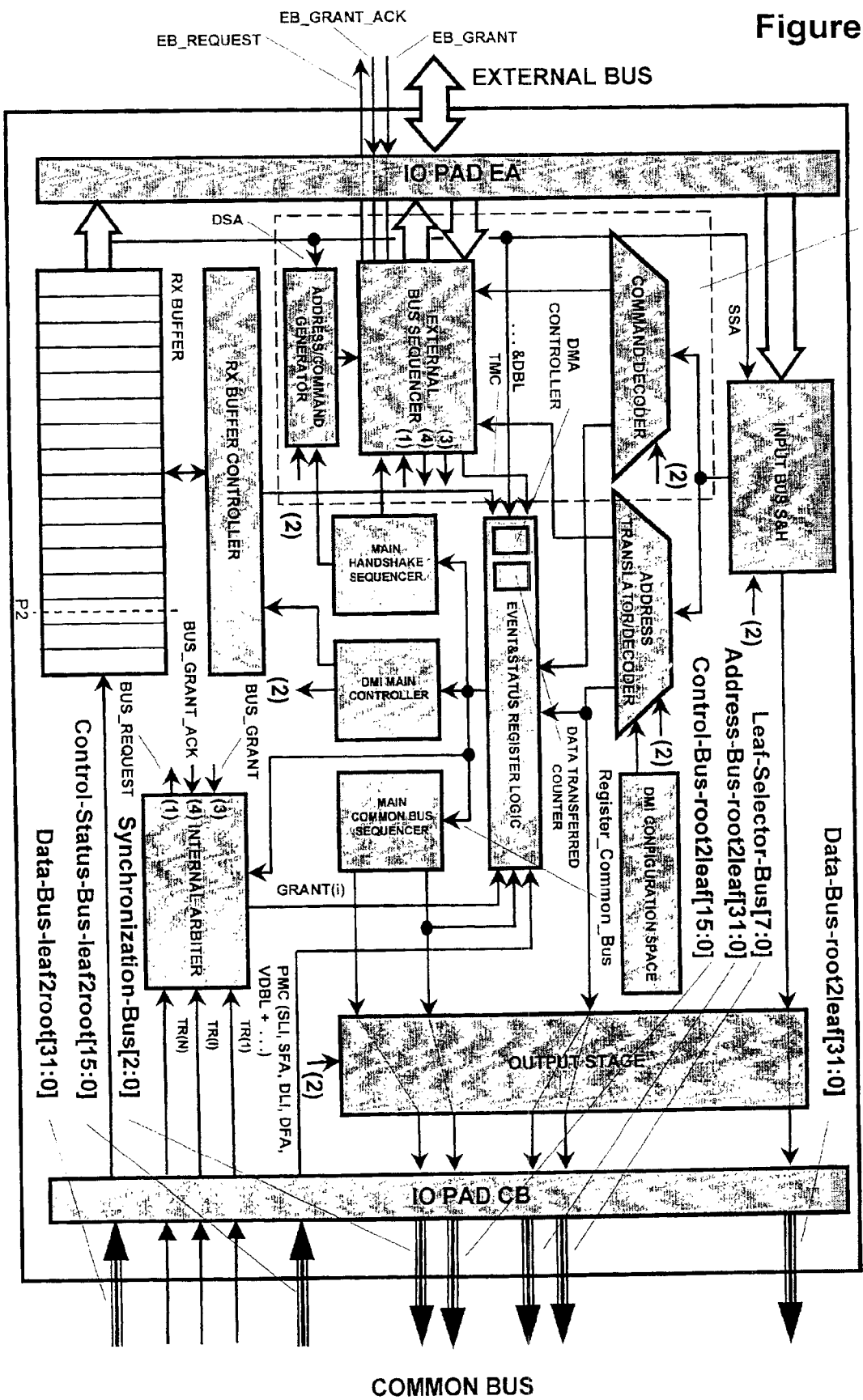
FIG. 14 shows a diagrammatic representation of a block DMI MAIN (DMI ROOT) belonging to the microprocessor/local bus interfaces of FIGS. 9 to 11 of the invention.

With reference to FIG. 14, we see that the main DMI MAIN block includes the following functional blocks: INPUT BUS S&H, COMMAND DECODER, ADDRESS TRANSLATOR/DECODER, DMI CONFIGURATION SPACE, EXTERNAL BUS SEQUENCER, MAIN HANDSHAKE SEQUENCER, DMI MAIN CONTROLLER, MAIN COMMON BUS SEQUENCER, EVENT&STATUS REGISTER LOGIC, COMMAND GENERATOR, RX BUFFER CONTROLLER, RX BUFFER, INTERNAL ARBITER, IO PAD EA and IO PAD CB. On its turn, the EVENT&STATUS REGISTER LOGIC block embeds a DMA CONTROLLER. Other entities, not shown in FIG. 14, will be described later. At left and right side of block DMI MAIN there are the EXTERNAL-BUS and COMMON-BUS respectively. In the present FIG. 14 two blocks ADDRESS TRANSLATOR and ADDRESS DECODER are designed, for graphical reasons, combined in the same block named ADDRESS TRANSLATOR/DECODER.

At the left side of DMI block the EXTERNAL-BUS is bidirectionally connected to a side of the IO PAD EA pad block which buffers signal from/to the EXTERNAL-BUS. At the other side of the pad IO PAD EA the EXTERNAL-BUS having downstream direction is forwarded to both EXTERNAL BUS SEQUENCER and INPUT BUS S&H blocks. In the same way both RX BUFFER and again EXTERNAL BUS SEQUENCER blocks send their output buses to the pad IO PAD EA which merge them into the EXTERNAL-BUS having upstream direction. At the right side of the DMI block the OUTPUT STAGE block is connected to the IO PAD CB block which buffers signals in the two directions of COMMON-BUS. Moreover a three signals named EB_REQUEST (External-Bus REQUEST), EB_GRANT (External-Bus GRANT) and EB_GRANT_ACK (External-Bus GRANT ACKowledge) are exchanged between the EXTERNAL AGENT and the EXTERNAL BUS SEQUENCER embedded into the DMI MAIN passing through the IP PAD EA block. The block IO PAD CB is simply a set of buffer if DMI MAIN and DMI PERIPHERALS are implemented inside the same chip.

The block INPUT BUS S&H has a first output connected to an input of block OUTPUT STAGE, and a second output connected to the input of both block COMMAND DECODER and ADDRESS TRANSLATOR/DECODER. The block INPUT BUS S&H, via both the OUTPUT STAGE block and the IO PAD CB block, drives the Data-Bus-root2leaf[31:0] bus. Two outputs of both COMMAND DECODER and ADDRESS DECODER stages are sent to two inputs of both blocks EXTERNAL BUS SEQUENCER and EVENT&STATUS REGISTER LOGIC. Moreover a output of the ADDRESS DECODER stage drives both Leaf-Selector-Bus[7:0] and Address-Bus-root2leaf[31:0] via both OUTPUT STAGE and IO PAD CB blocks.

On its turn, the output of EVENT&STATUS REGISTER LOGIC block is connected to the following blocks: MAIN HANDSHAKE SEQUENCER, DMI MAIN CONTROLLER, and MAIN COMMON BUS SEQUENCER via a dedicated bus REGISTER_COMMON_BUS internal to DMI block. Moreover it monitors, via dedicated links, the blocks: INTERNAL ARBITER, RX BUFFER CONTROLLER, EXTERNAL BUS SEQUENCER (or EBS) and also monitors the status of the sub-bus Control-Status-Bus-leaf2root[15:0] and Control-Bus-root2leaf[15:0]. The block INTERNAL ARBITER receives request signals TR(i) 1≦i≦N from blocks DMI PERIPHERAL(i), via IO PAD CB block, and the REGISTER_COMMON_BUS from the EVENT&STATUS REGISTER LOGIC block. On the basis of request signals the block INTERNAL ARBITER delivers GRANT(i) signals to the EVENT&STATUS REGISTER LOGIC block, and a BUS_REQUEST signal (marked by (1) in Figure) to the EXTERNAL BUS SEQUENCER block. The BUS_REQUEST signal asks the EXTERNAL BUS SEQUENCER to require mastership of the EXTERNAL BUS. Moreover the INTERNAL ARBITER receives a signal BUS_GRANT (marked by (3) in Figure) indicating that the EXTERNAL BUS SEQUENCER has become master of EXTERNAL-BUS. Finally it receives a BUS_GRANT_ACK (marked by (4) in Figure) signal indicating that the EXTERNAL BUS AGENT (EBA) has become master of the EXTERNAL-BUS.

The MAIN HANDSHAKE SEQUENCER block drives the blocks EXTERNAL BUS SEQUENCER and ADDRESS/COMMAND GENERATOR, the last drives the block EXTERNAL-BUS SEQUENCER. The block MAIN COMMON BUS SEQUENCER drives both the buses Synchronization-Bus[2:0] and Control-Bus-root2leaf[15:0], via the cascade of OUTPUT STAGE and the IO PAD CB blocks. The DMI MAIN CONTROLLER block drives the following blocks: RX BUFFER CONTROLLER, COMMAND DECODER (the connection is marked by a (2) in the Figure). Moreover it drives ADDRESS TRANSLATOR/DECODER (the connection is marked by a (2)), ADDRESS COMMAND/GENERATOR (the connection is also marked by a (2)), INPUT BUS S&H (the connection is marked by a (2)), and OUTPUT STAGE (the connection is marked by a (2)).

Block RX BUFFER CONTROLLER is connected in a bi-directional way to the RX BUFFER block. The RX BUFFER block receives data from Data-Bus-leaf2root[31:0] via IO PAD CB block and outputs data on the EXTERNAL-BUS. Further data outgoing from RX BUFFER block are outputted inside the block DMI MAIN, namely: datum SSA[31:0] (Source Starting Address) reaches a further input of block INPUT BUS S&H; datum DSA[31:0] (Destination Starting Address) reaches a further input of block ADDRESS/COMMAND GENERATOR; finally datum DBL[15:0] (Data Burst Length) plus some other bits and padding reaches the input of the DMA CONTROLLER embedded in the EVENT&STATUS REGISTER LOGIC block, the meaning of each signal outgoing from the buffer will be detailed later on. The DMA controller is further reached from other signals carried by the Control-Status-Bus-leaf2root[15:0] and whose meaning will be detailed later on, namely: SLI, SFA, DLI, DFA and others all directed to an input of block EVENT&STATUS REGISTER LOGIC further reached by a datum TMC (Transaction Monitoring signals & Command signals) not directed as the previous ones. All those signals, except TMC, are necessary to set a DMA on which DMI acts a master and read data from a DMI PERIPHERAL and writes them into the EXTERNAL AGENT. Data read from said DMI PERIPHERAL are temporarily stored into the RX BUFFER FIFO.

In the operation, the INPUT BUS S&H block samples and holds input signals from the EXTERNAL-BUS. The COMMAND DECODER block decodes commands received from the EXTERNAL-BUS. The ADDRESS TRANSLATOR/DECODER block decodes addresses received from the EXTERNAL-BUS into addresses of the Address-Bus-root2leaf[31:0] sub-bus of the COMMON-BUS and the mate values translated on Leaf-Selector-Bus [7:0]. The ADDRESS TRANSLATOR/DECODER block is not dependent on the external processor, this means that some general method for addressing resources has to be adopted. A well experienced method that it is useful to follow, in part, for addressing peripheral resources in the non limiting example of the present invention is that disclosed in the Chapter 6 of PCI Local Bus Specification. The addressing method used by the PCI is the most general and sophisticated used in the Information Technology area. As a consequence the minimum requirement for the DMI is to support such features and as, will be show in the next, to introduce some new ideas to enhance the interfacing with the resources embedded into the custom design. The PCI case will be included as a particular case. Coming back to chapter 6 of the PCI specification there is that of providing a mechanism to proper configure the space address in order to allow:

full device relocation, including interrupt binding;
installation, configuration, and booting without user intervention;
System address map construction by device-independent software.

Basing on these aims, the system designer is obliged to fill a list of the equipped resources, their individual address span and their properties (as an example prefetchable or not characteristic, Memory Space or IO Space required mapping and so on). The list is completed with some other fields, like: device identifier, vendor identifier, serial number, interrupt pin, latency, supported commands, status etc. This list has to be hardwired or downloaded into a set of register characteristic of the PCI. The set of these registers constitutes the 128 byte Configuration Space Header of the PCI. The information contained into the Configuration Space Header of the PCI is used from the boot software (at the boot time after the power-up) to correctly boot, configure and handle said PCI interface.

In particular, the boot software (at the boot time after the power-up) reads this Configuration Space Header to understand how to handle each resource. At the same time it maps resources into physical memory (by writing proper values into the so-called Base Addresses) taking in account the requirements of each resource (in terms of memory or IO space required and modality of access). PCI standard specifies that all ADDRESS SPACES used for allocation are power of two in size, and are naturally aligned, so a granularity of 4 kbyte results (in case of the Memory Space). Devices that need less space are in any case allocated into 4 kbyte and the remaining space is void. Conversely devices mapped into the IO Space can not use more than 256 byte per ADDRESS SPACE (per BASE ADDRESS register). Regarding the Memory Space this means that the minimum memory space allocation could be of 4 Kbyte. Conversely the maximum one in unbounded So, the result of space configuration is an Address Map of the resources which subdivide the overall address space among them, each resource being identified by means of an absolute base address and the relative size.

A lot of divergences arise in respect of PCI standard concerning both resource addressing and structure of the configuration space. This is because of the distributed architecture of the microprocessor interface of the invention, resources embedded in the DMI PERIPHERALs, and for the same reason user macro-cells, are not addressed directly by the EXTERNAL AGENT but filtered from a second level of addressing cascaded to the first. Moreover to handle in a flexible way the association between resources hosted into DMI PERIPHERALs and ADDRESS SPACES extra registers have been added in the DMI CONFIGURATION SPACE with respect to the PCI Configuration Space Header.

Said extra register belongs to three classes, the one of BASE_ADDR_MASK registers, the one of RESOURCE_CONFIGURATION registers and the one of RESOURCE_MAPPING registers.

To understand the reasons of these differences is necessary to anticipate same details of the DMI architecture. Each DMI PERIPHERAL has a layered architecture in which each layer contains homogeneous resources (layer of registers named REGBLOCK, layer of fifos named FIFOBLOCK and layer of memories MEMBLOCK). Moreover, also the DMI MAIN has its own layers of resources that are named NULL DEVICE and DMI CONFIGURATION SPACE.

The user of the DMI has to choose the number of DMI PERIPHERAL to use in its design and what layers to use for each DMI PERIPHERAL and what layer of resources to use in the DMI MAIN. Than he has to properly program the extra registers mentioned above, that is RESOURCE_CONFIGURATION and RESOURCE_MAPPING associated to each ADDRESS SPACE (i.e. BASE_ADDRESS register). This programming can be hard wired by means of GENERIC in the VHDL code or better to be downloaded by means of an EPROM, E2PROM or SERIAL E2PROM memory.

The extra registers BASE_ADDR_MASK, RESOURCE_CONFIGURATION and RESOURCE_MAPPING are provided inside the DMI CONFIGURATION SPACE to specify extra information about the resources associated to each ADDRESS SPACE (whose base is pointed by the corresponding BASE_ADDRESS register). This triplet of extra registers, peculiarity of the DMI, is present for each BASE ADDRESS provided in the PCI Configuration Space Header. According to PCI specifications up to 6 ADDRESS SPACES and consequently up to BASE_ADDRESS registers can be present, conversely in the DMI the number of address spaces is configurable. While the use of first register (BASE_ADDR_MASK) is trivial the other two have been introduced to fully exploit DMI PERIPHERAL architecture.

RESOURCE_CONFIGURATION registers are charged to specify the type of the resources mapped to the associated BASE_ADDRESS register. In particular RESOURCE_CONFIGURATION registers can be programmed with six labels that corresponds to six kind of resources: REGISTER_TYPE, FIFO_SINGLE_ADDRESS_TYPE, FIFO_MULTIPLE_ADDRESS_TYPE, MEMORY_TYPE, DMI_CFG_SPACE_TYPE and NULL_DEVICE_TYPE.

RESOURCE_MAPPING registers are charged to translate incoming addresses, generated by the EXTERNAL AGENT to addresses in a format suitable for the COMMON-BUS and the distributed architecture of the DMI. With a language used in the IT area they translates from linear address space to physical address space. Said registers are divided into two portions. A first one specifies the DMI PERIPHERAL where is hosted the resource associated to the ADDRESS SPACE to which a specific RESOURCE_MAPPING register is coupled (DMI PERIPHERAL SELECTION PORTION), a second one is an address, to decode inside the selected DMI PERIPHERAL (ADDRESS REMAP PORTION). Said address can override the incoming address or not depending on the setting of the RESOURCE_CONFIGURATION register associated to that ADDRESS SPACE. In this last case a second level of address translation is executed. The use of the DMI PERIPHERAL SELECTION PORTION can be switched on or off via a configuration setting while the use of the ADDRESS REMAP PORTION depends on the contents of the RESOURCE_CONFIGURATION register coupled to the mentioned RESOURCE_MAPPING register.

By the use of these register is possible to set up associations between and ADDRESS SPACE (corresponding to a specific BASE_ADDR) from one side and a selected LAYER belonging to a selected DMI PERIPHERAL. For instance, this means to associate to a certain ADDRESS SPACE the FIFOBLOCK or MEMBLOCK layer of a selected DMI PERIPHERAL. Moreover is possible to setup associations between an ADDRESS SPACE (corresponding to a specific BASE_ADDR) from one side and all LAYERS of a selected type belonging to all DMI PERIPHERALs. For instance, this means to associate to a certain ADDRESS SPACE all REGBLOCK layers of all DMI PERIPHERALs. In general is possible translating from a linear address space (the one seen from the EBA accessing the DMI) to a structured address space conform to the topology of the distributed interface and to the layered organization of leaves. This constitutes a peculiar aspect of the invention.

Now is possible to explain how RESOURCE_CONFIGURATION register and RESOURCE_MAPPING registers make possible this association. The contents of a RESOURCE_CONFIGURATION register allow the generation of the proper chip select (CS_REG, CS_FIFO or CS_MEM) carried by the Leaf-Selector-Bus[7:0] which activate the proper layer of the addressed DMI PERIPHERAL when an hit on the BASE_ADDRESS register corresponding to the mentioned RESOURCE_

CONFIGURATION register is detected. Both hits on a BASE_ADDRESS register coupled to a RESOURCE_CONFIGURATION register set as FIFO_SINGLE_ADDRESS_TYPE or FIFO_MULTIPLE_ADDRES_TYPE generates the same CS_FIFO chip select. Conversely an hit on a BASE_ADDRESS register coupled to a RESOURCE_CONFIGURATION register set as NULL_DEVICE_TYPE causes the generation of a chip select internal to DMI MAIN (CS_DEV_NULL) that on its turn causes the incoming data to be discarded. This feature emulates the use of the null device (/dev/null) in UNIX O.S. In the same way a hit on a BASE_ADDRESS register coupled to a RESOURCE_CONFIGURATION register set as MEMORY_TYPE generates the CS_MEM chip select. A hit on a BASE_ADDRESS register coupled to a RESOURCE_CONFIGURATION register set as REGISTER_TYPE generates the CS_REG chip select. Finally, an hit on a BASE_ADDRESS register coupled to a RESOURCE_CONFIGURATION register set as DMI_CFG_SPACE_TYPE causes the generation of a chip select internal to DMI MAIN (CS_CFG_SPACE). This chip select causes the selection of the DMI CONFIGURATION SPACE and the incoming address, generated by the EXTERNAL AGENT, select a row of this space. Moreover, as in the PCI case, this space can be selected also by an explicit signal (IDSEL in PCI) coupled to a specific command (CONFIGURATION READ or CONFIGURATION WRITE). This feature, allowing to reach the DMI CONFIGURATION SPACE both via specific chip select and as a normal memory access, is necessary to have compatibility toward both PCI and microprocessor buses (like the AHB bus of ARM processor). Only one RESOURCE_CONFIGURATION register can be programmed DMI_CFG_SPACE_TYPE while other types (FIFO_SINGLE_ADDRESS_TYPE, FIFO_MULTIPLE_ADDRESS_TYPE, MEMORY_TYPE or NULL_DEVICE_TYPE) can be used more than once. Regarding type REGISTER_TYPE, generally, only one RESOURCE_CONFIGURATION register is programmed as REGISTER_TYPE. The reason is that the DMI CONFIGURATION SPACE must be unique to avoid conflicts and REGBLOCK layers can be conveniently mapped in the same address space because of both the reduced amount of memory required and the undifferentiated access policy between different REGBLOCKS. Is also possible, even if not convenient, to map REGBLOCKS is separated ADDRESS SPACES.

In the first case the incoming address, generated by the EXTERNAL BUS AGENT, must have a portion (in a precise position of the incoming address) specifying the DMI PERIPHERAL where the REGBLOCK hosting the resources to address is embedded. On the contrary, in the second case this is achieved by properly programming the DMI PERIPHERAL SELECTION PORTION of the RESOURCE_MAPPING register coupled to the specified ADDRESS SPACE.

What described so far regarding the DMI PERIPHERAL SELECTION PORTION of the RESOURCE_MAPPING registers is generally applicable for other kind of resources. If the software driving the EXTERNAL BUS AGENT has the knowledge of the DMI topology organized in DMI PERIPHERALs it drives directly the bits corresponding to the DMI PERIPHERAL SELECTION PORTION of the RESOURCE_MAPPING register coupled to a certain ADDRESS SPACE. This means to drive a precise portion of the address bus of the EXTERNAL-BUS with a pattern identifying the desired DMI PERIPHERAL.

Conversely, the software driving the EXTERNAL BUS AGENT does not care about it and maps the resource to address in a linear address space relying for address translation on the RESOURCE_MAPPING register properly programmed in advance (e.g. at system boot). The provided address must belong to a certain ADDRESS SPACE (this is checked by the couple of BASE_ADDRESS and BASE_ADDRESS_MASK registers corresponding to said ADDRESS SPACE). Then after having detected a hit on a certain ADDRESS SPACE the DMI PERIPHERAL SELECTION PORTION of the corresponding RESOURCE_MAPPING register is used to fill the portion of the Leaf-Selector-Bus[7:0] of FIG. 12 which identifies the DMI PERIPHERAL hosting the resource to address. In the described case the corresponding portion of the address provided from the EXTERNAL BUS AGENT is not discarded but forwarded to the Address-Bus-root2leaf[31:0] of FIG. 12.

The ADDRESS REMAP PORTION of RESOURCE_MAPPING registers is ignored from all types of resources except the FIFO MULTIPLE ADDRESS and MEMORIES. With FIFO_MULTIPLE_ADDRESS_TYPE is referred the case that a FIFOBLOCK has to be mapped in current address space and incoming addresses are generated directly by the EXTERNAL AGENT with linear increment; in this case having a FIFO single address by construction the contents of this register define both the value of the portion of the Leaf-Selector-Bus[7:0] which selects the proper DMI PERIPHERAL where the referred FIFO is hosted (DMI PERIPHERAL SELECTION PORTION) and the address into the FIFOBLOCK where said FIFO is mapped (that is the incoming address is discarded and substituted with a portion of the RESOURCE_MAPPING register, this is referred as address translation, the involved portion is the ADDRESS REMAP PORTION). With FIFO_SINGLE_ADDRESS_TYPE is referred the case that a FIFOBLOCK has to be mapped in current address space and incoming address are generated by the EXTERNAL AGENT with no increment, that is access cycles are characterized by the same address. In that case, if configured, the DMI PERIPHERAL SELECT PORTION of the RESOURCE_MAPPING register coupled to current address defines the value of the portion of the Leaf-Selector-Bus[7:0] which selects the proper DMI PERIPHERAL where the referred FIFO is hosted. No translation of the ADDRESS REMAP PORTION is done in this case because the incoming address is fixed (that is the ADDRESS REMAP PORTION does not override the incoming address). The ability of performing address translation between address stepping burst modality and fixed address burst modality (FIFO_MULTIPLE_ADDRESS_TYPE case) that is often required by real applications (see scatter-gather list in SCSI devices) constitutes a peculiar aspect of the proposed address decode scheme.

Resources marked as MEMORY_TYPE depending of configuration settings can use or not the DMI PERIPHERAL SELECTION and ADDRESS REMAPPING features described so far.

Because of the distributed architecture of the microprocessor interface of the invention the address decode is in general performed in two steps: a first one embedded into the DMI MAIN by the ADDRESS TRANSLATOR/DECODER block and the second one inside the DMI PERIPHERALs. During an address phase of a read/write transaction, the ADDRESS TRANSLATOR/DECODER block of FIG. 14 preliminarily detects the matching of a received external address with one of the configured ADDRESS SPACES. If the address matches the condition then the block ADDRESS TRANSLATOR/DECODER gives prosecution to the transaction, otherwise not. In the former case the incoming address generated by the EXTERNAL BUS AGENT (either translated or not with the methods explained above) is forwarded on the sub-bus Address-Bus-root2leaf[31:0] and in the meanwhile on a selected portion of Leaf-Selector-Bus [7:0] a bit pattern selecting the proper DMI PERIPHERAL is forwarded (generation of this bit pattern is done via the RESOURCE_MAPPING register associated to the hit ADDRESS SPACE in the way explained above). Both sub-buses Leaf-Selector-Bus[7:0] and Address-Bus-root2leaf[31:0] are then forwarded to the cluster of peripheral leaves to make operative the second decoding step for addressing resources.

Said second level of address decode located into DMI PERIPHERALs is not mandatory but is used for convenience in all suitable cases. When the number of resources inside a layer of a DMI PERIPHERAL mapped behind a certain ADDRESS SPACE is large the most convenient way is to use a said second layer of address decode located inside the DMI PERIPHERAL. This is obtained by decoding at ADDRESS SPACE level only the address of the layer leaving "fine grain" decoding (single registers of the REGBLOCK layer) inside the DMI PERIPHERAL itself. This prevents from exhausting ADDRESS SPACES put at disposal by standard buses (e.g. PCI selected as EXTERNAL-BUS) connected with the DMI. This is what is done with REGBLCK layer resources. Moreover, as explained before, this concept is extended by mapping the REGBLOCK layer of all DMI PERIPHERAL in the same ADDRESS SPACE because of both the reduced amount of memory required and the undifferentiated access policy between different REGBLOCKS. This is obtained by programming only one RESOURCE_CONFIGURATION register as REGISTER_TYPE.

On the contrary, when this number is small and there is not the risk to exhaust ADDRESS SPACES put at disposal by standard buses (e.g. PCI selected as EXTERNAL-BUS) connected with the DMI, is convenient to dedicate a whole ADDRESS SPACE to that specific resource. As an example consider: a single ADDRESS SPACE for each MEMBLOCK layer, a single ADDRESS SPACE for each write fifo inside each FIFOBLOCK layer and a single ADDRESS SPACE for each read fifo inside each FIFOBLOCK layer. In such cases said second layer of address decode may be very simple.

In case of resource of type FIFO_MULTIPLE_ADDRESS_TYPE due to address remapping (via RESOURCE_MAPPING register) this second layer of decode disappears. In case of resource of type FIFO_SINGLE_ADDRESS_TYPE said second layer of address decode may disappear if address remapping (via RESOURCE_MAPPING register) is applied; on the contrary it is required. Let's consider this second case when an EXTERNAL BUS AGENT of PCI type is considered. In such a case a memory ADDRESS SPACE must be at least 4 kbyte and a IO ADDRESS SPACE must be maximum 256 byte. Thus, is clear that a hit on said ADDRESS SPACE does not imply a hit on the single address of a fifo inside a certain FIFOBLOCK of a certain DMI PERIPHERAL. In such a case the second step of decoding is simply a check of the consistence of a certain low portion of the address sent on the Address-Bus-root2leaf[31:0] matches with the single address assigned to the fifo.

When a MEMBLOCK layer embedded inside a certain DMI PERIPHERAL has to be interfaced and the EXTERNAL BUS AGENT is of PCI type the presence of the second layer of address decoding is required under certain conditions. Precisely, if the size of the memory is less than the minimum side of the ADDRESS SPACE standardized from PCI, that is 4 kbyte. In any case a second level of address decode is performed inside a block named MEMORY CONTROLLER, embedded in a block named MEMORY HOST MODULE which on its turn embeds the memory.

When two layers of address decode are required the key idea is to organize things in such a way that an hit on the first decoder (the ADDRESS TRANSLATOR/DECODER inside the DMI MAIN) is possibly followed by an hit on the second decoder (the one inside the DMI PERIPHERAL). This, in case of REGBLOCK layer, is achieved by substituting the lacking resources in the REGBLOCK space causing holes in the address space with special blocks replying accesses with a 'bad access code' code. This makes the interface able to reply to the EBA basing on the results of the hit on the first address decode (the ADDRESS TRANSLATOR/DECODER inside the DMI MAIN) reducing the initial latency of the access.

The DMI CONFIGURATION SPACE is implemented as a register-based table that makes available resources to configure the main block DMI MAIN following the protocol specification of the EXTERNAL-BUS. As seen above this table is similar to the PCI Predefined Header for the aspects regarding addressing. The registers belonging to the DMI CONFIGURATION SPACE can be arranged to emulate to PCI standard Predefined Header and other types of configuration spaces. This flexibility is obtained by controlling by means of VHDL GENERICS or strings of bits downloaded (at the power-up time) from the external memory (EPROM, E2PROM or SERIAL E2PROM) mentioned above the behavior of each single bit of each single register. The user definable options for each bit are READ_ONLY, READ_WRITE and WRITE_ONE_TO_CLEAR (it means that said bit could only be cleared by writing a one into it). All the registers are arranged in scan (a serial chain connecting all registers) and the most convenient mode of programming is the use of an external SERIAL E2PROM. Moreover, some registers is reserved to configure some parameters allowing controlling the working mode and fine tuning of COMMON-BUS operation. Finally, also the relative order of registers into the table can be altered. This is possible by an address translator embedded into the table itself.

To go on in the operation, the EXTERNAL BUS SEQUENCER block interfaces a protocol agent acting on the EXTERNAL-BUS by implementing its communication protocol. The MAIN COMMON BUS SEQUENCER block generates commands towards the COMMON-BUS. The MAIN HANDSHAKE SEQUENCER block generates status signals and commands towards the EXTERNAL BUS SEQUENCER block. The DMI MAIN CONTROLLER block generates control signals for blocks embedded in main DMI MAIN (other than blocks: EVENT&STATUS REGISTER LOGIC, MAIN COMMON BUS SEQUENCER and MAIN HANDSHAKE SEQUENCER).

Block EVENT&STATUS REGISTER LOGIC: transmits, detects, traps, integrates, infers and determinates events and states meaningful for synchronization between EXTERNAL-BUS and COMMON-BUS protocols. Example of these synchronization events are a start/end transaction detection on the two buses, wait states insertion detection, availability of data detection. Further operations in which the last block is engaged are: monitoring of number of data currently transferred towards the EXTERNAL-BUS (by means of the block DATA TRANSFERRED COUNTER), monitoring of number of data currently in the RX BUFFER block, monitoring of operations requested by the protocol agent taking charge of the EXTERNAL-BUS and promoting corresponding operations in sub-blocks embedded in block DMI MAIN (e.g. address increment command to INPUT BUS S&H block, clear command to RX BUFFER CONTROLLER block, etc.).

Block EVENT&STATUS REGISTER LOGIC receives information from the buses EXTERNAL-BUS and Control Status Bus Leaf2Root, and from the RX BUFFER CONTROLLER, COMMAND DECODER and ADDRESS DECODER, and ARBITER which sends GRANT(i) signals. Output states and events are outputted by the block EVENT&STATUS REGISTER LOGIC on the bus REGISTER-COMMON-BUS and forwarded in parallel to the blocks MAIN HANDSHAKE SEQUENCER, MAIN COMMON BUS SEQUENCER and DMI MAIN CONTROLLER.

The use of common information carried by the REGISTER-COMMON-BUS to synchronize and control the blocks MAIN HANDSHAKE SEQUENCER, MAIN COMMON BUS SEQUENCER and DMI MAIN CONTROLLER greatly helps in de-coupling them each other and from the EXTERNAL BUS SEQUENCER block. This makes the system reliable because the meaningful events for the various machines are homogeneous and easy to modify because the various machines are each other de-coupled. In other words no direct communication take places between the mentioned machines.

Block EVENT&STATUS REGISTER LOGIC also embeds a DMA CONTROLLER used in burst transaction for transferring information from user Macro-cells to the EXTERNAL-BUS through the RX BUFFER block, only when the DMI acts a bus master.

Block ADDRESS/COMMAND GENERATOR generates commands to be issued and transmitted by the EXTERNAL BUS SEQUENCER block on the EXTERNAL-BUS. Block RX BUFFER CONTROLLER controls operation of RX BUFFER block. The last receives and stores data from COMMON-BUS; it makes allowable data for read to the EXTERNAL-BUS protocol agent. The OUTPUT STAGE block performs the time alignment of output signals before sending them on the COMMON-BUS.

Block IO PAD EA embeds all the input/output pads for interfacing the EXTERNAL-BUS. Block IO PAD CB embeds all the input/output pads for interfacing the COMMON-BUS. Other entities, not shown in FIG. 14, are present in main block DMI MAIN: namely DMI CONFIGURATION SPACE CONTROLLER, and INTERRUPT COLLECTOR/CONTROLLER blocks.

The CONFIGURATION SPACE CONTROLLER controls accesses to the CONFIGURATION SPACE TABLE following the same protocol used to interface peripheral blocks DMI PERIPHERALs; this simplify the interfacing of the CONFIGURATION SPACE TABLE and makes more modular the system. The INTERRUPT COLLECTOR/CONTROLLER is an entity which receives interrupt requests from DMI PERIPHERALs, collects them, masks them (using a mask set in the CONFIGURATION SPACE TABLE) and sends a proper request to the MAIN EVENT&STATUS REGISTER LOGIC block. The MAIN EVENT&STATUS REGISTER LOGIC block, on its turn, will provide to send the interrupt to the protocol agent acting on the EXTERNAL-BUS, via the EXTERNAL BUS SEQUENCER block. The INTERRUPT COLLECTOR/CONTROLLER provides the most common functions of interrupt controllers as described in known art.

Figure 6:
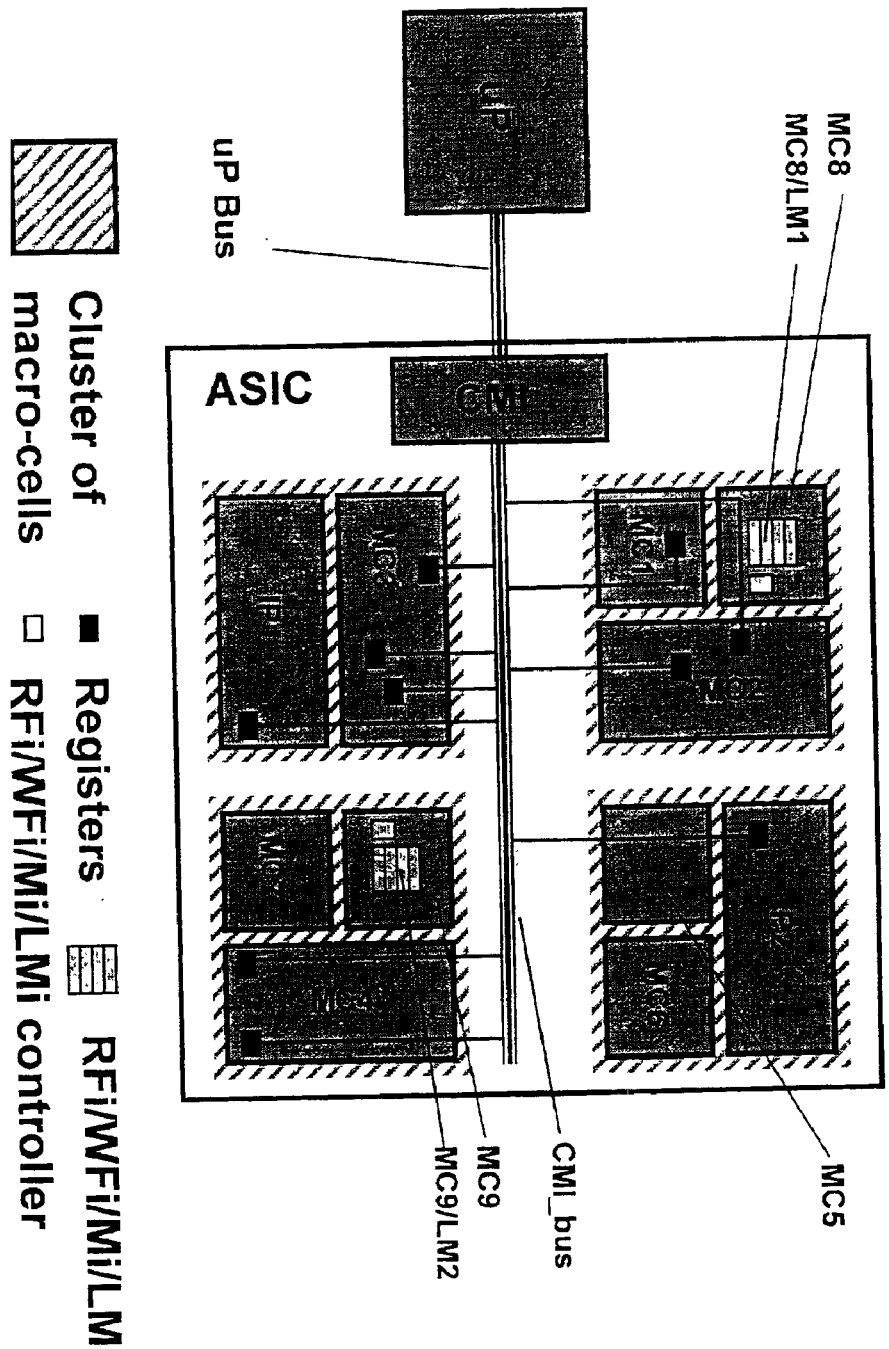
Figure 7:
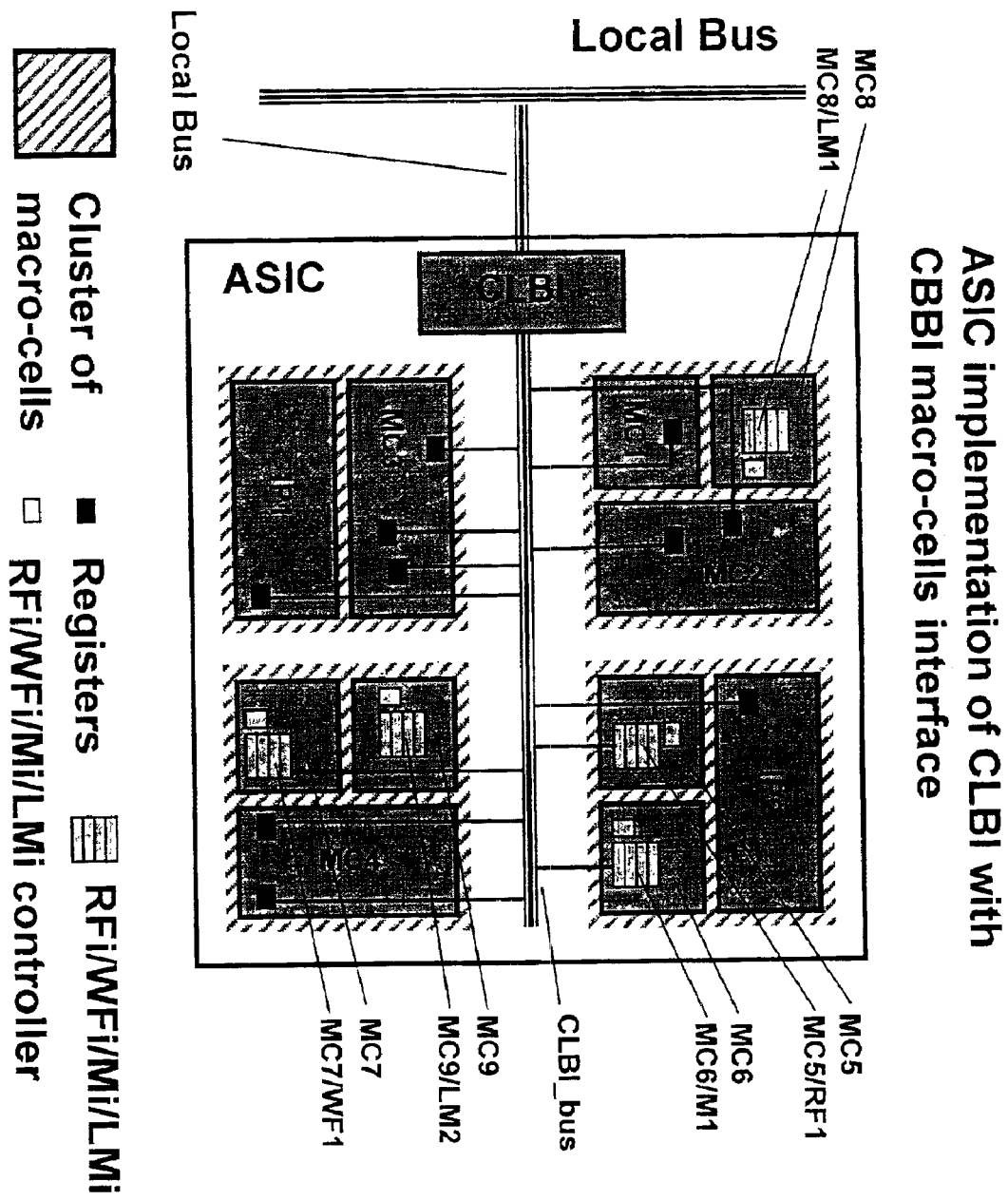

The three blocks enclosed in dashed rectangle in FIG. 14 are similar to a plug-in module that changes when the EXTERNAL-BUS protocol changes. This internal architecture of the main block DMI MAIN allows great advantages in terms of modularity and reusability, in fact, thanks to the de-coupling resulting between the protocol running on EXTERNAL-BUS and the protocol running on the COMMON-BUS, it is possible to change a type of protocol on the EXTERNAL-BUS without affecting the rest of the Distributed Microprocessor Interface (DMI) an the interfaced user macro-cells. It is enough to redesign the only the plug-in module. Differently, in "classic" solutions which admit bus (visible in FIGS. 6, 7 and 8) this is not possible because the protocol of the CMI_bus or CLBI_bus interfacing resources is closely related to the one of the uP Bus or Local Bus respectively.

The architecture of block DMI MAIN presented complies to the COMMON-BUS layout shown in FIGS. 12 and 13 referred as "full version" and DMI MAIN block is supposed to be of master type. If DMI MAIN block is of slave type the blocks COMMAND GENERATOR and INTERNAL ARBITER are not present, moreover the request signals (TR(i)) are not present.

Figure 15:
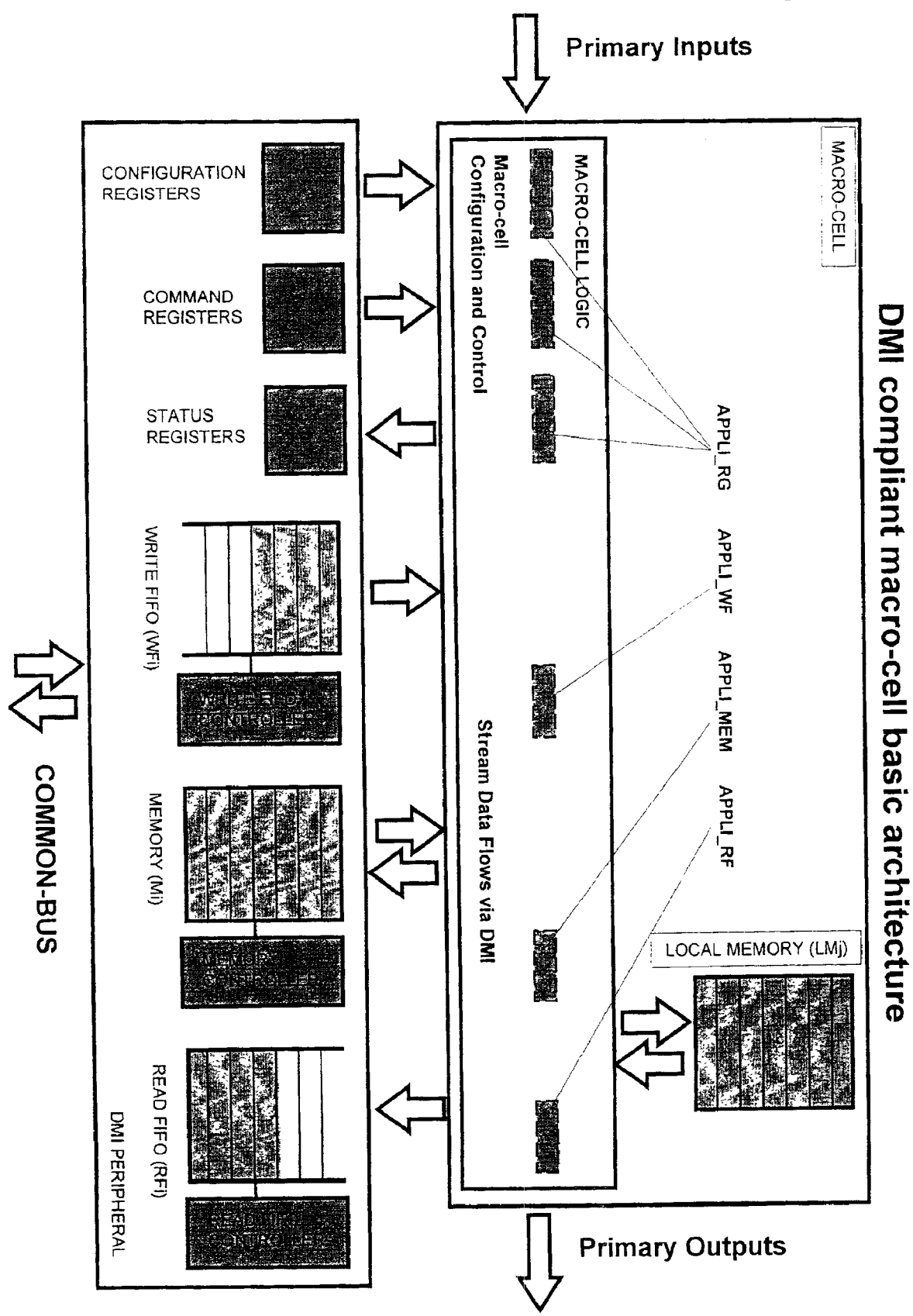
FIG. 15 shows a most general diagrammatic representation of a block DMI PERIPHERAL (DMI LEAF) connected to a MACRO-CELL, both included in a CLUSTER OF MACRO-CELLS belonging to the microprocessor/local bus interfaces of FIGS. 9 to 11 of the invention.

With reference to FIG. 15 we see at the top part of the Figure a most general application-dependent MACRO-CELL communicating with a most general application-independent peripheral block DMI PERIPHERAL, both compliant with an embodiment of the invention depicted in FIGS. 9 to 11. Block DMI PERIPHERAL includes the following hardware resources: CONFIGURATION REGISTERS, COMMAND REGISTERS, STATUS REGISTERS, WRITE FIFO WFi plus its WRITE FIFO CONTROLLER, MEMORY Mi plus its MEMORY CONTROLLER, READ FIFO RFi plus its READ FIFO CONTROLLER, etc.; obviously the set of resources is not limiting, further detailed figures enlarge it. All these resources are served by the COMMON-BUS connected at one side of the block DMI PERIPHERAL as detailed in FIGS. 12 and 13, and by several sub buses generically indicated as Point-to-Point-Buses at the opposite side of the block DMI PERIPHERAL.

Block MACRO-CELL includes a functional block MACRO-CELL LOGIC bi-directionally connected with the previous block DMI PERIPHERAL, and a memory block LOCAL MEMORY LMj bi-directionally connected with block MACRO-CELL LOGIC. As said in the case of FIG. 1, even if not represented in FIG. 15, in the generic known macro-cell also a LOCAL READ FIFO and a LOCAL WRITE FIFO and relative controllers can be present. Moreover, the macro-cell embeds four dashed boxes. First three boxes are collectively indicated as:

APPLI RG (APPLIcation logic charged of ReGisters Interfacing).

Further three dashed boxes are respectively indicated as:

APPLI WF(APPLIcation logic charged of Write Fifo interfacing),

APPLI RF (APPLIcation logic charged of Read Fifo interfacing), and

APPLI MEM (APPLIcation logic charged of MEMory Interfacing).

The MACRO-CELL LOGIC block is connected to peripheral block DMI PERIPHERAL by means of Point-to-Point-Buses; it is also connected to input/output points of the macro-cell, or with other macro-cells not visible in the Figure, by means of the buses PRIMARY-INPUTS and PRIMARY-OUTPUTS. Block MACRO-CELL LOGIC hosts the so-called "glue logic" (generic combinatorial and/ or sequential logic networks) plus control FSM (Finite States Machines).

The block MACRO-CELL LOGIC, plus Local Memories are dedicated to the implementation of the task that constitutes the primary macro-cell function. This function hereinafter will be referred also as application.

Every resource (REGISTERS, FIFOS, MEMORIES and so on) have two sides, one towards the EXTERNAL-BUS via COMMON-BUS and DMI MAIN block and one towards the user macro-cells. The side towards COMMON-BUS is also interfaced with it and the knowledge of the COMMON-BUS protocol is necessaries at this side. To interface the resources with the COMMON-BUS a specific controller is provided (this controller may be complex). To interface the resources with the user macro-cell, each resource has a specific port (set of data and control signals) towards the user macro-cell. At this level a straightforward (the connection is point to point) protocol of interface is proposed.

For instance, for a CONFIGURATION REGISTER a strobe signal is used indicating to the application that the value of that CONFIGURATION REGISTER (written from the EXTERNAL-BUS) is changed. For a COMMAND REGISTER the change of the value of the COMMAND REGISTER itself is a piece of information sent to the application (this change is the command issued because the command is always an event and not a state as a configuration). For a STATUS REGISTER the user macro-cell must supply a strobe signal allowing the STATUS REGISTER to latch the status sent from the application. Logic detecting the strobe signal associated to the CONFIGURATION REGISTER is part of the user macro-cell itself. Regarding the STATUS REGISTER, logic generating the strobe signal allowing the STATUS REGISTER to latch the status sent from the user macro-cell is part of the user macro-cell itself. Similar arguments can be used for other kinds of registers. The logic discussed above is the one indicated as APPLI RG in FIG. 15. Resources of register type and related controllers devoted to interface them with the COMMON-BUS are not logically part of the user macro-cell but are "services"; by this reason they were embedded into the DMI PERIPHERAL.

The same arguments valid for resources of register type are still valid for resources of memory type. The logic needed to interface memories (not local memories) to the user macro-cell is the one indicated as APPLI MEM in FIG. 15. This is the application logic that decides when and what to read/write from/to the memory and is separated from the logic that actually generates control signals to the memory, and interfaces it to the COMMON-BUS. Resources of memory type (not local memories) and related controllers devoted to interface them with the COMMON-BUS are not logically part of the user macro-cell but are "services"; by this reason they were embedded into the block DMI PERIPHERAL.

Again, the same arguments valid for resources of register type are still valid for resources of FIFO type. The logic blocks needed to interface FIFOs is indicated as either APPLI WF or APPLI RF in FIG. 15 and there are not important conceptual differences between them, so for simplicity we can refer only to the APPLI WF one. This logic is the user MACRO-CELL LOGIC that decides when and what to write to the FIFO. To do that this logic must be able of generating push signal and to monitor the FIFO status to be sure not to write when the FIFO is full (otherwise written data are lost). This logic is separated from the FIFO controller that, on the contrary, can be seen as a "service" and by this reason is embedded with the FIFO itself into the block DMI PERIPHERAL.

Figure 1:
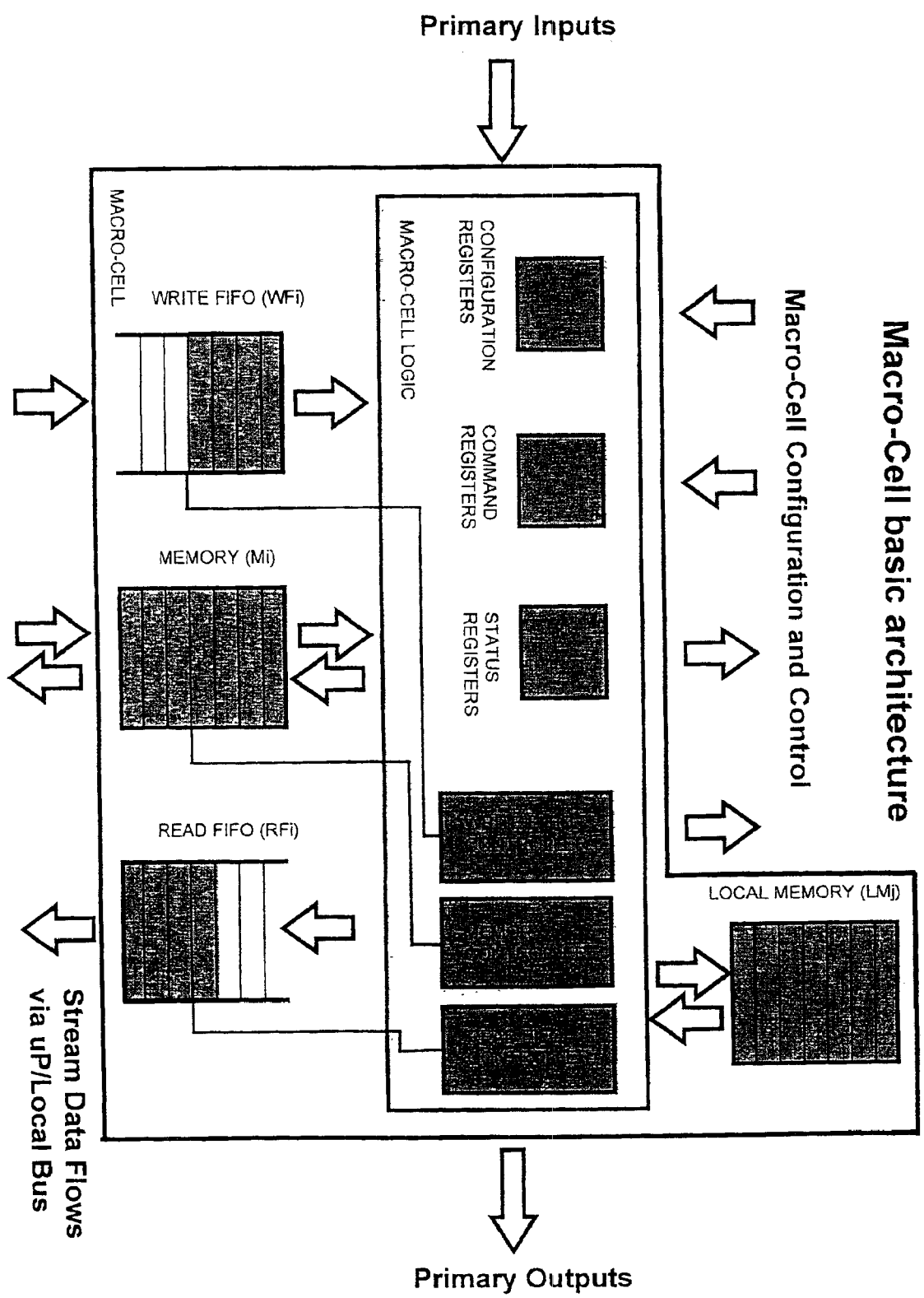
FIG. 1 shows a diagrammatic representation of a known macro-cell.
Figure 2:
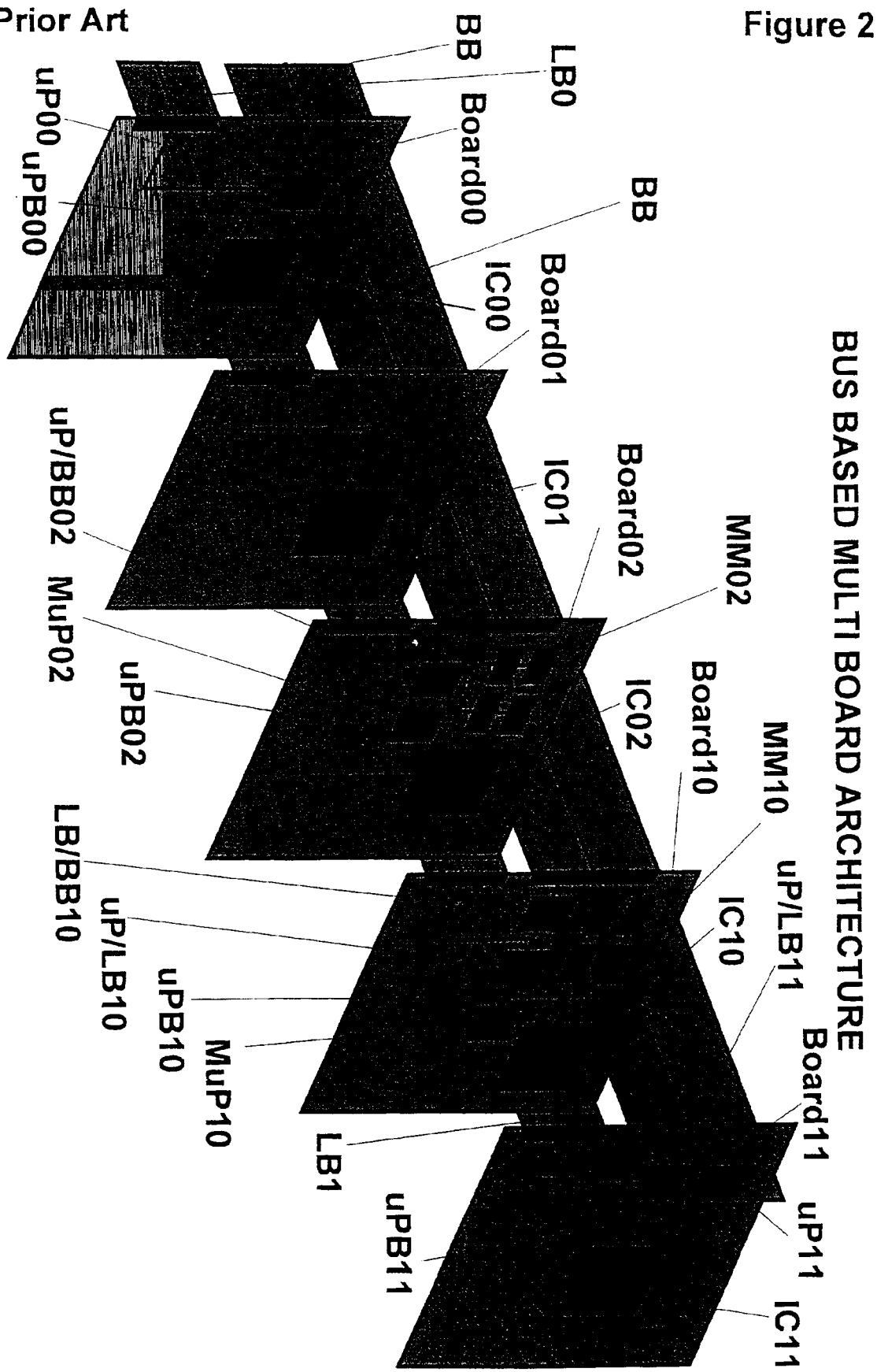
FIG. 2 shows a typical assembling of a few interconnected boards/cards including macro-cells of FIG. 1 and relative microprocessor/local bus interfaces.
Figure 3:
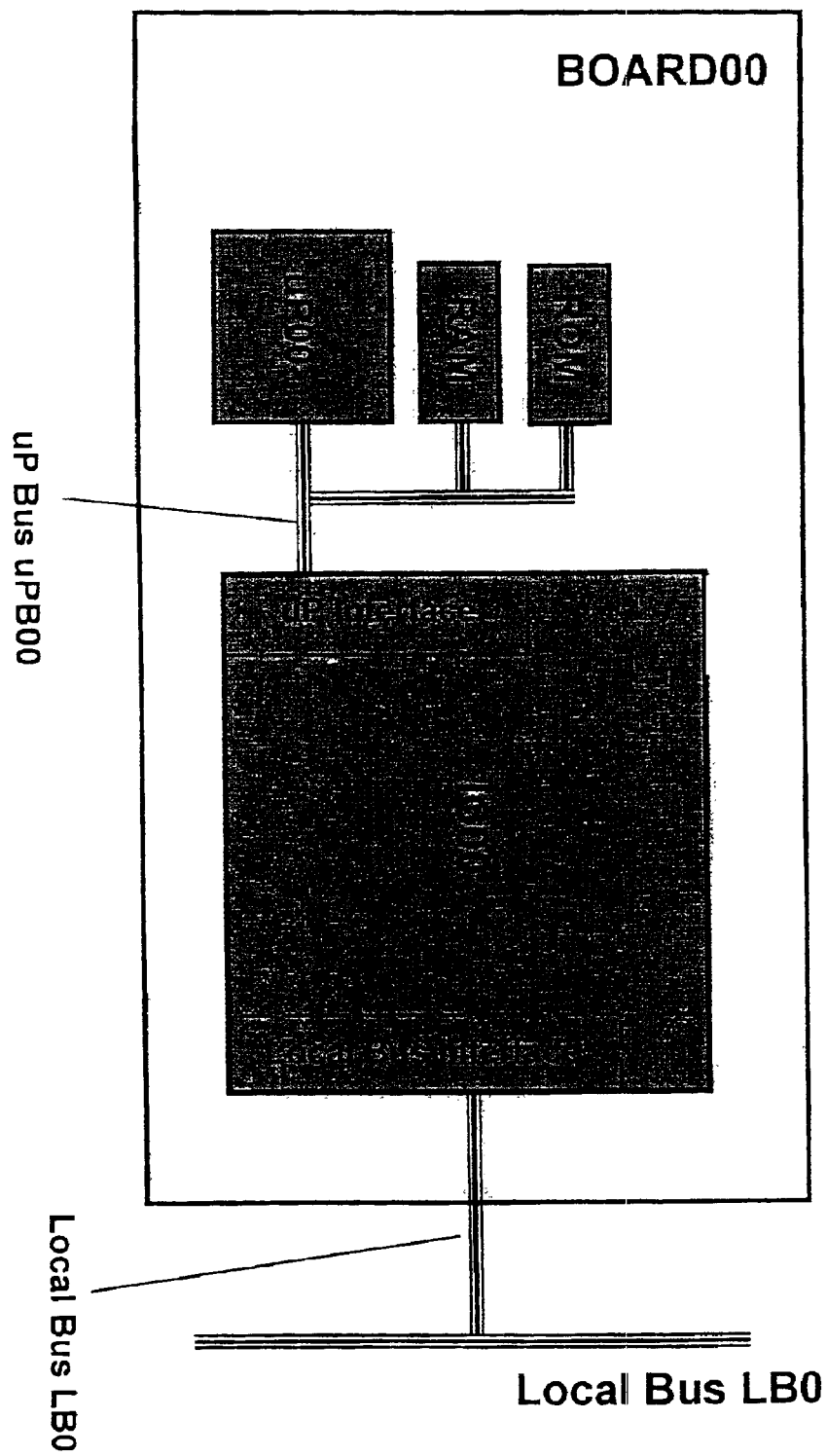
FIGS. 3 to 8 show several general known architectures of interfaces between a microprocessor or a local bus and clusters of FIG. 1's macro-cells.
Figure 4:
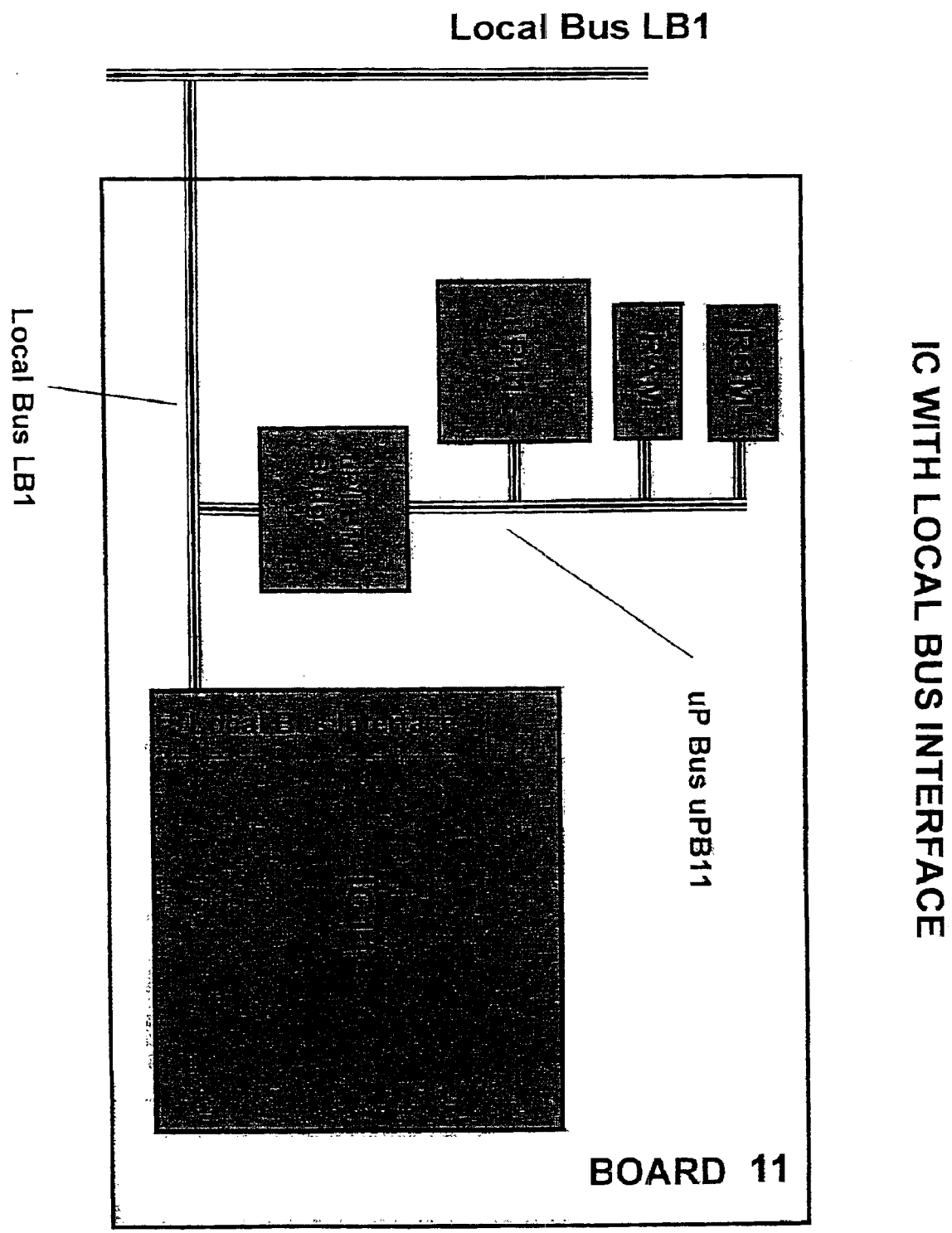
Figure 5:
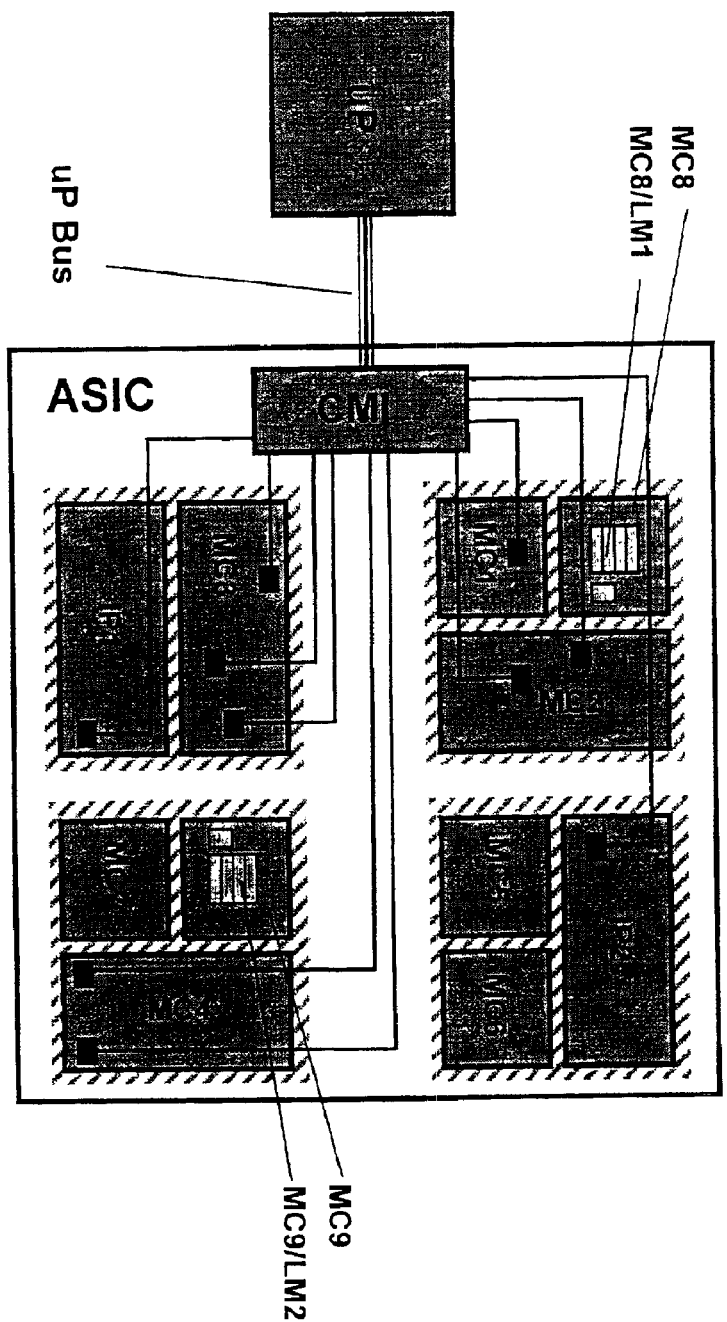

In the operation, the purposes of the various hardware resources of the two FIG. 15's blocks DMI PERIPHERAL and MACRO-CELL are like those listed in the description of the most general macro-cell of the prior art shown in FIG. 1. At glance we see that into the peripheral block DMI PERIPHERAL of FIG. 15 a great deal of hardware resources of known FIG. 1's macro-cell are shifted. The remaining hardware resources are visible into the new application-dependent macro-cell, substantially reduced to the only glue logic, FSM, and LOCAL MEMORY.

The novel architecture obtained by associating peripheral blocks DMI PERIPHERALs with user developed macro-cells is not to be considered as a mere shifting of resources between the two blocks. More properly it has to be intended in the way of a scalable architecture in which the number of peripherals blocks DMI PERIPHERALs does not necessarily correspond to the number of user macro-cells. The most important aspect of peripheral blocks DMI PERIPHERALs is that their embedded hardware resources encompass a pre-defined set comprehensive of the most popular needs of the user developed macro-cells; in this context the set appears standardizable. The resources of said standardizable set are individually configurable into a variety of sub-sets in accordance with specific needs of the respective interfaced macro-cells. It is useful to remind that in the known interface the resources are not standardizable, not provided with the interface, designed by users for their specific applications, and functionally embedded into user macro-cells.

The distributed microprocessor interface of the present invention has a great impact on the design of user macro-cells. In fact having removed from the macro-cell the majority of hardware resources related to configuration, control, transmission and/or reception of stream data flows to/from an external standard bus, a new "bare" macro-cell basic architecture results. Consequently all the advantages of the invention previously stated in the disclosure are plenty justified. Additional or further detailed advantages implied by the introducing of peripheral blocks DMI PERIPHERALs are:

hardware primitives and related low level drivers do not need to be designed by the user "ad hoc" for the specific application;

no redesign of hardware primitives and related low level drivers is needed when a peripheral block DMI PERIPHERAL is used in different contexts (e.g. interfaced with different user macro-cells). It is enough to configure the peripheral block DMI PERIPHERAL, selecting needed hardware primitives and resources;

the integration of a system composed by several macro-cells is made easy and accelerated by the use of a standardizable interface towards macro-cells, where standardizable is referred to the type of resources embedded into peripheral blocks DMI PERIPHERALs and in their interface towards user macro-cells;

the development of drivers at macro-cell level, or higher, is highly facilitated and accelerated by the use of standard low level drivers for hardware primitives;

concurrent engineering is enforced. The use of a standardizable set of hardware primitives makes possible developing macro-cell level and higher level drivers in advance with respect to the hardware implementation;

development and interfacing of user macro-cells is made easier and accelerated by having removed from the macro-cell all hardware primitives and resources related to configuration and control and transmission and/or reception of stream data flows to/from an external standard bus. Having removed all said resources from the macro-cell the designer can concentrate only on the macro-cell function (the application).

The entire application (set of macro-cells) integrated using DMI is re-targetable to a different technology and/or context with minimum effort.

With reference to FIGS. 16 to 21 the overall architecture of peripheral block DMI PERIPHERAL of FIG. 15 is shown. The architecture is specialized into standardizable sub-sets of resources individually configurable in accordance with specific needs of the respective interfaced macro-cells. The opportunity to specialize peripheral blocks DMI PERIPHERALs results from the fact that not all the functions explicated by the complete set of resources must be simultaneously present. Conversely, number and type of the resources present in each block DMI PERIPHERAL are tuned depending on the specific application to achieve the best implementation efficiency in terms of gates/area. The configurability of peripherals DMI PERIPHERALs is obtained in a very easy way by tuning in the HDL code a sub-set of parameters (GENERICS in VHDL) before the synthesis phase. To be compliant with the given configurability implementation guideline, a layered architecture is selected for the block DMI PERIPHERAL of FIG. 15.

Figure 16:
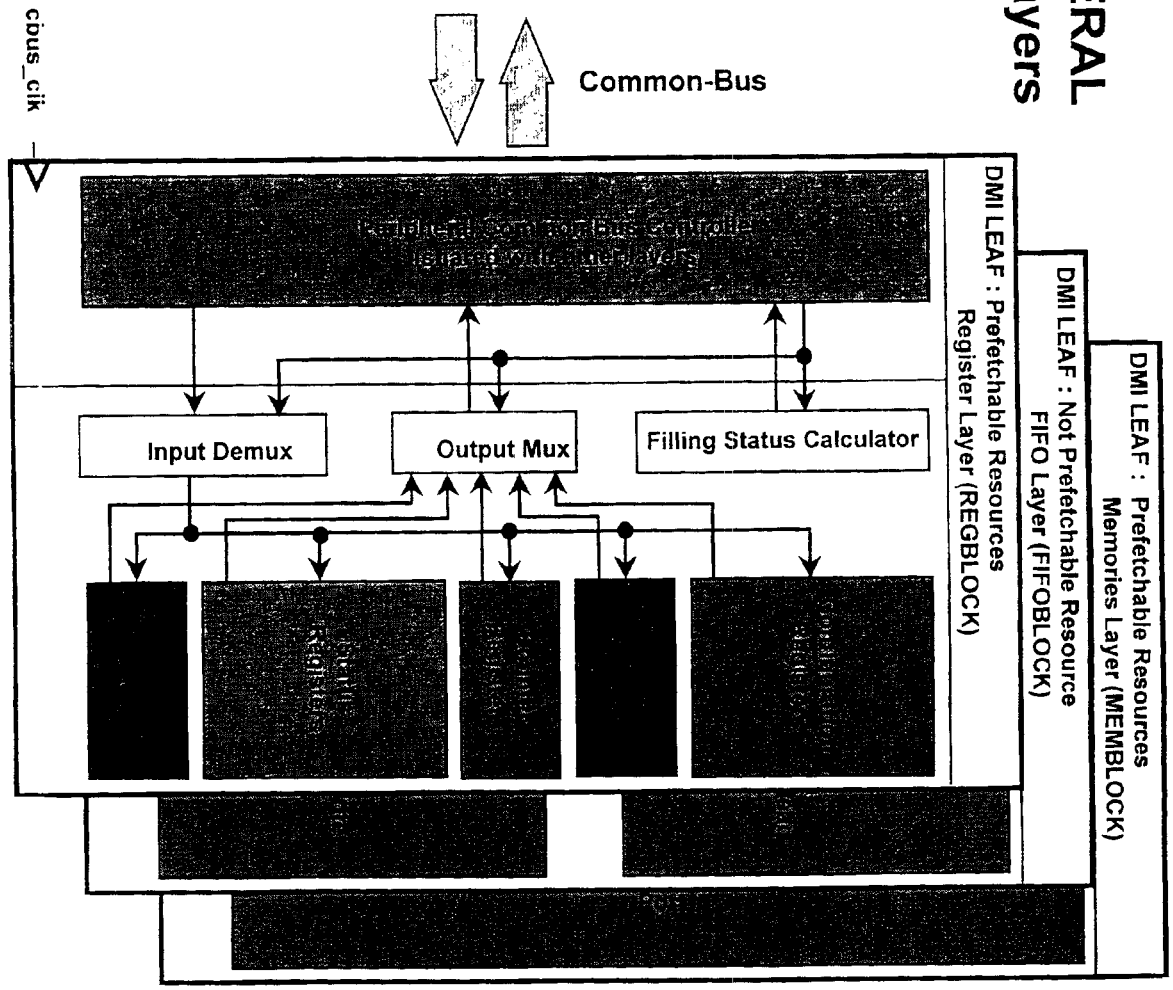
FIG. 16 shows a layered representation of the block DMI PERIPHERAL (DMI LEAF) of FIG. 15.

In FIG. 16 three separated layers are provided, each are corresponding to a particular sub-set. The three leaf distinguishing layers are:

Layer REGBLOCK embedding prefetchable resources of register type (a register is a logic sequential unit which memorizes information);

Layer MEMBLOCK embedding prefetchable resources of memory type;

Layer FIFOBLOCK embedding not Prefetchable resources of FIFO type.

Prefetchable referred to a resource means that a read performed on that resource has no side effects on the same resource. A resource is said to exhibit no side effect on read if, when a datum is read from that resource, that datum is still available to said resource, that is the read operation is not destructive. An example of prefetchable resource is given from a STATUS REGISTER. When a STATUS REGISTER is read the datum contained into the register is not lost but is only made accessible to the reader. Another example of prefetchable resource is represented by RAM memories. Not Prefetchable referred to a resource means that said resource exhibit side effect on read. A resource is said to exhibit side effect on read when a datum read from that resource is no longer available to said resource, that is the read operation is destructive. Examples of not prefetchable resources are given from a FIFO or from a Test-and-Set Register (Semaphore). The three layers are connected to a unique block PERIPHERAL COMMON BUS CONTROLLER to support the COMMON-BUS protocol in duality with block DMI MAIN CONTROLLER of FIG. 14.

In the next FIGS. 17 to 19 and 22, 23 and 34 the PERIPHERAL COMMON BUS CONTROLLER block will be represented for convenience in all layers, to underline that all layers use it. The above three layers are managed in a so-called "shadowing" modality from the main DMI MAIN, each layer activated by a specific chip select. This makes modular and scalable a peripheral DMI PERIPHERAL from the point of view of address decode and makes easier to collate the three layers. Due to these reasons not all layers are required to be simultaneously present. Depending on the application, only the required layers are instantiated; this saves area in implementations.

Figure 17:
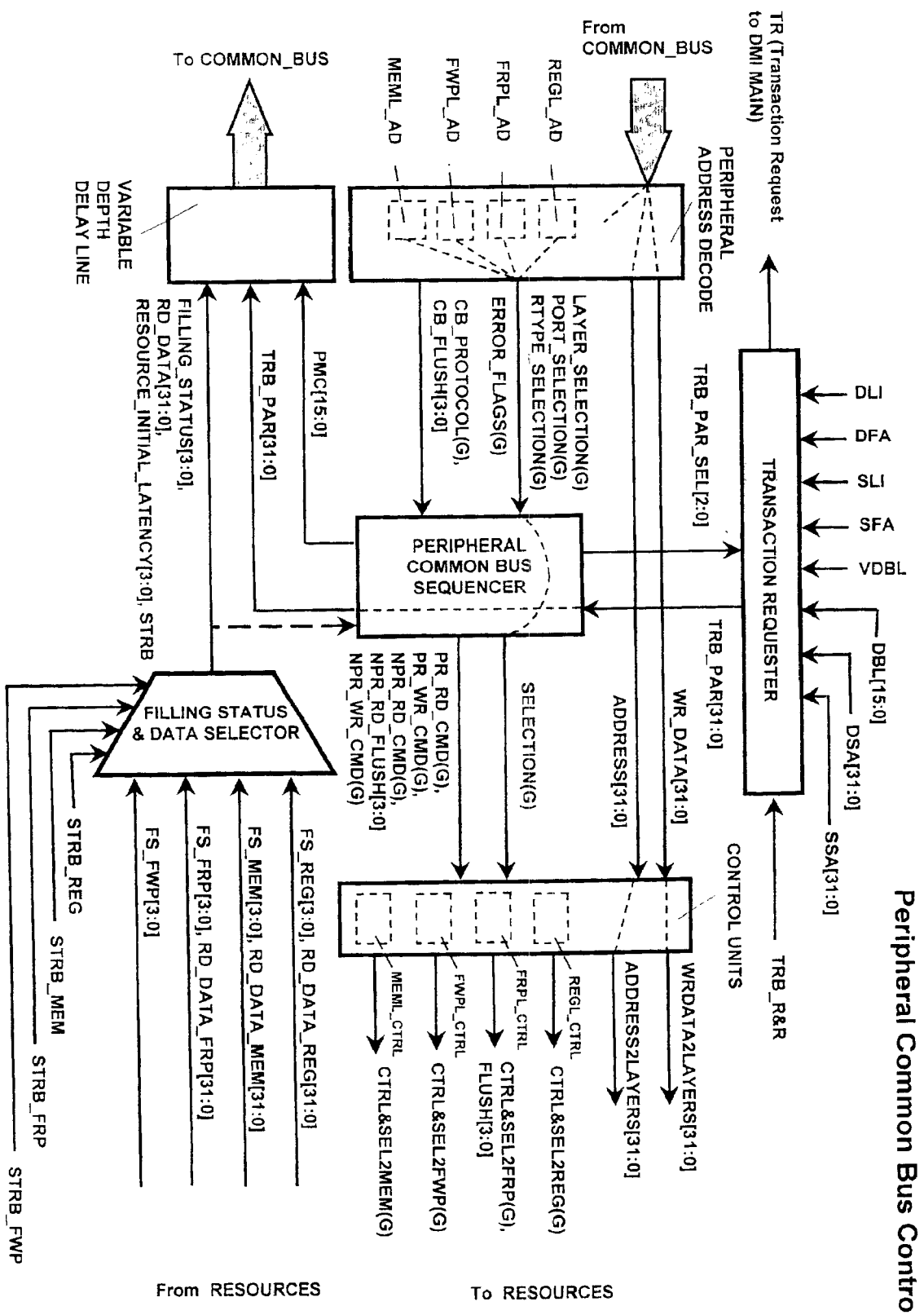
FIG. 17 shows in detail a block PERIPHERAL COMMON BUS CONTROLLER only indicated in FIG. 16.

With reference to the FIG. 17, it can be appreciated that the PERIPHERAL COMMON BUS CONTROLLER block is detailed in six blocks, namely: PERIPHERAL ADDRESS DECODE, PERIPHERAL COMMON BUS SEQUENCER, CONTROL UNITS, TRANSACTION REQUESTER, FILLING STATUS & DATA SELECTOR, and finally VARIABLE DEPTH DELAY LINE. Block PERIPHERAL ADDRESS DECODE receives the COMMON-BUS and forwards the Address-Bus-root2leaf[31:0] and the Leaf-Selector-Bus[7:0] to a group of four inside (dashed) Layer selection Registers named REGL_AD, FRPL_AD, FWPL_AD, and MEML_AD: the first register selects Layer REGBLOCK, the second selects a READ PORT of Layer FIFOBLOCK, the third selects a WRITE PORT of Layer FIFOBLOCK, and the fourth selects a READ/WRITE PORT of Layer MEMBLOCK. Exhaustive explanation concerning the various Layer ports will be give later. Both the Address-Bus-root2leaf[31:0] and Data-Bus-root2leaf[31:0] are forwarded to the block CONTROL UNITS and to the various layers from there. The outputs of the four Layer Registers are all directed to one input of block PERIPHERAL COMMON BUS SEQUENCER, the various signals on the connection are named ERROR_FLAGS(G), LAYER_SELECTION(G), PORT_SELECTION(G), and RTYPE_SELECTION(G), where (G) means group of signals. Block PERIPHERAL ADDRESS DECODE decodes the content of Address-Bus-root2leaf[15:0], having care of the synchronization information on the Synchronization-Bus [2:0]. Moreover it obtains from Control-Bus-root2leaf[15:0] two group of protocol signals CB_PROTOCOL(G) and CB_FLUSH[3:0] forwarded to a second input of block PERIPHERAL COMMON BUS SEQUENCER.

Block TRANSACTION REQUESTER receives from Layer REGBLOCK a Transaction Request signal TRB_R&R in correspondence of the requests to be read originated from Applications. The Requests are forwarded to the DMI MAIN block by the output signal TR, corresponding to the signal TR(i) at the input of the INTERNAL ARBITER block of FIG. 14. The further parameters DLI, DFA, SLI, SFA, VDBL, DBL[15:0], DSA[31:0] and SSA[31:0] (required by a specific grant cycle issued by the DMI MAIN) sent from Layer REGBLOCK are received at as many inputs from block TRANSACTION REQUESTER. These parameters are collected to an output bussed signal TRB_PAR[31:0] and sent to the block PERIPHERAL COMMON BUS SEQUENCER basing on a request issued from block PERIPHERAL COMMON BUS SEQUENCER through a bussed signal TBR_PAR_SEL[2:0]. Said request selectively indicate the set of parameters to put on TRB_PAR [31:0] bus (DLI & DFA & SLI & SLA & VDBL & DBL[15:0] or DSA[31:0] or SSA[31:0]). The latter block, after having forwarded the received parameters to one input of block VARIABLE DEPTH DELAY LINE which put them on the COMMON-BUS.

Block PERIPHERAL COMMON BUS SEQUENCER elaborates all the groups of signals received from PERIPHERAL ADDRESS DECODE block, more precisely: decodes the protocol commands CB_PROTOCOL(G) and CB_FLUSH[3:0] active on the COMMON-BUS and forwards the decoded command to a second input of block CONTROL UNITS; generates in correspondence of each decoded command a field PMC acronym of PERIPHERAL_MONITORING_CODE which terminates the protocol governing the COMMON-BUS transactions; gives prosecution to the SELECTION(G) signal towards a third input of the block CONTROL UNITS. The forwarded decoded command are named: PR_RD_CMD(G), PR_WR_CMD(G), NPR_RD_CMD(G), NPR_RD_FLUSH[3:0] and NPR_WR_CMD(G), whose meaning will be explained later. Fields PMC sent to the second input of block VARIABLE DEPT DELAY LINE are in form of a bussed signal PMC[15:0], this block puts them on the sub-bus Control-Bus-leaf2root[15:0] of the COMMON-BUS. Group of signals PR_RD_CMD(G) defines a read command on a prefetchable resource. Group of signals PR_WR_CMD(G) defines a write command on a prefetchable resource. Group of signals NPR_RD_CMD(G) defines a read command on a not prefetchable resource. Group of signals NPR_WR_CMD(G) defines a write command on a not prefetchable resource. The operation to perform (either read or write) is based on the protocol commands CB_PROTOCOL(G), while the type of interfaced resource (prefetchable or not prefetchable) is based on RTYPE_SELECTION(G) group of signals. Finally, bus NPR_RD_FLUSH[3:0] takes the value of the bus CB_FLUSH[3:0].

Block CONTROL UNITS embeds four (dashed) control registers named: REGL_CTRL, FRPL_CTRL, FWPL_CTRL, MEML_CTRL, they store control and selection groups of signals generated from the CONTROL UNITS on the basis of the command and selection signal previously received. The outputs of the registers are forwarded to the various Layers (RESOURCES); more precisely:

register REGL_CTRL is dedicated to a group of signals CTRL&SEL2REG(G) sent to the Layer REGBLOCK;
register FRPL_CTRL is dedicated to two groups of signals CTRL&SEL2FRP(G) and FLUSH[3:0] sent to the Read Port of the Layer FIFOBLOCK;
register FWPL_CTRL is dedicated to a group of signals CTRL&SEL2FWP(G) sent to the WRITE PORT of the Layer FIFOBLOCK;
register MEML_CTRL is dedicated to a group of signals CTRL&SEL2MEM(G) sent to the READ/WRITE PORT of Layer MEMBLOCK.

On the opposite direction of communication, that from Layers (RESOURCES) to DMI MAIN, the block FILLING STATUS & DATA SELECTOR collects the relevant signals coming from the various Layers or Layer-Ports managed directly by it. The collected signals are selectively transferred at the output and forwarded to a third input of block VARIABLE DEPTH DELAY LINE. The incoming signals are of the following type: FILLING_STATUS of the selected resource; read data; initial latency FILLING_STATUS/DATA; strobes accompanying valid FILLING_STATUS or FILLING_STATUS and valid read_data. The inputs are four, each selected by a respective strobe asserted. In this case the incoming signals and related strobes are as in the following:

First Input and Related Strobe
STRB_REG: strobe of the REGBLOCK Layer, validates the two following signals:
FS_REG[3:0]: FILLING_STATUS of the REGBLOCK Layer (both for read or write transactions),
RD_DATA_REG[31:0]: contents of the various registers of the REGBLOCK Layer obtained by read transactions.
Second Input and Related Strobe
STRB_MEM: strobe from the READ/WRITE PORT of the MEMBLOCK Layer, validates the two following signals:
FS_MEM[3:0]: FILLING_STATUS of the MEMBLOCK Layer (both for read or write transactions),
RD_DATA_MEM[31:0]: data read from the memory of the MEMBLOCK Layer.
Third Input and Related Strobe
STRB_FRP: strobe from the READ PORT of the FIFOBLOCK Layer, validates the two following signals:
FS_FRP[3:0]: FILLING_STATUS of the FIFOBLOCK Layer (for read transactions),
RD_DATA_FRP[31:0]: data read from the FIFO of the FIFOBLOCK Layer.
Fourth Input and Related Strobe
STRB_FWP: strobe from the WRITE PORT of the FIFOBLOCK Layer, validates the following signal:
FS_FWP[3:0]: FILLING_STATUS of the FIFOBLOCK Layer (for write transactions).

At the output of block FILLING STATUS & DATA SELECTOR the following signals are sent to a third input of block VARIABLE DEPTH DELAY LINE: FILLING_STATUS[3:0], RD_DATA[31:0], RESOURCE_INITIAL_LATENCY[3:0], STRB.

The architectural description of the PERIPHERAL COMMON BUS CONTROLLER is concluded and a short hint of operation is given, the understanding of operation will be gradually improved as the various Layers will be described, a filling status notion introduced, and protocol commands with concerned PERIPHERAL_MONITORING_CODE (PMC) fields discussed. At the end one can appreciate that:

a latency of communication exists between the PERIPHERAL COMMON BUS SEQUENCER block and the resources embedded in the Layers;
because of the latency the PMC field prepared in the current clock cycle shall be delayed until the datum the PMC refers to arrives from the resource, in order to couple PMC with the relevant datum and put both on COMMON-BUS;
the PMC field concerning filling status is not getting ready in the current clock cycle because both the true value of filling status and the relevant read/write datum get together and are subjected to the same latency (so the previous delay of PMC lacks of meaning);
the PERIPHERAL COMMON BUS SEQUENCER block can only acts as a remote executor of the protocol carried out from the DMI MAIN block. This because the algorithms charged to the MAIN COMMON BUS SEQUENCER block of FIG. 14 are vulnerable to a local change in the sequence of the transactions.

Block VARIABLE DEPTH DELAY LINE is just implemented to solve all the above mentioned problems. In fact it acts as a delay line for a PMC value, the entity of the delay being equal to the input signal RESOURCE_INITIAL_LATENCY[3:0]. Besides it waits to receive filling status coupled with the read datum, or the filling status only in case of write transaction, and get ready the relative field PMC put on the COMMON-BUS.

Finally a detail on addressing carried out by block PERIPHERAL ADDRESS DECODE is considered with reference to the previous arguments developed describing the block ADDRESS TRANSLATOR/DECODER of FIG. 14. Reconnecting to the previous developed arguments, we remember that the power-on configuration software produced a memory map of the allocated resources indicating their base addresses. Block PERIPHERAL ADDRESS DECODE samples and holds signals on COMMON-BUS and completes the above said two steps addressing mechanism, taking care of the resources allocated in the address domain of the DMI PERIPHERAL it belongs to. For this aim the following information is required.

Identification code of the leaf (DMI_PERIPHERAL_ID);
address of FIFO READ PORT inside the DMI PERIPHERAL (inside the ADDRESS SPACE dedicated to said FIFO in the DMI CONFIGURATION SPACE TABLE);
address of FIFO WRITE PORT inside the DMI PERIPHERAL (inside the ADDRESS SPACE dedicated to said FIFO in the DMI CONFIGURATION SPACE TABLE);

BASE_ADDRESS and BASE_ADDR_MASK of MEMBLOCK DMI PERIPHERAL (inside the ADDRESS SPACE dedicated to said MEMBLOCK in the DMI CONFIGURATION SPACE TABLE).

These parameters are set by the user by properly setting corresponding inputs present on each DMI PERIPHERAL. Also the REGBLOCK layer is conditioned by dedicated parameters that as will be explained in the following. Differently from the parameters described above said parameters have to be set as GENERICS in the VHDL code describing the REGBLOCK layer of that certain DMI PERIPHERAL. This is done before the synthesis because of the high optimization both in terms of area and performance resulting from eliminating unused logic. Each REGBLOCK needs 32 consecutive address (32 word 4 byte each for a total of 128 byte lower than 4 kbyte);

This makes clear the meaning of second level of address decode (local to DMI PERIPHERALs) which has been introduced talking about the configuration space. When a hit on a certain ADDRESS SPACE inside the DMI CONFIGURATION SPACE TABLE is detected the transaction is forwarded towards the COMMON-BUS to the proper LAYER of the proper DMI PERIPHERAL. This implies forwarding the address (remapped or not) on the Address-Bus-root2leaf[31:0], the proper DMI_PERIPHERAL_ID on the Leaf-Selector-Bus[7:0], and the proper chip select (identifying the proper LAYER: REGBLOCK, FIFOBLOCK or MEMBLOCK) on Leaf-Selector-Bus[7:0] to. DMI PERIPHERAL Precisely, at the beginning of an address phase of a read/write transaction the PERIPHERAL ADDRESS DECODE block verifies if the following conditions are all true:

the value on Leaf_selector_bus[7:0] is corresponding to the DMI_PERIPHERAL_ID configuring that particular leaf;

the three bit [7:5] of Leaf_selector_bus[7:0] devoted to layers selection are selecting an effectively configured layer (REGBLOCK, FIFOBLOCK or MEMBLOCK);

the address received on Address-Bus-root2leaf[31:0] is effectively selecting an existing resources, for example in case of the layer REGBLOCK it fall into the 128 byte span of the assigned 4 kbyte.

Whether the three above conditions are jointly matched valid groups of signals LAYER_SELECTION(G) (indicating the selected layer), RTYPE_SELECTION(G) (indicating the selected resource type, either prefetchable or not) and PORT_SELECTION(G) (indicating the selected port of the selected LAYER). The generation of RTYPE_SELECTION(G) is ever possible starting from LAYER_SELECTION(G) information only (which on its turn is based on Leaf-Selector_Bus[7:0]) if a LAYER contains homogeneous resources that is either all prefetchable or all not not prefetchable. If a LAYER does not contains homogeneous resources (that is mixed prefetchable and not prefetchable) also PORT_SELECTION(G) information (which on its turn is based on Address-Bus-root2leaf[31:0]) is required together with LAYER_SELECTION(G) to generate RTYPE_SELECTION(G).

In the same way, whether the three above conditions are jointly matched then the group of signals CB_PROTOCOL (G) is forwarded to the PERIPHERAL COMMON BUS SEQUENCER block, otherwise not, in the former case the SELECTION(G) group of signals and the ADDRESS[31:0] sub-bus are forwarded to the CONTROL UNITS block.

As explained talking about the DMI CONFIGURATION SPACE the second level of address decode located into the PERIPHERAL COMMON BUS CONTROLLER is not mandatory but is used for convenience in all suitable cases. In most of cases, for resources belonging to the MEMBLOCK or the FIFOBLOCK layers, is an identity function. On the contrary it is ever used for resources belonging to the REGBLOCK layer.

In the first layer REGBLOCK of FIG. 16 a FILLING STATUS CALCULATOR block is visible. This block is also embedded in the other two layers MEMBLOCK and FIFOBLOCK, so a general introduction of the important aim of this block is useful at this point, while a detailed description will be postponed to the description of the three layers.

Any FILLING STATUS CALCULATOR block includes a sub-block MAX BURST LENGTH CALCULATOR (not visible in the Figures) which checks the maximum length of a permissible reading or writing burst. The length being expressed in number of 32-bit word and the check consisting of a comparison between the actual value of the address for read or write transaction with the boundary of the resource of register or memory type. The purpose of a block FILLING STATUS CALCULATOR is that to promote sustained burst transactions taking latency of communication into consideration. A burst transaction is either a read or write transaction for moving a certain number of sequential data words. Depending on the read or write transaction, block FILLING STATUS CALCULATOR acquires either one or the other of two fields outputted from block MAX BURST LENGTH CALCULATOR, namely MAX_READ_BURST_LENGTH or MAX_WRITE_BURST_LENGTH.

MAX_READ_BURST_LENGTH is the number of data available for reading inside a specified resource at a given time.

MAX_WRITE_BURST_LENGTH is the number of free positions available for writing inside a specified resource at a given time.

Binary values of these two fields are not yet pieces of information suitable to carry out efficient burst transactions, they had to be further elaborated in view of latency to obtain a filling status indicator managed by COMMON-BUS protocol for reaching the efficiency goal. Further arguments about filling status indicator need that latency of communication and efficiency of protocols be preliminary discussed in view of the prior art. The following considerations help in the comprehension.

Figure 8:
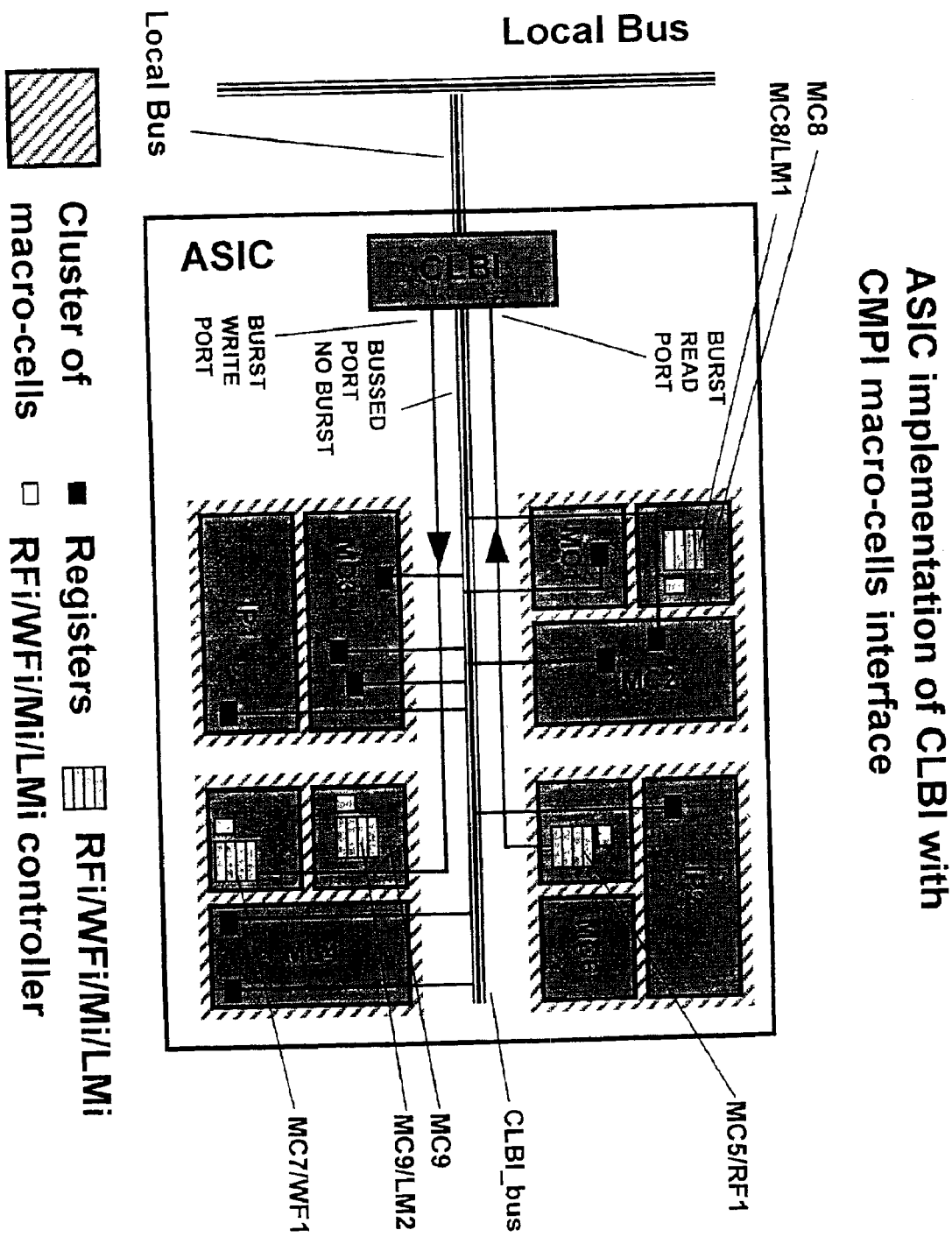

FIG. 8 of the prior art shows an ASIC implementation of a architecture (presented at point 1c). In said architecture a block CLBI (Centralized Local Bus Interface) is connected to a burst read port and to a burst write port of two macro-cells embedding FIFOs, and to other macro-cells by a bussed port (no burst capable) devoted to configuration and control of the macro-cells. The connection at the burst ports exploits the mentioned CMPI (Centralized Multi-Port Interface) interconnection topology, while the connection at the bussed port exploits the mentioned CBBI (Centralized Bus Based Interface) interconnection topology. The architecture of FIG. 8 is derived from a more general microprocessor interface towards macro-cell based on a unique block CMI (Centralized Microprocessor Interface).

The round trip latency of communication between block CLBI and a selected port is defined as the time (expressed in clock cycles) elapsing from beginning to the end of the chain of events listed in the following. Sending of a read/write command from block CLBI to the selected port, the reception and interpretation of the command from the selected port, the sending of the acknowledge versus block CLBI, and the reception and interpretation of the received acknowledge by block CLBI. Analogue considerations are valid for other typologies of transaction. Latency of communication in the above round trip path is mainly due to input and output sampling and to an intrinsic delay of control FSMs in both blocks CLBI and selected macro-cell. As a consequence, the latency can change when the type of the interfaced resource (register, memory or FIFO) changes and when the type of executed transaction change (read or write). This happens because in the described scenarios, operation of the control FSMs embedded in block CLBI and macro-cells can be different (this depends on implementation). To simplify the discussion, a RounD TriP Latency (RDTPL), upper bound of all round trip latencies of different possible scenarios is assumed. Consider for example a burst transaction to write (read) a FIFO. It is clear that when block CLBI issues the write command it is not informed of the true residual room on the memory either for writing (reading) until the RDTPL time is elapsed, presupposing to have activated check means at beginning of write (read) transaction. When the relevant information arrives to CLBI block, perhaps that in the meanwhile the boundary of the FIFO is crossed due to a burst too long and some data are definitely lost. Dual considerations are valid for reading. To avoid this drawback, as happen in the majority examples of the known art, a read and a write threshold have to be set at a certain clock pulses before the two boundaries of the FIFO are reached. The crossing of a threshold causes a feedback message towards block CLBI for stopping the burst and regulating consequently. Furthermore, the threshold-crossing detector in the macro-cell also detects when the boundary of the FIFO is reached, in case it generates another feedback message to the block CLBI that definitively stops the residual transaction.

Usually the IP vendors let the threshold management charged to the users. A smart threshold management policy is that to put the threshold prudently away from the boundary of the FIFO and when the threshold is crossed the returned message is used to stop the burst. Since that point the access is continued with slower handshake method in which two consecutive data are time spaced by a number of clock pulses at least equal to the round trip latency RDTPL.

The majority of known protocols that govern read and write burst transactions between a unique block CMI and peripheral resources embedded in the macro-cells, are referable to the above arguments. Those protocols exhibit a not optimum efficiency in managing burst transactions but the drawback doesn't particularly worsen the overall bus efficiency mainly because the connection through the bus are point to point. On the contrary in the distributed interface of the present invention, in which a COMMON-BUS is shared among a cluster of peripheral resources that in turn access to it, a not optimum efficiency accumulated when servicing the various resources can negatively affect the performance of the interface. Bus efficiency is a pure number spanning from zero to one for measuring how a bus protocol is fast in transferring data. To define the bus efficiency let's consider a device (interfaced bus agent) with a defined bus interface. Be the bus driven by a golden bus agent; the golden bus agent is a device which drives the bus in the most efficient way defined in the bus protocol definition (e.g. minimum initial latency, minimum subsequent latency, no wait states etc.). The efficiency of the bus protocol is defined as:

$$\text{Efficiency} = N/(N+TLi+TLs) \quad (1)$$

Where, N is the number of exchanged data and TLi is the total initial latency of the transaction (latency to start the transaction up to first data exchanged) while TLs is the total subsequent latency (latency spent to exchange subsequent data in the transaction up to the end). The number TLi+TLs represents the latency spent to complete the N data transaction. From the expression (1) it can be argued that to increase Efficiency, the latency TLi+TLs shall be held constant (or better to diminish) while N increases. In that hypothesis the Efficiency increases for N increasing. A known way to increase Efficiency is to recur to a burst transaction exploiting a pipelined architecture like buffering data into a FIFO. The longer is the FIFO buffer, the higher is the efficiency. In such a case the first one of the N replies from the receiving Macro-cell to the data sender CLBI appears after TLi clock pulses from the start of transaction and, if the burst is not slowed down, the subsequent replies spend N−1 clock cycles. In this case the system has only initial latency TLi, that can also be seen as a delay. Being latency TLi constant, to increase Efficiency (1) is useful to increase the residual burst length N as over TLi clock cycles as possible but this increases the communication delay.

Maximum increasing of the residual burst length would implicate the full exploiting of the pipelined architecture, but the previous arguments about the necessity of introducing thresholds show that this is not possible. So in the known protocol (introducing thresholds) the effective residual burst is lowered from the ideal value N to N−y value. Moreover each reply to a singular transaction taking place from N−y to N has a delay of RDTPL which contributes to increase the subsequent latency TLs which, being not less than zero, consequently reduces Efficiency (1).

In conclusion, known protocols are not optimum because not able to take delay TLi without introducing subsequent latency TLs. Delay is unavoidable due to physical reasons. This is also valid for digital delays measured in clock cycles. Conversely subsequent latency TLs due to both protocol and architectures could be avoided or at least drastically reduced by innovative solutions.

Returning to the invention, as stated in precedence, the COMMON-BUS transfer protocol makes use of a properly dimensioned filling status of the accessed resource for achieving the efficiency goal. Maximum filling status retrieved is a binary constant, named RDPTL_FILLING_STATUS, initially calculated as a design datum, which is greater than or equal to the maximum round trip latency RDTPL between DMI MAIN and DMI PERIPHERAL expressed in cbus_clk clock cycles. Bit length (Nbit) of the constant RDPTL_FILLING_STATUS is preferably equal to the round up integer of logarithm base two of constant RDTPL:

$$Nbit = INT[\log_2 RDTPL] + 1 \quad (2)$$

where INT[ . . . ] is the integer part of [ . . . ]. For example, if latency RDTPL is 27, then $\log_2 27$ is 4.76, and Nbit of expression (2) is 5 whose configuration 11011 corresponds to the RDPTL_FILLING_STATUS equal to 27. In the case of the not limiting example the filling status field is 4 bit long and the RDPTL_FILLING_STATUS is decimal 15, in line with the RDTPL latency. For implementation reasons the RDPTL_FILLING_STATUS can be chosen greater than the one expressed from equation (1) taking a safety margin.

The FILLING STATUS CALCULATOR block embedded in any layer of FIG. 16 checks if the returned value MAX_WRITE_BURST_LENGTH (or MAX_READ_BURST_LENGTH), that corresponds to the maximum length of a physically permissible writing (or reading) burst, is greater than the constant RDPTL_FILLING_STATUS (binary 1111). If that is true (generally due to the latency) the returned value is saturated at the RDPTL_FILLING_STATUS value, otherwise not. Saturation, applied by proper hardware, also prevents the filling status to become not meaningful. For instance let's suppose the filling status generated by the FILLING STATUS CALCULATOR to be the binary number "10000", that is decimal 16, if this value has to be transported over a 4 bits wide bus it become truncated to "0000", that is decimal 0. To avoid this the 5 bits (b4, b3, b2, b1, b0) binary number "10000" must be saturated to the 4 bits (b3, b2, b1, b0) binary number "1111" by OR-ing the MSB b4 with all the remaining bits b3, b2, b1 and b0 before truncating the result to 4 bits. Saturation is even successfully applied when filling status is involved in arithmetic operation; in this case the result might be not meaningful due to overflow. To avoid the overflow problems calculating the filling status it is enough to append a 0 as MSB to the filling status before executing arithmetic operations on it and then saturating the result to the original bit width. Naming "I" the value of the filling status after saturation, the number "I" can either depends on issued commands only or be a random number. In the first case the filling status indicator is said to be static, in the second it is said to be random. An example of the first type is the bank of 32 registers embedded into the layer REGBLOCK. If the main block DMI MAIN is reading the $2^{nd}$, other 30 registers can be read. If the reader DMI MAIN is idle the number of remaining register to read does not change: it is static; the same is valid is DMI MAIN writes. An example of the second case is a FIFO embedded into the layer FIFOBLOCK. Let's suppose the FIFO being written from a user macro-cell and read from block DMI MAIN. At cycle $C_i$ the filling status takes the value $I_i$. Now even if DMI MAIN does not read the FIFO, at cycle $C_{i+k}$ the filling status is not granted to be equals to $I_i$. This is because, in the meanwhile, the user macro-cell connected to the FIFO might have been writing it, as a result the number of readable data might have been increased (this number is random).

The gain in efficiency using filling status instead of thresholds is that the length of the burst is always dimensioned to the effective boundary of the resources. This is a smart solution quite advantageous in presence of a shared bus because it manages the round trip delay in a transparent way avoiding subsequent latency, this means that round trip delay has no effects on burst efficiency, contrary to the threshold used in known protocols.

Let us exemplify the notion of saturated filling status and its effect on the efficiency by means of an example in which the dimension of the filling status is deliberately lower than round-trip latency. Suppose that we have to write a 6 words burst into a FIFO 6 words long connected between a DMI PERIPHERAL and a macro-cell, in presence of a RDTPL of 8 clock cycles using a filling status indicator only 2 bits wide (RDPTL_FILLING_STATUS=4). We also consider the worst case where no new room is created by an application which read the FIFO in the meanwhile. When the protocol of the distributed interface will be discussed it will be appreciated that block DMI MAIN further elaborates the received filling status, summing up or subtracting the contribute of the actual transaction, in order to gain the capability of stopping a burst exactly at the boundary of the FIFO. Further consideration is that block DMI MAIN forwards a pure query to the selected resources just before a write, or read, transaction to have the filling status returned and so appreciating the maximum permissible burst length consequently. The query transaction lasts all the RDTPL time before a valid reply returns and in the meanwhile DMI MAIN is silent on the COMMON-BUS. In the case considered, after 8 cbus_clk clock pulses the returned filling status is a binary 4. Then 4 consecutive writes are executed and DMI MAIN block subtracts one to the local filling status at each write; as the fourth datum is sent the local filling status is zero. This condition is detected by opportune protocol means which stop write because it interprets the condition, as there is no more room to write the FIFO. DMI MAIN enters a wait state lasting a certain number of clock cycles for receiving back a new filling status indicating some new space in the FIFO. We suppose that a new query is sent at the first wait cycle after completion of the fourth write, precisely at the $5^{th}$ clock cycle from the beginning of writes. So in the case of the example the first datum is effectively written in the resource at the $5^{th}$ clock cycle from the start of the first write, successive second, third and fourth data are written at the $6^{th}$, $7^{th}$, and $8^{th}$ clock cycle. Gradually the data arrive to destination, the FILLING STATUS CALCULATOR embedded in the peripheral resources updates the filling status. As a consequence, at the arrival of the fourth datum the updated filling status matches the correct binary 2 (binary 4 is held constant for both the first and second data time by effect of saturation). The query sent at the $5^{th}$ clock cycle reach destination at the $8^{th}$ clock cycle and at the $9^{th}$ clock cycle the correct filling status binary 2 is sent back to the DMI MAIN block. At the $12^{th}$ clock cycle said binary 2 reaches DMI MAIN block which can complete the sending of the 2 remaining writes at the $13^{th}$ and of $14^{th}$ clock cycle, before realizing that FIFO is full. If the FIFO were longer than 6 words the four additional wait states should be equally introduced, because they depend from the difference between RDTPL and saturated filling status, and the burst also written in fits and starts as above.

In conclusion the depicted transaction takes 22 clock cycles, 8 clock cycles of latency RTPDL are unavoidable, 6 clock cycles last for writing the 6 words, the remaining 8 clock cycles represent a subsequent latency that can be zeroed by a better dimensioned filling status. The efficiency formulation (1) gives in this case 6/(6+8+8) equal 0.27 very slow indeed. In case longer burst and FIFO are considered, for example 64 words, from the mechanism described above it descends that block DMI MAIN takes 8 additional clock cycles for each 4 words written, and 128 clock cycles for 64 words. The efficiency formulation (1) gives in this case 64/(64+8+128) equal 0.32, which is almost the previous value although the burst is considerably longer.

Let us now introduce a second more fitting example whose aim is to demonstrate that when the filling status is dimensioned to be saturable at the value of latency RTPDL, than the additional wait states are not more necessaries. Suppose latency RTPDL 8 clock cycles unchanged and filling status expressed with 3 bit, furthermore consider an empty FIFO incomparably longer than 8 words. Starting from this position, at the end of the initial query long RTPDL time the returned filling status is saturated at binary 7. Now the write burst starts to write 8 consecutive words (as many expressed by filling status 0, . . . , 7). Suppose that to meet with a more efficient communication and to have a constant monitor of the residual space in the FIFO, the single write command be coupled with a query for a returned filling status, as effectively implemented in the protocol of the invention. It can be argued that just at the end of the eighth word written, filling status relative to the query coupled with the first word arrives to the DMI MAIN block and still contains the saturated binary 7. So a new write burst of eight words starts avoiding interruption and without taking subsequent latency. Bursts after bursts the boundary zone of the FIFO is reached, so from a certain point in time the returned filling status is no more saturated but begins to decrease. DMI MAIN is consequently informed and can restrain the burst in time for avoiding overflow.

The same conclusion is valid in case the filling status is saturated at a value greater than RDTPL latency, or not saturated at all. This is because the only condition that must be verified is the visibility of a valid filling status during the RDTPL time window. Precisely a saturated filling status effectively corresponding to a memory room to write greater than or equal to the returned value, or a not saturated filling status having a decreasing value as the writes being in progress. Supposing in the second example a burst length N equal to 64, the efficiency formulation (1) gives 64/(64+8) equal 0.88 much better than the first example.

Preliminary technical problems arising to manage efficient transactions through shadow layers DMI PERIPHERALs of FIG. 16 have been discussed, now singular layers will be examined.

In FIG. 18 a layer of prefetchable resource of register type, referred to the block REGBLOCK summarized in FIG. 16, is shown. The layer includes a first block REGBLOCK belongs to peripheral block DMI PERIPHERAL and a second block MACRO-CELL representing a user macro-cell or group of macro-cells. The block REGBLOCK includes the following blocks:
PERIPHERAL COMMON BUS CONTROLLER (depicted in FIG. 17);
FILLING STATUS CALCULATOR (embedding a MAX BURST LENGTH TABLE not shown in FIG. 18);
INPUT DEMUX;
OUTPUT MUX.
CLUSTERS OF REGISTERS (prefetchable resources of register type).

In the not limiting examples of FIGS. 9 to 11, block REGBLOCK of FIG. 18 includes 32 registers, namely: 14 CONFIGURATION REGISTERS, 2 COMMAND REGISTERS, 2 COUNTER REGISTERS, 11 STATUS REGISTERS and 1 READ&RESET REGISTER. Each cluster of registers is connected, at one side, to both the blocks INPUT DEMUX and OUTPUT MUX to be respectively written or read from DMI MAIN block. At the other side with corresponding dashed blocks APPLI RG inside the MACRO-CELL LOGIC dashed block, to be read or written from the application in an independent way with respect to the DMI MAIN block. The Point-to-Point-Buses sketched in continuous lines carry data, the sketched in dashed lines carry controls.

In the exemplification of Figure block INPUT DEMUX has a first input connected to the output WRDATA2LAYERS[31:0] of block PERIPHERAL COMMON BUS CONTROLLER, a second input connected to the two outputs ADDRESS2LAYERS[31:0] and CTRL&SEL2REG(G) of the same controller block, and as many outputs as the number of CLUSTERS OF REGISTERS. Those outputs are indicated in the upper part of the Figure: SYNC_WRITE, SYNC_READ, CS[31:0], WR_DATA2REG[31:0] plus CLEAR (to READ&RESET REGISTERS). The two first signals are strobe, the third is a set of 32 chip selects each one dedicated to one of the 32 registers, the fourth is a data word written into the selected register, and the fifth is a clear dedicated to the READ&RESET REGISTER.

Conversely, block OUTPUT MUX has as many inputs RD_DATA2CB[31:0] as the number of CLUSTERS OF REGISTERS and one output connected to the inputs RD_DATA_REG[31:0] and STRB_REG of PERIPHERAL COMMON BUS CONTROLLER block. A further input of block OUTPUT MUX is connected to the two outputs ADDRESS2LAYERS[31:0] and CTRL&SEL2REG (G) of block PERIPHERAL COMMON BUS CONTROLLER.

In the operation, all the three blocks OUTPUT MUX, INPUT DEMUX and FILLING STATUS CALCULATOR autonomously decode the incoming address ADDRESS2LAYERS[31:0] inside the 128 byte span devoted to Registers of a REGBLOCK layer (32×32 bit registers equals 32×4 byte that is 128 byte). Blocks OUTPUT MUX and INPUT DEMUX for read and write with a concerned register and block FILLING STATUS CALCULATOR to read a piece of information in a location of a table (MAX BURST LENGTH TEABLE). In particular block INPUT DEMUX decodes address ADDRESS2LAYERS [31:0] and control CTRL&SEL2REG(G) group of signals and generates in correspondence one chip select CS[31:0] for one register out of 32 and a relative writing strobe SYNC_WRITE, in that a 32-bit data word WR_DATA2REG[31:0] can be correctly written. Block OUTPUT MUX accomplishes the same decoding for a register to generate a relative reading strobe SYNC_READ and a 32-bit data word RD_DATA2REG[31:0] can be correctly read. An alternative solution is that to implement a unique block for the register selection and read/write strobe generation.

The prefetchable resources of register type belonging to the CLUSTER OF REGISTERS are the architectural view of registers-based Configuration and Control Functions (CCF). A set of Configuration and Control Functions (CCF) is defined analyzing several designs. This set of functions mainly consists of configuration setting, command issuing, events counting, status retrieving and event trapping. These functions define at fine grain level, for the leaf side portion of the DMI architecture, a superset of the functions depicted for prior art interfaces. The types have been defined studying several real applications and allow effective interfacing of macro-cells for all configuration and control problems. In conclusion, the groups of registers belonging to the layer REGBLOCK are those mentioned back in the text, namely:
CONFIGURATION REGISTERS. A Configuration Register memorizes and forwards the configuration information sent by main DMI MAIN to macro-cells. Can be read/written from the main DMI MAIN and read from macro-cells. Write operation is destructive. Read operation is not destructive.
COMMAND REGISTERS. A Command Register forwards the commands sent by main DMI MAIN to macro-cells. Can be read/written from main DMI MAIN and read from macro-cells. Write operation is destructive. Read operation is not destructive.
COUNTER REGISTERS (also referred as Decrement or Increment Registers). A Counter Register counts events signaled by a macro-cell. When the count reaches a threshold set by the main DMI MAIN a signaling pulse is sent to an output interface. The signaling pulse can be used by the macro-cell itself, sent to a Interrupt Collector Unit which sends the resulting interrupt to the main DMI MAIN, or sent to a READ&RESET REGISTER which can be polled by the main DMI MAIN. The threshold is written by the DMI MAIN that can also read the counter value to monitor a process, which take places into the macro-cell (for which the events count is meaningful). The macro-cell can only signal (write) events. Write operation is destructive. Read operation is not destructive.
STATUS REGISTERS. A Status Register memorizes status information sent by macro-cells and puts it at main DMI MAIN disposal for reading. It can be read from the main DMI MAIN and written from system macro-cells. Write operation is destructive. Read operation is not destructive.

READ&RESET REGISTER. A Read&Reset Register traps events signaled by macro-cells and puts them at main DMI MAIN disposal for reading and transferring to an EXTERNAL BUS AGENT. Consequently this register can be written from macro-cells and read/reset from the main block DMI MAIN. The read/reset operation is seen as atomic from the EXTERNAL BUS AGENT (atomic means that read and reset are operation simultaneous and indivisible like those carried out by a Test-and-Set semaphore) but in reality it takes places in two separated phases. In a first one the main block DMI MAIN reads the asserted logic value of the READ&RESET REGISTER and transfers it into the RX BUFFER FIFO (FIG. 14). The read value is held in the register; in a second phase the EXTERNAL BUS AGENT acknowledges the data read on the EXTERNAL BUS and the DMI MAIN reset the READ&RESET REGISTER consequently. The utility of registers like those is in polling transient interrupts and alarms, which, without trap, can be lost when the whole RX BUFFER contents are purged because supposed originated from prefetchable resources. We can appreciate that a typical not prefetchable Test-and-Set register is now turned into a prefetchable one.

Concerning the implementation of Register Layer REGBLOCK, the number and type of embedded registers are defined by generics before the synthesis phase. So, if no instances of certain registers are required to interface a certain CLUSTER OF MACRO-CELLS, they are configured (by generics and generate statements in VHDL) to be not synthesized. Consequently only the exact required number of registers of the exact required type is synthesized; this saves area in the implementation.

From an addressing point of view each register in the layer (implemented with a 32-bit word) is seen as an address. If all available registers are used, the address map of this layer is a sequence of contiguous addresses. If some registers are not implemented (not configured for implementation by generics) some holes result in the contiguous address space. Being not convenient, by efficiency reasons, to stop a burst accessing to the layer, when the holes are accessed the hardware reply a particular code named BAD ACCESS CODE. This means that when a not configured address, that is an address internal to the accessible address space, is accessed the burst is not stopped but a BAD ACCESS CODE in sent back to main DMI MAIN via the COMMON-BUS.

Now the operation of the block FILLING STATUS CALCULATOR is detailed as far as it concerns the Register Layer REGBLOCK. For this particular aim the FILLING STATUS CALCULATOR block is implemented by means of a look-up table (ROM based) named MAX BURST LENGTH TABLE. The table includes two fields for each register of the pile: a first one named MAX_READ_BURST_LENGTH corresponds to the maximum length of a permissible reading burst, a second one named MAX_WRITE_BURST_LENGTH corresponds to the maximum length of a permissible writing burst. The length is expressed in number of 32-bit word. The table is accessed to generate an actual value of the FILLING_STATUS indicator when the block REGBLOCK is accessed.

In the not limiting examples of FIGS. 9 to 11, the content of the table MAX BURST LENGTH TABLE is shown in APPENDIX A (TABLE A1: MAX BURST LENGTH TABLE). The table indicates that the maximum lengths of reading and writing bursts for a certain register are not equal; that because not all the registers are both readable and writeable. The only registers both readable and writeable are 18, namely: the CONFIGURATION REGISTERS, COMMAND REGISTERS, and COUNTER REGISTERS; while the remaining 14 Registers, namely: 13 STATUS REGISTERS and 1 READ&RESET REGISTER are only readable. Consequently the MAX_READ_BURST_LENGTH is 32, while the MAX_WRITE_BURST_LENGTH is 18. So, when, for example, an application gains access to block REGBLOCK for write the Configuration Register No. 6, the returned value for the remaining reads in that block included the actual read is 26 (32−6). At the same time the returned value for the remaining writes in that block included the actual is only is 12 (18−6).

Each register (resource) in the block REGBLOCK has an address corresponding to the RESOURCE_ID field of the Table A1; so for example when the RESOURCE_ID field contains CONFIGURATION 8 means that the eighth CONFIGURATION REGISTER of the address space is accessed (starting from the higher address). In correspondence with CONFIGURATION REGISTER 8 the returned value of MAX_READ_BURST_LENGTH is 24, that means that there are 24 registers to read again. The FILLING STATUS CALCULATOR block checks if the returned value 24 is greater than the RDPTL_FILLING_STATUS due to the latency (the number of bits allocated to express the filling status is chosen accordingly). If it is so the returned value is saturated at the RDPTL_FILLING_STATUS value, otherwise not. In both cases the final value becomes a filling status indicator managed by the protocol governing the distributed interface. A value 1 read in the MAX_READ_BURST_LENGTH field means that the current is the last possible read and no more reads can be performed from the current transaction. As an access outside the boundaries of the MAX BURST LENGTH TABLE is tried, a value zero is retrieved.

The write access is treated in duality, and precisely: when a register is accessed for a write, the FILLING STATUS CALCULATOR block reads the MAX_WRITE_BURST_LENGTH field of the table MAX BURST LENGTH TABLE corresponding to the RESOURCE_ID address. The read value, in case opportunely saturated, is the filling status indicator at the current writing transaction. A value 1 read in the MAX_WRITE_BURST_LENGTH field means that the current is the last possible write and no more write can be performed from the current transaction. As an access outside the boundaries of the MAX BURST LENGTH TABLE is tried a value zero is retrieved.

In the present FIG. 18 blocks DMI MAIN and DMI PERIPHERALs are both clocked with the clock cbus_clk sent on COMMON-BUS. As can be seen in Figure, also the user macro-cell is clocked with the same clock cbus_clk. In this case each Point-to-Point-Bus exiting from block REGBLOCK trough the corresponding register port is directly connected to the respective dashed block APPLI RG. The case presented in FIG. 18 is not the most general one. User macro-cells may be clocked with the same clock cbus_clk or with a different clock named appl_clk. The situation can be mixed: some macro-cells clocked with the clock cbus_clk and some other with the clock appl_clk.

Figure 19:
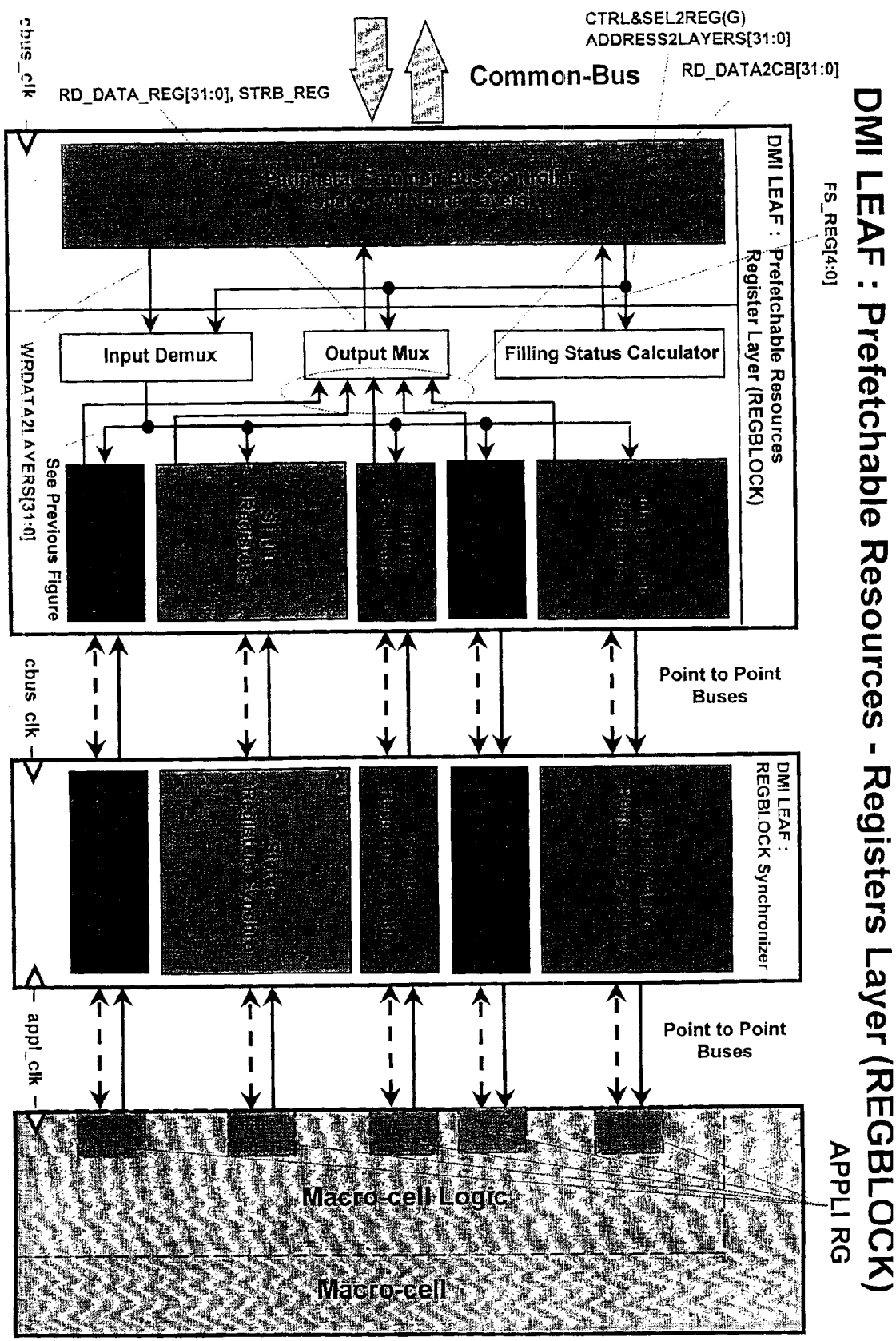
FIG. 19 is the FIG. 18 plus a block REGBLOCK SYNCHRONIZER interposed between the block REGBLOCK and the user MACRO-CELL.

In FIG. 19, in addition to the two blocks REGBLOCK and "Application user macro-cell" or group of macro-cells, there is a third block named REGBLOCK SYNCHRONIZER interposed between the first two. The third block belongs to DMI PERIPHERALS. The clock signal cbus_clk reaches a clock input of both blocks REGBLOCK and REGBLOCK SYNCHRONIZER, while the clock signal appl_clk coming from macro-cells reaches a second clock input of the block REGBLOCK SYNCHRONIZER. Each different register embedded into the block REGBLOCK has a corresponding block into the REGBLOCK SYNCHRONIZER. The two blocks are bi-directionally connected through respective Point-to-Point-Buses. Block REGBLOCK SYNCHRONIZER is connected at the other side to a respective block APPLI RG by means of Point-to-Point-Bus too. So we can appreciate that those buses are connected at the two sides of the block REGBLOCK SYNCHRONIZER. In each Point-to-Point-Bus some sub-buses are present. The ones sketched in continuous lines carries data, the ones sketched in dashed lines carries controls.

The function of each synchronization block in the REGBLOCK SYNCHRONIZER block is to make possible reliable transfer of information between the user macro-cell and a respective register of block REGBLOCK. In the case presented in FIG. 19 the user macro-cell is clocked with a clock appl_clk different from cbus_clk. In this case a register embedded into block REGBLOCK cannot be directly connected to the user macro-cell, by means of a Point-to-Point-Bus, because the communication would not be reliable.

Each block embedded into REGBLOCK SYNCHRONIZER is a Synchronization Unit whose implementation will be discussed in detail with reference to the FIG. 24, FIG. 25, FIG. 26, FIG. 27 and FIG. 28. The synchronization unit acts as a bridge between the two clock domains. An alternative solution allowing reliable communication is based on a known synchronization technique implementing both two phase handshake and double sampling. It is important to point out that is not mandatory the block REGBLOCK SYNCHRONIZER be sketched outside the block REGBLOCK (this has been done to graphically underline the concept of modularity), so block REGBLOCK can include block REGBLOCK SYNCHRONIZER. It is important to point out that wherever the block REGBLOCK SYNCHRONIZER is located it is an add-on module, that is, it is implemented only and only if required from applications; this feature allows gate/area saving. Moreover, each Synchronization Unit embedded into REGBLOCK SYNCHRONIZER is configurable by tuning in the HDL code a sub-set of parameters (generics with generate statements in VHDL) before the synthesis phase. Not configured Synchronization Units will not be implemented; this feature allows gate/area saving.

Figure 20:
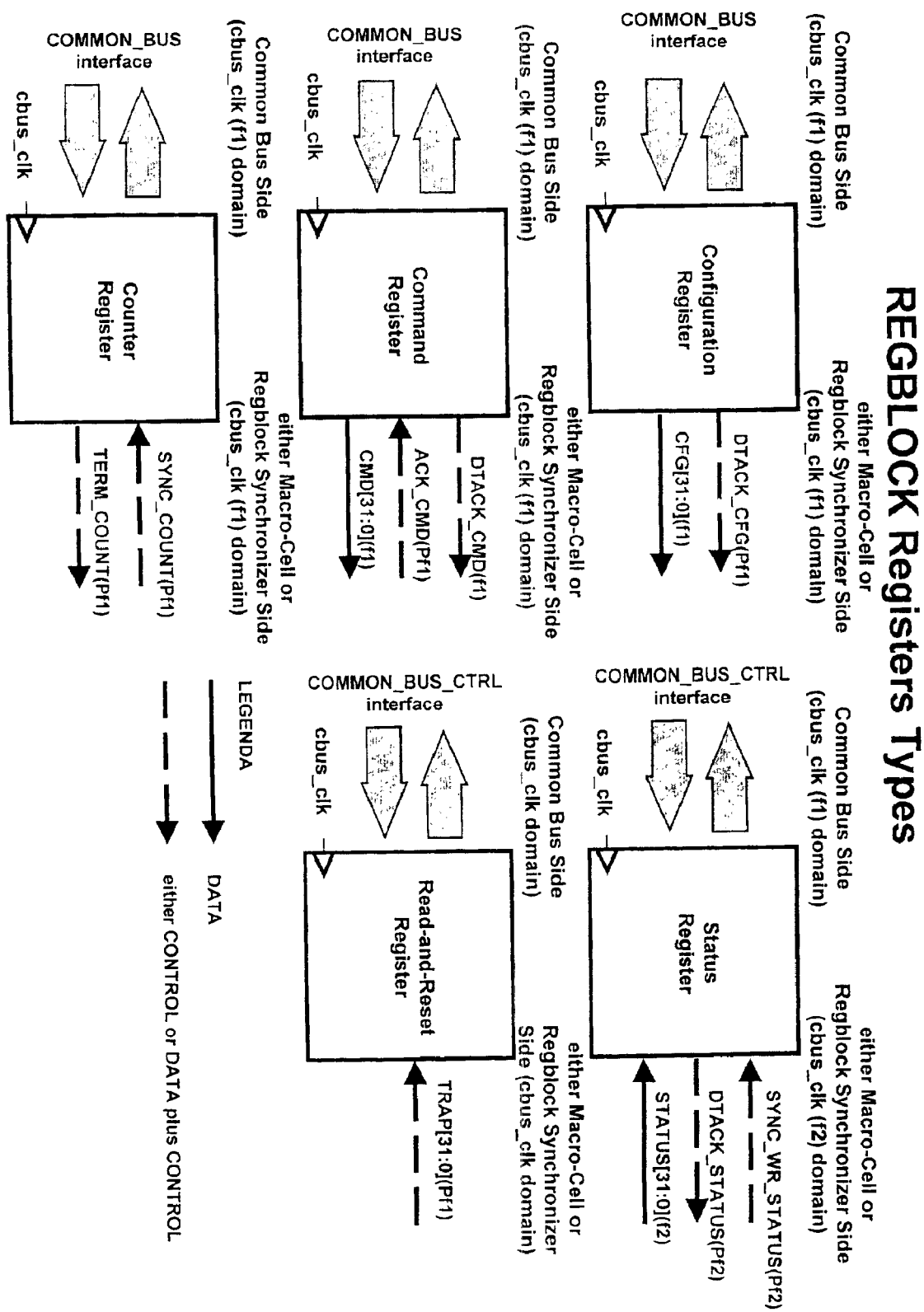
FIG. 20 details all the signals at the left side of each register embedded in block REGBLOCK either of FIG. 18 or 19.

In FIG. 20 all the registers shown in the preceding FIG. 18 or FIG. 19 are represented as many boxes. All of them are clocked with cbus_clk clock, which reaches the left-hand side of each box. Moreover, all of them have the left-hand side dedicated to the interface with the COMMON-BUS, through the blocks INPUT DEMUX, OUTPUT MUX and PERIPHERAL COMMON BUS CONTROLLER. The box at the top in the left-hand side of figure is a CONFIGURATION REGISTER. The box in the middle in the left-hand side of figure is a COMMAND REGISTER. The box at the bottom in the left-hand side of figure is a COUNTER REGISTER. The box at the top in the right-hand side of figure is a STATUS REGISTER. Finally, the box at the bottom in the right-hand side of figure is a READ&RESET REGISTER.

Figure 21:
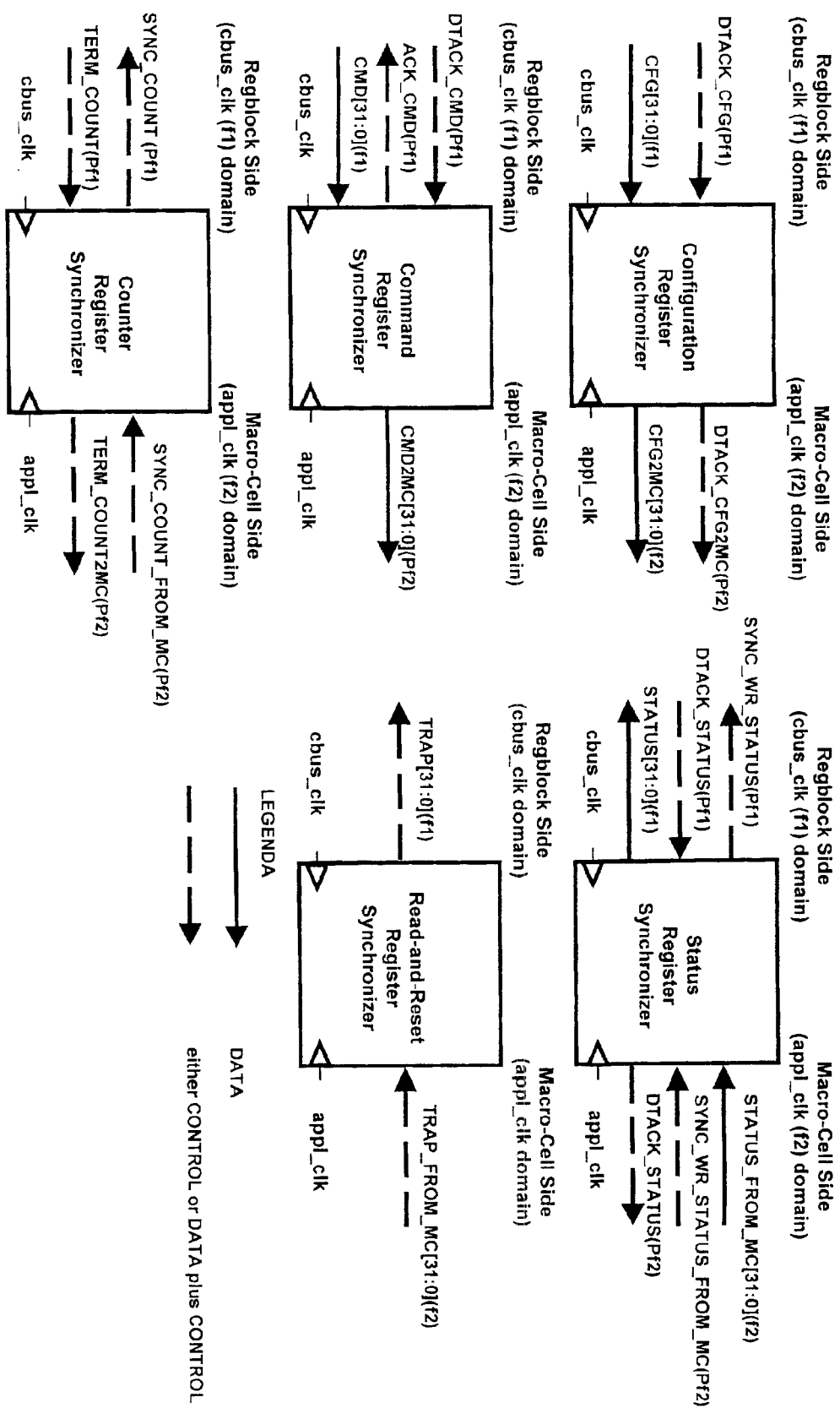
FIG. 21 details all the signals at the two sides of each block Register Synchronizer embedded in block REGBLOCK SYNCHRONIZER of FIG. 19.

FIG. 21 details the signals at the two side of each synchronization unit embedded into the module REGBLOCK SYNCHRONIZER of FIG. 19. Obviously, the left side of the synchronization units clocked from cbus_clk is interested in the same signals of the corresponding interfaced register. The right side of the synchronization units clocked from appl_clk is interested in equivalent signals originated from or directed to the user macro-cells.

Now, with reference to FIG. 20 the interface of each type of register towards its synchronizer is described. The interface of each type of synchronizer towards macro-cellss is immediate from FIG. 21. The direction of a generic signal is indicated by an arrow; solid line indicates 32-bit DATA word, dashed line either CONTROL or DATA plus CONTROL. Symbols between round parenthesis appended to the name of signals in both Figures and text have the meaning explained in a Table A2 reported in APPENDIX A.

The CONFIGURATION REGISTER interfaces its synchronizer block through two outgoing signals named DTACK_CFG(Pf1) and CFG[31:0](f1). Signal DTACK_CFG(Pf1) is used as strobe for CFG[31:0] which carries configuration information toward macro-cells.

The COMMAND REGISTER interfaces its synchronizer block through two outgoing signals DTACK_CMD(f1) and CMD[31:0](f1), and through an incoming signal ACK_CMD(Pf1). Signal DTACK_CMD(f1) is a strobe signaling the presence of a valid command word CMD[31:0](f1) which carries commands towards macro-cells. ACK_CMD(Pf1) is a backward strobe generated internally to the synchronizer for restoring the capability of receiving a new command word. The presence of a valid command is evident by itself to the application and it does not need a strobe, so from the right side of command register synchronizer (FIG. 21) the command word CMD2MC[31:0](f2) is only outputted towards macro-cells.

The COUNTER REGISTER interfaces its synchronizer block through one incoming signal SYNC_COUNT(Pf1) and one outgoing signal TERM_COUNT(Pf1). SYNC_COUNT(Pf1) indicates to the register to advance the internal counter. TERM_COUNT(Pf1) indicates to the user macro-cell that the internal counter of the register has reached the terminal count.

The STATUS REGISTER interfaces its synchronizer block through two incoming signals SYNC_WR_STATUS(Pf1) and STATUS[31:0](f1), and one outgoing signal DTACK_STATUS(Pf1). Signal SYNC_WR_STATUS(Pf1) is a strobe indicating the validity of the data STATUS[31:0](f1) sent by the user macro-cell. Signal DTACK_STATUS(Pf1) is activated when the STATUS REGISTER has been read by the DMI MAIN module.

The READ&RESET REGISTER interfaces its synchronizer block through one incoming signal TRAP[31:0](f1) or TRAP[31:0](Pf1). This signal carries events coming from user macro-cell.

The Configuration and Control Functions (CCF) supported by all the above listed registers are provided in both cases the main DMI MAIN be connected to a configuration and control processor or to a standard bus (like a PCI).

Figure 22:
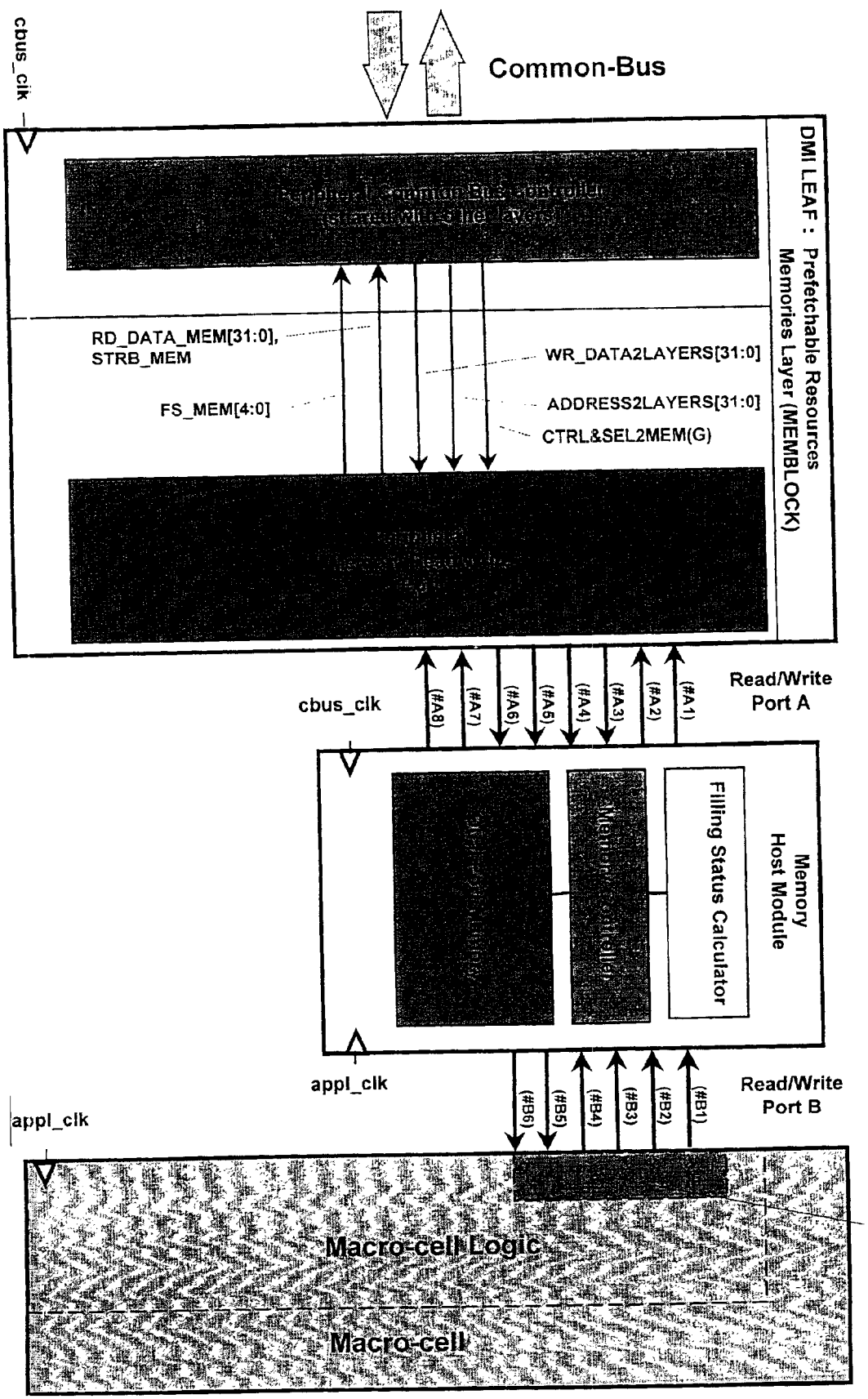
FIG. 22 shows a memory block MEMBLOCK of FIG. 16 and the relative interconnection to a user MACRO-CELL.

In FIG. 22 a layer of prefetchable resource of memory type, referred to the block MEMBLOCK summarized in FIG. 16, is shown. The layer includes the block MEMBLOCK and a second block named MEMORY HOST MODULE that physically embeds the prefetchable memory resource. The second block is external to the peripheral MEMBLOCK but this requisite is not mandatory, that is the block MEMORY HOST MODULE can be internal to the block MEMBLOCK. A third block in Figure represents a user macro-cell or group of macro-cells. Block MEMORY HOST MODULE is interposed between blocks MEMBLOCK and user MACRO-CELL.

The block MEMBLOCK is charged to interface memories to a DMI PERIPHERAL block, it includes the following interconnected blocks:

PERIPHERAL COMMON BUS CONTROLLER (referenced in FIG. 17 and shared with other layers); PERIPHERAL MEMORY READ/WRITE PORT.

The second block receives addresses ADDRESS2LAYERS[31:0], data WR_DATA2LAYERS [31:0], and control and select group of signals CTRL&SEL2MEM(G). In its turn it sends to the first block the filling status indicator FS_MEM[3:0] and data RD_DATA_MEM[31:0] plus the reading strobe STRB_MEM.

Block MEMORY HOST MODULE embeds the memory chosen by the user, in the present case a DUAL PORT MEMORY, and two further blocks named FILLING STATUS CALCULATOR and MEMORY CONTROLLER respectively. The block MEMORY CONTROLLER is interposed between blocks FILLING STATUS CALCULATOR and DUAL PORT MEMORY. The block MEMORY HOST MODULE is connected to the block PERIPHERAL MEMORY READ/WRITE PORT of block MEMBLOCK through a set of connections specified at READ/WRITE PORT A and to the block APPLI MEM of the user MACROCELL through a set of connections specified at a READ/WRITE PORT B.

In the present FIG. 22 it can be appreciate that the connections at READ/WRITE PORT A are eight, numbered from #A1 to #A8. In the following the type of connections, the relative signals involved and their directions are indicated:

symbol #A1 indicates a wire for a signal FS_MEM[3:0] outputted from block MEMORY HOST MODULE and inputted to PERIPHERAL MEMORY READ/WRITE PORT; the signal is the filling status indicator;

symbol #A2 indicates a wire for a signal PERIPHERAL_QUERY_B outputted from block PERIPHERAL MEMORY READ/WRITE PORT and inputted to MEMORY HOST MODULE. This signal is the query command (the command that query the MEMORY HOST MODULE for the number of words available for reading or writing at the READ/WRITE PORT A);

symbol #A3 indicates a wire for a signal PERIPHERAL_CS_B inputted to the block MEMORY HOST MODULE and outputted from PERIPHERAL MEMORY READ/WRITE PORT; the signal is a chip select indicating that the block MEMORY HOST MODULE (READ/WRITE PORT A) is selected for operations;

symbol #A4 indicates a wire for a signal PERIPHERAL_RD_WRB inputted to the block MEMORY HOST MODULE and outputted from PERIPHERAL MEMORY READ/WRITE PORT; when asserted, this signal indicates the current operation (READ/WRITE PORT A) is a write, otherwise the current operation (READ/WRITE PORT A) is a read. It has to be validated by the previous signal PERIPHERAL_CS_B;

symbol #A5 indicates a bus for signals PERIPHERAL_ADDR[31:0] inputted to the block MEMORY HOST MODULE and outputted from PERIPHERAL MEMORY READ/WRITE PORT; the configuration of signals on the bus settles the address at which current access is performed (at READ/WRITE PORT A);

symbol #A6 indicates a bus for signals PERIPHERAL_WRDATA[31:0] inputted to the block MEMORY HOST MODULE and outputted from PERIPHERAL MEMORY READ/WRITE PORT; this is the data bus used to write data from PERIPHERAL MEMORY READ/WRITE PORT to the block memory embedded into MEMORY HOST MODULE;

symbol #A7 indicates a bus for signals PERIPHERAL_RDDATA[31:0] outputted from the block MEMORY HOST MODULE and inputted to PERIPHERAL MEMORY READ/WRITE PORT; it is the data bus used to read data from the memory embedded into the block MEMORY HOST MODULE to PERIPHERAL MEMORY READ/WRITE PORT;

symbol #A8 indicates a wire for a signal PERIPHERAL_RDDATA_STROBE_B outputted from the block MEMORY HOST MODULE and inputted to PERIPHERAL MEMORY READ/WRITE PORT; the signal is a strobe validating data PERIPHERAL_RDDATA[31:0].

The connections at READ/WRITE PORT B are five, numbered from #B1 to #B5. In the following the type of connections, the relative signals involved, and their directions are indicated:

symbol #B1 indicates a wire for a signal CORE_CS_B outputted from APPLI MEM block and inputted to the block MEMORY HOST MODULE; the signal is a chip select indicating that the MEMORY HOST MODULE (READ/WRITE PORT B) is selected for operations;

symbol #B2 indicates a wire for a signal CORE_RD_WRB inputted to the block MEMORY HOST MODULE and outputted from dashed block APPLI MEM; when asserted this signal indicates the current operation is a write (involving READ/WRITE PORT B), otherwise the current operation is a read (involving READ/WRITE PORT B). It has to be validated by the signal CORE_CS_B;

symbol #B3 indicates a bus for signals CORE_ADDR[31:0] inputted to the block MEMORY HOST MODULE and outputted from dashed block APPLI MEM; the configuration of signals on the bus settles the address at which current access is performed (at READ/WRITE PORT A).

symbol #B4 indicates a bus for data CORE_WRDATA[31:0] inputted to the block MEMORY HOST MODULE and outputted from the dashed block APPLI MEM, it is the data bus used to write data from block APPLI MEM to the memory embedded into the block MEMORY HOST MODULE;

symbol #B5 indicates a bus for data CORE_RDDATA[31:0] outputted from the memory embedded into the block MEMORY HOST MODULE and inputted to the block APPLI MEM;

symbol #B6 is a wire for a signal CORE_RDDATA_STROBE outputted from the block MEMORY HOST MODULE and inputted to the dashed block APPLI MEM; the signal is a strobe validating CORE_RDDATA[31:0].

In the operation, block "PERIPHERAL MEMORY READ/WRITE PORT" is the port where to connect the block MEMORY HOST MODULE to peripheral DMI PERIPHERAL. Block "PERIPHERAL MEMORY READ/WRITE PORT" generates commands and addresses for the block MEMORY HOST MODULE, via READ/WRITE PORT A, basing on commands received by the block PERIPHERAL COMMON BUS CONTROLLER that, in its turn receives commands from the COMMON-BUS. Moreover, in write operations, block "PERIPHERAL MEMORY READ/WRITE PORT" receives data and commands from the COMMON-BUS under control of the block PERIPHERAL COMMON BUS CONTROLLER and sends them to the block MEMORY HOST MODULE, via READ/WRITE PORT A. On the contrary, in read operations, it receives data from the block MEMORY HOST MODULE, via READ/WRITE PORT A, and sends them to the COMMON-BUS under control of the block PERIPHERAL COMMON BUS CONTROLLER.

As far as concerns block MEMORY HOST MODULE, the embedded block DUAL PORT MEMORY allows transmission of data bursts from peripheral DMI PERIPHERAL to macro-cells, and vice versa. Block DUAL PORT MEMORY automatically grants synchronization itself. In fact, as well known, Dual Port Memories are largely used to allow communication between different clock domains because the transactions at the two sides are each other independent. The operation of the DUAL PORT MEMORY block is controlled by block MEMORY CONTROLLER interposed between the two blocks DUAL PORT MEMORY and FILLING STATUS CALCULATOR. Block MEMORY CONTROLLER collects all signals of READ/WRITE PORT A and READ/WRITE PORT B of the MEMORY HOST MODULE block and, based on the collected signals and on the information received from FILLING STATUS CALCULATOR block, prevents read or write operations outside the boundaries of the DUAL PORT MEMORY. The FILLING STATUS CALCULATOR block receives the address value involved in a current read/write transaction and, basing on memory size, calculates the maximum possible burst length starting from current address before crossing lower/higher memory boundaries, then it checks if the maximum possible burst length is greater than the RDPTL_FILLING_STATUS due to the latency, if it's so the returned value is saturated at the RDPTL_FILLING_STATUS value, otherwise not, in both cases the final value becomes the filling status indicator FS_MEM[3:0] managed by the protocol governing the distributed interface.

Figure 23:
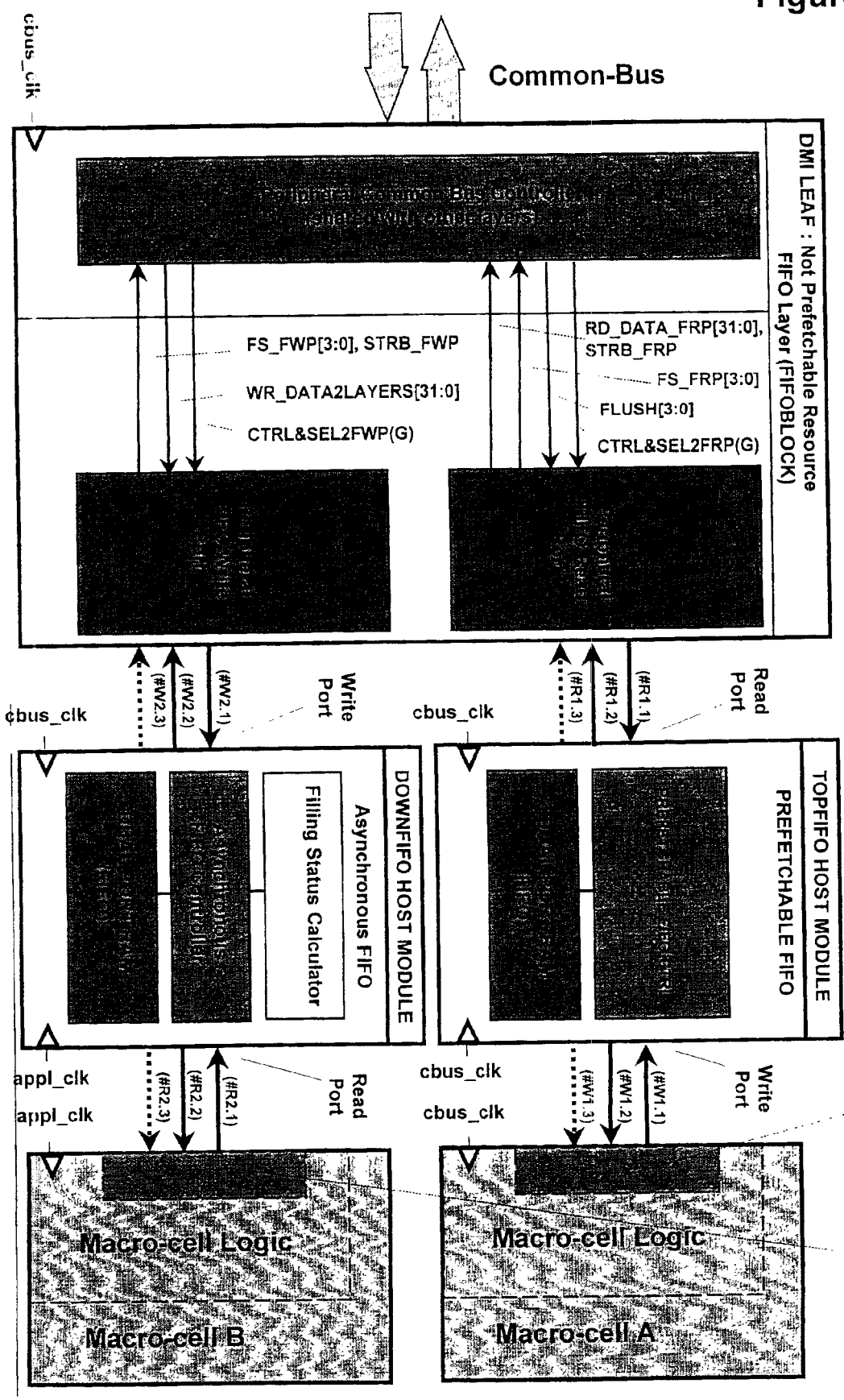
FIG. 23 shows a FIFO block FIFOBLOCK of FIG. 16 and the relative interconnection to a user MACRO-CELL.

In FIG. 23 a layer of not prefetchable resource of FIFO type, referred to the block FIFOBLOCK summarized in FIG. 16, is shown. The layer includes three blocks: FIFOBLOCK, TOPFIFO HOST MODULE, and DOWNFIFO HOST MODULE. First block FIFOBLOCK is charged to interface FIFOs to a DMI PERIPHERAL block. Second block TOPFIFO HOST MODULE, that is external to the peripheral FIFOBLOCK (but the requisite to be external is not mandatory), embeds either a special fifo named PREFETCHABLE FIFO, that will be described later, or a cascade of said PREFETCHABLE FIFO with a "classic" ASYNCHRONOUS FIFO. The special fifo (PREFETCHABLE FIFO) can be used either in a synchronous or in an asynchronous implementation. As for "classic" fifos, the asynchronous PREFETCHABLE FIFO is able to bridge between agents belonging to different clock domains while the synchronous one is not. As a consequence, when the PREFETCHABLE FIFO only is embedded into TOPFIFO HOST MODULE it can be either asynchronous or synchronous while when the cascade is embedded into TOPFIFO HOST MODULE the synchronous PREFETCHABLE FIFO is selected. Third block DOWNFIFO HOST MODULE, that is external to the peripheral FIFOBLOCK (but the requisite to be external is not mandatory), embeds either a "classic" SYNCHRONOUS FIFO or a "classic" ASYNCHRONOUS FIFO. A fourth block represents user macro-cell or group of macro-cells. In the specific case two distinct macro-cells are represented, namely MACRO-CELL A and MACRO-CELL B.

A SYNCHRONOUS FIFO is instantiated in DOWNFIFO HOST MODULE when the clock domains to which MACRO-CELL B and DMI PERIPHERAL belong are coincident, when they differs an ASYNCHRONOUS FIFO has to be instantiated. For the same reasons, if the macro-cell A were asynchronous with respect to the DMI PERIPHERAL either an asynchronous implementation of the PREFETCHABLE FIFO or a cascade composed of a synchronous implementation of the PREFETCHABLE FIFO plus an ASYNCHRONOUS FIFO should be put in the TOPFIFO HOST MODULE. In fact, as well known, asynchronous FIFOs are largely used to allow communication between different clock domains because they automatically grant synchronization.

The asynchronous version of the PREFETCHABLE FIFO can be obtained from the synchronous one adopting known techniques used for asynchronous fifos, so without any limitation only the synchronous implementation of the PREFETCHABLE FIFO will be described. As a consequence, if not differently specified, with PREFETCHABLE FIFO will be intended the synchronous implementation.

In conclusion, without any limitation, the block TOPFIFO HOST MODULE embeds a PREFETCHABLE FIFO, (synchronous implementation) while the DOWNFIFO HOST MODULE embeds an ASYNCHRONOUS FIFO.

A COMMON-BUS clock signal cbus_clk reaches a clock input of both blocks FIFOBLOCK and TOPFIFO HOST MODULE (and the embedded PREFETCHABLE FIFO). The same clock cbus_clk reaches the clock input of the user MACRO-CELL A. Furthermore, clock cbus_clk reaches a clock input of block DOWNFIFO HOST MODULE (and the embedded ASYNCHRONOUS FIFO), while a user clock appl_clk coming from MACRO-CELL B reaches a second clock input of the block DOWNFIFO HOST MODULE.

The block FIFOBLOCK includes the following blocks:
PERIPHERAL COMMON BUS CONTROLLER
    (referenced in FIG. 17 and shared with other layers);
PERIPHERAL FIFO READ PORT;
PERIPHERAL FIFO WRITE PORT.

The first port block PERIPHERAL FIFO READ PORT is a port dedicated to read data from the FIFO embedded into the block TOPFIFO HOST MODULE, while the second block PERIPHERAL FIFO WRITE PORT is a port dedicated to write data to the FIFO embedded in DOWNFIFO HOST MODULE block. Block PERIPHERAL FIFO READ PORT receives control and select group of signals CTRL&SEL2FRP(G) while sends towards the PERIPHERAL COMMON BUS CONTROLLER the filling status indicator FS_FRP[3:0] and data RD_DATA_FRP[31:0] plus the reading strobe STRB_FRP. Moreover block PERIPHERAL FIFO READ PORT receives from block PERIPHERAL COMMON BUS CONTROLLER signal FLUSH[3:0] indicating the number of word to flush from the fifo embedded inside TOPFIFO HOST MODULE (in case flush operation is supported by said fifo). Block PERIPHERAL FIFO READ PORT only act as a "wrapper" between the PERIPHERAL BUS CONTROLLER and the TOPFIFO HOST MODULE adapting format and timing of signals. Block PERIPHERAL FIFO WRITE PORT receives data WR_DATA2LAYERS[31:0] and the control and select group of signal CTRL&SEL2FWP(G). In its turn it sends to the PERIPHERAL COMMON BUS CONTROLLER the filling status indicator FS_FWP[3:0] and the accompanying strobe STRB_FWP. Block PERIPHERAL FIFO WRITE PORT only act as a "wrapper" between the PERIPHERAL BUS CONTROLLER and the DOWNFIFO HOST MODULE adapting format and timing of signals.

Block TOPFIFO HOST MODULE is connected to the port LEAF FIFO READ PORT of block FIFOBLOCK through a set of connections specified at its read port, and to the block APPLI WF of the MACRO-CELL A through a set of connections specified at its write port. Similarly, the block DOWNFIFO HOST MODULE is connected to the port LEAF FIFO WRITE PORT of block FIFOBLOCK through a set of connections specified at its write port, and to the block APPLI RF of the MACRO-CELL B through a set of connections specified at its read port.

The connections at PERIPHERAL FIFO READ PORT are indicated with three arrows respectively indicated as (#R1.1), (#R1.2) and (#R1.3) each one representing a specific set of signals. Symbol (#R1.1) represents output signals from PERIPHERAL FIFO READ PORT, while symbol (#R1.2) represents input signals for PERIPHERAL FIFO READ PORT, finally symbol (#R1.3) represents optional input signals for PERIPHERAL FIFO READ PORT. All signals belonging to groups (#R1.1), (#R1.2) and (#R1.3) will be indicated with the subscript "$_{R1}$". Moreover, for each mandatory signal is indicated the relationship with the originating or receiving signal inside the PERIPHERAL FIFO READ PORT.

Group (#R1.1) is composed by:

RD_POPWORD_B$_{R1}$ signal which is the pop command (the command that pop a word from the PREFETCHABLE FIFO). Driven by PERIPHERAL FIFO READ PORT. Originated from group of signals CTRL&SEL2FRP(G) inside PERIPHERAL FIFO READ PORT;

RD_QUERY_B$_{R1}$ signal which is the query command (the command that query the PREFETCHABLE FIFO for the number of words available for reading at read port). Driven by LEAF FIFO READ PORT. Originated from group of signals CTRL&SEL2FRP(G) inside PERIPHERAL FIFO READ PORT;

RD_FLUSH_B$_{R1}$ signal which is the flush command (the command that flush out of the PREFETCHABLE FIFO a number of words specified by the bus RD_NOWRD2FLUSH$_{R1}$[3:0]. Driven by PERIPHERAL FIFO READ PORT. Originated from group of signals CTRL&SEL2FRP(G) inside PERIPHERAL FIFO READ PORT;

RD_CLEAR_B$_{R1}$ signal which is the clear command (the command issued when a read transaction involving the PREFETCHABLE FIFO is terminated). Driven by PERIPHERAL FIFO READ PORT. Originated from group of signals CTRL&SEL2FRP(G) inside PERIPHERAL FIFO READ PORT;

RD_NWORD2FLUSH$_{R1}$[3:0] bussed signal which indicates the number of words to flush out from the PREFETCHABLE FIFO when the flush command (RD_FLUSH_B$_{R1}$) is asserted. Driven by PERIPHERAL FIFO READ PORT. Originated from FLUSH[3:0] bus inside PERIPHERAL FIFO READ PORT.

All signals belonging to Group (#R1.1) are directed from the PERIPHERAL FIFO READ PORT to the Read Port of TOPFIFO HOST MODULE.

Group (#R1.2) is composed by:

RD_NWORD_AVAIL$_{R1}$[3:0] bussed signal which indicates the number of words available for reading at PREFETCHABLE FIFO read port. Driven by PREFETCHABLE FIFO; Collected to FS_FRP[3:0] bus inside PERIPHERAL FIFO READ PORT;

RD_RDDATA$_{R1}$[31:0] bussed signal which is the data bus carrying data from PREFETCHABLE FIFO read port. Driven by PREFETCHABLE FIFO. Collected to RD_DATA_FRP[31:0] bus inside PERIPHERAL FIFO READ PORT;

RD_RDDATA_STR_B$_{R1}$ signal strobes both RD_NWORD_AVAIL$_{R1}$[3:0] and RD_RDDATA$_{R1}$[31:0]. Driven by PREFETCHABLE FIFO. Collected to STRB_FRP signal inside PERIPHERAL FIFO READ PORT;

All signals belonging to Group (#R1.2) are directed from the Read Port of TOPFIFO HOST MODULE to the PERIPHERAL FIFO READ PORT.

Group (#R1.3) is composed by:

RD_EMPTY$_{R1}$ signal is a flag indicating when asserted that the PREFETCHABLE FIFO is empty and no more data can be read. Driven by PREFETCHABLE FIFO;

RD_RDTH$_{R1}$ signal is a flag indicating when asserted that a certain user definable lower threshold of the filling level (expressed in number of words available for reading) of PREFETCHABLE FIFO has been crossed, this means that the fifo is getting empty. Driven by PREFETCHABLE FIFO.

All signals belonging to Group (#R1.3) are directed from the Read Port of TOPFIFO HOST MODULE to the PERIPHERAL FIFO READ PORT.

The connections at PERIPHERAL FIFO WRITE PORT are indicated with three arrows respectively indicated as (#W2.1), (#W2.2) and (#W2.3) each one representing a specific set of signals. Symbol (#W2.1) represents output signals for PERIPHERAL FIFO WRITE PORT, while symbol (#W2.2) represents input signals for PERIPHERAL FIFO WRITE PORT, finally symbol (#W2.3) represents optional input signals for PERIPHERAL FIFO WRITE PORT. All signals belonging to groups (#W2.1), (#W2.2) and (#W2.3) will be indicated with the subscript "$_{w2}$". Moreover, for each mandatory signal is indicated the relationship with the originating or receiving signal inside the PERIPHERAL FIFO WRITE PORT.

Group (#W2.1) is composed by:

WR_PUSHWORD_B$_{W2}$ signal which is the push command (the command that push a word into the ASYNCHRONOUS FIFO (SYNCHRONOUS FIFO) write port embedded into the DOWNFIFO HOST MODULE). Driven by PERIPHERAL FIFO WRITE PORT. Originated from the group of signals CTRL&SEL2FWP(G) inside PERIPHERAL FIFO WRITE PORT;

WR_QUERY_B$_{W2}$ signal which is the query command (the command that query the ASYNCHRONOUS FIFO (SYNCHRONOUS FIFO) embedded into the DOWNFIFO HOST MODULE for the number of locations available for writing). Driven by PERIPHERAL FIFO WRITE PORT. Originated from the group of signals CTRL&SEL2FWP(G) inside PERIPHERAL FIFO WRITE PORT;

WR_WRDATA$_{W2}$[31:0] bussed signal which is the data bus carrying data from the PERIPHERAL FIFO WRITE PORT to the write port of the ASYNCHRONOUS FIFO (SYNCHRONOUS FIFO) embedded into the DOWNFIFO HOST MODULE. Data are validated by the assertion of WR_PUSHWORD_B$_{W2}$. Driven by PERIPHERAL FIFO WRITE PORT. Originated from WR_DATA2LAYERS[31:0] bus inside PERIPHERAL FIFO WRITE PORT;

All signals belonging to Group (#W2.1) are directed from the PERIPHERAL FIFO WRITE PORT to the Write Port of DOWNFIFO HOST MODULE.

Group (#W2.2) is composed by:

WR_NWORD_AVAIL$_{W2}$[3:0] bussed signal which indicates the number of locations available for writing at the write port of the ASYNCHRONOUS FIFO (SYNCHRONOUS FIFO) embedded into the DOWNFIFO HOST MODULE. Driven by ASYNCHRONOUS FIFO (SYNCHRONOUS FIFO) embedded into the DOWNFIFO HOST MODULE. Collected to FS_FWP [3:0] bus inside PERIPHERAL FIFO WRITE PORT;

WR_STR_B$_{W2}$ signal strobes WR_NWORD_AVAIL$_{W2}$ [3:0] and indicates that the push operation successfully completed. Driven by ASYNCHRONOUS FIFO (SYNCHRONOUS FIFO) embedded into the DOWN- FIFO HOST MODULE. Collected to STRB_FWP inside PERIPHERAL FIFO WRITE PORT;

All signals belonging to Group (#W2.2) are directed from the Write Port of DOWNFIFO HOST MODULE to the PERIPHERAL FIFO WRITE PORT;

Group (#W2.3) is composed by:

WR_FULL$_{W2}$ signal is a flag indicating when asserted that the ASYNCHRONOUS FIFO (SYNCHRONOUS FIFO) is full and no more data can be written. Driven by ASYNCHRONOUS FIFO (SYNCHRONOUS FIFO) embedded into the DOWNFIFO HOST MODULE;

WR_WRTH$_{W2}$ signal is a flag indicating when asserted that a certain user definable higher threshold of the filling level (expressed in number of location available for writing) of ASYNCHRONOUS FIFO (SYNCHRONOUS FIFO) has been crossed, this means that the fifo is getting full. Driven by ASYNCHRONOUS FIFO (SYNCHRONOUS FIFO) embedded into the DOWNFIFO HOST MODULE.

All signals belonging to Group (#W2.3) are directed from the Write Port of DOWNFIFO HOST MODULE to the PERIPHERAL FIFO WRITE PORT.

Block TOPFIFO HOST MODULE is connected to the port PERIPHERAL FIFO READ PORT of block FIFOBLOCK and thereby its read port has the same set of connections described above talking about the PERIPHERAL FIFO READ PORT. Moreover, block TOPFIFO HOST MODULE is connected to the block APPLI WF of the MACRO-CELL A through a set of connections specified at its write port which are represented with three arrows respectively indicated as (#W1.1), (#W1.2) and (#W1.3) each one representing a specific set of signals. Symbol (#W1.1) represents output signals for the write port, while symbol (#W1.2) represents input signals for write port, finally symbol (#W1.3) represents optional input signals for the write port. All signals belonging to groups (#W1.1), (#W1.2) and (#W1.3) will be indicated with the subscript "$_{w1}$".

Group (#W1.1) is composed by:

WR_PUSHWORD_B$_{W1}$ signal which is the push command (the command that push a word into the PREFETCHABLE FIFO write port embedded into the TOPFIFO HOST MODULE). Driven by APPLI WF;

WR_QUERY_B$_{W1}$ signal which is the query command (the command that query the PREFETCHABLE FIFO embedded into the TOPFIFO HOST MODULE for the number of locations available for writing). Driven by APPLI WF;

WR_WRDATA$_{W1}$[31:0] bussed signal which is the data bus carrying data from the APPLI WF to the write port of the PREFETCHABLE FIFO embedded into the TOPFIFO HOST MODULE. Data are validated by the assertion of WR_PUSHWORD_B$_{W1}$. Driven by APPLI WF;

All signals belonging to Group (#W1.1) are directed from APPLI_WF to the Write Port of TOPFIFO HOST MODULE;

Group (#W1.2) is composed by:

WR_NWORD_AVAIL$_{W1}$[3:0] bussed signal which indicates the number of locations available for writing at the write port of the PREFETCHABLE FIFO embedded into the TOPFIFO HOST MODULE. Driven by the PREFETCHABLE FIFO embedded into the TOPFIFO HOST MODULE;

WR_STR_B$_{W1}$ signal strobes WR_NWORD_AVAIL$_{W1}$[3:0] and indicates that the push operation successfully completed. Driven by the PREFETCHABLE FIFO embedded into the TOPFIFO HOST MODULE. Driven by the PREFETCHABLE FIFO embedded into the TOPFIFO HOST MODULE;

All signals belonging to Group (#W1.2) are directed from the Write Port of TOPFIFO HOST MODULE to APPLI_WF.

Group (#W1.3) is composed by:

WR_FULL$_{W1}$ signal is a flag indicating when asserted that the PREFETCHABLE FIFO is full and no more data can be written. Driven by PREFETCHABLE FIFO embedded into the TOPFIFO HOST MODULE;

WR_WRTH$_{W1}$ signal is a flag indicating when asserted that a certain user definable higher threshold of the filling level (expressed in number of location available for writing) of PREFETCHABLE FIFO has been crossed, this means that the fifo is getting full. Driven by the PREFETCHABLE FIFO embedded into the TOPFIFO HOST MODULE.

All signals belonging to Group (#W1.3) are directed from the Write Port of TOPFIFO HOST MODULE to APPLI_WF.

Block DOWNFIFO HOST MODULE is connected to the port PERIPHERAL FIFO WRITE PORT of block FIFOBLOCK and thereby its read port has the same set of connections described above talking about the PERIPHERAL FIFO WRITE PORT. Moreover, block DOWNFIFO HOST MODULE is connected to the block APPLI RF of the MACRO-CELL B through a set of connections specified at its read port which are represented with three arrows respectively indicated as (#R2.1), (#R2.2) and (#R2.3) each one representing a specific set of signals. Symbol (#R2.1) represents output signals for the read port, while symbol (#R2.2) represents input signals for the read port, finally symbol (#R2.3) represents optional input signals for the read port. All signals belonging to groups (#R2.1), (#R2.2) and (#R2.3) will be indicated with the subscript "$_{R2}$".

Group (#R2.1) is composed by:

RD_POPWORD_B$_{R2}$ signal which is the pop command (the command that pop a word from the ASYNCHRONOUS FIFO (SYNCHRONOUS FIFO)). Driven by APPLI RF;

RD_QUERY_BR2 signal which is the query command (the command that query the ASYNCHRONOUS FIFO (SYNCHRONOUS FIFO) for the number of words available for reading at read port). Driven by APPLI RF;

All signals belonging to Group (#R2.1) are directed from APPLI_RF to the Read Port of DOWNFIFO HOST MODULE.

Group (#R2.2) is composed by:

RD_NWORD_AVAIL$_{R2}$[3:0] bussed signal which indicates the number of words available for reading at ASYNCHRONOUS FIFO (SYNCHRONOUS FIFO) read port. Driven by ASYNCHRONOUS FIFO (SYNCHRONOUS FIFO);

RD_RDDATA$_{R2}$[31:0] bussed signal which is the data bus carrying data from ASYNCHRONOUS FIFO (SYNCHRONOUS FIFO) read port. Driven by ASYNCHRONOUS FIFO (SYNCHRONOUS FIFO);

RD_RDDATA_STR_B$_{R2}$ signal strobes both RD_NWORD_AVAIL$_{R2}$[3:0] and RD_RDDATA$_{R2}$[31:0]. Driven by ASYNCHRONOUS FIFO (SYNCHRONOUS FIFO);

All signals belonging to Group (#R2.2) are directed from the Read Port of DOWNFIFO HOST MODULE to APPLI_RF.

Group (#R2.3) is composed by:

RD_EMPTY$_{R2}$ signal is a flag indicating when asserted that the ASYNCHRONOUS FIFO (SYNCHRONOUS FIFO) is empty and no more data can be read. Driven by ASYNCHRONOUS FIFO (SYNCHRONOUS FIFO);

RD_RDTH$_{R2}$ signal is a flag indicating when asserted that a certain user definable lower threshold of the filling level (expressed in number of words available for reading) of ASYNCHRONOUS FIFO (SYNCHRONOUS FIFO) has been crossed, this means that the fifo is getting empty. Driven by ASYNCHRONOUS FIFO (SYNCHRONOUS FIFO).

All signals belonging to Group (#R2.3) are directed from the Read Port of DOWNFIFO HOST MODULE to APPLI_RF.

Now the blocks TOPFIFO HOST MODULE and DOWNFIFO HOST MODULE of the present FIG. 23 are described concerning internal architecture and operation (at the interfaces).

Block TOPFIFO HOST MODULE embeds either a block PREFETCHABLE FIFO (either synchronous or asynchronous implementation) or a cascade of a PREFETCHABLE FIFO (synchronous implementation) plus an ASYNCHRONOUS FIFO, depending on the user Macro-cell to which the block TOPFIFO HOST MODULE has to be connected. The selected solution depends on the clock relationship between the user macro-cell and the COMMON-BUS. For example, when communication between asynchronous clock domains is required the asynchronous implementation or the cascade is used, conversely the only PREFETCHABLE FIFO in the synchronous implementation is used. First case occurs when COMMON-BUS is clocked with clock cbus_clk and MACRO-CELL A is clocked with appl_clk clock, which differs in phase and frequency from cbus_clk. On the contrary, if the MACRO-CELL A is also clocked with cbus_clk clock, then only a PREFETCHABLE FIFO of synchronous type will be lodged into the block TOPFIFO HOST MODULE. The first situation is the case of FIG. 23 where the block TOPFIFO HOST MODULE embeds a PREFETCHABLE FIFO (synchronous implementation). On its turn, the PREFETCHABLE FIFO module embeds a DUAL PORT RAM used to implement the FIFO, a block named PREFETCHABLE FIFO CTRL. The block PREFETCHABLE FIFO CTRL is connected to the block FIFO and collects all signals of write port and read port of the TOPFIFO HOST MODULE. The FIFO block, in the present case, as in almost all cases of the known art, is build by a dual port memory transformed into a circular buffer by the management of addressing performed by the block PREFETCHABLE FIFO CTRL.

The block DOWNFIFO HOST MODULE embeds either a block SYNCHRONOUS FIFO or ASYNCHRONOUS FIFO depending on the user macro-cell to which the block DOWNFIFO HOST MODULE has to be connected. When communication between asynchronous clock domains is required the ASYNCHRONOUS FIFO is used, conversely the SYNCHRONOUS FIFO is used. As an example, when communication between asynchronous clock domains is required the ASYNCHRONOUS FIFO is used, conversely the only SYNCHRONOUS FIFO is used. First situation occurs when COMMON-BUS is clocked with clock cbus_clk and MACRO-CELL B is clocked with appl_clk clock, which differs in phase and frequency from cbus_clk. Second case occurs if the MACRO-CELL B is also clocked with cbus_clk clock. This is the case of Figure where the block DOWNFIFO HOST MODULE embeds an ASYNCHRONOUS FIFO. On its turn, the ASYNCHRONOUS FIFO module embeds a FIFO, a block named ASYNCHRONOUS FIFO CONTROLLER and a block indicated FILLING STATUS CALCULATOR, the last embedding a further block MAX BURST LENGTH CALCULATOR (this one not shown in Figure). The block ASYNCHRONOUS FIFO CONTROLLER is connected to both blocks FIFO and FILLING STATUS CALCULATOR and collects all signals of write port and read port of the block DOWNFIFO HOST MODULE. The FIFO block, in the present case, as in almost all cases of the known art, is build by a dual port memory transformed into a circular buffer by the management of addressing performed by the block ASYNCHRONOUS FIFO CONTROLLER. Block ASYNCHRONOUS FIFO CONTROLLER is able to manage the communication between the two asynchronous clock domains using known techniques.

Block PERIPHERAL FIFO READ PORT and PERIPHERAL FIFO WRITE PORT are two ports of the FIFOBLOCK layer where to respectively connect blocks TOPFIFO HOST MODULE and DOWNFIFO HOST MODULE. The two ports generate commands for both blocks TOPFIFO HOST MODULE and DOWNFIFO HOST MODULE, under control of the block PERIPHERAL COMMON BUS CONTROLLER, basing on commands received by the COMMON-BUS. Moreover, in write operations, block PERIPHERAL FIFO WRITE PORT receives data from COMMON-BUS and, under control of the block PERIPHERAL COMMON BUS CONTROLLER, sends them to the block DOWNFIFO HOST MODULE. In read operations, block PERIPHERAL FIFO READ PORT receives data from block TOPFIFO HOST MODULE and, under control of block PERIPHERAL COMMON BUS CONTROLLER, sends them to COMMON-BUS. The transactions at the two sides of both TOPFIFO HOST MODULE and DOWNFIFO HOST MODULE are each other independent.

From the interfacing point of view blocks ASYNCHRONOUS FIFO and SYNCHRONOUS FIFO are equivalent. Their difference, consisting in the ability of interfacing different clock domains, ability owned by the ASYNCHRONOUS FIFO and now owned by the SYNCHRONOUS FIFO does not have impact on their interfacing and operation. By this reason it is enough to describe only one block operation, for instance the SYNCHRONOUS FIFO block operation. Conversely the PREFETCHABLE FIFO is not equivalent, from the point of view of interfacing, to a SYNCHRONOUS FIFO or to an ASYNCHRONOUS FIFO. While the write port of different types of fifos is equivalent, the read port is not. In particular, as seen in the port description for PREFETCHABLE FIFO (either synchronous or asynchronous) and ASYNCHRONOUS FIFO, the read port of the PREFETCHABLE FIFO has some specific signals not present in the read port of ASYNCHRONOUS FIFO.

Therefore, to fully describe the interfacing aspects it is enough to describe read operations at read port of PREFETCHABLE FIFO (connected to PERIPHERAL FIFO READ PORT) and write operation at write port of ASYNCHRONOUS FIFO (connected to PERIPHERAL FIFO WRITE PORT).

In read operation, when the signal RD_POPWORD_$B_{R1}$ (coming from CTRL_SEL2FRP(G) group of signals) is asserted at the read port and the PREFETCHABLE FIFO CONTROLLER executes the pop operation, as a consequence the read datum RD_RDDATA$_{R1}$ validated by the RD_RDDATA_STR_$B_{R1}$ is placed on its bus and collected to RD_DATA_FRP[31:0] inside PERIPHERAL FIFO READ PORT. Block PREFETCHABLE FIFO CONTROLLER manages both reading and writing address pointers of the PREFETCHABLE FIFO in order to implement a circular buffer. Moreover the PREFETCHABLE FIFO CONTROLLER calculates the maximum possible burst length starting from current pointers position before the FIFO becomes empty, then it checks if the maximum possible burst length is greater than the RDPTL_FILLING_STATUS, if it is so the returned value is saturated at the RDPTL_FILLING_STATUS value, otherwise not, in both cases the final value becomes the filling status indicator RD_NWORD_AVAIL$_{R1}$[3:0] managed by the protocol governing the distributed interface. Each clock cycles the signal RD_QUERY_B$_{R1}$ is asserted. RD_NWORD_AVAIL$_{R1}$[3:0] is recalculated to reflect current situation and outputted towards the PERIPHERAL FIFO READ PORT validated with the signal RD_STR_B$_{R1}$. Internally to PERIPHERAL FIFO READ PORT the RD_NWORD_AVAIL$_{R1}$[3:0] is mapped to FS_FRP[3:0], which, on its turn, packed into proper message is sent from the PERIPHERAL COMMON BUS CONTROLLER to the main DMI MAIN via Control-Status-leaf2root sub-bus of the COMMON-BUS. The block DMI MAIN, basing on said filling status information, regulates the read burst (ending it exactly when RD_NWORD_AVAIL$_{R1}$[3:0] reaches zero and RD_EMPTY$_{R1}$ is asserted) in accordance with the COMMON BUS PROTOCOL that will be described later on. Other signals RD_FLUSH_B$_{R1}$ (originating from CTRL_SEL2FRP(G) group of signals), RD_CLEAR_B$_{R1}$ (originating from CTRL_SEL2FRP(G) group of signals) and RD_NWORD2FLUSH$_{R1}$[3:0] (originating from FLUSH[3:0] bus) are managed via the COMMON BUS PROTOCOL to allows not destructive read operation of the PREFETCHABLE FIFO; this will be explained in details when, after having described the COMMON BUS PROTOCOL, the internal architecture and operation of PREFETCHABLE FIFO will be introduced.

As previously said for readings, the following description is valid for write port of both SYNCHRONOUS FIFO and ASYNCHRONOUS FIFO, when write port is connected to PERIPHERAL FIFO WRITE PORT.

In write operation, when the signal WR_PUSHWORD_B$_{W2}$ (coming from CTRL_SEL2FWP(G) group of signals) is asserted at the write port a valid write datum WR_WRDATA$_{W2}$[31:0] (coming from WRDATA2LAYERS[31:0] bus) is placed on its bus and the ASYNCHRONOUS FIFO CONTROLLER executes the push operation (the write datum is pushed into the FIFO). Block ASYNCHRONOUS FIFO CONTROLLER manages, in a known way, both reading and writing address pointers of the FIFO in order to implement a circular buffer. The two pointers are sent to the block FILLING STATUS CALCULATOR which calculates the maximum possible burst length starting from current pointers position before the FIFO becomes full, then it checks if the maximum possible burst length is greater than the RDPTL_FILLING_STATUS, if it is so the returned value is saturated at the RDPTL_FILLING_STATUS value, otherwise not, in both cases the final value becomes the filling status indicator WR_NWORD_AVAIL$_{W2}$[3:0] managed by the protocol governing the distributed interface. Each clock cycles the signal WR_QUERY_B$_{W2}$ is asserted. WR_NWORD_AVAIL$_{W2}$[3:0] is recalculated to reflect current situation and outputted towards the PERIPHERAL FIFO WRITE PORT validated with the signal WR_STR_B$_{W2}$. Internally to PERIPHERAL FIFO WRITE PORT the WR_NWORD_AVAIL$_{W2}$[3:0] is mapped to FS_FWP[3:0], which, on its turn, packed into proper message is sent from the PERIPHERAL COMMON BUS CONTROLLER to the main DMI MAIN via Control-Status-leaf2root sub-bus of the COMMON-BUS. The block DMI MAIN, basing on said filling status information, regulates the write burst (ending it exactly when WR_NWORD_AVAIL$_{W2}$[3:0] reaches zero and WR_FULL is asserted) in accordance with the COMMON BUS PROTOCOL that will be described later on.

Connecting both write port of PREFETCHABLE FIFO and read port of SYNCHRONOUS FIFO or ASYNCHRONOUS FIFO to respectively the dashed blocks APPLI WF and APPLI RF, the operation still remains that described above with minor differences. The main difference is that commands WR_PUSHWORD_B$_{W1}$ and RD_POPWORD_B$_{R2}$ have to be generated by blocks APPLI WF and APPLI RF.

At the same time, all tasks that are not application specific, as the generation of flags and filling levels (RD_EMPTY$_{R2}$, RD_RDTH$_{R2}$, RD_NWORD_AVAIL$_{R2}$[3:0], WR_FULL$_{W1}$, WR_WRTH$_{W1}$, and WR_NWORD_AVAIL$_{W1}$[3:0]) allowing the user MACRO-CELL LOGIC to monitor and control the port to which the Macro-cell itself is connected, are offered as a "service" by both blocks TOPFIFO HOST MODULE and DOWNFIFO HOST MODULE. The user is free to select among the offered signal the preferred to implement the port control.

With reference to FIG. 24, FIG. 25, FIG. 26, FIG. 27 and FIG. 28, the blocks REGBLOCK and REGBLOCK SYNCHRONIZER of FIG. 19, FIG. 20, and FIG. 21 are detailed concerning, for sake of simplicity, two couples of paired blocks only, namely COMMAND REGISTER, COMMAND REGISTER SYNCHRONIZER and STATUS REGISTER, STATUS REGISTER SYNCHRONIZER. Analogue arguments and conclusions are still valid for the remaining coupled blocks in FIG. 18. The aim is that to outline some advantages in synchronization, intrinsically due to the specific MAIN/PERIPHERALs architecture of the distributed interface subject of the invention, in the task of interfacing different clock domains. A first great advantage evident at glance in FIGS. 18 to 23 is that user macro-cells are totally discharged from the embedding of any gender of synchronization circuitry. This is a further goal in the direction to obtain bare macro-cells deprived of any interfacing jobs. Peripheral blocks DMI PERIPHERALs benefit by a second architectural advantage in synchronization, that is the devolution of this task to specialized blocks interposed between macro-cells and the DMI PERIPHERALs (synchronization excluded), that is REGBLOCK SYNCHRONIZER and the various controllers embedded in blocks FIFOBLOCK and MEMBLOCK. The advantage is particularly significant in transactions with registers because in the dual port memories, either RAMs or FIFOs (dual port based), the operations at the two sides are already independent, as in the known art, and automatically grant synchronization. Arguments concerning synchronization are exposed starting with describing the circuits of FIG. 24 and FIG. 25 but not their operation. Follows the description of a particular synchronization unit P2P shown in FIG. 26 and its operation with reference to FIG. 27; then the operation of the circuits of FIG. 24 and FIG. 25, both embedding P2P units. At the end, with reference to FIG. 28, the overview of synchronization is considered for a write burst transaction from block DMI MAIN and a stack of registers embedded in block REGBLOCK of a DMI PERIPHERAL and devoted to different applications in the complex of macro-cells.

Figure 24:
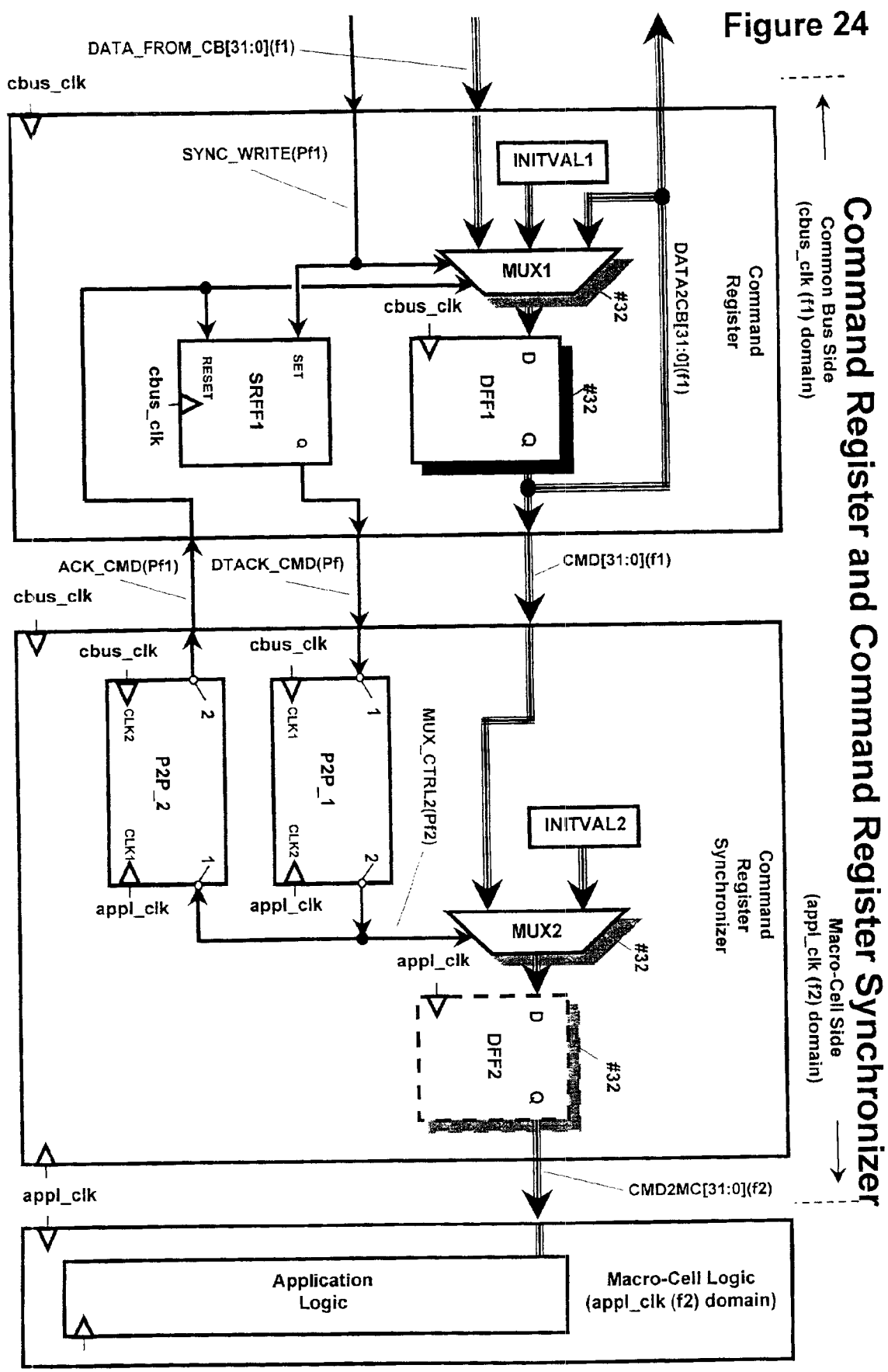
FIG. 24 shows a detailed description of paired blocks COMMAND REGISTER and COMMAND REGISTER SYNCHRONIZER of FIG. 19.

With reference to FIG. 24 the cascade of blocks COMMAND REGISTER, COMMAND REGISTER SYNCHRONIZER, and MACRO-CELL of FIG. 19 is detailed. Both the COMMAND REGISTER and the COMMAND REGISTER SYNCHRONIZER. The first block includes a block INITVAL1, a three-way multiplexer MUX1, a D-type flip-flop DFF1, and a set-reset edge-triggered flip-flop SRFF1. The second block includes a block INITVAL2, a two-way multiplexer MUX2, a second D-type flip-flop DFF2 (which in reality is an optional block), and two identical synchronization circuits P2P_1 and P2P_

2. The user MACRO-CELL block includes an APPLICATION LOGIC sub-block, in turn included in the MACRO CELL LOGIC block. The shadowy blocks MUX1, MUX2, DFF1 and DFF2 have multiplicity of 32 (meaning of symbol #32), as many as the bits of the commands bus CMD2MC[31:0](f2).

Circuits P2P_1 and P2P_2 are identical units, both have a first clock input pin CLK1 at the side of a signal input pin 1, and a second clock input pin CLK2 at the side of a signal output pin 2. The clock cbus_clk reaches pin CLK1 of P2P_1 unit, pin CLK2 of P2P_2 unit, and the clock input of both flip-flops DFF1 and SRFF1. The clock appl_clk reaches pin CLK2 of P2P_1 unit, pin CLK1 of P2P_2 unit, the clock input of flip-flop DFF2, sub-block APPLICATION LOGIC, and block MACRO-CELL LOGIC of the user MACRO-CELL.

A First input of multiplexer MUX1 is connected to the output Q of DFF1. The block INITVAL1 is connected to a second input of multiplexer MUX1, whose third input is reached from a data bus indicated as DATA_FROM_CB[31:0](f1) carrying data from the COMMON-BUS of FIG. 19 (via the PERIPHERAL COMMON BUS CONTROLLER block). One of the selection input of multiplexer MUX1 is reached from a strobe signal SYNC_WRITE (Pf1), while the other is reached from a signal ACK_CMD (Pf1) outputted from pin 2 SOUT of the block P2P_2 of COMMAND REGISTER SYNCHRONIZER. The output of multiplexer MUX1 is connected to the D input of flip-flop DFF1 which outputs data DATA2CB[31:0](f1).

The block INITVAL2 is connected to a first input of multiplexer MUX2, whose second input is reached from the data from the DFF1 flip-flop, renamed CMD[31:0](f1). The selection input of multiplexer MUX2 is respectively connected to pin 2 of P2P_1 unit and pin 1 of P2P_2 unit. The output of multiplexer MUX2 is connected to the D input of flip-flop DFF2 which outputs synchronized data CMD2MC[31:0](f2) directed to the sub-block APPLICATION LOGIC inside the block MACRO-CELL LOGIC of the user MACRO-CELL.

The strobe SYNC_WRITE(Pf1) is generated by the block PERIPHERAL COMMON BUS CONTROLLER which executes commands sent on the COMMON-BUS. This strobe reaches the set input of the SRFF1 flip-flop. On its turn the Q output signal of SRFF1 flip-flop renamed DTACK_CMD(Pf1) is outputted towards pin1 of P2P_1 unit.

Figure 25:
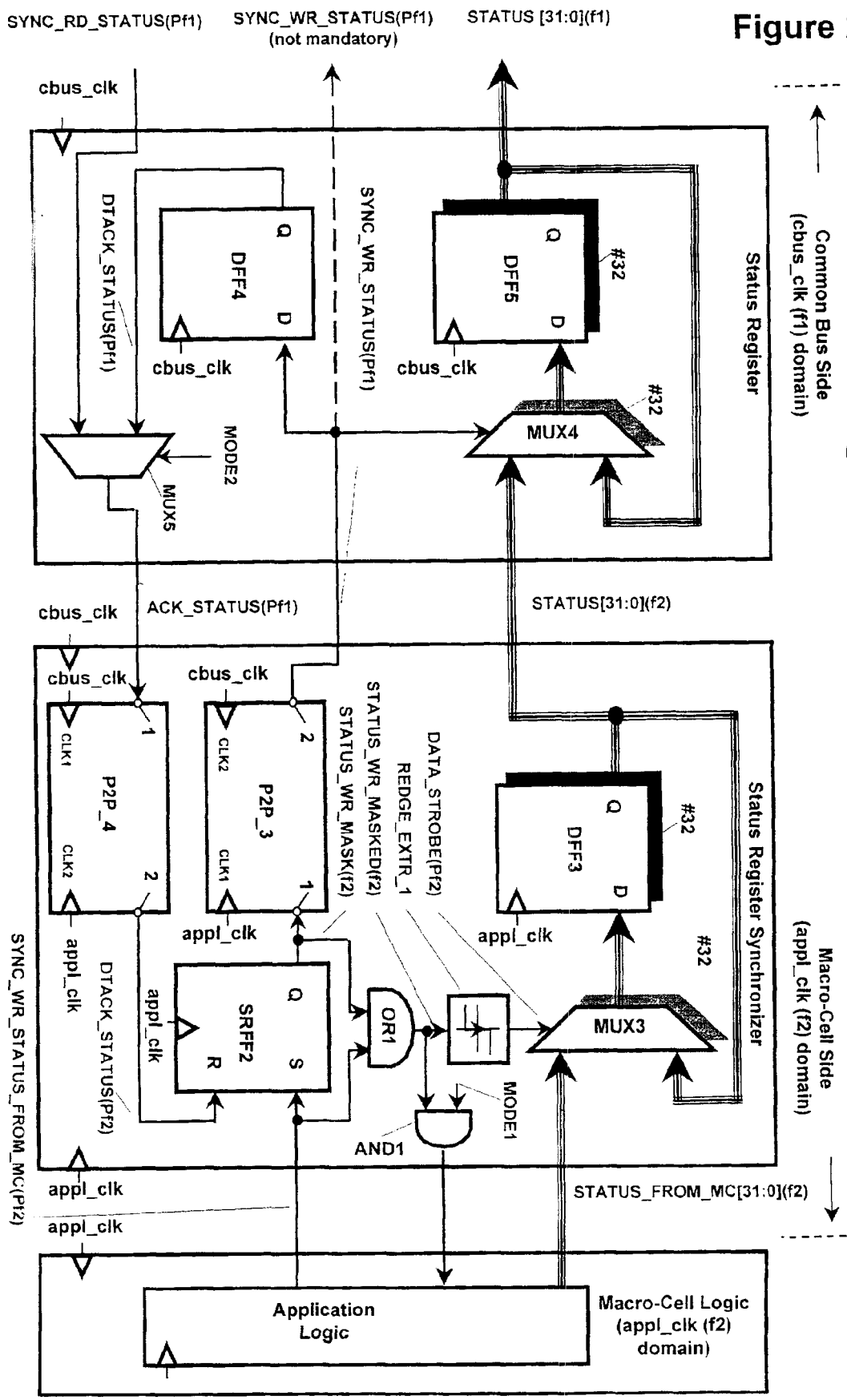
FIG. 25 shows a detailed description of paired blocks STATUS REGISTER and STATUS REGISTER SYNCHRONIZER of FIG. 19.

With reference to FIG. 25 the cascade of blocks STATUS REGISTER, STATUS REGISTER SYNCHRONIZER, and MACRO-CELL of FIG. 19 is detailed. The block STATUS REGISTER SYNCHRONIZER includes: one two-way multiplexer MUX3; one D-type flip-flops DFF3; one Set-Reset edge triggered flip-flop SRFF2; two synchronization units P2P_3 and P2P_4 equal to the units P2P_1 and P2P_2 of FIG. 24; one two input OR gate OR1; one two input AND gate AND1; and one rising edge detector REDGE_EXTR_1. The block STATUS REGISTER includes two two-way multiplexers MUX4 and MUX5 and two D-type flip-flops DFF4 and DFF5.

The shadowy blocks MUX3, MUX4, DFF3, and DFF5 have multiplicity of 32 (meaning of symbol #32), as many as the bits of the status bus STATUS_FROM_MC[31:0] (f2).

Clock appl_clk reaches the clock input of flip-flops DFF3 and SRFF2, pin CLK1 of P2P_3 unit, and pin CLK2 of P2P_4 unit. Clock cbus_clk reaches the clock input of flip-flops DFF4 and DFF5, pin CLK1 of P2P_4 unit, and pin CLK2 of P2P_3 unit.

Considering the side of the STATUS REGISTER SYNCHRONIZER towards MACRO-CELL, a first input of multiplexer MUX3 is connected to sub-block APPLICATION LOGIC inside the block MACRO-CELL LOGIC of the user MACRO-CELL, through a Point-to-Point-Bus carrying a status word named STATUS_FROM_MC[31:0] (f2). The second input of multiplexer MUX3 is connected to the output Q of flip-flop DFF3. The selection input of multiplexer MUX3 is reached from a strobe signal DATA_STROBE(Pf2) outputted by the rising edge detector REDGE_EXTR_1. The output of multiplexer MUX3 is connected to the D input of flip-flop DFF3, the latter outputs a status word named STATUS[31:0](f2). A strobe signal named SYNC_WR_STATUS_FROM_MC(Pf2) is outputted from the MACRO-CELL LOGIC block towards the Set input of SRFF2 flip-flop, and to one input of the gate OR1. The SRFF2 flip-flop generates at the output Q a signal STATUS_WR_MASK(f2) directed to the input pin 1 of block P2P_3 and to the other input of gate OR1. Gate OR1 generates a signal named STATUS_WR_MASKED(f2) reaching the input of the detector REDGE_EXTR_1 and one input of the gate AND1. The other input of gate AND1 is reached from a bit MODE1 which controls the outputting of the signal STATUS_WR_MASKED(f2) towards the APPLICATION LOGIC block inside MACRO-CELL LOGIC. The Reset input of SRFF2 flip-flop is reached from a signal DTACK_STATUS(Pf2) outputted from the synchronization unit P2P_4.

Considering the side of the STATUS REGISTER SYNCHRONIZER towards the STATUS REGISTER, the status word STATUS[31:0](f2) reaches a first input of multiplexer MUX4, a strobe signal SYNC_WR_STATUS(Pf1) outputted from pin 2 of the P2P_3 unit reaches the input D of the flip-flop DFF4 and select input of multiplexer MUX4; optionally this strobe signal crosses the Status Register block and is forwarded to the remaining interface. In the opposite direction a strobe signal named ACK_STATUS_(Pf1) outputted from multiplexer MUX5 reach the input pin 1 of the P2P_4 unit. Inside the Status Register block the output of multiplexer MUX4 is connected to the input D of flip-flop DFF5; at the output Q of this flip-flop a re-synchronized status word STATUS[31:0](f1) is present to be directed towards the second input of multiplexer MUX4 and to the PERIPHERAL COMMON BUS CONTROLLER of FIG. 19.

Considering the side of the STATUS REGISTER towards the PERIPHERAL COMMON BUS CONTROLLER, besides the above signals directed upward, a downward strobe signal SYNC_RD_STATUS(Pf1) reaches one input of the MUX5 multiplexer, whose other input is connected to the output Q of DFF4 flip-flop.

Figure 26:
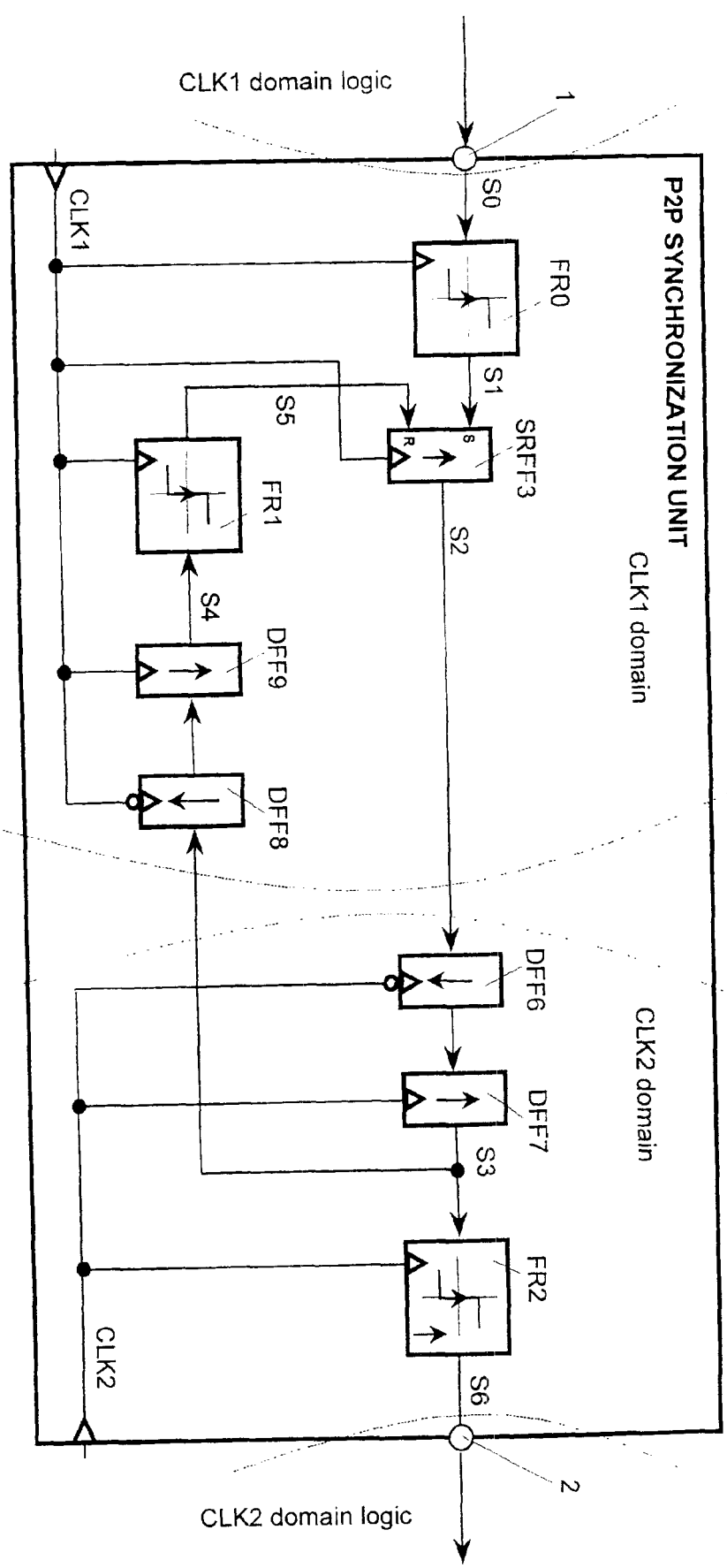
FIG. 26 shows a detailed description of synchronization block P2P of FIGS. 24 and 25.

With reference to FIG. 26 we see in detail a synchronization unit P2P which, in turn, may be assimilate to the units P2P_1 to P2P_4 indifferently. The unit P2P is the subject matter of a separate invention developed in the laboratories of the same Applicant by the same inventors. Further developments claims disclose the implementation of a Command Register Synchronizer and a Status Register Synchronizer like those depicted in FIGS. 24 and 25 of the present distributed interface invention. Application for the preceding invention titled "TWO CLOCK DOMAIN PULSE TO PULSE SYNCHRONIZER", has been filed with the number "PCT/IT/00/00153". As visible in the preceding FIG. 24 and FIG. 25 at both left-hand side and right-hand side of a generic P2P block a different clock input is present. Precisely, at left-hand side the CLK1 input pin is present, while at right-hand side the CLK2 input pin is present. These pins are one-to-one associated with clocks CLK1 and CLK2 in the description, but clocks cbus_clk and appl_clk can be exchanged at the two inputs.

All memory devices of P2P units are realized with D-type flip-flops plus logic gates. Even if other solutions are possible, this ensures the feasibility of said P2P circuit with every component library available on the market. Moreover, each memory device in FIG. 26 has a small arrow sketched inside. The arrow direction indicates the sensitivity of the memory device either to the rising (up arrow direction) or falling (down arrow direction) clock edge. The use on both clock edges (rising and falling) has a positive impact regarding the time spent in the synchronization process, but is also possible to use only one active edge of clock. Regarding the use of the clock falling edge is useful to point out that, in general component library make available only memory devices sensitive to the clock rising edge. The simplest solution to obtain a memory device sensitive to the clock falling edge is to negate the clock by an inverter and to provide this negated clock to a memory device sensitive to the clock rising edge. The use of an inverter to negate clock do not introduce skew problems (also in an ASIC device) is the number of memory device to be supplied is low.

The circuit is split into two clock domains, namely CLK1 domain and CLK2 domain. Each domain is further characterized into a logic domain outside the unit P2P, the acronyms P2P means pulse to pulse.

The CLK2 domain includes a cascade of two type-D flip-flop DFF6 and DFF7, and a rising edge detector FR2. The CLK1 domain includes: a rising edge detector FR0, a set-reset flip-flop SRFF3 (edge triggered), a cascade of two type-D flip-flop DFF8 and DFF9, and a rising edge detector FR1. All elements of the CLK1 domains clocked with the rising edge of the clock CLK1, except flip-flop DFF8 clocked with the falling edge. All elements of the CLK2 domain are clocked with the rising edge of the clock CLK2, except flip-flop DFF6 clocked with the falling edge.

The input of the rising edge detector FR0 is connected to the input pin 1 for receiving the input signal Sin, indicated as S0 internally to the block P2P. The set input of flip-flop SRFF1 is connected to the output of the rising edge detector FR0 for receiving a signal S1. Starting from the output of SRFF3 flip-flop a signal S2 reaches the input of flip-flop DFF6. At the output of the flip-flop DFF7 there is a signal S3 directed to both the input of front detector FR2 and flip-flop DFF8. At the output of DFF9 flip-flop a signal S4 is directed to the input of front detector FR1, whose output signal S5 reaches the reset input of the SRFF3 flip-flop. At the output of front detector FR2 a signal S6 is outputted via an output pin 2 of P2P unit associated with clock CLK2.

Now the working principle of P2P synchronization unit of FIG. 26 is explained. The property of this circuit is to transform any kind of signal either of level or pulse type inputted at pin 1 associated to CLK1 clock into a pulse outputted from a pin 2 associated to clock CLK2. The handshake that is necessary to the synchronization, implied by the communication between two asynchronous clock domains, is resolved internally. The operation of the circuit of FIG. 26 is described with reference to the FIG. 27.

Figure 27:
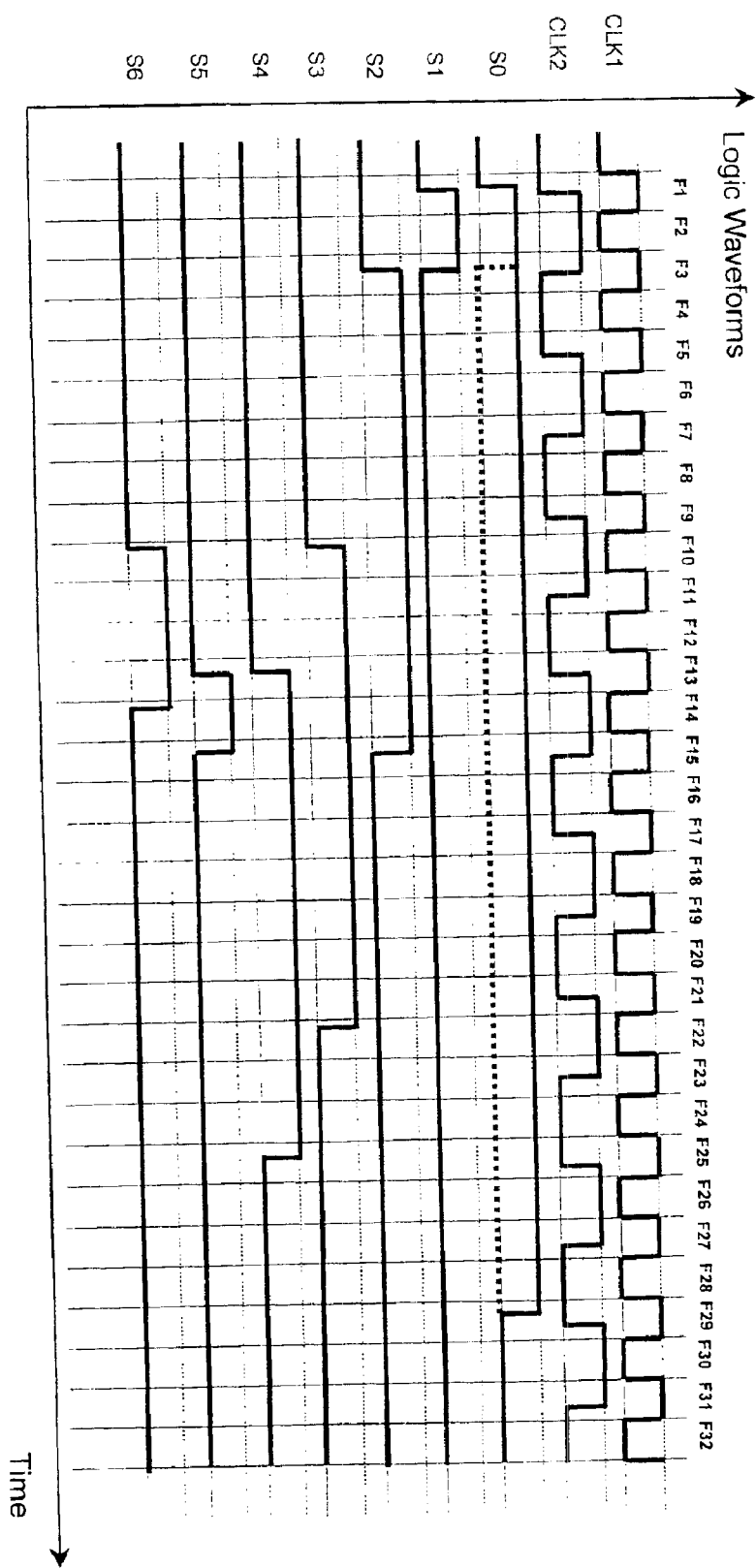
FIG. 27 shows some temporal wave-shapes concerning the operation of synchronization block P2P of FIG. 26.

In FIG. 27 the wave-shapes of signals CLK1, CLK2, S0, S1, S2, S3, S4, S5 and S6 are shown. Time is divided into frames from F1 to F32 where each frame represents half period of the speediest clock CLK1. Either a pulse (sketched with dotted line) or a step (sketched with continues line) signal S0 is provided to the input of rising edge detector FR0. In any case the output of rising edge detector FR0 is a pulse S1 provided to set input of flip-flop SRFF3. Said pulse is asserted in frames from F1 to F3 in Figure. Flip-flop SRFF3 samples the asserted pulse signal S1 with rising edge of CLK1 at time frame F2. As a consequence, flip-flop SRFF3 switches and during F3 signal S2 is asserted. Since now, signal S2 is kept asserted and is not possible for any signal belonging to the clock domain CLK1 to negate it. The signal S2 is then transmitted to the second clock domain CLK2. In the clock domain CLK2 a first double sampling (with CLK2 clock) occurs to recover from metastability. In particular, to avoid metastability without wasting two clock pulses the solution of double sampling with opposite clock phases is selected, but as said before a more traditional solution using two flip-flops sensitive to the same edge is possible. This grants that at the output of DFF7 the signal S3 does not assume illegal values. The duration of the active phase of signal S2 is the key-factor to grant correct communication between the two clock domains. In fact, if the duration of signal S2 would be less than two CLK2 cycles, nevertheless to the double sampling, communication between the signal S2 and S3 may be unreliable. In fact, if the transition zero to one of flip-flop SRFF3 would happen in the setup-hold window of flip-flop DFF6, the output this flip-flop shall assume an illegal value (a value not recognized by logic devices) with a certain probability. Due to the double sampling, the output of the second flip-flop DFF7 shall assume in any case a legal logic value (either zero or one) but the theory of metastability does not grant us that the recognized value is the correct one. The theory of metastability only ensures that the recognized value is a legal logic value and hence does not cause metastability in logic devices in which is inputted. By the way of an example, the recognized signal S3 could be zero even if signal S2 has switched from zero to one. Hence, if signal S2 were a pulse the information carried by signal S2 could be lost. To avoid this loose of information the signal S2 must be kept stable. Stability allows flip-flop DFF6 to perform more than one single sampling. In this way flip-flop DFF6 has the opportunity of sampling a stable signal S2. This is granted by the SRFF3 flip-flop. Then the signal S3, which is a step signal activating in time frame F10, is inputted into the front detector FR2. This front detector is able to extract a pulse associated with the clock CLK2 from a step signal associated to the same clock. Then the output of front detector FR2, which is the signal S6, is sent to the output pin 2. The signal S6 is a pulse (asserted from time frame F10 to the beginning of time frame F14) associated to clock CLK2 whose length is one clock period. At the same time signal S3 is sent back to the CLK1 domain. It is inputted to the series of flip-flops constituted by DFF8 and DFF9 that are charged to recover from metastability. Than the output of flip-flop DFF9, which is the signal S4 is inputted to the front detector FR1. The operation of the series of devices DFF8, DFF9 and FR1 is the same to that of devices DFF6, DFF7 and FR2. Also the boundary conditions are the same: signal S3 as S4 is a step signal and signal S5 as S6 is a pulse signal. The signal S4 is asserted during time frame F13. Thus the output of the front detector FR1 is a pulse associated to clock CLK1 of one period of clock CLK1 duration (from F13 to F15). This signal is named S5 is asserted together with signal S4 at cycle c13 due to the front detector FR1. The signal S5 is inputted to the reset pin of flip-flop SRFF3 resetting this flip-flop. As a consequence signal S2 is negated (at time frame F15) and all the circuit comes back to initial conditions. This means that after signal S2 is negated, also signals S3 and S4 are negated, respectively at time frames F22 (at the beginning) and F25. The loop of devices SRFF3, DFF6, DFF7, DFF8, DFF9 and FR1 back to SRFF3 grants that signal S2 is negated after its effect has been felt by device FR2. This ensures reliable communication between signals S1 and S6.

Now, the operation of both the blocks COMMAND REGISTER and COMMAND REGISTER SYNCHRONIZER is explained with reference to FIG. 24.

In the operation the function of block INITVAL1 is to provide a fixed pattern of logic one and logic zero to the input of multiplexer MUX1. This pattern is the hardwired binary translation of a parameter set before the synthesis phase as an initialization value for the Command Register. The same is valid for block INITVAL2. Moreover blocks INITVAL1 and INITVAL2 exhibit the same pattern. Each bit of the Command Register represents an independent command. Thus, when the EXTERNAL-BUS AGENT wants to write a command to a specific bit of the Command Register, it writes into the REGBLOCK layer, at the address of the specified Command Register, a bit of opposite value with respect to the corresponding one (the one which has the same position in the word) hard-wired into blocks INITVAL1 and INITVAL2. As an example if bit N of both blocks INITVAL1 and INITVAL2 is 0, than the command expressed from bit N is active high (the opposite of the one hard-wired into bit N). To activate the bit N of the Command Register the EXTERNAL-BUS AGENT writes a 1 into bit N of the Command Register itself. The remaining bits are written to the same value hard-wired into blocks INITVAL1 and INITVAL2. The same argument is still valid if more than one bit of the Command Register have to be activated. They can be activated simultaneously. The written word is sent onto DATA_FROM_CB[31:0](f1) bus. This word is coupled with a strobe pulse SYNC_WRITE(Pf1) sent onto a separate wire. Both DATA_FROM_CB[31:0](f1) and SYNC_WRITE(Pf1) are associated to clock cbus_clk at frequency f1 and phase PH1, moreover, while DATA_FROM_CB[31:0](f1) is a level signal, SYNC_WRITE (Pf1) is a pulse signal. This pulse set the SRFF1 flip-flop which assert the DTACK_CMD(Pf1) signal. At the same time the SYNC_WRITE(Pf1) causes the multiplexer MUX1 to switch from the idle position selecting INITVAL1 to the selection of the input signal DATA_FROM_CB [31:0](f1). As a consequence, the flip-flop DFF1 samples the value sent from the EXTERNAL-BUS AGENT and as a last result the bit N on CMD[31:0](f1) bus switches from 0 to 1. At the same time the pulse SYNC_WRITE(Pf1) set the SRFF1 flip-flop which assert the DTACK_CMD(Pf1) signal switches to active level. This event is coupled to the outputting of the command CMD[31:0](f1). The duration of SYNC_WRITE(Pf1) is one clock pulse of cbus_clk, after one clock pulse it is negated and the multiplexer MUX1 holds the output of DFF1. More precisely, the selection logic of the multiplexer MUX1 holds the output of DFF1 when both SYNC_WRITE(Pf1) and ACK_CMD(Pf1) are negated; when ACK_CMD(Pf1) is asserted MUX1 selects the INITVAL1 input; when SYNC_WRITE(Pf1) is asserted MUX1 selects the input connected to DATA_FROM_CB [31:0](f1). At this point the command on bit N has been provided. This command is synchronous with clock cbus_clk with frequency f1 and phase PH1. Now, the rest of operations differ, depending on the block to which the Command Register is interfaced. Two cases arise.

First one is when the Command Register is directly connected to a user macro-cell. In this case being a command an event information (a change of a status) and not a status (as a configuration), the presence of a valid command is evident by itself to the application (it does not need a strobe). In this case the signals DTACK_CMD(Pf1) and ACK_CMD(Pf1) are used to set command duration. The user which wants one clock pulse command duration simply short circuit signals DTACK_CMD(Pf1) and ACK_CMD (Pf1). If two clock pulses command duration is required a D type Flip-Flop is interposed between the two control signals and so on. The duration has not been set by parameters set before the synthesis phase because is a parameter that the user, in a few cases, may also change after the synthesis phase.

A second use of these two control signals is when the Command Register is connected to its dedicated Synchronization Unit lodged in the REGBLOCK SYNCHRONIZER module and is the present case. In this second case, the pulse carried by DTACK_CMD(Pf1) is sent to the input pin 1 of the P2P_1 unit. This block translates the signal at frequency f1 and phase PH1 associated to the clock cbus_clk into a pulse at frequency f2 and phase PH2 associated to the clock appl_clk. This last pulse is outputted from the output pin 2 of the P2P_1 unit and renamed MUX_CTRL2 (Pf2), the last signal drives the selector on multiplexer MUX2. As a consequence the multiplexer MUX2 switches from its idle position selecting block INITVAL2 to the selection of the input CMD[31:0](f1) data pattern. The contents of CMD[31:0](f1) are delivered to flip-flop DFF2 to be sampled with appl_clk clock (with frequency f2 and phase PH2). This sampling cannot lead DFF2 flip-flop into a metastable state because into the setup/hold window centered across the rising edge of appl_clk, the signals composing CMD[31:0](f1) are all stable. This happens because when DTACK_CMD(Pf1) signal is asserted all bits of the bus CMD[31:0](f1) are stable; on its turn this happens because the output of flip-flop DFF1 is stable until SYNC_WRITE(Pf1) and ACK_CMD(Pf1) signals are negated. The pulse outputted by output pin 2 of P2P_1 unit is granted to be successive with respect to the assertion of incoming DTACK_CMD(Pf1) signal driving input 1 of P2P_1 unit (this derive from the preceding explanation of the working principle of P2P unit). By this reason, being the selection pin of multiplexer MUX2 driven by this signal, when the multiplexer MUX2 switches its input, data CMD[31:0](f1) is stable. The signal MUX_CTRL2(Pf2) is both present at the output pin 2 of P2P_1 unit and the input pin 1 of P2P_2 unit. As a consequence at the output pin 2 of P2P_2 unit a pulse is generated [successive to the assertion of DTACK_CMD(Pf1)] that constitutes the signal ACK_CMD(Pf1). The pulse ACK_CMD(Pf1) which is synchronous to clock cbus_clk at frequency f1 and phase PH1 causes the multiplexer MUX2 to switch to the input connected to block INITVAL1. As a consequence the flip-flop DFF1 samples the hard-wired pattern INITVAL1 and the idle condition is recovered. This means that bit N switch from 1 to 0 which is the idle value set by the hard-wired pattern INITVAL1. Regarding the flip-flop DFF2 it is useful to point out that it is optional. His presence de-couples the user MACRO-CELL LOGIC from the presence of delays depending on the propagation delay inside multiplexer MUX2 (both input to output and selector to output). The presence of flip-flop DFF2 is a matter of implementation.

Now the operation of both the blocks STATUS REGISTER and STATUS REGISTER SYNCHRONIZER is explained with reference to FIG. 25. When the APPLICATION LOGIC block of the user MACRO-CELL decides to transfer a status word, it put the datum STATUS_FROM_MC[31:0](f2) on the relative Point-to-Point-Bus and asserts the strobe SYNC_WR_STATUS_FROM_MC(Pf2) (supposed active at high logic value) held for a period of appl_clk clock. The strobe goes through both the gate OR1 and the rising edge detector REDGE_EXTR_1 at whose output becomes the control signal DATA_STROBE(Pf2) asserted for one appl_clk clock pulse. The involved operations are all combinatorial, so the status word STATUS_FROM_MC[31:0](f2) is near simultaneous with the control strobe DATA_STROBE(Pf2). The latter signal causes the switching of the multiplexer MUX3 from the hold position, in which continuously read the datum at the output of DFF3 flip-flop, to the position of capture where it reads the status word STATUS_FROM_MC[31:0](f2). The successive clock period the output Q of Set-Reset flip-flop SRFF2 is fixed at logic 1 by the preceding set carried out from strobe SYNC_WR_STATUS_FROM_MC(Pf2). Logic 1 at the input of gate OR1 holds the output STATUS_WR_MASKED(f2) high whatever happens on the input strobe SYNC_WR_STATUS_FROM_MC(Pf2). That means the APPLICATION LOGIC block of the user MACRO-CELL no more can write a new status word until the signal STATUS_WR_MASKED(f2) is high. So the latter signal can be intended like a semaphore for enabling the APPLICATION LOGIC block to write the status and consequently it has been sent backward to the user MACRO-CELL. This feature is application-dependent, in a way explained later, so it is governed by means of the bit MODE1. The APPLICATION LOGIC block observes this signal and writes a status word only if enabled to do it. The step signal STATUS_WR_MASK(f2) enters the P2P_3 synchronization unit to be transformed into a pulse SYNC_WR_STATUS(Pf1) one period of cbus_clk clock long. The latter enables the switching of multiplexer MUX4 to capture the status word STATUS_FROM_MC[31:0](f2) previously memorized at the output of DFF3 flip-flop and named STATUS[31:0](f2). The successive cbus_clk clock period the strobe SYNC_WR_STATUS(Pf1) goes low switching the multiplexer MUX4 to the hold position in which it goes on reading the datum at the output of DFF5 flip-flop. At this point of time the status word STATUS[31:0](f1) is available on the internal bus connecting block REGBLOCK to the PERIPHERAL COMMON BUS CONTROLLER until the datum is transferred on COMMON-BUS to be read. The strobe signal SYNC_WR_STATUS(Pf1) is forwarded for accompanying the status word, this is an optional features being the block REGBLOCK slave the strobe information is unnecessary to the master. The remaining blocks DFF4 ad MUX5, together with the configuration signal MODE2, allows two different application-dependent operating modalities, said for convenience: "Write on Read" and "Updating Status".

Considering the first one, until the EXTERNAL-BUS AGENT does not decide to read a status word, for its own will depending on high level application programs, the preceding status STATUS[31:0](f1) remains stable indefinitely and the write of a possible new state from user MACRO-CELL is prevented. When the EXTERNAL BUS AGENT wants to read the latched status STATUS[31:0](f1) it initiates a chain of events crossing the various levels of the DMI interface for a double purpose: first to have the latched status word backward on the EXTERNAL-BUS and second to allow the MACRO-CELL to write a new status. For the last purpose the downwards flow of events is EXTERNAL BUS AGENT→EXTERNAL-BUS→DMI MAIN→COMMON-BUS→PERIPHERAL COMMON BUS CONTROLLER (of the addressed DMI PERIPHERAL hosting the layer REGBLOCK)→internal bus of the leaf→INPUT DEMUX (embedded in the selected layer REGBLOCK)→current Status Register addressed (one out of 32 registers of layer REGBLOCK)→associated STATUS REGISTER SYNCHRONIZER→Point-to-Point-Bus to which the user MACRO-CELL is connected (only if the signal STATUS_WR_MASKED(f2) is provided to the MACRO-CELL). The final events represented in FIG. 25 are started from the block INPUT DEMUX of FIG. 18 that generates the reading strobe SYNC_RD_STATUS(Pf1) when it decodes the address of the Status Register concerned the reading transaction. The reading strobe SYNC_RD_STATUS(Pf1) is selected at the output of multiplexer MUX5 by the control signal MODE2 (whose meaning will be explained later on) and sent to the input of P2P_4 synchronization unit (as ACK_STATUS(Pf1)) which extracts at its output the pulse DTACK_STATUS(Pf2) a period of appl_clck clock long. This pulse resets the SRFF2 flip-flop making a new status word possible to write by the APPLICATION LOGIC inside the user MACRO-CELL.

Considering the second operating modality named "Updating status", it can be noticed that the writing strobe SYNC_WR_STATUS(Pf1) is sampled by flip-flop DFF4, obtaining a sampled write strobe signal DTACK_STATUS(Pf1) which is outputted from the multiplexer MUX5 and forwarded to the Synchronizer block for resetting the SRFF2 flip-flop. This puts the multiplexer with hold MUX3/DFF3 back on updating condition and frees the block on the status writings. On the contrary of the "Write on Read" modality, in the "Updating status" modality the reading strobe SYNC_RD_STATUS(Pf1) is unnecessary and the status word STATUS[31:0](f1) at the output of DFF5 flip-flop is the latest written one.

The choice between the two operating modalities of the Status Register block is discussed examining two exemplifying scenarios concerning the not limiting example of FIG. 9:

1. The status is the counting of the number of packets processed until current time now from the relevant user Macro-cell and its utility is for statistics and/or monitoring purposes.
2. The status detects the type of error that has happened. The case in which errors taken place in burst is considered.

In the case 1) the updated datum is better than the first written one, so the MODE2 configuration signal shall select the strobe DTACK_STATUS(Pf1).

In the case 2) is useful to know the originating cause of the error, that is the first written datum; so the MODE2 configuration signal shall select the strobe SYNC_RD_STATUS(Pf1).

In selecting one of the two operating modalities 1) and 2) by properly setting signal MODE2 has to be taken in account the interfacing with the APPLICATION LOGIC resulting from the setting of signal MODE1:

a) MODE1 set to 1 allows the forwarding of STATUS_WR_MASKED(f2) signal towards the user Macro-cell. The APPLICATION LOGIC block looks at this signal and writes a status word only when it is enabled to do it.
b) MODE1 set to 0 prevents the forwarding of the signal STATUS_WR_MASKED(f2) which is only used internally to the Synchronizer block to filtering/preventing the writing attempts of the APPLICATION LOGIC block without the Application knowing that.

In the outlined cases 1) and 2) both the solutions a) and b) are equivalent. Other cases may arise in which the modality-b) could be dangerous for the simple fact that the Application, convinced to have forwarded its status word, can definitively cancel it when in reality the latched status was a preceding one.

FIG. 25 shows a full hardware method to execute the implementation choices bound to the signal MODE1. Another method is that not providing multiplexer MUX5 and configuring (with VHDL GENERICS and GENERATE statements) flip-flop DFF4 connections in the synthesis process of the DMI PERIPHERAL. When the application context is that of case 1) the output of DFF4 flip-flop is synthesized directly connected to pin 1 of P2P_4 unit and the external reading strobe SYNC_RD_STATUS(Pf1) is not considered. The contrary happens in the case 2); in this case flip-flop DFF4 is not provided and the reading strobe SYNC_RD_STATUS(Pf1) reaches the pin 1 of P2P_4 unit directly. An alternative method (firmware/software only) to manage both cases 1) and 2) is that to effect a double reading of the status word: if case 1) is considered, then the first word is kept and the second discharged, the contrary is true if the case 2) applies.

Considering now the synchronization process from a higher point of view, it is evident by the characteristic operation mode of P2P unit and its specific use inside the REGBLOCK SYNCHRONIZER, that some clock cycles are spent in the communication between the two clock domains. This does not prevent the main block DMI MAIN from performing burst when addressing prefetchable resources of register type. Bursts involving the same register (fixed address) have no meaning, not even in case of polled interrupts. On the contrary bursts involving more registers are meaningful. For instance, if the EXTERNAL BUS AGENT wants to configure a macro-cell, likely it will write more than one CONFIGURATION REGISTER. In the same way, being burst transfers more efficient than single access, if the EXTERNAL BUS AGENT wants to monitor the status of a macro-cell, likely it will read more than one STATUS REGISTER. In both cases the access take place in pipeline, thus the synchronization processes between the different couples register/user macro-cell connected to it will not interfere each other.

Figure 28:
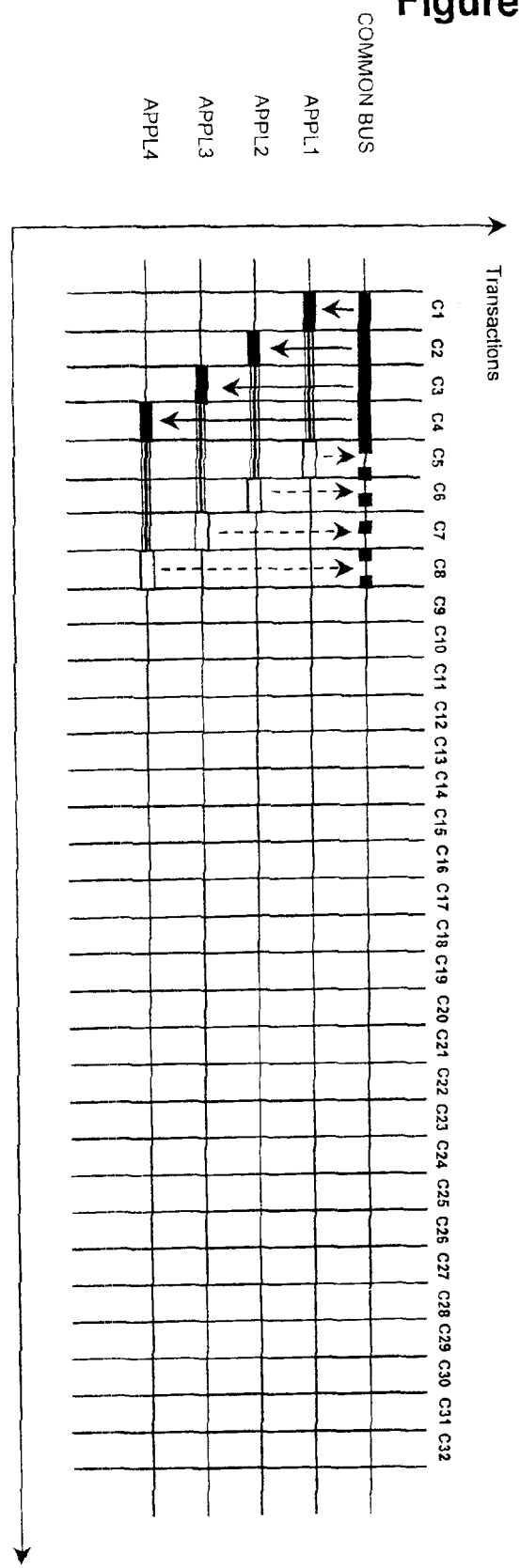
FIG. 28 shows a time diagram of the synchronization operation carried out by means of synchronization block P2P of FIG. 26.

This is shown in FIG. 28 where five symbolic waveshapes are sketched over a time grid divided in 32 cycles each cycle representing a clock cycle of the clock cbus_clk. The represented symbolic wave-shapes are COMMON-BUS, APPL1, APPL2, APPL3 and APPL4. COMMON-BUS is the COMMON-BUS of the invention while, APPL1, APPL2, APPL3 and APPL4 represent the synchronization process taking place between the register dedicated to application i and its register synchronizer, for i spanning from 1 to 4. In Figure, the triple line represents the time spent in synchronization. The continuous line referred to the COMMON-BUS symbolic wave-shape represents "data on COMMON-BUS" while the dotted line referred to the COMMON-BUS represents "no data on COMMON-BUS". The black continuous line lasting for a cycle referred to APPLi represents the event "data associated to cbus_clk available to register" while the gray continuous line lasting for a cycle referred to APPLi represents the event "data associated to appl_clk available to application". The black continuous arrow referred to APPLi represents the event "start of synchronization phase between register and register synchronizer" and the black dashed arrow referred to APPLi represent the event "end of synchronization phase between register and register synchronizer".

In overall operation on the COMMON-BUS are sent 4 data (from cycle c1 to cycle c4). First datum is sent to register dedicated to application 1 (cycle c1), second datum is sent to register dedicated to application 2 (cycle c2), third datum is sent to register dedicated to application 3 (cycle c3) while fourth datum is sent to register dedicated to application 4 (cycle 4). The synchronization for first datum starts at cycle c1 and ends at cycle c5. The synchronization for second datum starts at cycle c2 and ends at cycle c6. The synchronization for third datum starts at cycle c3 and ends at cycle c7. The synchronization for fourth datum starts at cycle c4 and ends at cycle c8. As we can see from figure all these synchronization process take place in parallel and by this reason do not interfere each other. In this way continuous burst (no wait states) involving registers can be supported even if the synchronization phase last for more than one clock cycle.

Now a protocol governing transactions through the COMMON-BUS is disclosed. This protocol will be named COMMON BUS PROTOCOL. The explanation starts with reference to FIG. 29 for introducing basic transactions. FIG. 29, which in turn refers to the previous FIG. 12 and FIG. 13 for COMMON-BUS wiring detail, differs from FIG. 13 mainly for the presence of an EXTERNAL BUS AGENT block connected to the main block DMI MAIN, through the EXTERNAL-BUS, and for the indication of three user macro-cells. Said three macro-cells are user MACRO-CELL A, user MACRO-CELL B, and user MACRO-CELL C, respectively connected to peripheral blocks DMI PERIPHERAL1, DMI PERIPHERAL2, and DMI PERIPHERAL3 of the distributed interface, via three Point-to-Point-Buses. In FIG. 29 Read/Write directions on both EXTERNAL-BUS and COMMON-BUS are indicated by arrows, respectively for the cases of block DMI MAIN master or slave.

Further arrows indicate the directions of Interrupts and Request/Grant transactions A block named EXTERNAL ARBITER represents another difference, with respect to FIG. 13. This block is the arbiter regulating competition for the EXTERNAL-BUS among device connected to it. Each device connected to the EXTERNAL-BUS sends to the EXTERNAL ARBITER an EB_REQUEST signal. When asserted this signal indicates the will of the sender device to become master of the EXTERNAL-BUS. On its turn, the EXTERNAL ARBITER sends, to each device connected to the EXTERNAL-BUS, an EB_GRANT signal. When asserted this signal indicates that the receiving device is granted to become master of the EXTERNAL-BUS. If the EXTERNAL ARBITER has selected the EBA to become master of the EXTRENAL-BUS the EB_GRANT_ACK signal (indicating that the EBA has become master of the EXTERNAL-BUS) is asserted. The described one is the so-called centralized arbitration. Other kinds of arbitration exist, like the so-called daisy chain; in any case, whatever the selected arbitration type, the situation is equivalent. The COMMON BUS PROTOCOL will be explained with reference to this embodiment.

Every transaction between blocks EXTERNAL-BUS AGENT and a selected DMI PERIPHERAL, or vice versa, is decomposed in the following two concurrent transactions:

EXTERNAL BUS AGENT TRANSACTION

This transaction, governed from the EXTERNAL BUS AGENT PROTOCOL, either transfers data from the block EXTERNAL BUS AGENT to the block DMI MAIN or vice versa. The EXTERNAL BUS AGENT PROTOCOL is not an object of the present invention and by this reason is not discussed here, nevertheless is useful to point out that this protocol is activated by embedding a proper EXTERNAL BUS SEQUENCER block into main block DMI MAIN detailed in FIG. 14. In the following some general and non limiting assumptions about the EXTERNAL BUS AGENT PROTOCOL to allow a very precise description of the protocol governing the COMMON-BUS.

COMMON BUS TRANSACTION

This transaction, governed from the COMMON BUS PROTOCOL, either transfers data from the block DMI MAIN to the selected DMI PERIPHERAL or vice versa. This transaction is composed by the following phases: command phases, for sending commands; address phases for the selection of a block DMI PERIPHERAL and an embedded resource; and data phases for the transfer of data from/to a selected block DMI PERIPHERAL. The COMMON BUS PROTOCOL governs both the COMMON BUS TRANSACTIONS and the bridging between the COMMON BUS and the sequencer charged of interfacing the EXTERNAL-BUS (EXTERNAL BUS SEQUENCER, see FIG. 14).

A third transaction, that can be considered part of the COMMON BUS TRANSACTION, takes place; this transaction is executed between the DMI PERIPHERAL and the user macro-cell connected to it. This transaction takes place on a Point-to-Point-Bus connecting a DMI PERIPHERAL to a user macro-cell; by this reason it is named POINT2POINT TRANSACTION. This transaction is a transfer of data either from user macro-cell to a block DMI PERIPHERAL (REGBLCK/FIFOBLOCK/MEMBLOCK) or from a block DMI PERIPHERAL (REGBLCK/FIFOBLOCK/MEMBLOCK) to user macro-cell. As already stated, both blocks TOPFIFO HOST MODULE and DOWNFIFO HOST MODULE are considered a part of FIFOBLOCK while the MEMORY HOST MODULE is considered a part of MEMBLOCK. Thus, with reference to FIG. 22, this transaction takes place on the Point-to-Point-Bus connecting READ/WRITE PORT B to user macro-cell. With reference to FIG. 23 the POINT2POINT TRANSACTION takes place either on the Point-to-Point-Bus between the WRITE PORT of TOPFIFO HOST MODULE and the user MACRO-CELL A or on the Point-to-Point-Bus between the READ PORT of DOWNFIFO HOST MODULE and the user MACRO-CELL B. Regarding the REGBLOCK, POINT2POINT TRANSACTION takes place on the Point-to-Point-Buses towards user macro-cells. If the REGBLCK SYNCHRONIZER is used in combination with the REGBLOCK, as in FIG. 19, with POINT2POINT TRANSACTION is referred the transaction between the REGBLOCK SYNCHRONIZER and the user macro-cell. The POINT2POINT TRANSACTION is de-coupled with respect to both EXTERNAL-BUS AGENT TRANSACTION and COMMON BUS TRANSACTION from and ordering point of view, taking only care that read and write cannot take place simultaneously on the same resources. Memories in FIG. 22 are read/written from the READ/WRITE PORT A in an independent way with respect to the accesses performed from the user MACRO-CELL A that is connected to READ/WRITE PORT B. In FIG. 23 the READ PORT of TOPFIFO HOST MODULE is read in an independent way with respect to the accesses performed from the user MACRO-CELL A that is connected to the WRITE PORT. The WRITE PORT of DOWNFIFO HOST MODULE is written in an independent way with respect to the accesses performed from the user MACRO-CELL B that is connected to the READ PORT. Registers of FIG. 18 and FIG. 19 are read in an independent way with respect to the accesses performed from the user macro-cell that is connected via Point-to-Point-Buses. When a register is read due to a transaction on COMMON-BUS, the value stored into the register is read, no matter when it has been written from application. The only exception to this rule is represented by write transactions involving registers in which, a write to a register performed from the COMMON-BUS side, depending on the kind of involved register, may cause a specific signal to the user macro-cell advising that the register value is changed.

Concerning master of slave status of blocks EXTERNAL-BUS AGENT and DMI MAIN, we refer to the previous illustration of FIG. 29 and to a TABLE A3 reported in the APPENDIX A.

First row of TABLE A3 means that when the distributed microprocessor interface DMI is of master type, that is, is able to initiate a transaction, the transaction requester can be a resource embedded into a block DMI PERIPHERAL. The main block DMI MAIN initiates a transaction as a consequence of the Transaction Request TR issued by an application via the peripheral block DMI PERIPHERAL charged to that application. The only type of operation allowed is a read, executed by main DMI MAIN, from the resource embedded into the block DMI PERIPHERAL that requested the transaction. Than main DMI MAIN catches the read data, carried by the COMMON-BUS, and transfers them to the block EXTERNAL BUS AGENT. Even if the transaction requester is a block DMI PERIPHERAL, the main DMI MAIN still remains the master of the transaction issued on the COMMON-BUS because the data exchanged on the COMMON-BUS is ever controlled by block DMI MAIN. Moreover it translates the read transaction from the block DMI PRERIPHERAL which takes place on the COMMON-BUS, into a write transaction to the block EXTERNAL BUS AGENT which takes place on the EXTERNAL-BUS. Letter D in FIG. 29 indicates the equivalent arrow's case.

Second row of TABLE A3 means that, even when the distributed microprocessor interface DMI is of master type (this means able to initiate a transaction), the transaction requester can be the block EXTERNAL BUS AGENT and the ability of the distributed microprocessor interface DMI of becoming master is not exercised. In this case the block EXTERNAL BUS AGENT becomes master and can initiate either a write or a read transaction with main DMI MAIN. The final goal of said transaction is either to write to resource embedded into a block DMI PERIPHERAL, or to read from a resource embedded into a block DMI PERIPHERAL. In this second case the main block DMI MAIN translates the read transaction issued from the block EXTERNAL BUS AGENT to a read transaction issued to a peripheral block DMI PERIPHERAL via the COMMON-BUS. Letter A in FIG. 29 indicates the equivalent arrow's case. In case of a write transaction the main block DMI MAIN translates the write transaction issued from the block EXTERNAL BUS AGENT to a write transaction issued to a peripheral block DMI PRERIPHERAL via the COMMON-BUS. Letter B in FIG. 29 indicates the equivalent arrow's case.

Third row of TABLE A3 means that when the distributed microprocessor interface DMI is of slave type, that is, is not able to initiate a transaction, the transaction requester can only be the EXTERNAL BUS AGENT. The mimic of operations is equal to that in the second row of TABLE A3 when the transaction initiator is the block EXTERNAL BUS AGENT.

As specified above, in the DMI, every transaction between blocks EXTERNAL BUS AGENT and a selected DMI PERIPHERAL, or vice versa, is decomposed in the following two transactions: EXTERNAL BUS AGENT TRANSACTION and the COMMON BUS TRANSACTION. The EXTERNAL BUS AGENT TRANSACTION, obeying to the EXTERNAL BUS AGENT PROTOCOL is not an object of the present invention and its protocol is taken into account in the DMI by embedding a proper EXTERNAL BUS SEQUENCER block into main block DMI MAIN. This subject should not be further investigated, but for the sake of precision and the clarity and completeness of the proposed embodiment of the invention same general principles of the "so called" information technology bus protocols and some examples taken from the real world are presented. This will enable the definition of a reference stream protocol to be used as EXTERNAL BUS AGENT PROTOCOL with the purpose of illustrating in a precise way the working of the DMI. This does not limit the field of application of the DMI but only permits to appreciate how the COMMON BUS PROTOCOL interacts with the protocol running on the EXTERNAL-BUS.

In the next a protocol is assumed to be set of signals and their mimic. A bus is defined as a shared media to which devices access in parallel. The bus is used to control (data transfer), select/identify (devices and/or resources embedded into devices) and connect (for data exchange) devices connected to its. Taking in account these functions buses are generally structured in sub buses: control bus, address bus and data bus. A device is an agent connected to the bus with the ability of exchanging data with other agents.

Devices can be classified in Master Device and Slave Device. Master Device is a device that can initiate transactions with other devices connected to the bus, that is can become master of the bus. Only one master device at a time can be master of the bus. Slave Device or Target Device is a device that can only acknowledge to transactions initiated by other devices connected to the bus. More devices at a time can be slaves.

The devices connected to the bus has to be identified, this is done by means of their address. The selection/identification of a device connected to the bus is based on a specific bit configurations set on an address bus; this bit configuration is said the address of that device; this kind of identification is closely related to the bus topology. The use of addresses is typical of information technology area. Addresses are used as identifiers in almost all bus topology connectable devices: microprocessors, micro-controllers and standard bus interfaces. Examples are Motorola 68000 family of microprocessor and micro-controllers and PCI and VME standard buses.

In general a communication protocol between devices connected to a bus embeds three basic phases named Arbitration phase, Address/Commands phase and Data phase. During the Arbitration phase master devices which want to initiate transactions compete for the mastership of the bus. Generally an arbiter device basing on requests and priority selects a master device to become the master of the bus. During the Address/Commands phase the slave (target of transaction) is selected by the master (the initiator of transaction) using its address (which is put on the address bus) and commands specifying the operation to execute (either read or write) are set to the target slave (putting them on the command bus). During the Data phase data are exchanged (via data bus) between the master and the slave. A data phase is referred as the exchange of a single datum.

The arbitration phase always come before other phases that can instead be assembled/sequenced in different ways. In microprocessor buses the address/command phases and the data phases are executed in parallel; this means that when an agent wants to write a datum to another agent it address that agent, send the write command and send the datum to write. In standard buses a wide spectrum of solutions are implemented. The VME bus uses the same method of microprocessor buses while the PCI bus issue a single address/command phase which is followed by a sequence of data phases. In the case of PCI a specific policy of implicit address increment is declared in the address/command phase. For instance, if a linear increment is declared, the target knows that the first datum has to be associated to the address ADDR0 (the one sent during the address/command phase) while the second datum has to be associated to the address ADDR0+1 and so on.

Now is possible to define concept of transaction basing on the phases described above. A transaction is referred as an address/command phase plus one or more data phases. Depending on the number of contained data phases, transactions can be classified in single transfer transactions (single transfer protocols) and multiple transfer transactions (burst transfer protocols). In a Single Transfer Protocol only a single datum can be transferred in each transaction and more transaction cannot be contiguous. As a consequence the resulting data flow is characterized by single data spaced by pauses of transmission. This is common of most families of microprocessor and micro-controllers (DMA mode and multiple outstanding instruction cases are not considered);

In the second case we have a burst data transfer protocol. A Burst Transfer Protocol satisfies to at least one of these conditions: more than one datum can be transferred in each transaction; transactions can be contiguous. In both cases the resulting data flow is continuous without pauses of transmission. Burst transfers are obviously more efficient with respect to single transfers in terms of bus use. Examples are PCI and VME standard buses. A data transfer that is realized in this last way is named stream. Stream data flows are characterized by continuous or spaced (data with pauses of transmission) without any further formatting. In stream protocols, in general, the end of message cannot be established in advance with respect to the end of transmission. These protocols are mainly used in the information technology area. From the point of view of data formatting many other kinds of protocols exist: Packet/Cell protocols and Frame protocols are higher level protocols largely used in the communication area. They are very powerful but on the other hands the complex is data formatting and greater is the overhead to manage it, this is the reason of the success of stream technique in low level application.

To summarize what explained up to now, the basic transaction structure for microprocessors, VME bus and PCI bus is shown in the next. The Microprocessors basic transaction structure is: 1×(address/command phase//data phase). The VME bus basic transaction structure is: N×(address/command phase+data phase). Finally the PCI bus basic transaction structure is: address/command phase+N×(data phase). What stated regarding microprocessors is true when DMA mode and multiple outstanding instruction are not considered. In reality modern microprocessors are incorporating very efficient solution like the possibility of having multiple outstanding instructions.

Once defined what information is exchanged it remains to understand how/when the exchange happens. These problems affect to the synchronization of protocols.

From the point of view of synchronization, protocols can be classified in synchronous and asynchronous. In synchronous protocols data are sent in known positions with respect to a protocol specific time frame. The time frame is built referring to a specific synchronization signal. So a receiver knows when a particular datum has to be expected from a transmitter and vice-versa. In this case no synchronization process is needed. An example of this is the PCM-TDM (Pulse Code Modulation-Time Division Multiplex) technique used in the communication area. In asynchronous protocols data are not sent in known positions with respect to a protocol specific time frame. An example of this in the communication area is the ATM technique. In the information technology area the most used asynchronous protocol is the two phase handshake.

The two phase handshake is both a communication protocol and synchronization technique. This protocol and its derivatives are largely used in microprocessors and standard bus interfaces. Its minimal implementation is based on a couple of signals. For a generic handshake these signals are DS and DTACK; their meaning is described in APPENDIX A, TABLE A4.

Figure 30:
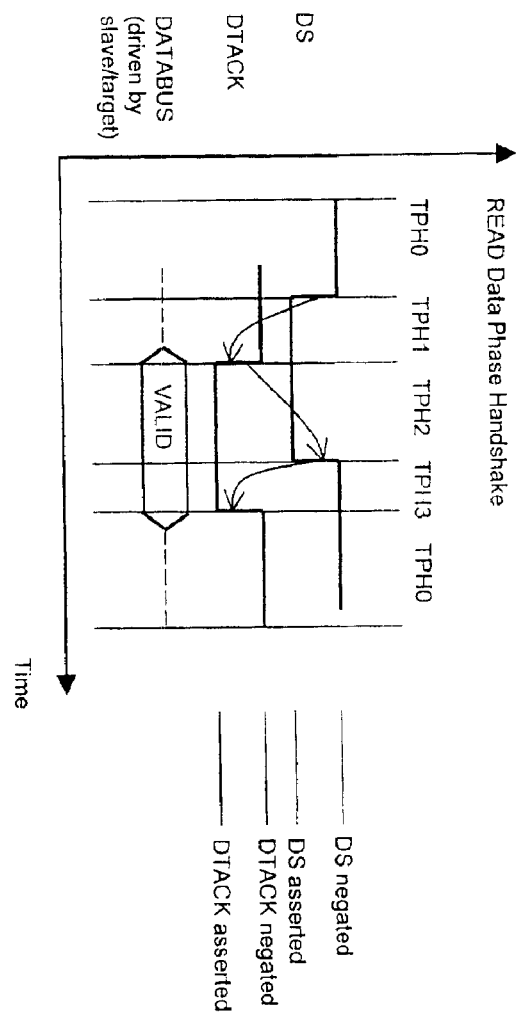
FIGS. 30 and 31 shows an example, typical of microprocessor bus, of asynchronous two phases handshake in both read and write operations.

To see how this protocol is used is interesting to discuss some examples taken from real application. In the described examples also RD_WRN signal and DATABUS and ADDRBUS buses are used; these signals/buses are not part of the two phase handshake, on the contrary are slaved to it. In these examples the use of the protocol in data phase is shown; moreover we will refer to the exchange of a single datum. In FIG. 30 a typical data phase handshake for a read transaction of a microprocessor is shown. The signals involved in the handshake are two: DS (Data Strobe) driven by the microprocessor (master) and DTACK (DaTa ACKnowledge) drive by a slave/target device that interfaces the microprocessor. In a read transaction the data bus is driven by the slave/target. At the beginning the bus is idle. Then the slave/target device is addressed (a valid ADDRESS is put onto the bus by the master), RD_WRN is set to one (by the master) and the read command issued (by the master). Then the master asserts the signal DS to indicate that it is ready to receive the datum. The slave/target recognizes the assertion of DS and, as soon as it can, prepare the datum. Then a valid datum is put (by the slave/target) on the data bus and to signal this the signal DTACK is asserted (by the slave/target). As the master recognizes the assertion of DTACK it uses DTACK to strobe the valid datum, then it negates DS to indicate that the datum has been catch. As soon as the slave/target recognizes the negation of DS it also negate DTACK and valid data are no more present on data bus.

Figure 31:
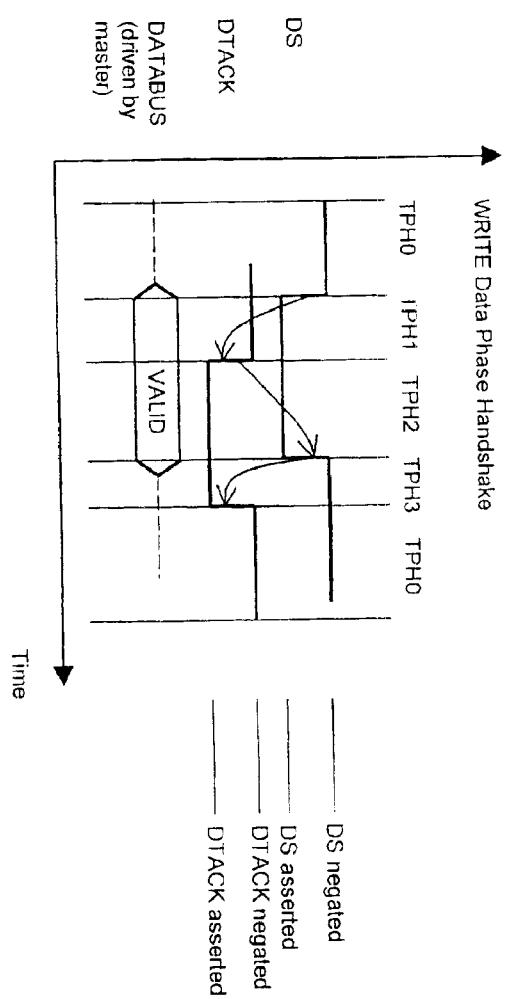

A typical data phase handshake for a write transaction is shown in FIG. 31. Signals involved in the handshake are the same: DS (Data Strobe) driven by the microprocessor (master) and DTACK (DaTa ACKnowledge) drive by a slave/target device that interfaces the microprocessor. In a write the master drives transaction data bus. At the beginning the bus is idle. Then the slave/target device is addressed the master puts a valid ADDRESS onto the bus, RD_WRN is set to zero (by the master) and the write command issued (by the master). Then the master put a valid datum on the data bus and asserts the signal DS to indicate this. As the slave/target recognizes the assertion of DS it uses DS to strobe the valid datum, then it assert DTACK to indicate that the datum has been caught. As soon as the master recognizes the assertion of DTACK it negate DS and valid data are no more present on data bus. When the slave/target recognizes the negation of DS it also negate DTACK.

Can be seen that these protocols are asynchronous because when in a read operation the master waits for the datum from the slave/target it do not know how long it will be wait for the valid datum.

Regarding the interface between agents (the bus) at electrical signal level a choice must be done between synchronous and asynchronous interface. It is the concept of synchronicity of interfaces. This concept of synchronicity differs with the one explained above. From the point of view of synchronization at electrical signal level, interfaces can be either synchronous or asynchronous. In synchronous interfaces exists a clock signal synchronizing all the operations: signals are meaningful only at clock active edges. As a consequence the protocol phases are divided into clock cycles and the atomic operation lasts a clock cycle. Examples are Motorola 68000 family of microprocessor and micro-controllers (synchronous interface mode) and PCI and VME standard buses.

On the contrary, in asynchronous interfaces does not exist a clock signal synchronizing all the operations. All signals are meaningful at any instant of time. As a consequence the protocol is divided in phases identified by different configurations of the whole set of control signals. Examples are Motorola 68000 family of microprocessor and micro-controllers (when asynchronous interface mode is used).

In industrial device every combination of synchronous and asynchronous protocol with either synchronous or asynchronous interfaces can be found. For instance the PCI bus implement an enhanced version of the two phases handshake with synchronous interface. Basically two signals are involved the TRDY (terminator ready) and IRDY (initiator ready). The initiator (the master) assert the IRDY signal when in a write operation (the initiator writes into the terminator) it has put a stable datum onto the bus or in a read operation (the initiator reads data from the terminator) it has caught the datum onto the bus. The terminator (the slave) assert the TRDY signal when in a write operation (the initiator writes into the terminator) it has caught the datum onto the bus or in a read operation (the initiator reads data from the terminator) it has put a stable datum onto the bus. The IRDY and TRDY signals are meaningful only at the rising edge of the clock.

To highlight some further problems involved with communication between agents must be taken in account that when an agent wants to exchange data with another agent it actually exchange data with a resource embedded into that agent.

A resource is a piece of hardware, embedded into an agent, which can be read and/or written. From the addressing point of view a resource can represent a single address (a register or a fifo) or a multiple address (a memory). As a consequence an agent, from the addressing point of view, can represent a span of addresses. Resources are characterized by two parameters called latency and delay. Let's suppose that an agent requires some data to a resource embedded into another agent.

The time elapsed from the first data request to the delivery of the first datum is the latency of the resource in case of read (in these example all the other elements involved has been assumed to have zero latency). The time elapsed from the first write request to its acknowledge is the latency of the resource in case of write. Latency of a certain resource can be predictable and fixed or not predictable. As an example a read register or the read port of a memory are ever ready for operation and have fixed latency which depends both on their physical hardware implementation and on the way they are interfaced. Other kinds of resources, like fifos, do not have predicable latency. A fifo is not readable (writeable) when is empty (full); to read it, it is necessary to wait for a data (for a empty place for a data). That kind of resources have fixed latency when are ready for operation; when they are not ready the latency can be not predictable.

The delay (in case of read) is the time elapsed between the two data corresponding to two adjacent data requests. The delay (in case of write) is the time elapsed between the two acknowledges corresponding to two adjacent write requests. Moreover, when resources are embedded into an agent, an overall latency of communication arises; this parameter depends on the coupling between the resource and the agent. The same is true for the delay.

A last important property of resources takes in account for the side effects of operations performed on them. A certain resource can support a specific operation (for instance read or write) either with or without side effect. The most common side effect considered is the integrity of data on which said operation is performed. For instance a resource can either supports destructive read or not destructive read. In general registers and memories support not destructive read; it means that such a resource is read a copy of the read datum is still present into the resource after the read operation. On the contrary fifos do not support not destructive read (they support destructive read); it means that when a fifo is read the read datum is no more present into the fifo after the read operation. In general commonly used resources do not support not destructive write.

This important property reflects on agents embedding resources. Let's consider two agents A and B involved in a transaction on a bus. In general when the agent A write a datum to agent B, as soon as the handshake for the data phase is terminated B owns the datum and A has not more a copy of it. In the same way, when the agent A read a datum from the agent B, as soon as the handshake for the data phase is terminated A owns the datum and B has no more a copy of it.

Taking in account what said about latency and side effects resources can be further classified into prefetchable and not prefetchable. This classification usually applies to resources with respect to the read operation. As an example, if I want to read a burst of data from a certain resource to optimize the transfer I can perform a so called "anticipative read" fetching each datum in advance with respect to the request of the agent requesting the datum (the so called "prefetch"). The prefetch, and as a consequence the anticipative read, is only possible if the interfaced resources can be prefetched. A resource can be prefetched in a reliable mode if and only if it supports not destructive read. In fact let's suppose that I perform an anticipative read of N data (prefetching N single datum from the resource) and the agent requesting data stops after having read M data with M<N. In this case, if the interfaced resource is not prefetchable, N–M data are lost. By this gender of considerations, in literature, a resource is defined prefetchable if it supports not destructive read, not prefetchable otherwise. Obviously registers and memories are prefetchable while fifo are not. In literature is not present any definition about the prefetchability of a resource with respect to the write operation. If it were, this definition should consider the possibility of prefetching the room for writing data. For the present invention the concept of prefetchability of a resource with respect to the write operation is intended as the possibility of verifying the room for writing data in advance with respect to the completion of all the write requests performed by the agent requesting the write. This technique could be named "write space prefetch". Regarding the concept of prefetch must be specified that some authors consider the prefetch as the possibility of accessing a datum (in read) or the room for a datum (in write) with fixed latency. They separate the concept of side effect of a certain operation onto a resource from the concept of prefetch. For them a resource is prefetchable if can be accessed with fixed latency and not prefetchable if the latency is not predictable. In the text we will use the first definition, which means accessibility with no side effect on read, which is the most diffused.

A final aspect of IT stream protocols very important for efficiency is the handling of the termination of transactions. As an example, an agent (master) wants to read (write) a datum from (to) a fifo embedded in another agent (target) it has to deal with the availability of the datum (availability of the room for the datum). So when it try to read a datum not only it do not know how long it will wait for the datum but it do not know if a datum will be available in the end. In the same manner when it try to write a datum it not only do not know how long it will wait for the room to write the datum but it do not know if some room will be available in the end. For instance let's consider a microprocessor (asynchronous protocol) with an asynchronous interface coupled to a not prefetchable resource. The microprocessor starts a transaction and if the not prefetchable resource is not ready it does not reply (do not assert DTACK) to the request (DS) and the transaction is terminated by the microprocessor by timeout. The timeout method has low bus efficiency; by this reason the verification of data availability is managed in more sophisticated way in PCI (which is burst transfer oriented).

In PCI bus the basic two phase handshake in the data phase is enhanced adding some further signals which have the same mimic of the basic two way handshake ones but carry information about the availability of data (availability of room for data) at the addressed resource. By this reason in PCI bus the transaction termination, which is the way to terminate a transaction, is managed in a very efficient way with respect to the timeout method.

In PCI bus both, the initiator (master) and the target (slave) of the transaction can terminate the transaction and insert wait-states in a burst transaction. The target (slave) initiated terminations are Disconnect (with or without data), Retry and Target Abort.

The Disconnect means end after current data phase. Data can be transferred (disconnect with data) or not (disconnect without data). It can occur at any time during a transaction. Examples of disconnect cause: a target may recognize that the next transfer "steps" out of its own address space boundary; a slow target may permit more efficient access to the pci bus while it prepares for the next data phase.

The Retry means end after current data phase. Data is not transferred. Retry transaction later. It can only occur at the first data phase. Examples of retry cause: a target is accessed for read and data are unavailable for read; a target is accessed for write and is full. The Target Abort means end after current phase (address/command or data) because of a fatal error. Data is not transferred. Examples of abort cause: an error condition happens in the target for which no number of retries will produce a successful response.

The master initiated termination is named Master Abort. Master Abort means end after current phase (address/command or data) because of a fatal error. Data is not transferred. A master abort takes place when a transaction to not a existent or disabled device is attempted. In this case the master will never observe the target assertion of the signal DEVSEL. Master abort also happens, in a read transaction, when the delay for data, in the first data phase, exceeds a certain limit. Moreover it happens, in a read transaction, when the delay for data in one of the successive data phases exceeds a certain limit.

The object of this invention is not the standard bus connected to the DMI MAIN. Nevertheless some of the peculiarity of the protocols of the DMI are evident when a stream data flow is applied from the external bus. Moreover, the DMI can be adapted at low cost (plug-in module) to different standard of external bus. By the reasons above, instead of supposing a particular standard bus as external bus, an external bus embedding the most qualifying point of current information technology buses is defined. This bus will allow us to highlight the most important property and advantages of the DMI protocol. The protocol of the EXTERNAL BUS will be named EXTERNAL BUS PROTOCOL.

This bus is synchronous from the point of view of interface, implement an asynchronous handshake protocol based on the two phase handshake, support bursts, its basic transaction structure is N×(address/command phase//data phase). Moreover, from the point of view of termination management, it supports the same features of PCI. To be more general no multiplexing between data and addresses is supposed. Depending on which is the master, either the EBA or the DMI ROOT, two situations arises.

Figure 32:
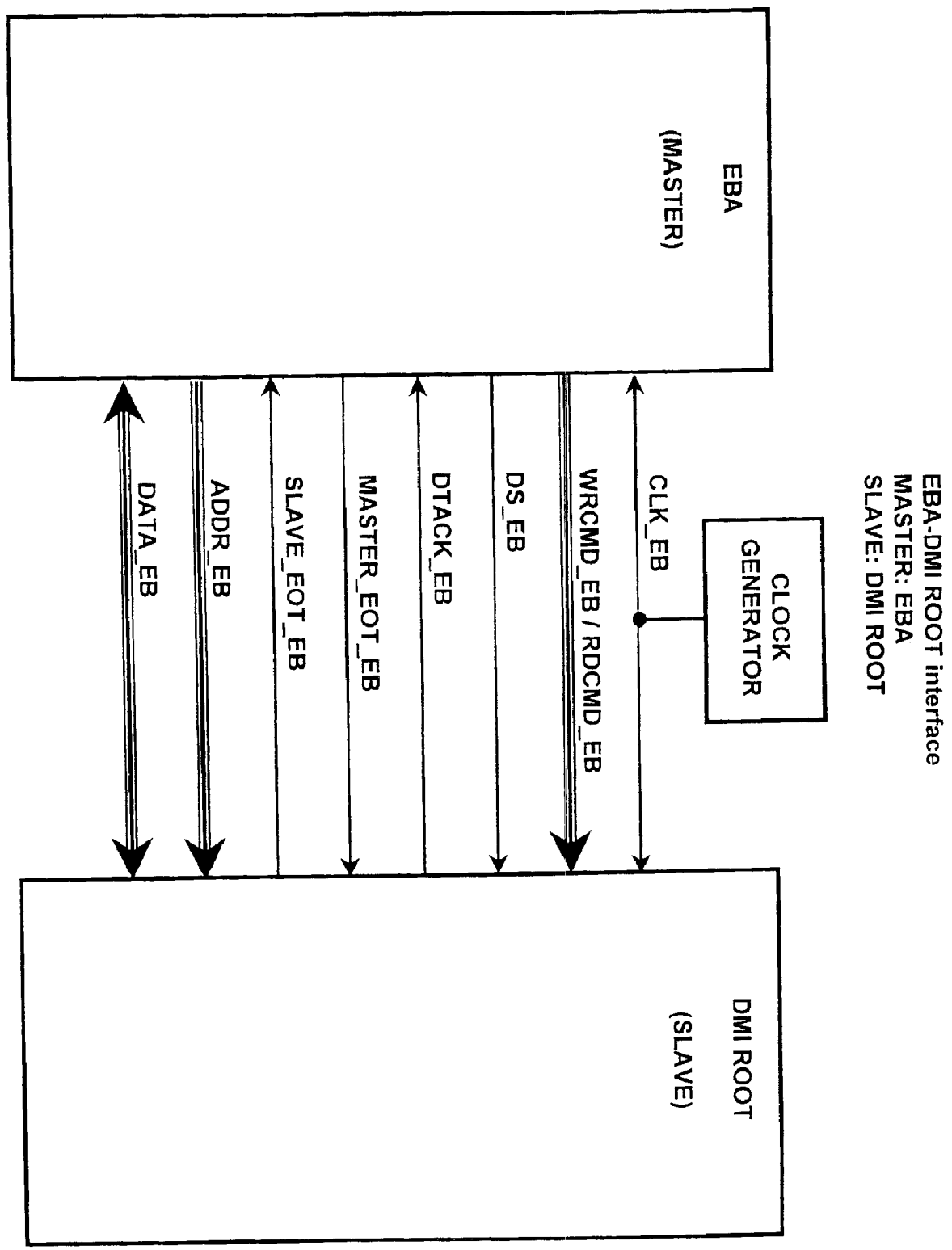
FIG. 32 shows a reference embodiment for the connection between the DMI MAIN (DMI ROOT) of present invention and a generic EXTERNAL BUS AGENT (either a microprocessor or a local bus controller) implementing a reference SYNCHRONOUS EXTERNAL BUS AGENT PROTOCOL. In the represented case the EXTERNAL BUS AGENT is supposed to act as master while the DMI MAIN is supposed to act as slave.

In FIG. 32 the first one, depicting the case in which EBA is the master and DMI MAIN is the slave is shown. A clock generator generates the clock for both EBA and DMI MAIN. EBA outputs two buses WRCMA_EB/RDCMD_EB and ADDR_EB towards DMI MAIN. Moreover it outputs signals DS_EB and MASTER_EOT_EB. A bi-directional bus named DATA_EB connects EBA to DMI MAIN. On its turn, DMI MAIN outputs signals DTACK_EB and SLAVE_EOT_EB towards EBA.

Figure 33:
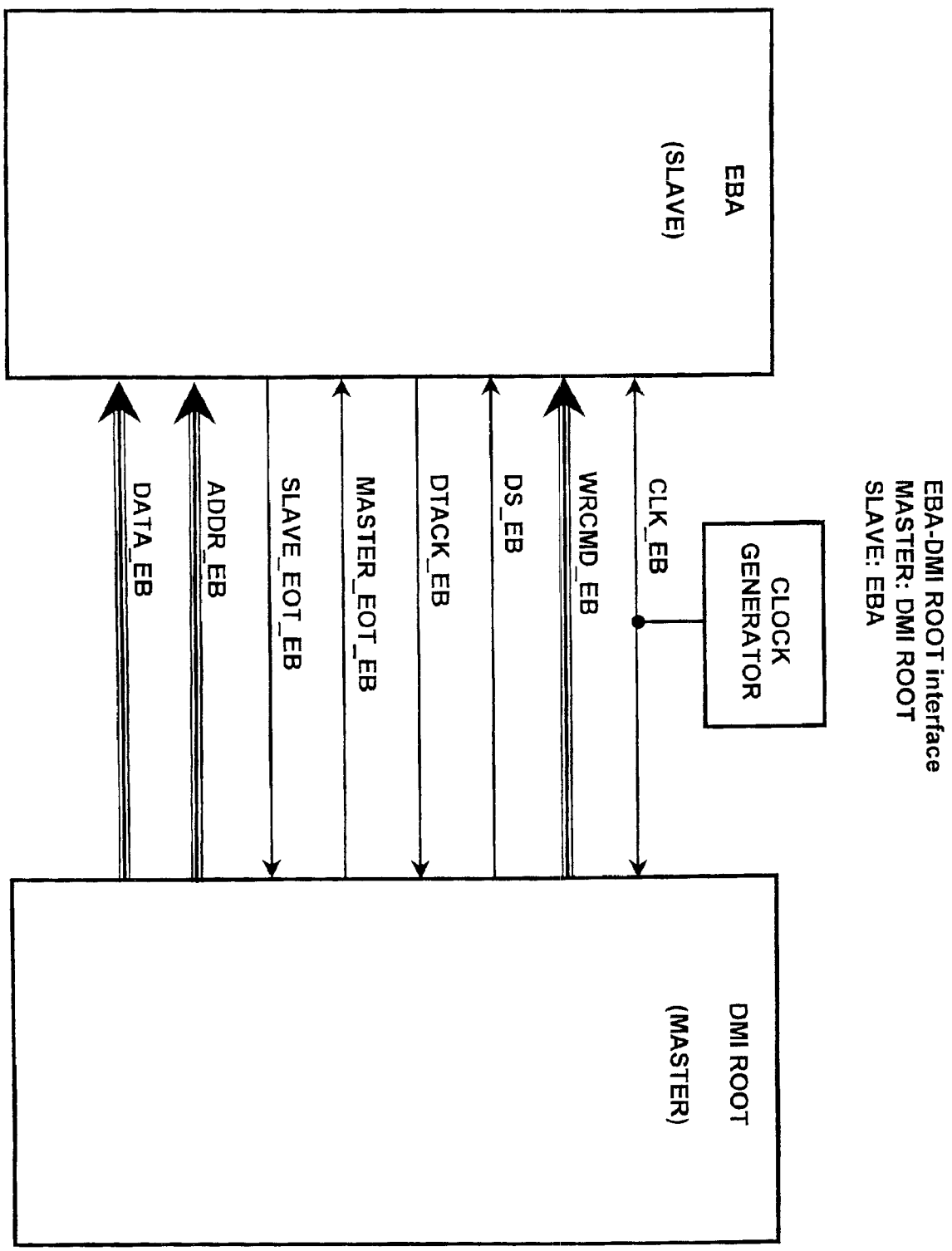
FIG. 33 shows a reference embodiment for the connection between the DMI MAIN (DMI ROOT) of present invention and a generic EXTERNAL BUS AGENT (either a microprocessor or a local bus controller) implementing a reference SYNCHRONOUS EXTERNAL BUS AGENT PROTOCOL. In the represented case the EXTERNAL BUS AGENT is supposed to act as slave while the DMI MAIN is supposed to act as master.

In FIG. 33 the second one, depicting the case in which EBA is the master and DMI MAIN is the slave is shown. A clock generator generates the clock for both EBA and DMI MAIN. DMI MAIN outputs two buses WRCMA_EB and ADDR_EB towards DMI MAIN. Moreover it outputs signals DS_EB and MASTER_EOT_EB. A bus named DATA_EB connects DMI MAIN to EBA. On its turn, EBA outputs signals DTACK_EB and SLAVE_EOT_EB towards EBA.

Comparing the two Figures it is evident that all the signals have changed their direction with the only exception of CLK_EB. That means that all signals must be bi-directional. The data bus DATA_EB is also bi-directional inside FIG. 32 because, when EBA is master and DMI MAIN is slave, data can be transferred from EBA to DMI MAIN (write) or from DMI MAIN to EBA (read). On the contrary, when DMI MAIN is master and EBA is slave, data can only be transferred from DMI MAIN to EBA.

The meaning and mimic of all the listed signals is described in APPENDIX A, Table A5. From both the mimic and direction of signals it is evident that commands like WRCMD_EB/RDCMD_EB and address like ADDR_EB are always generated by the master. MASTER_EOT_EB, which means master end of transfer, is always generated by the master, while SLAVE_EOT_EB, which means slave end of transfer, is always generated by the slave. Regarding the handshake signals, the master always generates DS_EB while the slave always generates DTACK_EB. Data direction has been already described.

Now the arbitration aspects involving both the EBA and the DMI MAIN will be investigated. From a general point of view the arbitration is composed by two different arbitration: INTERNAL ARBITRATION and EXTERNAL ARBITRATION. The DMI MAIN manages the INTERNAL ARBITRATION while the EXTERNAL ARBITER manages the EXTERNAL ARBITRATION. The two arbitration phases are executed concurrently. The INTERNAL ARBITRATION is part of the invention while the EXTERNAL ARBITRATION is not. The two arbitration phases will be illustrated with reference to FIG. 14 and FIG. 29.

INTERNAL ARBITRATION. Is an arbitration phase, internal with respect to the DMI MAIN, that only takes place if the distributed microprocessor interface DMI is of master type. In that case, blocks DMI PERIPHERALS can request transactions and if more than one request to be read is issued, an arbiter (INTERNAL ARBITER block of FIG. 14) must decide which of them have to be granted. The arbitration phase consists in selecting only one request among several ones. If almost one Transaction Request (TR(i)) from a DMI PERIPHERAL has been issued, a selection process is executed and a result is produced: the assertion of a BUS_REQUEST signal directed towards the EXTERNAL BUS SEQUENCER. The asserted BUS_REQUEST signal, sent towards the EXTERNAL BUS SEQUENCER, authorizes it to compete with other agents connected to the EXTERNAL-BUS for EXTERNAL-BUS master-ship (the EXTERNAL BUS SEQUENCER require mastership of the EXTERNAL-BUS by asserting signal EB_REQUEST). If the EXTERNAL BUS SEQUENCER become master of the EXTERNAL-BUS (the EXTERNAL ARBITER grants it by asserting signal EB_GRANT) it asserts signal BUS_GRANT directed towards the INTERNAL ARBITER. As a consequence GRANT(i) signal identifying (by index i) the selected transaction requester is asserted. If no Transaction Requests are issued, then GRANT(i), for each i (i is an identifier spanning over the DMI PERIPHERALS), are negated. If the EXTERNAL BUS AGENT is master of the EXTERNAL BUS an EB_GRANT_ACK signal (indicating that the EBA has become master of the EXTERNAL-BUS) is asserted. As a consequence the EXTERNAL BUS SEQUENCER is not authorized to compete for master-ship over EXTERNAL-BUS and signals it to the INTERNAL ARBITER by asserting the signal BUS_GRANT_ACK.

EXTERNAL ARBITRATION. If the DMI/EXTERNAL BUS SEQUENCER of FIG. 14 is authorized to compete for master-ship by the INTERNAL ARBITER block, it asserts its EB_REQUEST signal on the wire connected to the EXTERNAL ARBITER block of FIG. 29. If the EXTERNAL ARBITER selects the DMI for gaining the master-ship of the EXTERNAL-BUS it asserts the EB_GRANT signal on the wire connected with block DMI. On its turn, this signal reaches the DMI/EXTERNAL BUS SEQUENCER that becomes master of the EXTERNAL-BUS. If the EXTERNAL ARBITER has selected the EBA to become master of the EXTRENAL-BUS the EB_GRANT_ACK signal (indicating that the EBA has become master of the EXTERNAL-BUS) is asserted. The exact mimic of external arbitration is proper of a standard EXTERNAL-BUS and is not object of the invention. The EXTERNAL ARBITRATION is executed by the EXTERNAL ARBITER and also is not object of present invention.

The "basic" realization of the INTERNAL ARBITRATION a simple "fixed priority scheme" (well known in literature).

A first internal arbitration variant is constituted by a "rotating priority scheme" (also well known in literature).

A second internal arbitration variant is used It constitutes on its turn a variant to the well known Round-Robin arbitration algorithm designed for time sharing systems and disclosed, for example, in the book of A. Silberschatz, J. Peterson and P. Galvin, titled "Operating System Concepts", published by Addison Wesley in 1991. This second internal arbitration variant will be described in place of both the "basic" realization and first internal arbitration variant because is more complex while other are well described in literature.

The Round-Robin scheduling algorithm is based on a ready queue in which processes book for execution is treated as a circular queue. The CPU scheduler, which is the scheduler assigning the CPU in time sharing fashion, scans the ready queue assigning the CPU to each booked process for a lapse of time not exceeding one short fixed time unit, referred as time slice.

In accordance with the Round-Robin scheduling algorithm all request signals Transaction Request (TR(i)) coming from DMI PERIPHERAL blocks are pushed into a ready queue FIFO located in the block INTERNAL ARBITER (FIG. 14). A co-located scheduler pops out a first one request for service following a policy called FCFS (First Come First Served). The request selected for service is signaled by a GRANT(i) signal (FIG. 14). The INTERNAL ARBITRATION phase is interleaved with the EXTERTNAL ARBITRATION phase. If the EXTERNAL BUS SEQUENCER becomes master of the EXTERNAL-BUS, the MAIN COMMON BUS SEQUENCER block, basing on GRANT(i) signals sends to the selected transaction requester block DMI PERIPHERAL(i) a specific grant command onto the Control-Bus-root2leaf[15:0] sub-bus via a specific grant cycle. This grant cycle has the function to retrieve parameters from the transaction requester located into the user macro-cell. These parameters are starting addresses of both source and destination of data, and relative burst length; they are carried by the Data-Bus-leaf2root[31:0]. Additional information like the address increment modality is carried by the Control-Status Bus leaf2root[15:0] bus. Said parameters are loaded from various blocks of DMI MAIN. The source starting address, tapped from the output of the RX BUFFER, is loaded by the block INPUT BUS S&H under control of DMI MAIN CONTROLLER which, on its turn, is conditioned by signals (carried by the bus REGISTER-COMMON-BUS) emitted by the DMA CONTROLLER. The destination starting address, tapped from the output of the RX BUFFER, is loaded from the ADDRESS/COMMAND GENERATOR under control of DMI MAIN CONTROLLER which, on its turn, is conditioned by signals (carried by the REGISTER-COMMON-BUS) emitted by the DMA CONTROLLER. The DMA CONTROLLER loads the burst length parameter, tapped from the output of the RX BUFFER. Finally, some additional parameters' like the source and destination address increment modality, carried by the Control-Status-Bus-leaf2root[15:0] are loaded by the DMA CONTROLLER. After the execution of the grant cycle, the MAIN COMMON BUS SEQUENCER block initiates a read transaction towards the requester identified by the source address. At the same time, the EXTERNAL BUS SEQUENCER initiates a write transaction towards the EXTERNAL BUS AGENT addressed by the destination address. The defined address increment policy is implemented by commands issued by the DMI MAIN CONTROLLER towards both INPUT BUS S&H and ADDRESS/COMMAND GENERATOR under information provided by the DMI CONTROLLER.

A transaction when the DMI is in master mode can be terminated under three conditions.

The first kind of termination is caused by the EXTERNAL ARBITER that stops granting the DMI. The negation of EB_GRANT sensed by EXTERNAL BUS SEQUENCER cause this block to negate BUS_GRANT which, on its turn, received from the INTERNAL ARBITER causes the negation of all GRANT(i).

The second kind of termination occurs when the programmed burst has been completed. The DMA CONTROLLER embeds a counter named DATA_TRANSFERRED_COUNTER counting data really exchanged between the FIFO RX BUFFER and the EXTERNAL-BUS. When the counting of DATA_TRANSFERRED_COUNTER reaches the burst length parameter loaded at the beginning of transaction into DMI CONTROLLER the transaction is terminated. This termination condition is transmitted from EVENT&STATUS REGISTER LOGIC to the INTERNAL ARBITER by means of the REGISTER_COMMON_BUS. Also this termination causes the negation of all GRANT(i).

Transaction can also be terminated under different condition (the third condition) optimizing the use of both COMMON-BUS and EXTERNAL-BUS. A different logic of termination is based on the observation of GRANT(i) signals. As we said, when GRANT(i) (i>0) is asserted by block INTERNAL ARBITER the grant cycle is executed and after the grant cycle the transfer phase from DMI PERIPHERAL(i) is enabled. The duration of the transfer phase, if the transfer is not terminated because the burst length is reached (DATA_TRANSFERRED_COUNTER counting equal burst length), is regulated by the INTERNAL ARBITER. Transfer duration is regulated by a "time slice counter" embedded in the block INTERNAL ARBITER. This counter, counting clock pulses, starts when a signal GRANT(i) is asserted. The DATA_TRANSFERRED_COUNTER value is transmitted from EVENT&STATUS REGISTER LOGIC to the INTERNAL ARBITER by means of the REGISTER_COMMON_BUS.

In accordance with the second internal arbitration variant, which on its turn is a variant of the Round-Robin algorithm, at every clock pulse the counting of time slice counter is compared with the contents of the i-nth row of a "priority table" also embedded in the block and, if the value of the counting equals the value read from the table, signal GRANT(i) is negated, the transfer phase towards block DMI PERIPHERAL(i) terminated and the scheduling function of the INTERNAL ARBITER block selects the next TR(i) to enable for data transfer; this happen until the EXTERNAL ARBITER negates EB_GRANT. The negation of EB_GRANT sensed by EXTERNAL BUS SEQUENCER cause this block to negate BUS_GRANT which received from the INTERNAL ARBITER causes the negation of all GRANT(i).

The presence of the priority table just characterizes the above-mentioned variant to the Round-Robin arbitration algorithm. Speaking about priority table it is convenient to indicate with the general term "agent" all peripheral blocks DMI PERIPHERALS. Each of those agents has a proper entry in the priority table for a respective location in which is written the number of clock pulses that the agent is enabled for executing the transfer phase. The advantage of the variant is the possibility of introducing a priority in the service, for instance it is reasonable that an internal resource collecting alarms has higher priority with respect to other resources. The priority is added with no risks of starvation of requests. The priority table should be filled up in such a way that most of resources could terminate their transactions without being interrupted.

An algorithm carried out by block DMI MAIN formalizes the described relationship between arbitration, EXTERNAL BUS AGENT TRANSACTION and COMMON BUS TRANSACTION. This algorithm named Main Algorithm MA embeds both arbitration and TRANSFER PHASES. With TRANSFER PHASES are intended the phases of data transfer carried out by the concurrent execution of EXTERNAL BUS AGENT TRANSACTION and COMMON BUS TRANSACTION. This algorithm collects all mechanism described above. The algorithm MA, in its turn, encompasses four other algorithms named HSKW, CMDW, HSKR, CMDR and CMDRF that will be described later. The Main Algorithm MA is shown in APPENDIX B. The algorithm MA starts with a process declaration indicating between parenthesis the signals TR(i) (the set of Transaction Request signals for each i from 1 to N), the signal BUS_

GRANT and the signal BUS_GRANT_ACK. The algorithm is an infinite loop (MA2 to MA27) in which arbitration and data transfer tasks are executed. At step MA3 all the TR(i) are observed and one is selected among the asserted ones; step MA3 represents the main pass of the INTERNAL ARBITRATION. At step MA4 is checked if one of them has been selected, if so at step MA5 the signal BUS_REQUEST is asserted to signal to the EXTERNAL BUS SEQUENCER to assert on its turn the signal EB_REQUEST to request mastership of the EXTERNAL-BUS. Then, the EXTERNAL ARBITRATION occurs; this step is named EA1 and does not belong to the MA algorithm but to the EXTERNAL ARBITER, nevertheless it is reported in a reasonable position inside the MA algorithm just to underline that the EXTERNAL ARBITRATION starts considering EB_REQUEST after algorithm MA has executed step MA5 (in which BUS_REQUEST is asserted). Obviously EXTERNAL ARBITER is always active evaluating bus requests coming from other devices connected to the EXTERNAL-BUS event when EB_REQUEST is not asserted. At step MA7 is put a WAIT ON statement. This statement is intended to be as the WAIT ON statement in VHDL; the process suspends itself after having reached the WAIT ON statement. The wake up of the process takes place if and only if an event occurs on one of the signal arguments of the WAIT ON statement (in the present situation BUS_GRANT and BUS_GRANT_ACK). After the wake up two situations can take place. In the first one BUS_GRANT has been asserted, this implies the EXTERNAL BUS SEQUENCER is master of the EXTERNAL-BUS (EXTENAL AGENT is slave) and the execution prosecutes from step MA8. In the second case BUS_GRANT_ACK has been asserted and this implies that the EXTERNAL AGENT has become master of the EXTERNAL-BUS and the EXTERNAL BUS SEQUENCER is slave; in this case execution prosecutes from step MA18.

In first case at step MA9 the GRANT(i) signal (with the same index i of the selected TR(i) signal) is asserted. This GRANT(i) causes the DMI MAIN to start a grant cycle which has the function to retrieve from the DMI PERIPHERAL coupled to the Transaction Requester that asserted signal TR(i) the parameters specifying the requested read transaction (source starting address, destination starting address, burst length, etc.). After GRANT(i) has been asserted the TIME SLICE COUNTER is started (step MA10) accordingly to the previously described modified Round Robin algorithm waiting for the grant cycle to be terminated. The wake up of the process is caused from the termination of the grant cycle.

After the termination of the grant cycle all the parameters required to execute the requested read transaction have been loaded into the DMI MAIN and the loop (from MA12 to MA14) governing the DMI in master mode is entered. In this loop the algorithms CMDR or CMDRF and HSKW are executed concurrently; at the same time the EXTERNAL BUS SEQUENCER works in master mode issuing write commands towards the EXTERNAL-BUS; regarding the execution is used the following convention: all the tasks listed between brackets "[ ]" and separated by commas "," are supposed to be executed concurrently. The loop is normally exited when BUS_GRANT is negated. This happen under three conditions: first the EXTERNAL ARBITER negate EB_GRANT, second the TIME SLICE COUNTER, accordingly to the modified Round Robin algorithm explained above, reaches the value written into the i-nth row of the PRIORITY TABLE, last the programmed burst has been completed. All those three events cause the exiting from the loop. After having exited the loop GRANT(i) is negated (step MA15), BUS_REQUEST is negated (step MA16) and the TIME SLICE COUNTER is reset (step MA17).

If the wake up from the WAIT ON statement at step MA7 is caused from the assertion of signal BUS_GRANT_ACK the loop (from MA18 to MA25) governing the DMI in slave mode is entered. An IF . . . THEN . . . ELSIF clause selects between write and read commands issued from the EBA. If a write command is issued (step MA20) algorithms CMDW and HSKW are executed concurrently; at the same time the EXTERNAL BUS SEQUENCER works in slave mode executing write commands issued from the EBA. If a read command is issued (step MA22) algorithms CMDR or CMDRF and HSKR are executed concurrently; at the same time the EXTERNAL BUS SEQUENCER works in slave mode executing read commands issued from the EBA. When BUS_GRANT_ACK is negated the loop (MA18 to MA25) is exited.

Concerning the already mentioned TRANSFER PHASES taking places on the COMMON-BUS and governed from the COMMON BUS PROTOCOL, is useful point out that the main block DMI MAIN is always the master of the COMMON-BUS even whether the distributed microprocessor interface DMI is slave in TABLE A3. This means that, no matter how the transaction request is, the DMI MAIN controls the COMMON-BUS by monitoring the status of interfaced resources and by issuing proper commands (both via the COMMON-BUS). By this reason the control algorithm performed by the block MAIN COMMON BUS SEQUENCER (FIG. 14) directly implies the COMMON BUS PROTOCOL. For the same reasons, the block PERIPHERAL COMMON BUS CONTROLLER embedded in the Leafs (from FIG. 16 to FIG. 23), that is slaved to the MAIN COMMON BUS SEQUENCER block, only works in duality with the last and does not determine the COMMON BUS PROTOCOL.

Concerning the algorithms HSKW, CMDW, HSKR, CMDR and CMDRF, belonging to the Main Algorithm MA, for the moment it is enough to point out that they define and implement the COMMON-BUS protocol charged of TRANSFER PHASES taking place on the COMMON-BUS. Precisely, CMDW and HSKW combined are charged of write transaction towards DMI PERIPHERAL blocks when the EXTERNAL BUS AGENT, acting as a master, is writing data to block DMI MAIN. In this scenario block DMI MAIN is in slave mode, this, among other things, implies that DMI/EXTERNAL BUS SEQUENCER is acting as a slave. Algorithms CMDR or CMDRF and HSKR combined are charged of read transaction towards blocks DMI PERIPHERALS when the EXTERNAL BUS AGENT, acting as a master, is reading data from block DMI MAIN. Also in this scenario block DMI MAIN is in slave mode, this, among other things, implies that DMI/EXTERNAL BUS SEQUENCER is acting as a slave. On the contrary, when block DMI MAIN is in master mode (the EXTERNAL BUS AGENT is in slave mode) also the DMI/EXTERNAL BUS SEQUENCER is in master mode. At the same time, algorithms HSKW and CMDR or CMDRF combined are charged of read transaction towards blocks DMI PERIPHERALS, and to properly interface block DMI/EXTERNAL BUS SEQUENCER for writing data to the EXTERNAL BUS AGENT. These algorithms will be described after having introduced commands and peripheral monitoring codes running over COMMON-BUS.

The CMDR, CMDRF and CMDW algorithms are defined in terms of a set of commands allowing the DMI MAIN to control DMI PERIPHERALS and a set of peripheral monitoring codes allowing DMI MAIN to monitor status of DMI PERIPHERALS. Both commands and termination codes regulates the transfer of data between DMI MAIN and DMI PERIPHERALS. Special commands and peripheral monitoring codes are dedicated to arbitration; precisely to the set of the transfer requested by an application charged to a certain DMI PERIPHERAL. The commands are carried by the sub-bus Control-Bus-root2leaf[15:0] of the COMMON-BUS, while the termination codes are carried by the sub-bus Control-Status-Bus-leaf2root[15:0].

The command has the format: OPCODE, FLAGS. These two fields, named COMMAND.OPCODE and COMMAND.FLAGS, are respectively reported in Table C1 (opcode) and Table C2 (flag). A third field named COMMAND.FLUSH constitutes an improvement of the basic situation and is reported in Table C3 (flush). These Tables are shown in APPENDIX C. All these commands are issued by DMI MAIN and sent to the DMI PERIPHERALS. Commands are identified by means of the OPCODE field.

With reference to TABLE C1, when the COMMON-BUS is idle or in a wait state, an opcode MBC_OPCODE_NOP is issued for No Operation. When a Read&Query(N) is performed, an opcode MBC_OPCODE_RD_QR is issued, this composite commands means that in a unique bit configuration two simultaneous requests are forwarded to the reception side of peripheral which decodes them, namely the request for a datum and the request to have a filling status returned together with the read datum; number N is the saturated filling status. Alternatively, if the presence of data to perform a burst has to be verified or a wait state in a burst is to be inserted by a WaitRead&Query(N), an opcode MBC_OPCODE_WTRD_QR is issued; in this case no read take place and a Query(N) is executed. Combining these operations all the read policy can be realized. The same is valid for the write operation (MBC_OPCODE_WR_QR; MBC_OPCODE_WTRD_QR).

Other commands depend on the type of resource involved in transaction. To end a write transaction a Clear (MBC_OPCODE_CLR) is issued. Clear is also used to end a read transaction with prefetchable resources.

When a READ&RESET REGISTER has been involved in a read transaction, if the EXTERNAL BUS AGENT has accessed the READ&RESET REGISTER (by means of DMI MAIN), in the end of transaction an opcode MBC_OPCODE_CLR_RESET_RAR is issued to read and reset the READ&RESET REGISTER. This is done for signaling to the DMI PERIPHERAL the will of DMI MAIN to terminate the transaction and in the meanwhile force a Read-and-Reset on the READ&RESET REGISTER. Block DMI MAIN verifies, at first, that the EXTERNAL BUS AGENT access to the READ&RESET REGISTER has been completed (the value written into the register has been read (Test)), then it executes a reset on the register (the content of register is cancelled (Reset)). This two steps operation may appear a bit strange because by definition a Read-and-Reset operation is atomic and effectively it is. A READ&RESET REGISTER resource acts like a trap for each bit sent from the user macro-cell. This kind of register has a negated or inactive configuration (all bits negated, where negated means not active value) defined by a parameter (generic in VHDL language). Each assertion of a single bit (that bit assumes an active value, where active means opposite with respect to the negated value) cause the trapping of that active bit value. Trap means that when a user macro-cell connected to the Read-and-Reset resource has written a value into the READ&RESET REGISTER it cannot be altered until the EXTERNAL BUS AGENT access it. Then the Read-and-Reset atomic operation is executed on it. These two steps are only visible internally the DMI architecture, at DMI protocol level. For the EXTERNAL BUS AGENT, and the software running on it, the access is atomic. Moreover, to avoid loose of information the algorithm is more sophisticated. In fact, when the Read-and-Reset is executed, all the bits of the READ&RESET REGISTER, resulting different with respect to their negated values at the time of the read are reset. After the reset the register is loaded with all bits resulting trapped (those bits resulting asserted) in the time interval starting from the Read and ending to the Reset. Thus, information is not lost. By an implementation point of view this is obtained by using two registers in shadowing.

When an application charged to a certain DMI PERIPHERAL requests a transaction, if the INTERNAL ARBITER located into the DMI MAIN decides to grant it, the DMI MAIN sends a grant command towards the selected DMI PERIPHERAL. This command is specified by the opcode MBC_OPCODE_GRANT in the COMMAND.OPCODE field. The DMI MAIN, as a reply to the issued command, expects a set of parameters allowing the DMA controller (DMA CONTROLLER) included in the block DMI MAIN to read data from the requesting application and writing it to a device connected to the EXTERNAL BUS AGENT. All the parameters are provided from the TRANSACTION REQUESTER embedded into the application macro-cell via the DMI PERIPHERAL connected to it. Said parameters are transmitted from the DMI PERIPHERAL to the DMI MAIN via the Data-Bus-leaf2root[31:0]. First parameter is Source Starting Address SSA[31:0] which, is the address of the requested application where to read data. Second parameter is the Destination Starting Address DSA[31:0] which, is the address of the external device (a device connected to the EXTERNAL-BUS) where to write data. The third parameter is in reality a set of parameters arranged as a string of bit: padding & DLI & DFA & SLI & SFA & VDBL & DBL [15:0]. DLI stands for Destination address Linear Increment and indicates that the destination address has to be linearly incremented (each clock cycle) during the burst. DFA stands for Destination Fixed Address and indicates that the destination address has to be kept constant during the burst. SLI stands for Source address Linear Increment and indicates that the source address has to be linearly incremented (each clock cycle) during the burst. SLA stands for Source Fixed Address and indicates that indicates that the source address has to be kept constant during the burst. VDBL is a flag whose meaning will be explained later. Last parameter of the set is the named Data Burst Length indicated with DBL which, is the number of data to transfer (referred to a certain data bus width). This last parameter is optional. When data are provided by the user macro-cell via a memory lodged in the MEMORY HOST MODULE (FIG. 22) the parameter DBL is mandatory to specify whose portion of the memory containing valid data. Conversely, when data are provided by the user macro-cell via a FIFO located in a TOPFIFO HOST MODULE (FIG. 23) the parameter DBL is not used. The VDBL flag, if asserted, indicates that DBL parameter is valid; if VDBL is negated the DBL parameter is not valid.

Two special commands are added to manage in a very efficient way not prefetchable resources: the Flush(I) command and the Clear&Flush(I) command. Flush(I) command correspond to the MBC_OPCODE_FLUSH opcode while Clear&Flush(I) command correspond to the MBC_OPCODE_CLR_FLUSH opcode. These commands are invoked from a special algorithm named CMDRF (CoMmanD Read Flush) used instead of the basic CMDR (CoMmanD Read) algorithm when not prefetchable resources are read. The set of algorithms HSKW, CMDW, HSKR and CMDR, together with their invoked commands, defines and implements the basic COMMON BUS PROTOCOL. In the same way the set HSKW, CMDW, HSKR and CMDRF, together with their invoked commands, defines and implements a preferred form of the COMMON BUS PROTOCOL of the invention (best mode) which is particularly suited for interfacing not prefetchable resources (in read). In particular this protocol has been developed to operate in conjunction with a special macro-cell named PREFETCHABLE FIFO hosted in the TOPFIFO HOST MODULE. This special macro-cell interposed between the DMI PERIPHERAL and a not prefetchable resource allows a very efficient interfacing in terms of both throughput and latency. The PREFETCHABLE FIFO is basically special fifo; its detailed working principle and its internal architecture will be described later.

Coming back to the commands meaning the first one (Flush(I)) is issued when, during a read towards the PREFETCHABLE FIFO, the number of data exchanged with the EXTERNAL BUS AGENT (registered by the of DATA_TRANSFERRED_CNT counter embedded inside the EVENT&STATUS REGISTER LOGIC) reaches a certain value (set by a parameter named DATA_TRANSF_CNT_THR), I takes the value of the DATA_TRANSFERRED_CNT. This causes the PREFETCHABLE FIFO to flush out I data. When the transaction on the EXTERNAL-BUS is terminated, said transaction corresponding to a transaction on the COMMON-BUS involving the PREFETCHABLE FIFO, a Clear&Flush(I) command is issued towards the PREFETCHABLE FIFO itself. I is set to the final value of the DATA_TRANSFERRED_CNT counter. This command causes the PREFETCHABLE FIFO to flush out I data and to clear its internal pointers in a way that will be explained describing the internal architecture of the PREFETCHABLE FIFO.

With reference to TABLE C2 flags associated to commands are shown. The Start of Transaction is asserted in the FLAG field from DMI MAIN to signal to DMI PERIPHERALS that a new transaction starts. The End of Transaction is asserted to signal that current transaction terminates and no other commands on data bus are to be considered valid from DMI PERIPHERALS until a new Start of Transaction is issued.

When a DMI PERIPHERAL replies to DMI MAIN it sends back a PERIPHERAL_MONITORING_CODE to allow resource monitor and transaction status, in the meanwhile block PERIPHERAL COMMON BUS CONTROLLER forwards one group of commands CTRL2REG(G), or CTRL2FRP(G) and FLUSH[3:0], or CTRL2FWP(G), or CTRL2MEM(G) to the selected layer. Each time a command is executed by a DMI PERIPHERAL a PERIPHERAL_MONITORING_CODE is returned to the DMI MAIN. If the execution of the command implies the retrieve of a datum, the datum itself is sent back with (in the same bus cycle) the PERIPHERAL_MONITORING_CODE corresponding to that command.

In this implementation the PERIPHERAL_MONITORING_CODE is split in seven fields respectively shown in TABLE C3, TABLE C4, TABLE C5, TABLE C6, TABLE C7, TABLE C8, TABLE C9 and TABLE C10, all the Tables are shown in APPENDIX C.

With reference to TABLE C3 the FLUSH field of the command is described. This field carries the I number referred in Flush(I) and Clear&Flush(I) commands. The I number carries by the COMMAND.FLUSH field represents the number of data to flush. When the symbol MBC_FLAG_NULL is used this means that there are no data to flush while when symbol MBC_FLUSH(I) is used this means that there are I data to flush.

With reference to TABLE C4, when a DMI PERIPHERAL replies to the DMI MAIN it sends back information relative to the type of resource, prefetchable or not prefetchable, involved in current transaction in the RESOURCE_TYPE field.

With reference to TABLE C5, when a DMI PERIPHERAL receives a flag MBC_FLAG_START_OF_TR and the related command from DMI MAIN, it decodes the command. Then, it executes the command and place in reply to the command a first PERIPHERAL_MONITORING_CODE named PBC_ST_START_OF_TR on the Control-Status-leaf2root-Bus.

With reference to TABLE C6, after the command-flag MBC_FLAG_END_OF_TR is received from a DMI PERIPHERAL, no other commands on data bus are to be considered valid until a new command-flag MBC_FLAG_START_OF_TR is received. When a DMI PERIPHERAL receives MBC_FLAG_END_OF_TR, it transmits code PBC_ET_END_OF_TR to DMI MAIN. In the same way, after code PBC_ET_END_ $_{OF}$_TR is received from a DMI MAIN, no other commands on data bus are to be considered valid until a new code PBC_ST_START_OF_TR is received. The use of code PBC_ET_END_OF_TR from DMI MAIN is optional. Two solutions are possible to detect the end of a transaction: the explicit use of code PBC_ET_END_OF_TR or the use of a CLEAR signal internally generated by DMI MAIN. The last solution is more efficient in terms of bus efficiency.

With reference to TABLE C7, the contents of sub-buses Data-Bus-leaf2root (which carries data from DMI PERIPHERALS to DMI MAIN blocks) and Control-Status-Bus-leaf2root (which carries PERIPHERAL_MONITORING_CODE from DMI PERIPHERALS to DMI MAIN) are signaled by the TRANSACTION_PAYLOAD field. When sub-bus Data-Bus-leaf2root is idle, code PBC_TP_NULL is asserted. When only Query-Result(N) is carried, code PBC_TP_QUERY_RESULT is asserted. This happens in a write as a consequence of command-flag MBC_OPCODE_WTWR_QR/MBC_OPCODE_WR_QR commands, or in a read as a consequence of MBC_OPCODE_WTRD_QR command. When Query-Result(N) with Data Payload is present, code PBC_TP_DATA_AND_QUERY_RESULT is asserted; this happens as a consequence of command-flag MBC_OPCODE_RD_QR command. Finally code PBC_TP_READ_AND_RESET is asserted when the payload is composed by a Query-Result (N) with Data coming from a Read-and-Reset resource; this last symbol is useful to handle Read-and-Reset resources in a distributed system. When a DMI PERIPHERAL replies to a grant cycle, it sends back to the DMI MAIN the three parameters SSA, DSA and DBL. The meaning of these parameters has been described above. To complete the reply 4 clock cycles are required. Parameter SSA is coupled to code PBC_ST_START_OF_TR at first bus cycle; parameter DSA is coupled to the second bus cycle, and parameter DBL is coupled to the third bus cycle. Finally, last bus cycle carries code PBC_ET_END_OF_TR. To signal that payload is constituted by said burst parameter code PBC_TP_GRANT_REPLY is issued.

With reference to TABLE C8, PERIPHERAL_MONITORING_CODES related to the field TRANSACTION_TYPE are listed. If code is PBC_TT_

READ a read transaction in progress; if code is PBC_TT_WRITE a write transaction is in progress. If the DMI is in master mode the operation of DMA CONTROLLER which superintends this type of transaction is regulated by codes: PBC_TT_GRANT_DFA, PBC_TT_GRANT_DLI, PBC_TT_GRANT$_{SFA}$, $_{PBC}$_TT_SLI, PBC_TT_VDBL, and PBC_TT_IDBL. Code PBC_TT_GRANT_SFA specifies that the read bust must be executed with fixed source address; this PERIPHERAL MONITORING CODE is carried by the Contol-Status-Bus-leaf2root[15:0] synchronously (at the same clock cycle) with the parameter SSA [31:0] carried by the Data-Bus-leaf2root[31:0] (if fixed source address mode is selected). PBC_TT_GRANT_SLI specifies that the read burst must be executed with linear increment of source address; this PERIPHERAL MONITORING CODE is carried by the Contol-Status-Bus-leaf2root[15:0] synchronously with the parameter SSA [31:0] carried by the Data-Bus-leaf2root[31:0] (if linear increment of source address mode is selected). PBC_TT_GRANT_DFA specifies that the read bust must be executed with fixed destination address; this PERIPHERAL MONITORING CODE is carried by the Contol-Status-Bus-leaf2root[15:0] synchronously with the parameter DSA [31:0] carried by the Data-Bus-leaf2root[31:0] (if fixed destination address mode is selected). PBC_TT_GRANT_DLI specifies that the read burst must be executed with linear increment of destination address; this PERIPHERAL MONITORING CODE is carried by the Contol-Status-Bus-leaf2root[15:0] synchronously (at the same clock cycle) with the parameter DSA[31:0] carried by the Data-Bus-leaf2root [31:0] (if linear increment of destination address mode is selected). PBC_TT_GRANT_VDBL specify that Data-Bus-leaf2root[31:0] is currently carrying a valid parameter DBL. If during third bus cycle the code is found to be PBC_TT_GRANT_IDBL this imply that the DBL parameter is not specified for current read burst.

Figure 34:
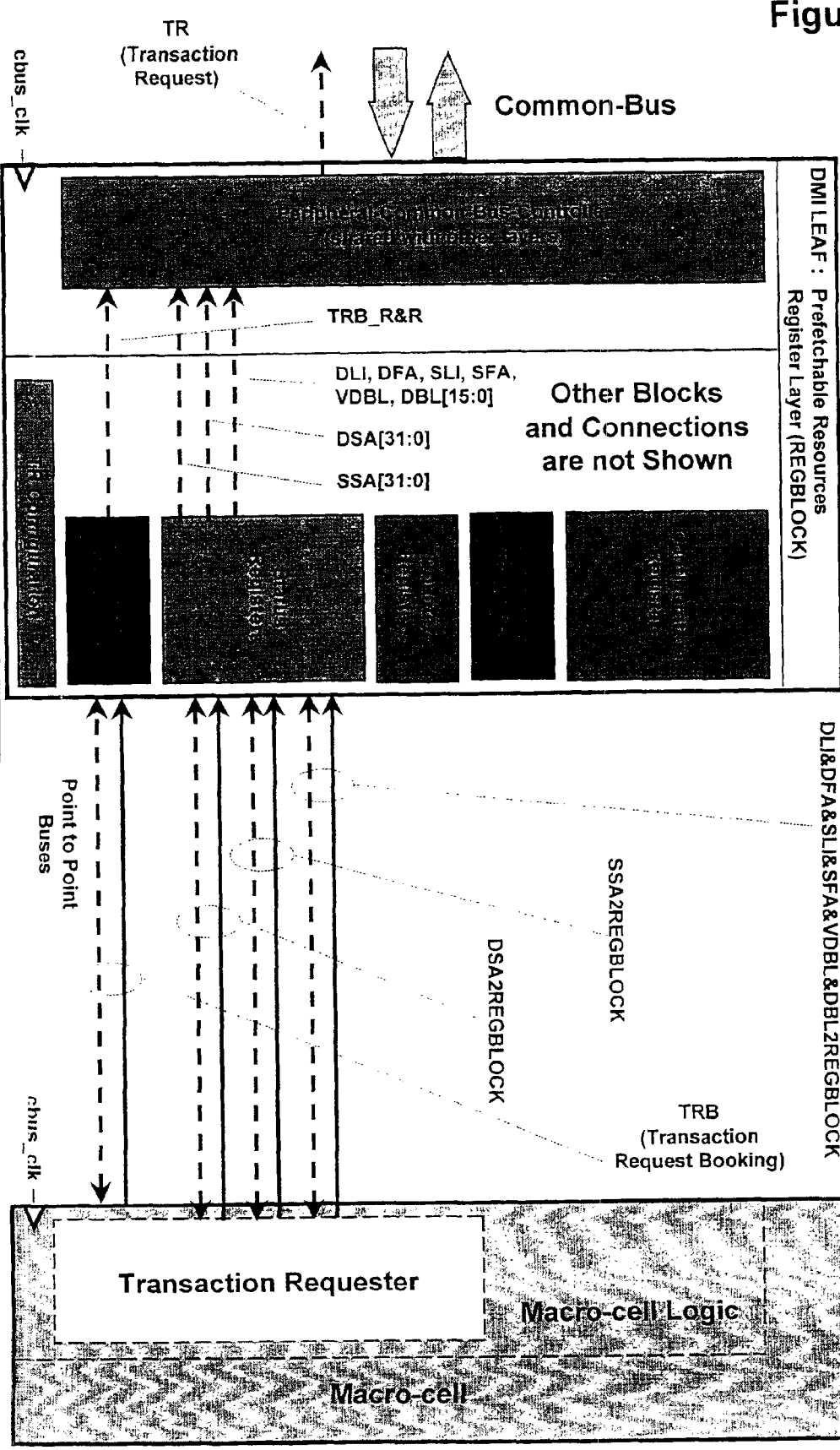
FIG. 34 is still the layer shown in FIG. 18 where both a DMA controller named TRANSACTION REQUESTER hosted into the MACRO-CELL and a set of signals to connect it to the DMI PRERIPHERAL are evidenced. This logic enables the MACRO-CELL to request transactions to the DMI MAIN and represents the master mode of the DMI.

To make visible all the parameters regarding the read transaction in burst modality, a new FIG. 34 has been introduced which indicates the route of this parameters through the distributed interface. FIG. 34 is obtained from FIG. 18 by giving more relief to said parameters and ignore the remaining blocks except Registers and PERIPHERAL COMMON BUS CONTROLLER. For the aim of above a new dashed block MACRO-CELL/TRANSACTION REQUESTER has been introduced inside the dashed block MACRO-CELL LOGIC of the user MACRO-CELL, and further buses Point-to-Point-Buses have been detailed to connect this block with the Registers of layer REGBLOCK. A first one of these Point-to-Point-Buses named TRB (Transaction Request Booking) is dedicated to forward the request of transactions from user Macro-cell to the Group of READ&RESET REGISTERS of layer REGBLOCK. Each new Request of transaction from the Application asserts one output bit of a corresponding READ&RESET REGISTER. A second and a third Point-to-Point-Buses carry two respective signals DSA2REGBLOCK and SSA2REGBLOCK, where the meaning of field DSA and SSA has been already done. A fourth Point-to-Point-Bus carries the informative field DBL and the following PERIPHERAL_MONITORING_CODES: DLI, DFA, SLI, SFA, VDBL whose meaning has been explained and altogether indicated as DLI&DFA&SLI&SFA&VDBL&DBL2REGBLOCK. The second, third, and fourth Point-to-Point-Buses connect some registers of the Group of STATUS REGISTERS. All the signal received on the right hand side of the Registers are inputted to the PERIPHERAL COMMON BUS CONTROLLER at the other side, more precisely to its TRANS-ACTION REQUESTER block (FIG. 17). The latter block generates a Transaction Request signal TR towards DMI MAIN block whenever one output of a READ&RESET REGISTER is asserted and, in case of burst transaction requiring DMA, all the above relevant signals received from STATUS REGISTERS are forwarded to the DMI MAIN block. Obviously the location of the registers charged with the outlined signals shall be notified to the addressing logic of layer REGBLOCK. All the SSA[31:0], DSA[31:0], DLI, DFA, SLI, SFA, VDBL and DBL[15:0] parameters are transmitted from the DMI PERIPHERAL to the DMI MAIN via the Data-Bus-leaf2root[31:0].

User data are generally provided from a macro-cell via a memory (MEMORY HOST MODULE) or a fifo (TOPFIFO HOST MODULE embedding a PREFETCHABLE FIFO) which in its turn is connected to a DMI PERIPHERAL.

Moreover some parameters characterizing the read transaction as the DSA or the DBL can be set from the software running on an external processor (the EBA or a processor reaching the EBA via a bridge). In such a case the TRANSACTION REQUESTER of FIG. 34 can originate its outputs DSA2REGBLOCK and the portion DBL of DLI&DFA&SLI&SFA&VDBL&DBL2REGBLOCK from some CONFIGURATION REGISTERS embedded in the same DMI PERIPHERAL connected to the data source.

With reference to TABLE C9, a field TRANSACTION_EXCEPTION is foreseen for managing exceptions in bus transactions. The assertion of code PBC_TE_NULL means no errors. Code PBC_TE_ABORT means unrecoverable error and as a consequence transaction has to be aborted from DMI MAIN. The crossing of address space boundaries of a resource embedded into DMI PERIPHERALS is signaled by assertion of code PBC_TE_OUT_OF_ADDR_SPACE.

With reference to TABLE C10, the most important field of the Control-Status-leaf2root-Bus is the RESOURCE_FILLING_STATUS. This field corresponds to the filling status indicator of the preceding discussion about protocol efficiency. The field allows the continuous monitoring of the resource involved in transaction from the DMI MAIN. When a resource is involved in a read transaction and code PBC_FILLING_STATUS_NULL is asserted, this means that there are no data to read in that resource. On the contrary when the returned value is PBC_FILLING_STATUS_(I) this means that there are "I" data to read. When a resource is involved in a write transaction and RI_FILLING_STATUS_NULL is asserted this means that there is no more room to write data in that resource. On the contrary when the returned value is PBC_FILLING_STATUS_(I) this means that there are "I" positions where allocate (write) data. As previously said discussing about protocol efficiency, number "I" can either be static or random. Maximum value "I" specified in code PBC_FILLING_STATUS_(I) is decimal 15, corresponding to the maximum round-trip-latency RDTPL of a transaction on COMMON-BUS expressed in cbus_clk cycles. This value is the RDPTL_FILLING_STATUS taken to saturate the maximum permissible burst length in write or read transaction.

Having introduced the command and peripheral monitoring codes running over the COMMON-BUS is now possible to describe in a precise way the COMMON BUS PROTOCOL further subject of the invention. Six algorithms determine this protocol. These algorithms are named: DELTA FILLING STATUS CALCULATOR Algorithm (DFSC), LOCAL FILLING STATUS CALCULATOR Algorithm (LFSC), COMMAND WRITE Algorithm (CMDW), HANDSHAKE WRITE Algorithm (HSKW), COMMAND READ Algorithm (CMDR), HANDSHAKE READ Algorithm (HSKR) and COMMAND READ FLUSH Algorithm (CMDRF). The combinations of the algorithms listed above have been formalized in algorithm MA. Algorithms CMDW and HSKW are charged of write transactions towards block DMI PERIPHERAL when DMI is in slave mode. Algorithms CMDR and HSKR are charged of read transactions from block DMI PERIPHERAL when DMI is in slave mode. If DMI is in slave mode and not prefetchable resources connected to a DMI PERIPHERAL have to be read, algorithm CMDR can be advantageously substituted with algorithm CMDRF, so in this case the pair HSKR, CMDRF manages the transaction. Last, If DMI is in master mode and read transactions from a not prefetchable resource connected to a DMI PERIPHERAL combined with write transactions towards EXTERNAL-BUS have to be performed then algorithms HSKW and CMDRF combined can be advantageously used. In any case to use the CMDRF the not prefetchable resource must be connected to the DMI PERIPHERAL by the special macro-cell named PREFETCHABLE FIFO hosted in the TOPFIFO HOST MODULE.

The CMDR and CMDRF algorithms are respectively claimed to be able of managing transactions with prefetchable and not prefetchable resources. Actually both of them have the capacity of interfacing both prefetchable and not prefetchable resources, even if with different efficiency (the term efficiency is intended accordingly to Eq. (1)).

The CMDRF algorithm is claimed able to interface not prefetchable resources with very high efficiency. To reach such a high efficiency CMDRF algorithm requires the special hardware at DMI PERIPHERAL level named PREFETCHABLE FIFO. Moreover CMDRF algorithm is also able to interface prefetchable resources as efficiently as CMDR; thus it would be possible to completely substitute the CMDR algorithm with the CMDRF.

The CMDR algorithm that is claimed able to interface prefetchable resources it is also able to interface also not prefetchable resources. It faces the problem of interfacing not prefetchable resources with a technique based on a register named RRBL but it is not as efficient as CMDRF algorithm combined with the PREFETCHABLE FIFO. On the other hands it has the small advantage of not requiring special hardware like the PREFETCHABLE FIFO.

Due to the above reasons we keep on maintaining the separation between CMDR and CMDRF in the description keeping in mind the following points. CMDR can substitute CMDRF when the PREFETCHABLE FIFO is not available. On the contrary, when PREFETCHABLE FIFO is available and therefore CMDRF is used there is no reason to keep on using CMDR.

The meaningful signals of all algorithms are described in the TABLE D1, also reported in APPENDIX D.

In general, in described algorithms, not all signals are assigned in each clause. The unassigned signals will be assumed assigned to their negated value. A signal is considered active when it is said asserted and not active when it is said negated.

The two algorithms named DFSC and LFSC have the goal of monitoring the filling status of selected resource and are used in all kinds of transfer phase. The knowledge of the filling status allows the DMI MAIN to issue the correct kind and number of commands to execute transactions avoiding the issuing of command not compatible with the status of selected resource. As an example a read command is not compatible with an empty resource and a write command is not compatible with a full resource. A sophisticated method of monitoring is made necessary because of the round trip delay of communication between the DMI MAIN and the DMI PERIPHERAL.

The Delta Filling Status Calculator algorithm DFSC is shown in TABLE D2, APPENDIX D.

In the sequential representation of APPENDIX D each clock pulse corresponds to the execution of steps from DFSC1 to DFSC28 of the DFSC algorithm that is the loop is executed each clock cycle. The DFSC algorithm calculates DFS. At CLEAR assertion (step DFSC4) both RFS and DFS are reset to zero. When start of transaction is signaled (step DFSC7), RFS is loaded with incoming PMC.RESOURCE_FILLING_STATUS. When currently received transaction payload is a query result (this means that no data are present (step DFSC10) the incoming PMC.RESOURCE_FILLING_STATUS and RFS are compared (step DFSC11). If the clause PMC.RESOURCE_FILLING_STATUS>RFS is false, the filling status has not been changed by endogenous factor (command issued by DMI MAIN on COMMON-BUS and executed by DMI PERIPHERAL) nor by exogenous factor (access executed by the application) and DFS is assigned to zero (step DFSC14). If the clause PMC.RESOURCE_FILLING_STATUS>RFS is true, the filling status has been changed by exogenous factors, so, at step DFSC12, DFS is loaded with the difference between the incoming PMC.RESOURCE_FILLING_STATUS and the filling status memorized at previous clock pulse (RFS). Finally, at step DFSC16, RFS is updated with current PMC.RESOURCE_FILLING_STATUS. When currently received transaction payload is a query result coupled with a datum (step DFSC17) the incoming PMC.RESOURCE_FILLING_STATUS and RFS are compared (step DFSC18). If the clause PMC.RESOURCE_FILLING_STATUS$\geq$RFS is false, the filling status has not been changed by endogenous factor (command issued by DMI MAIN on COMMON-BUS and executed by DMI PERIPHERAL) nor by exogenous factor (access executed by the application) and DFS is assigned to zero (step DFSC21). If the clause PMC.RESOURCE_FILLING_STATUS$\geq$RFS is true, the filling status has been changed by exogenous factors. So, at step DFSC19, DFS is loaded with the difference between the incoming PMC.RESOURCE_FILLING_STATUS and the filling status memorized at previous clock pulse (RFS) and 1 is added to the calculated difference (step DFSC19). The one is added to take in account that, being the filling status coupled to a datum, a difference 1 between RFS (the previous filling status) and the current one is expected because the exchange of a datum causes the variation equal to 1 in the filling status. Finally, at step DFSC23, RFS is updated with current PMC.RESOURCE_FILLING_STATUS. If no PMC is received RFS is held. All signals are reset when the CLEAR command is asserted.

The Local Filling Status Calculator algorithm LFSC is shown in TABLE D3, APPENDIX E.

In the sequential representation of APPENDIX E each clock pulse corresponds to the execution of steps from LFSC1 to LFSC24 of the LFSC algorithm, that is the loop is executed each clock cycle. The LFSC algorithm calculates value LFS taking in account both endogenous and exogenous factors. The endogenous factors are operation issued by the DMI MAIN itself (COMMAND and PMC), executed data phases (Table D1: DATA_TRANSFERRED) and initial value of PMC.RESOURCE_FILLING_STATUS. The exogenous factor is represented by the value DFS provided by the LFCS algorithm. In other words the LFCS algorithm starting from the initial PMC.RESOURCE_FILLING_

STATUS received from the COMMON-BUS and building a local image of the resource filling status, named LFS, in an incremental way in which the incremental terms are represented by said endogenous and exogenous factors.

The LFSC algorithm embeds two sub-algorithms one devoted to write operation and one devoted to read operation. First one is executed when PMC.RESOURCE_FILLING_STATUS is detected to coincide with RI_TT_WRITE (steps LFSC5, LFSC9, LFSC11, LFSC13) and the last one is executed when PMC.RESOURCE_FILLING_STATUS is detected to coincide with RI_TT_READ (steps LFSC7, LFSC15, LFSC17, LFSC19).

The write sub-algorithm is explained first. When start of write transaction is signaled (step LFSC5), value LFS is loaded with incoming code PMC.RESOURCE_FILLING_STATUS. Then prefix PMC is observed. Then, three situations arise. First one occurs when DFS is greater than zero and DATA_TRANSFERRED is asserted. LFS is calculated as the previous LFS plus the DFS calculated by the DFSC algorithm minus 1 (1 is subtracted cause to the assertion of DATA_TRANSFERRED because if a datum has been transferred the room for write in the selected resource will be decreased by one position—step LFSC10). Second one occurs when DFS equals zero and DATA_TRANSFERRED is asserted. LFS is calculated as the previous LFS plus the DFS minus 1 (1 is subtracted cause to the assertion of DATA_TRANSFERRED because if a datum has been transferred the room for write in the selected resource will be decreased by one position (step LFSC12). Third one occurs when DFS is greater than zero and DATA_TRANSFERRED is not asserted. LFS is calculated as the previous LFS plus the DFS calculated by the DFSC. In this case 1 is not subtracted because DATA_TRANSFERRED is not asserted (step LFSC22). When both DFS is zero and currently issued command is a pure query (query not coupled with datum at step LFSC22).

The read sub-algorithm is explained below. When start of read transaction is signaled (step LFSC7), value LFS is loaded with incoming PMC.RESOURCE_FILLING_STATUS. Then prefix PMC is observed. Then, three situations arise. First one occurs when both DFS is greater than zero and the currently issued command is a Read & Query (a query with a coupled write datum) at step LFSC15. In such a case LFS is calculated (at step LFSC16) as the previous LFS plus the DFS calculated by the DFSC algorithm minus 1. The 1 is subtracted cause to the execution of the read; in fact when a datum is read the number of data available for reading in the selected resource decreases by one). Second situation occurs (at step LFSC17) when both DFS equals zero and the currently issued command is a Read & Query (a query with a coupled write datum). In such a case LFS is calculated as the previous LFS minus 1 (step LFSC18). Third one occurs (at step LFSC19) when DFS is greater than zero and the currently issued command is a pure query (a query without a coupled write datum). In such a case LFS is calculated as the previous LFS plus the DFS calculated by the DFSC algorithm (step LFSC20). The 1 is not subtracted because to the query command, in fact in this case no read command is issued. When both DFS is zero and currently issued command is a pure query (query not coupled with datum) LFS is held (step LFSC22).

The test (DFS>0) executed at steps LFSC9, LFSC13, LFSC15 and LFSC19 is equivalent to the test (DFS≠0) because DFS cannot be less than zero.

The Command Write Algorithm CMDW is shown in Table D4, APPENDIX D.

In the sequential representation of Table D4 each clock pulse corresponds to the execution of passes from CMDW1 to CMDW20 of the CMDW algorithm, that is the loop is executed each clock cycle. The CMDW algorithm generates write commands and flags towards COMMON-BUS. Feedback signals read from the block EVENT&STATUS REGISTER LOGIC (FIG. 14) regulates the algorithm operation. Feedback signals are TRANSACTION_TERMINATION, DATA_TRANSFERRED and CLEAR. The algorithm starts when "write command decoded asserted" from block COMMAND DECODER (FIG. 14) and delivered via EVENT&STATUS REGISTER LOGIC. As soon as "write command decoded asserted" a pure query command (a query not coupled to a write datum) is issued towards selected resource (step CMDW2). At the same time the flag field indicates that a new transaction starts (step CMDW3). Then the loop at CMDW4 is entered and not exited until CLEAR is asserted. If DATA_TRANSFERRED is asserted and LFS>0 (step CMDW10) a Write & Query command is issued at step CMDW11 (a query command coupled to a write datum and a write command). At the same time the flag field is set to null (CMDW12). If DATA_TRANSFERRED is not asserted (step CMDW13) or LFS is zero, a pure query is issued (step CMDW14) and null flags are set into the flag field (step CMDW15). If TRANSACTION_TERMINATION is asserted (step CMDW5) a special clear command is sent onto the COMMON-BUS (step CMDW6), to the selected resource, coupled with a flag indicating the end of current transaction (step CMDW7). Then, CLEAR is asserted (step CMDW8) and the loop is exited (step CMDW9). Then, COMMAND.OPCODE is set to no operation (step CMDW18) and COMMAND.FLAGS is set to null (step CMDW19). Finally CLEAR is negated (step CMDW20).

The Handshake Write Algorithm HSKW is shown in Table D5, APPENDIX D.

In the sequential representation of APPENDIX D each clock pulse corresponds to the execution of passes from HSKW1 to HSKW29 of the HSKW algorithm, that is the loop is executed each clock cycle. The HSKW algorithm generates handshake signals towards the EXTERNAL BUS SEQUENCER (FIG. 14) enabling this block to regulate write transactions with the EXTERNAL-BUS. Input handshake signals read from the block EVENT&STATUS REGISTER LOGIC (FIG. 14) regulate the algorithm operation. Feedback signals are TRANSACTION_TERMINATION, PMC and LFS. The algorithm starts when "write command decoded asserted"; said information is originated from block COMMAND DECODER (FIG. 14) and delivered via block EVENT&STATUS REGISTER LOGIC. As the loop is entered, if LFS is greater than zero (step HSKW9) the READY signal is asserted (step HSKW10), TERMINATE signal negated (HSKW11) and the signal TIMEOUT_WR_CNT reset to zero (step HSKW12). The assertion of READY signal informs the EXTERNAL BUS SEQUENCER to signal to the EXTERNAL-BUS that block DMI MAIN is ready to receive a datum or to acknowledge to a datum previously received via EXTERNAL-BUS. If LFS equals zero and the selected resource is prefetchable (step HSKW13), the READY signal is negated (step HSKW14), TERMINATE signal is asserted (HSKW15); the assertion of signal TERMINATE cause the assertion of signal TRANSACTION_TERMINATION which force the loop exiting. The loop is exited because, when a prefetchable resource has LFS equals to zero no more room is available for writing and this situation cannot change under the action of the interfaced application as in the case of not prefetchable resources. The negation of READY signal informs the EXTERNAL BUS SEQUENCER to signal to the EXTERNAL-BUS that block DMI MAIN is not ready to receive a datum. The assertion of TERMINATE informs the EXTERNAL BUS SEQUENCER to signal to the EXTERNAL-BUS that DMI MAIN wants to terminate the transaction. If LFS equals zero and the selected resource is not prefetchable (step HSKW17) then the time-out counter value TIMEOUT_CNT is checked (HSKW18). If TIMEOUT_WR_CNT has reached a certain value N then READY is negated (step HSKW19), the TERMINATE signal is asserted (HSKW20); the assertion of the signal TERMINATE cause the assertion of TRANSACTION_TERMINATION signal which force the loop exiting. The loop is exited because LFS has been keeping zero for N clock pulses, so the time-out mechanism frees the EXTERNAL-BUS for other agents. The value N can be chosen to optimize the access to not prefetchable resources. As an example, let's consider a FIFO as selected resource (DOWNFIFO HOST MODULE). If the FIFO is full no more data can be written but the situation can change if the application charged in the MACRO-CELL B connected to the READ PORT of DOWNFIFO HOST MODULE reads some data. In that case new room is created to write new data. By this reason, can be convenient, when a not prefetchable resource is found full to wait some clock cycles (N), in fact the said application might free some room. Conversely, if TIMEOUT_WR_CNT has not reached the value N then READY and TERMINATE are negated (steps HSKW24 and HSKW25) and the loop is not exited. Clause at HSKW22 is executed until either time-out is reached or LFS is found different from zero (HSKW17). In this last case the transaction continues. If the EXTERNAL BUS AGENT performs a single datum access TRANSACTION_TERMINATION is asserted after a valid datum. If TRANSACTION_TERMINATION is asserted (step HSKW4) then READY is negated (step HSKW5), TERMINATE is negated (step HSKW6), TIMEOUT_WR_CNT is reset to zero (step HSKW7) and the loop is exited (HKSW8).

The Command Read Algorithm CMDR is shown in Table D6, APPENDIX D.

In the sequential representation of APPENDIX D each clock pulse corresponds to the execution of passes from CMDR1 to CMDR31 of the CMDR algorithm, that is the loop is executed each clock cycle. The CMDR algorithm generates read commands and flags towards COMMON-BUS. Feedback signals read from the block EVENT&STATUS REGISTER LOGIC (FIG. 14) regulate the algorithm operation. Feedback signals are PMC, TRANSACTION_TERMINATION, RX_BUFFER_FS, LFS, CLEAR and RRBL that means Residual Read Burst Length. The algorithm starts when "read command decoded asserted"; said information is originated from COMMAND DECODER (FIG. 14) and delivered via EVENT&STATUS REGISTER LOGIC. As soon as "read command decoded asserted" a pure query command (a query not coupled to a read command) is issued towards selected resource (step CMDR2). At the same time the COMMAND.FLAG field indicates that a new transaction starts (step CMDR3). Then the loop is entered (step CMDR4) and not exited until the signal CLEAR is asserted. Until the first valid peripheral prefix PMC is received (the implementation can be made by observing when PMC.START_OF_TRANSACTION equals PBC_ST_START_OF_TR) a pure query command is issued (step CMDR22) and COMMAND.FLAG is set to null (step CMDR23). After first valid PMC is received other steps can be executed. At this point, depending on type of the selected resource (prefetchable or not prefetchable) a proper value, which will be discussed later, is loaded into RRBL (this is not shown in the CMDR algorithm). If the selected resource is prefetchable, LFS is greater than zero and the filling level of the RX BUFFER (FIG. 14) does not exceed a certain threshold named RX_BUFFER_FS_THR (step CMDR11) a read command (step CMDR13) coupled with null flags is issued (step CMDR14). If the selected resource is not prefetchable, LFS is greater than zero, the filling level of the RX BUFFER does not exceed a certain threshold named RX_BUFFER_FS_THR and RRBL is greater than zero (step CMDR16) a read command (CMDR17) coupled with null flags is issued (CMDR18). Moreover, cause to the issuing of the read command, at (step CMDR19) RRBL is decreased by one. If the conditions at CMDR11 and CMDR16 are not satisfied then a query command are issued (step CMDR22) coupled with null flags (step CMDR23). Read commands are issued only if conditions expressed by clauses at CMDR11 or CMDR16 became true again. Conversely, as soon as TRANSACTION_TERMINATION is asserted clear is asserted (step CMDR5) and the loop is exited (step CMDR10). After the loop is exited the COMMAND.OPCODE is set to no operation (step CMDR28) and flags are set to null (step CMDR29). Finally, CLEAR is negated (CMDR31).

The test (LFS>0) executed at steps CMDR11 and CMDR16 is equivalent to the test (LFS≠0) because LFS cannot be less than zero.

As we can see from the algorithm when prefetchable resources are involved a "anticipative read is performed". This means that, no matter how the requests for data of the EXTERNAL BUS AGENT are, read commands are issued by the DMI MAIN (towards the selected prefetchable resource) until the RX BUFFER is almost completely filled; a confidence margin RX_BUFFER_FS_THR is kept to avoid buffer overflow. The reason of this read policy is represented by IT (Information Technology) protocols. The IT protocols individually handshake each single exchanged datum, so is not possible to perform a read burst without inserting wait states without using an "anticipative read" policy. In fact, let's suppose the round trip delay starting from the reception of a read command from DMI MAIN (said read command issued from the EXTERNAL BUS AGENT) to the reply of the DMI MAIN with the requested datum of N clock cycles. After having received the datum, the EXTERNAL BUS AGENT acknowledges it and a new request is issued. Even in the case the EXTERNAL BUS AGENT protocol supports zero wait states bursts (as the PCI), due to the round trip delay of N clock cycles, the best inter-arrival time of read data will be of N clock cycles. The "anticipative read" policy demonstrates very powerful, but what happens if the EXTERNAL BUS AGENT effectively reads less data that the ones stored in the RX BUFFER of FIG. 14. The proposed algorithm solves this problem by canceling, at the end of transaction, unread data remained stored in the fifo RX BUFFER (by the CLEAR command). In case the selected resource is prefetchable, like memories and registers, unread data are not lost because in prefetchable resources read operation is not destructive for stored data. The contrary happen with not prefetchable resources, like fifos, where data transferred in excess into the buffer with respect to the ones really read from the EXTERNAL BUS AGENT should be lost if the application designer had not expressly designed means to avoid the drawback. The "anticipative read" policy becomes effective also with resources like fifo, without differences in respect of the prefetchable ones, thanks to a PREFETCHABLE FIFO developed at the purpose and that will be disclosed later with reference to figures from FIG. 43 to FIG. 51 and APPENDIX E.

Other solutions different from the PREFETCHABLE FIFO are possible but clearly they only are ad hoc solutions which more or less diverge from the COMMON-BUS interface protocol and are penalized consequently. A first solution is that to modify the reading algorithm to allow the issuing of read commands on the COMMON-BUS each time a datum is read by the EXTERNAL BUS AGENT, for example by set the parameter RRBL to 1 executing single read accesses. In this case value LFS is different from zero and RX_BUFFER-FS is not greater than RX_BUFFER_FS_THR. Until said conditions are not verified, only query commands are issued from the DMI MAIN towards the selected resource. The improvement is limited, due to the high number of inserted wait states, caused from the read by fits and starts. The burst efficiency of such a burst is comparable with the overall bus efficiency calculated over a set of single read accesses totally carrying the same amount of data. The drawbacks about efficiency in burst transactions are the same as those algorithms in the known the art.

Another solution to the problem of executing an anticipative read with not prefetchable resources is that to exploit the DMA technique. In case of DMA operation efficient reading accesses can only be achieved if the DMA controller can provide via a custom connection the burst length information to the DMI MAIN block. Burst length information is provided for the precise purpose of charging in the buffer the only data that effectively will be red from the EXTERNAL BUS AGENT. This prevents unread data from remaining in the buffer and is lost at the successive access to buffer by a different resource, contrarily to the anticipative read of prefetchable resources where burst length information is unnecessary. The burst length is the number of data the DMA controller is going to transfer, reading them from an agent and writing them to another agent. In this case the burst length is copied into RRBL register before the transaction initiates. This approach is difficult to implement because when not prefetchable resources are involved both number of data to transfer and free space for data are not known in advance.

Another method to face this problem is used by the PCI standard bus. PCI standard defines commands able to transfer blocks of data. The drawback of this kind of approach is that it only works if the interfaced device embeds a cache memory and also in that case there is the problem to check the status of the lines of the cache (to see if valid data are present). If the resource supplying data to the cache is not prefetchable the problem is not solved but only moved.

Another workaround to the problem of reading not prefetchable resources is obtained connecting only a single resource in read direction to block DMI MAIN. Precisely, the only configured resource in read must be the not prefetchable resource connected in read direction (a TOPFIFO HOST MODULE of a DMI PERIPHERAL). Doing this way the unread data in the RX BUFFER at the end of a transaction will be read during the next transaction. Is it clear that this solution highly hampers the flexibility of the proposed architecture. Some less limited workaround can be obtained if a particular structure of the software running or controlling the EXTERNAL BUS AGENT is supposed. In any case no solutions are possible having the generality and the advantages of the PREFETCHABLE FIFO.

Besides fifos, other not prefetchable resources are known, for example Test&Set registers used like semaphores to synchronize concurrent process belonging to an operative system, or to set up high priority interrupts. In the distributed interface of the example the READ&RESET registers, intrinsically not prefetchable, are managed like the prefetchable ones for set up requests of service from peripheral resources. The stratagem consists of do not really reset a register after a polled interrupt is served but only after the content of the register has been read from the EXTERNAL BUS AGENT, in that a certain resemblance is noticed with the aim of the PREFETCHABLE FIFO.

The HandShake Read algorithm HSKR is shown in Table D8, APPENDIX D.

In the sequential representation of APPENDIX I each clock pulse corresponds to the execution of passes from HSKR1 to HSKR31 of the HSKR algorithm, that is the loop is executed each clock cycle. The HSKR algorithm generates handshake signals towards the EXTERNAL BUS SEQUENCER enabling this block to regulate read transactions with the EXTERNAL-BUS. Input handshake signals read from the block EVENT&STATUS REGISTER LOGIC (FIG. 14) regulate the algorithm operation. Feedback signals are PMC, TRANSACTION_TERMINATION, RX_BUFFER_FS and LFS.

The algorithm starts when "read command decoded asserted"; said information is originated from block COMMAND DECODER (FIG. 14) and delivered via register EVENT&STATUS REGISTER LOGIC. As the loop is entered, if the RX BUFFER (FIG. 14) is not empty (step HSKR9) then the signal READY is asserted (step HSKR10), TERMINATE signal negated (HSKR11), and the time-out counting value TIMEOUT_RD_CNT reset to zero (step HSKW12). The assertion of READY signal informs the EXTERNAL BUS SEQUENCER block to signal, to the EXTERNAL-BUS, that main DMI MAIN is ready to deliver a datum. If LFS equals zero, the selected resource is prefetchable and the RX BUFFER is empty (step HSKW13), then signal READY is negated (step HSKR14) and signal TERMINATE is asserted (HSKR15). On its turn, the assertion of signal TERMINATE causes the assertion of signal TERMINATE_TRANSACTION which force the loop exiting (step HKSR8). The loop is exited because, when a prefetchable resource has LFS equal to zero no more room is available for reading and this situation cannot change under the action of the interfaced application as in the case of not prefetchable resources. Moreover, being the RX_BUFFER empty no more previously stored data are available for reading from the EXTERNAL-BUS. The negation of READY signal informs the block EXTERNAL BUS SEQUENCER to signal to the EXTERNAL-BUS that main DMI MAIN is not ready to deliver a datum. The assertion of signal TERMINATE informs the EXTERNAL BUS SEQUENCER block to signal to the EXTERNAL-BUS that DMI MAIN wants to terminate the transaction. If value LFS equals zero, the RX BUFFER is empty and the selected resource is not prefetchable (step HSKR17) then the time-out counting value TIMEOUT_RD_CNT is checked (step HSKW18). If TIMEOUT_WR_CNT has reached a certain value N then READY signal is negated (step HSKR19), TERMINATE signal is asserted (step HSKR20); the assertion of TERMINATE signal cause the assertion of the signal TERMINATE_TRANSACTION which force the loop exiting (step HKSR8). The loop is exited because signals LFS and RX_BUFFER_FS have been keeping zero for N clock pulses, so the time-out mechanism frees the EXTERNAL-BUS for other agents. The value N can be chosen to optimize the access to not prefetchable resources. As an example, let's consider as selected resource the fifo of TOPFIFO HOST MODULE (FIG. 23). If the fifo is empty no more data can be read but the situation can change if the application embedded in MACRO-CELL A connected to the WRITE PORT of TOPFIFO HOST MODULE writes some data. In that case new data are available for reading. By this reason, can be convenient, when a not prefetchable resource is found empty to wait some clock cycles (N), in fact the application connected to the write port might write some data. Conversely, if the counting TIMEOUT_RD_CNT has not reached value N, then TIMEOUT_RD_CNT is increased (step HSKR23) READY and signal TERMINATE are negated (steps HSKR24 and HSKR25) and the loop is not exited. Clause at HSKR27 is executed until either time-out is reached or RX_BUFFER_FS is found different from zero (HSKR9). The first case arises when after first valid PMC comes back on the COMMON-BUS the conditions expressed in clause at step HSKR13 become true; in this case the loop is immediately exited. If after first valid PMC comes back on the COMMON-BUS the conditions expressed in clause at step HSKR17 become true the loop can be exited after time-out (with the mechanism explained above). In none of said two cases takes place the transaction continues (in this case the clause at step HSKR9 verifies). Regarding the step HSKR27 is important to underline that it is reached at the beginning of a transaction because at the beginning both RX_BUFFER_FS and LFS take the value zero and PMC.RESOURCE_TYPE has the value PBC_RT_NULL so steps HSKR13 and HSKR17 cannot be entered.

The CoMmanD Read Flush algorithm CMDRF is shown in Table D7, APPENDIX D. It will be described later, in its natural context, while describing the PREFETCHABLE FIFO.

Figure 35:
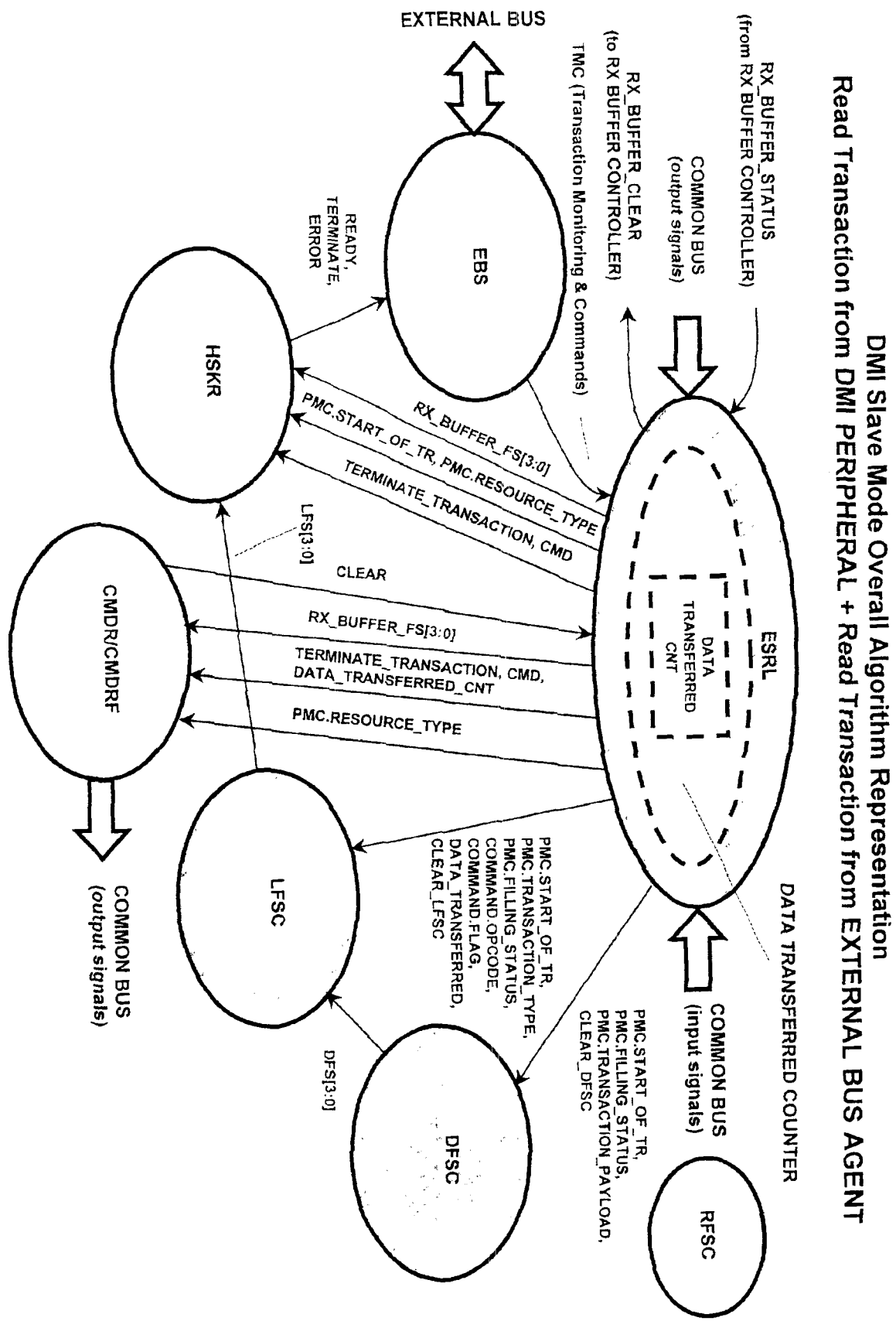
FIG. 35 indicates as many representations of transactions among overall algorithms building up the protocol governing the distributed microprocessor interface of FIG. 29 operating in slave mode. In Figure is represented the case of DMI slave, EBA master executing a read transaction transferring data from a resource belonging to a DMI PERIPHERAL to the EBA (read from DMI PERIPHERAL to DMI MAIN plus read from DMI MAIN to EBA)

FIG. 35 opens a series of Figures spanning from 35 to 42 in which the arguments discussed from APPENDIX A (Table A3) to APPENDIX D (from Table D1 to Table D8), namely commands, PMC Peripheral Monitoring Codes and algorithms, are duly exploited to illustrate the COMMON BUS PROTOCOL. The nine figures are subdivided in three groups each one refereed to a transaction illustrated in a row of Table A3 and by arrows in FIG. 29. Each group includes a bubble figure like the 35 followed by two other figures relative to two different conditions for terminating the transaction. Bubble figures show a cut of algorithms cooperating to carry out as many relevant transactions, the couples of followed figures are message sequence charts in which a "run" of the timing evolution of the protocol is shown in relation to the cooperating algorithms.

FIG. 35 shows the relationship among the different protocols cooperating in a read transaction when the EXTERNAL BUS AGENT is master and DMI is in slave mode. The figure may be seen as a graphical illustration of the protocol MA when this type of transaction is executed, omitting aspects connected to arbitration and focussing those aspects connected to interactions between involved protocols. Moreover describing this figure algorithms will be mapped to the blocks of FIG. 14 dedicated to implement them.

With reference both to the FIG. 35 and FIG. 14, and to the algorithms described in APPENDIX B, and APPENDIX D, we notice that algorithms are shown in the form of homonymous bubbles. Bubbles EBS and RFSC are not represented in dedicated appendixes, and a main bubble ESRL, which includes among other things the main algorithm MA, is not named in a homonymous way. Bubbles represent algorithms, to say they represent logical operation performed on input signals, the independent variable of the algorithm, for obtaining output signals useful to carry out a specific function which concur with other functions provided from other algorithms to complete the considered transaction. Algorithms in the distributed interface are mostly localized inside the main block DMI MAIN, they are shared among the various functional blocks of the main for the precise aim to serve peripherals. Blocks DMI PERIPHERALs are charged, upon reception of a Grant signal, to the only execution of an algorithm named Remote Filling Status Calculator algorithm (RFSC) corresponding to the operation of the various typologies of blocks FILLING STATUS CALCULATOR embedded in the layers REGBLOCK, MEMBLOCK, and FIFOBLOCK. The bubble RFSC is directly connected to the COMMON-BUS incoming to the main bubble ESRL to provide this bubble with relevant PMC indicating remote filling status (RFS). The main bubble ESRL receives signals from the two directions of the COMMON-BUS, exchanges signals with the RX BUFFER (FIG. 14) and directly communicates with five other bubbles DFSC, LFSC, CMDR, HSKR, EBS, and with bubble RFSC through the COMMON-BUS. FIG. 35, (and the similar FIG. 38 and FIG. 41). The distributed architecture of the hardware interface also impacts the architecture of the COMMON-BUS protocol in which a tool like the monitoring of filling status of the interfaced resources is forced to be remotely executed in respect of all the other algorithms localized inside block DMI MAIN. As pointed out in precedence, the problem of the latency shall be taken in consideration from the algorithms that use filling status. Said job is charged to the algorithm LFSC that is also prompted algorithm DFSC, as indicated in APPENDIX D. Both LSFC and DFSC cooperates for constructing at the actual clock cycle a local filling status LFS, delayed image of the remote filling status RFS. In carrying on this process they takes in account three different factors. First factor is the received remote filling status RFS. Second one is represented by the knowledge whether a read/written datum is really transferred or not. Third one, that as an example is to consider in case of not prefetchable resource like a fifo, is the possible variation in the remote filling status RFS between the current and the preceding clock cycle.

Figure 38:
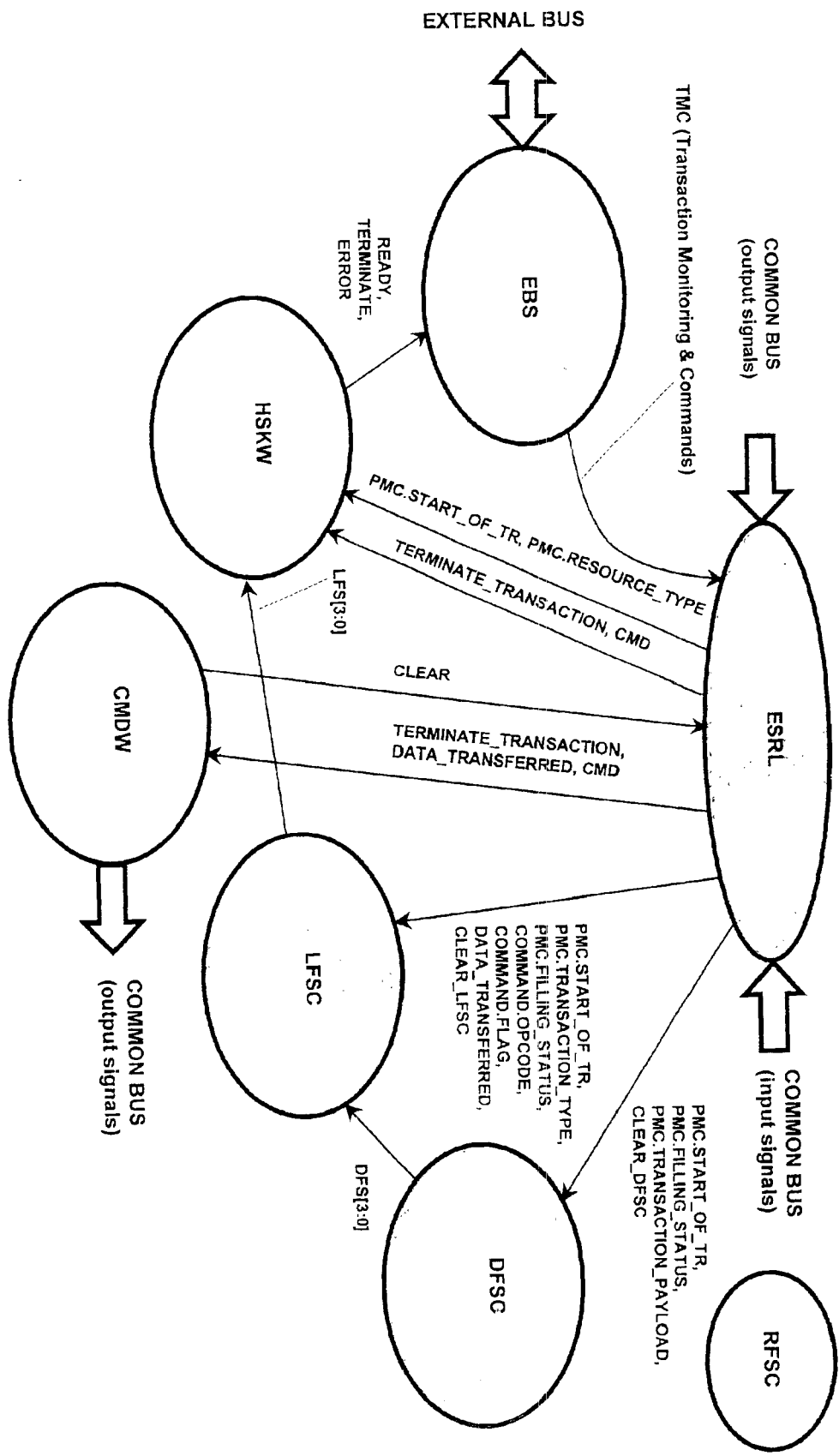
FIG. 38 indicates as many representations of transactions among overall algorithms building up the protocol governing the distributed microprocessor interface of FIG. 29 operating in slave mode. In Figure is represented the case of DMI slave, EBA master executing a write transaction transferring data from the EBA to a resource belonging to a DMI PERIPHERAL (write from EBA to DMI MAIN plus write from DMI MAIN to DMI PERIPHERAL)
Figure 41:
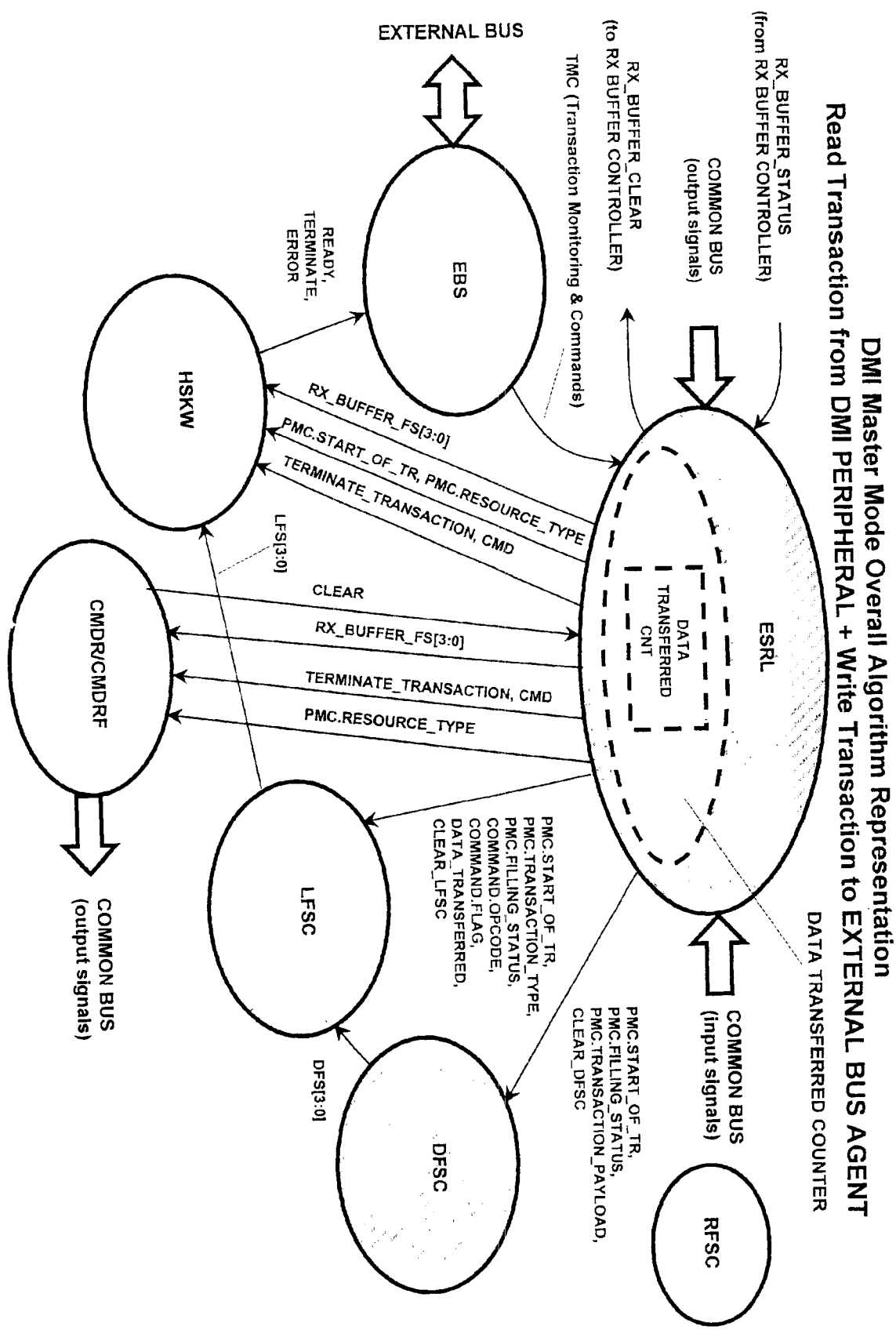
FIG. 41 indicates as many representations of transactions among overall algorithms building up the protocol governing the distributed microprocessor interface of FIG. 29 operating in of master mode. In Figure is represented the case of DMI master, EBA slave executing a write transaction transferring data from a resource belonging to a DMI PERIPHERAL to the EBA (read from DMI PERIPHERAL to DMI MAIN plus write from DMI MAIN to EBA)

Moreover the hardware architecture impacts the protocol in subject as concern the overall distributed interface but more in particular inside the main block DMI MAIN. The fact is recognizable when the algorithms (bubbles) of FIG. 35, FIG. 38, and FIG. 41 are mapped into as many functional blocks of DMI MAIN (FIG. 14), more precisely:
algorithm DFSC is implemented by EVENT&STATUS REGISTER LOGIC block;
algorithm LFSC is implemented by EVENT&STATUS REGISTER LOGIC block;
algorithm CMDR is implemented by MAIN COMMON BUS SEQUENCER block;
algorithm CMDRF is implemented by MAIN COMMON BUS SEQUENCER block;
algorithm CMDW (FIG. 35) is implemented by block MAIN COMMON BUS SEQUENCER;
algorithm HSKR is implemented by MAIN HANDSHAKE SEQUENCER block;
algorithm HSKW (FIG. 38 and FIG. 41) is implemented by block MAIN HANDSHAKE SEQUENCER;
algorithm EBS is implemented by EXTERNAL BUS SEQUENCER block;
algorithm ESRL represents the algorithm performed by parts of the block EVENT&STATUS REGISTER LOGIC; other parts of this block implement both DFSC and LFSC algorithms, by this reason bubbles ESRL, DFSC and LFSC are sketched with the same "stripped" pattern. Moreover the generation of meaningful signals, as RX_BUFFER_CLEAR, is attributed to ESRL bubble.

An algorithm controlling the operation of block DMI MAIN CONTROLLER is not represented in FIG. 35 because the functions performed by this algorithm are not fundamental in the comprehension of the invention. Said functions are most properly related to the control of several blocks in FIG. 14 using the normal design skill.

Looking at the various signals exchanged among the seven bubbles in FIG. 35 (the same will be true for similar FIG. 38 and FIG. 41) it can be appreciate at glance that the majority of the signals depart from the main bubble ESRL or are confluent to it. The fact is due to the main role of this bubble whose underlying algorithm observes the meaningful event on the two buses and prompts all the submitted algorithms, which run concurrently, with opportune signals able to synchronize the respective operation inside a clock cycle. In this way initial conditions relevant to a read/write, transaction evolve during successive clock cycles into a sequence of events leading to the execution of a read/write command, often reiterated in a burst, and terminating when a terminating condition is met.

Bubble ESRL receives the input signals of the COMMON-BUS (the ones inputted to DMI MAIN) and the output signals of the COMMON-BUS (the ones outputted from DMI MAIN). Moreover, it receives from RX BUFFER CONTROLLER (FIG. 14) signals (RX_BUFFER_STATUS) monitoring the status of RX BUFFER (filling level, etc.). Finally, it receives from the bubble EBS a set of signals named TMC (Transaction Monitoring and Commands) allowing the monitoring of the performed transaction and reception of commands from the EXTERNAL-BUS. These signals depend on the particular EXTERNAL BUS SEQUENCER implemented, which, on its turn, depends on which EXTERNAL-BUS has to be interfaced. One of the goals of the ESRL algorithm is to transform this set of signal, which may change, into the set of signals outputted from the ESRL bubble towards the other algorithms shown in FIG. 35. These outputted signals are supposed to be so general to allow the interfacing of COMMON-BUS with any possible EXTERNAL BUS SEQUENCER interfacing any EXTERNAL-BUS belonging to the Information Technology field. Peripheral code PMC.FILLING_STATUS (the remote filling status RFS) that the bubble ESRL receives from bubble RFSC via the COMMON-BUS is sent towards both bubbles DFSC and LFSC. Moreover bubble LFSC receives via bubble ESRL the COMMAND.OPCODE and COMMAND.FLAGS transmitted on COMMON-BUS from DMI MAIN to DMI PERIPHERALS, bubble LFSC further receives signals DATA_TRANSFERRED and CLEAR_LFSC directly from the bubble ESRL. The output of bubble DFSC represented by signal DFS[3:0] is inputted to the bubble LFSC. Moreover bubble DFSC receives from bubble ESRL a signal CLEAR_DFSC. On its turn bubble LFSC outputs the signal LFS[3:0] which is inputted into the bubble HSKR. The bubble CMDR/CMDRF receives from the bubble ESRL the following signals: DATA_TRANSFERRED, TERMINATE_TRANSACTION, RX_BUFFER_FS[3:0], PMC.RESOURCE_TYPE, DATA_TRANSFERRED_CNT and CMD. Starting from those signals bubble LFSC sets the COMMAND.OPCODE, COMMAND.FLAGS and COMMAND.FLUSH on the COMMON-BUS. Conversely, bubble CMDR sends to bubble ESRL a signal CLEAR. Bubble HSKR receives from the bubble ESRL the signals TERMINATE_TRANSACTION, RX_BUFFER_FS[3:0], CMD, PMC.START_OF_TR, PMC.RESOURCE_TYPE and outputs signals named READY, TERMINATE and ERROR to the bubble EBS. The bubble EBS directly interfaces the EXTERNAL-BUS. The status of the buffer RX BUFFER is monitored by a set of signal RX_BUFFER_STATUS while RX_BUFFER_CLEAR is a signal that clears the contents of the buffer. Finally, CMD is a group of signal representing the commands issued either from the EXTERNAL BUS AGENT or the ADDRESS/COMMAND GENERATOR block.

The role of each algorithm is now briefly pointed out with particular focus to interaction with other algorithms. The EXTERNAL BUS AGENT starts a new transaction issuing a read commands. The bubble EBS catches the read command on the EXTERNAL-BUS and via the signal TMC the command is delivered to the bubble ESRL. The command is decoded and possibly translated by the COMMAND DECODER/TRANSLATOR (this is not shown in FIG. 35), so the bubble ESRL has at disposal a command in a format CMD meaningful to the two bubbles HSKR and CMDR. Such CMD command is sent to both the bubbles CMDR and HSKR. Bubble CMDR starts a transaction on the COMMAND BUS towards the DMI PERIPHERAL identified by the ADDRESS DECODER/TRANSLATOR at the addressed resource. As soon as, the PMC begin to arrive from the COMMON-BUS both the bubbles DSFC and LFSC start to work. The bubble DFSC is charged to calculate the delta filling status (DFS[3:0]) and calculates it basing on the code PMC.FILLING_STATUS provided by the bubble ESRL which, on its turn receives it from the bubble RFSC via the COMMON-BUS. This filling status is the remote filling status RFS outputted from the currently interfaced resource. At the end of transaction signal CLEAR_DFSC restores the initial condition on bubble DFSC. In parallel with bubble DFSC, the bubble LFSC calculates a local (local with respect to DMI MAIN) image of the filling status of the currently interfaced resource. To do this it uses the following signals: COMMAND.OPCODE, COMMAND.FLAGS, DATA_TRANSFERRED, and PMC.FILLING_STATUS (the RFS one) via the bubble ESRL, plus delta filling status DFS[3:0] provided by bubble DFSC. The outputted local filling status LFS[3:0] is the basis of the flow control in both read and write transactions in the DMI interface. At the end of transaction signal CLEAR_LFSC restores the initial condition on bubble LFSC. The bubble HSKR performs the flow control basing on both filling status signals LFS[3:0] and RX_BUFFER_FS[3:0] and interface the bubble EBS sending to it proper flow control signals: READY, TERMINATE and ERROR. Bubble EBS is a bus sequencer designed to interface the EXTERNAL-BUS. It is controlled via flow control signals sent by bubble HSKR: READY, TERMINATE and ERROR, and monitored by the set of signals TMC sent from the bubble EBS itself to the bubble ESRL.

Figure 36:
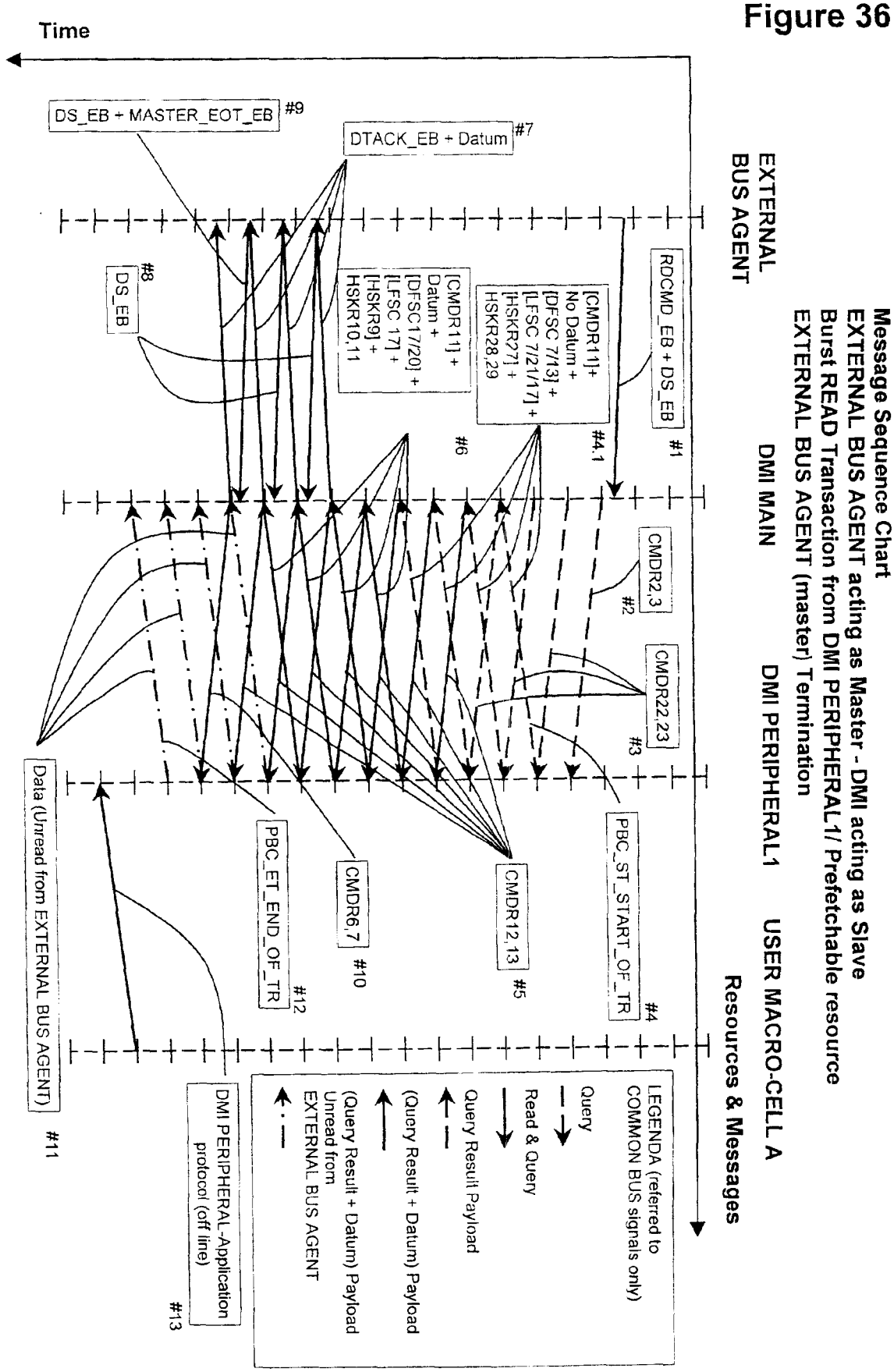
FIG. 36 indicates a message sequence chart related to the transactions of the preceding FIG. 35 in the case where the transaction is terminated by the EBA.
Figure 37:
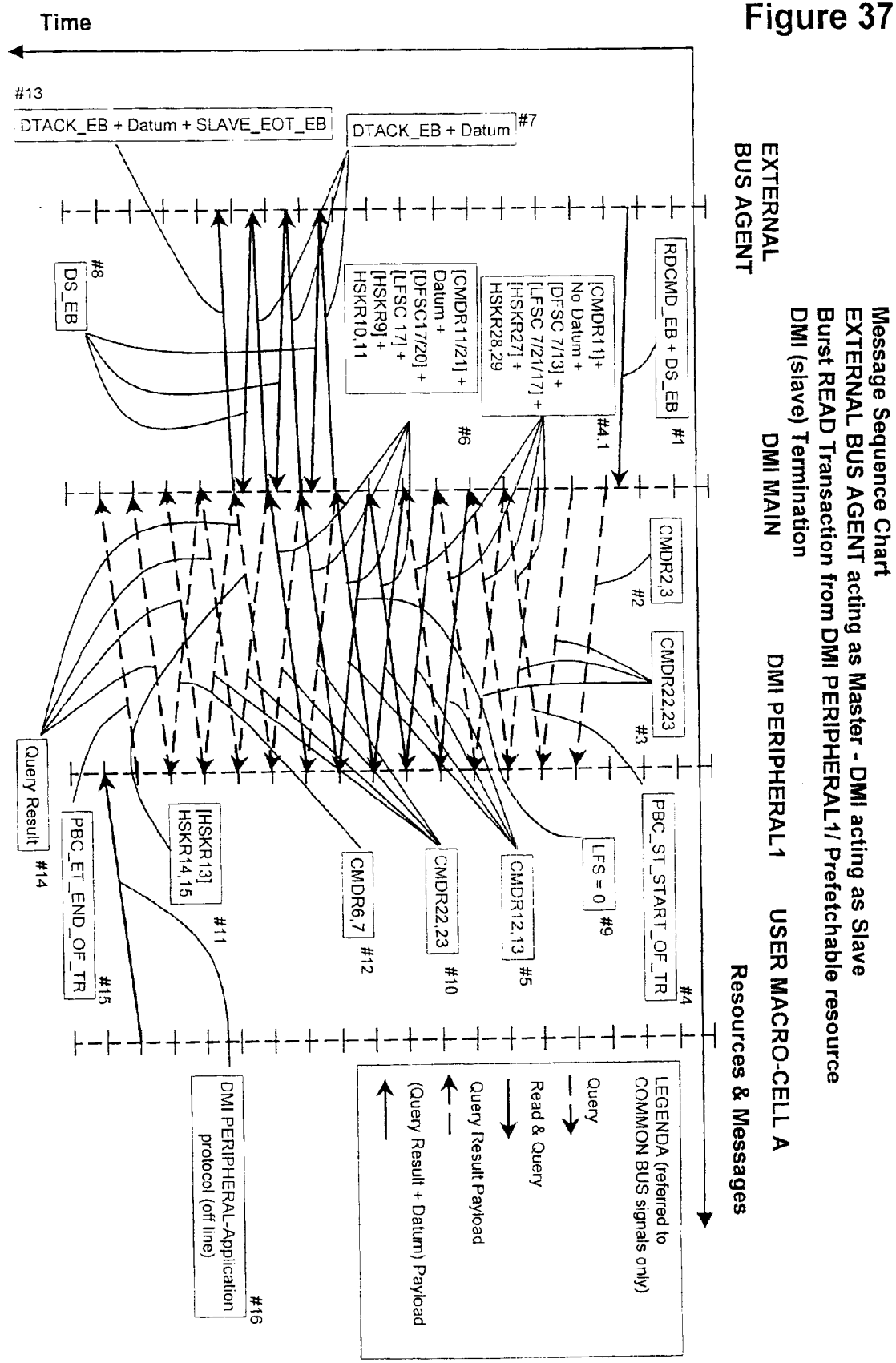
FIG. 37 indicates a message sequence chart related to the transactions of the preceding FIG. 35 in the case where the transaction is terminated by the DMI.

To understand how the algorithms work together, the flow control mechanism is discussed; the colloquial cut of the discussion will be carefully defined illustrating successive FIG. 36 and FIG. 37. A prefetchable resource connected to a certain DMI PERIPHERAL is involved in a read transaction. The filling status of said resource is retrieved from bubble ESRL via the COMMON-BUS and delivered to both DFSC and LFSC bubbles. Bubble LFSC provides the local filling status LFS[3:0]. In the meanwhile, when bubble CMDR recognizes that the resource involved in the transaction is a prefetchable one it starts an anticipative read burst. The flow of read commands towards the interfaced resource is regulated from the bubble CMDR by monitoring the filling level of the buffer RX BUFFER; such a monitoring is performed by observing RX_BUFFER_FS[3:0] signal, this prevents the buffer RX BUFFER from overflowing. At the same time bubble HSKR uses both filling status signals LFS[3:0] and RX_BUFFER_FS[3:0] to assert signal READY and negate signal TERMINATE to declare to bubble EBS the availability of data for reading.

When both signals LFS[3:0] and RX_BUFFER_FS[3:0] become zero no more data are available and TERMINATE is asserted and READY is negated. On the contrary, the negation of READY and the simultaneous negation of TERMINATE means the insertion of a wait state. After the assertion of TERMINATE, the bubble EBS signals to the EXTERNAL BUS AGENT the termination of the transaction using the EXTERNAL BUS AGENT protocol. The bubble ESRL, monitoring the EXTERNAL-BUS via bubble EBS, recognizes the termination of transaction and sends a TERMINATE_TRANSACTION signal to both bubbles HSKR and CMDR. Bubble HSKR goes to the idle state after having received signal TERMINATE_TRANSACTION. Bubble CMDR, after having received signal TERMINATE_TRANSACTION, puts on the COMMON-BUS the command to end the current transaction and asserts the signal CLEAR before going back to idle state. Bubble ESRL receives the CLEAR and asserts with proper timing the following signals: CLEAR_DFSC, CLEAR_LFSC and RX_BUFFER_CLEAR. Those signals respectively put into idle state bubbles DFSC and LFSC and reset the buffer RX BUFFER. The reset of the buffer is achieved by resetting the pointers provided by the block RX BUFFER CONTROLLER (FIG. 14). The reset of the buffer prevents the EXTERNAL BUS AGENT from reading, in a successive read transaction, the possible unread data.

The described protocol architecture is very powerful and flexible for the following reasons:

a unique signal LFS[3:0] needs for monitoring the status of the remote resource;

two only signals LFS[3:0] and RX_BUFFER_FS[3:0] are needed to the declare at the EXTERNAL BUS AGENT the availability of data for reading;

reading algorithms acting on the EXTERNAL-BUS and COMMON-BUS, namely bubbles HSKR and CMDR, are de-coupled and only communicate via the main algorithm of the bubble ESRL;

the main algorithm of the bubble ESRL synchronizes the concurrent algorithms using information from COMMON-BUS and EXTERNAL-BUS, this grants a simple synchronization because the synchronization signals (PERIPHERAL_MONITORING_CODE.<field>, TERMINATE_TRANSACTION, DATA_TRANSFERRED, CMD, CLEAR_DFSC and CLEAR_LFSC) are coupled to "milestones" of both protocols EBAP (EXTERNAL BUS AGENT PROTOCOL) and CBP (COMMON BUS PROTOCOL). For instance, the signal TERMINATE_TRANSATION is derived from the transaction termination of protocol EBAP, the signal PMC.START_OF_TRANSACTION is the start of transaction message of protocol CBP, the signal DATA_TRANSFERRED is derived from the acknowledge in the protocol EBAP which signals the exchanged datum, etc;

in case of change of EXTERNAL BUS AGENT changes needed in the DMI MAIN architecture are localized into the bubbles EBS and ESRL, into the ADDRESS/COMMAND GENERATOR block and into COMMAND DECODER/TRANSLATOR block.

In FIG. 36 a message sequence chart is shown of the read transaction initiated by an EXTERNAL BUS AGENT of FIG. 32 acting as a master toward a DMI MAIN block acting as a slave to interface a prefetchable resource. Said prefetchable resource (i.e. a STATUS REGISTER) embedded into DMI PERIPHERAL1 is, on its turn, connected to the MACRO-CELL A. Transactions takes place on EXTERNAL-BUS, COMMON-BUS and POINT2POINT bus. The master terminates the transaction after having read 4 words.

The message sequence chart of FIG. 36 shows a "run" of the cooperating algorithms whose relationships have been illustrated in FIG. 35. Message sequence charts are common means used in communication area to illustrate the timing evolution of protocols, it shows in abscissa the messages of the protocol under analysis exchanged between agents, while in ordinate time is shown as independent variable.

Messages of the protocols are represented by arrows in FIG. 35. The meaning of different arrows is explained in the legenda. Each arrow is referenced by a callout in which the steps of the algorithm involved with that particular message are shown. Inside the callout the steps of the algorithms involved with that message are referenced; as an example CMDR13, 14 means that steps 13 and 14 (in this context the comma "," acts as a logical AND) of algorithm CMDR charged of the generation of the message referenced in the callout embedding the text CMDR13, 14. Another possible notation is given in the following example: LFSC17, 18, 19/21; this means that two cases are possible, one in which steps LFSC17 and LFSC18 and LFSC19 of algorithm LFSC are executed and another in which step LFSC21 of algorithm LFSC is executed; in this context the slash ("/") acts as a logical OR. Moreover, a last notation using square brackets, is used; as an example, [CMDR11, 12] means that the clauses at steps CMDR11 and 12 are evaluated basing on information carried by the message referenced by the callout embedding the text [CMDR11, 12]. Additional text constituted by natural language can be embedded into callout.

Each callout is assigned a number in the form: #<number> to help in referencing the callout in the text. This number does not strictly imply the time ordering of the callout in the algorithm execution, because most of the involved algorithms are concurrent. In the same way, FIG. 36 and other message sequence chart contain correct but not complete information. Only the "milestones" in the protocol runs are reported for reasons of clarity. Moreover a lot of details can change in different implementations.

In FIG. 36, callout #1, the EXTERNAL BUS AGENT issues a read command. The DMI MAIN receives it and starts a read transaction on the COMMON-BUS in callout #2 issuing a WaitRead&Query(N) commands. Than, in callout #3, other WaitRead&Query(N) commands are issued. Than, the selected DMI PERIPHERAL (DMI PERIPHERAL1) replies to said commands with PMC, first reply is characterized by a start of transaction flag in callout #4. Said codes are evaluated (callout #4.1) in clause at step CMDR11 of algorithm CMDR to decide which further command have to be issued. At the same time, the filling status and other fields of PMC are evaluated in clause at step DFSC7 (current reply is the $1^{st}$ reply of current transaction) of algorithm DFSC and in clause at step LFSC7 (current reply is the $1^{st}$ reply of current read transaction) of algorithm LFSC. The local filling status LFS so calculated is put at HSKR and CMDR algorithms disposal. The HSKR algorithm evaluates clause at step HSKR27 and executes steps HSKR28 and 29, as a consequence algorithm EBS inserts wait states on the EXTERNAL-BUS or do not assert Data Strobe (the exact interface signals depends on the chosen EXTERNAL-BUS type selected). Since CMDR algorithm detect signal LFS different from zero it starts issuing Read&Query(N) commands on the COMMON-BUS, this is indicated by callout #5. At the same time HSKR algorithm keeps both READY and TERMINATE negated (clause at step HSKR27 is evaluated and steps HSKR28 and 29 are executed). Than, the replies to Read&Query(N) begin to arrive to the DMI MAIN this is indicated by callout #6. The PMC is evaluated in the clause CMDR11 of algorithm CMDR. The steps of DFSC algorithm from DFSC17 to DFSC20 are evaluated because the PMC.TRANSACTION_PAYLOAD indicates the presence of data into the payload; in this particular case the interfaced resource is prefetchable and so the resulting DFS value is zero. Than the algorithm LFSC evaluates the clause at step LFSC17 and calculates the new LFS value. At this point the algorithm HSKR evaluates clause at step HSKR9 and executes steps HSKR10 and 11. This imply the assertion of READY, indicating the availability of a valid datum, which is inputted to the algorithm EBS and this exchange the datum present into the RX BUFFER with the EXTERNAL BUS AGENT. The presence of a valid datum on the EXTERNAL-BUS is indicated by signals referenced in callout #7 which are originated by algorithm EBS and are not part of the present interface. In information technology protocols, as the PCI, as soon as a datum has been acknowledged, a new datum is required. This is illustrated in FIG. 36 by the DS_EB message issued from the EXTERNAL BUS AGENT; this is referenced by callout #8.

In this "run" we suppose the EXTERNAL BUS AGENT to terminate the transaction, so in callout #9 DS_EB and MASTER_EOT_EB are asserted (doing this the master catch the last datum and declare that no more data will be requested from it). When this event is detected by algorithm ESRL probing TMC signals. When this event is detected the ESRL algorithm asserts the TERMINATE_TRANSACTION signal which is sent to both algorithms HSKR and CMDR. Algorithm CMDR sends an end of transaction flag to DMI PERIPHERAL1 (callout #10, steps CMDR6 and 7). Due to the latency of communication between the two blocks DMI MAIN and DMI PERIPHERAL1 further data (unread from EXTERNAL BUS AGENT) are provided by DMI PERIPHERAL1 (callout #11) to the RX BUFFER embedded into DMI MAIN block. This goes on until also the block DMI PERIPHERAL1 sends an end of transaction flag to DMI MAIN block (callout #12). Finally, callout #13 illustrates a transaction promoted by MACRO-CELL A to write a datum in the resource embedded into DMI PERIPHERAL1. If, for instance, the resource is a STATUS REGISTER, it is evident that MACRO-CELL A, which is supposed to be connected with that register, can write the STATUS REGISTER at any moment without any relationship to the moment at which the STATUS REGISTER is read from the DMI MAIN block.

FIG. 37 differs from the preceding FIG. 36 in that the slave block DMI MAIN terminates the read transaction after that the master EXTERNAL BUS AGENT has read 4 words. In FIG. 37, operations specified from callout #1 to #8 are the same as those specified in FIG. 36 by the identical callout. In this "run", differently from case of FIG. 36, we suppose be the DMI MAIN block to terminate the read transaction, so in callout #9 the local filling status LFS is detected to be zero. This results from execution of steps LFSC17, in look ahead modality, this means that each time a Read&Query(N) command is executed the LFS value is decreased by one without waiting for the PMC corresponding to this command. The LFS value is supposed to become zero as a consequence of the execution of the last Read&Query(N) command. At this point, as indicated by callout #10, algorithm CMDR starts issuing WaitRead&Query(N) commands. When last read datum has been received and popped out from the RX BUFFER (callout #11) step HSKR13 is evaluated; as a consequence, signal READY is negated ad signal TERMINATE is asserted. The algorithm EBS translates these two signals into a termination message to the EXTERNAL BUS AGENT (callout #13) which, on its turn, terminates. The termination of the EXTERNAL BUS AGENT is sensed by algorithm ESRL probing TMC signals. When this event is detected the algorithm ESRL asserts the TERMINATE_TRANSACTION signal that is sent to both algorithms HSKR and CMDR. Algorithm CMDR sends an end of transaction flag to the peripheral DMI PERIPHERAL1 (callout #12) executing steps CMDR6 and CMDR7 of algorithm CMDR. Peripheral DMI PERIPHERAL1 stop sending PMC to the main DMI MAIN. Said codes are indicated by callout #14. After having received the Clear command from DMI MAIN block, the DMI PERIPHERAL reply with an End of Transaction PMC that is indicated by callout #15. In general DMI MAIN block does not need to receive this PMC to terminate; this depends on implementation. In the presented case the termination of algorithms CMDR and HSKR is caused by the TERMINATE_TRANSACTION signals asserted by algorithm ESRL. Finally, callout #16 is the same as callout #13 of the previous FIG. 36.

FIG. 38 shows the relationship among the different protocols cooperating in a write transaction when the EXTERNAL BUS AGENT is master and DMI is in slave mode. The figure may be seen as a graphical illustration of the protocol MA when this type of transaction is executed, omitting aspects connected to arbitration and focussing those aspects connected to interactions between involved protocols. The write transaction of FIG. 38 differs from the read transaction of FIG. 35 mainly because in the bubble representation of the algorithms, bubble CMDW replaces bubble CMDR/CMDRF and bubble HSKW replace bubble HSKR. Moreover in the write transaction of FIG. 38 the RX BUFFER (FIG. 14) is not used, so the relevant signals: RX_BUFFER_STATUS, RX_BUFFER_CLEAR, and RX_BUFFER_FS[3:0] are not present. All the other signals indicated by arrows remain unchanged in the two figures except for the signal DATA_TRANSFERRED in FIG. 38 directed from bubble ESRL to the bubble CMDW which replace signal PMC.RESOURCE_TYPE of FIG. 35.

The role of each algorithm is now briefly pointed out with particular focus to interaction with other algorithms. Operation of bubbles DFSC and LFSC for calculating filling status DFS and LFS remains unchanged with respect the operation discussed illustrating FIG. 35, that is not repeated. The EXTERNAL BUS AGENT starts a new transaction issuing a write commands. The command is caught on the EXTERNAL-BUS from bubble EBS, decoded and translated into the signals TMC put at disposition of the bubbles ESRL, HSKW, and CMDW. Bubble CMDW starts a transaction on the COMMAND-BUS towards the DMI PERIPHERAL/resource identified by the ADDRESS DECODER/TRANSLATOR (FIG. 14). As soon as, the PMC begin to arrive from the COMMON-BUS both DSFC and LFSC bubbles start to work as previously said, in this case the bubble HSKW receives the local filling status LFS[3:0] to perform the flow control on EXTERNAL-BUS, via the bubble EBS, together the signals READY, TERMINATE and ERROR.

To understand how the algorithms work together the flow control mechanism is illustrated. A prefetchable resource embedded/connected to a certain DMI PERIPHERAL is involved in a write transaction. The issued write command is decoded and a proper CMD command is sent from bubble ESRL to both bubbles CMDW and HSKW. Bubble CMDW starts issuing a WaitWrite&Query(N) command towards the selected peripheral DMI PERIPHERAL. The last starts replying to the DMI MAIN block with peripheral monitoring codes embedding the filling status of addressed resource. The filling status of the addressed resource is retrieved from bubble ESRL on the COMMON-BUS and delivered to both bubbles DFSC and LFSC for the calculation of local filling status LFS[3:0]. The flow of write commands towards the addressed resource is regulated from the bubble CMDW by monitoring DATA_TRANSFERRED signal. Each time bubble CMDW recognizes that a datum has been transferred from the EXTERNAL BUS AGENT to the block DMI MAIN (DATA_TRANSFERRED asserted), it issues a Write&Query(N) command towards the interfaced resource of the selected peripheral DMI PERIPHERAL. At the same time bubble HSKW uses the local filling status LFS[3:0] to declare to bubble EBS the availability of room for writing data by asserting signal READY and negating signal TERMINATE. When both LFS[3:0] become zero and the addressed resource is prefetchable no more room for data is available and TERMINATE is asserted and READY is negated. On the contrary, the negation of READY and the simultaneous negation of TERMINATE means the insertion of a wait state.

Two kinds of termination exist. First type is named master termination and occurs when the master, namely the EXTERNAL BUS AGENT, has no more data to write. Second type is named slave termination and occurs when the slave, namely the DMI has no more room for data. After the assertion of signal TERMINATE, the bubble EBS signal to the EXTERNAL BUS AGENT the termination of the transaction using the EXTERNAL BUS AGENT protocol. The main bubble ESRL recognizes the termination of transaction and sends a TERMINATE_TRANSACTION signal to both bubbles HSKW and CMDW. After having received TERMINATE_TRANSACTION bubble HSKW goes to idle. Bubble CMDW, after having received TERMINATE_TRANSACTION, puts on the COMMON-BUS the command to end the current transaction and asserts CLEAR before going back to idle state. Bubble ESRL receives the signal CLEAR and asserts with proper timing the signals CLEAR_DFSC and CLEAR_LFSC. Those signals respectively put into idle state both the bubbles DFSC and LFSC.

First kind of termination occurs when the EXTERNAL BUS AGENT signals the transaction termination. As in the previous case, the bubble ESRL, monitoring the EXTERNAL-BUS via the bubble EBS, recognizes the termination of transaction and sends a TERMINATE_TRANSACTION signal to both the bubbles HSKW and CMDW.

Figure 39:
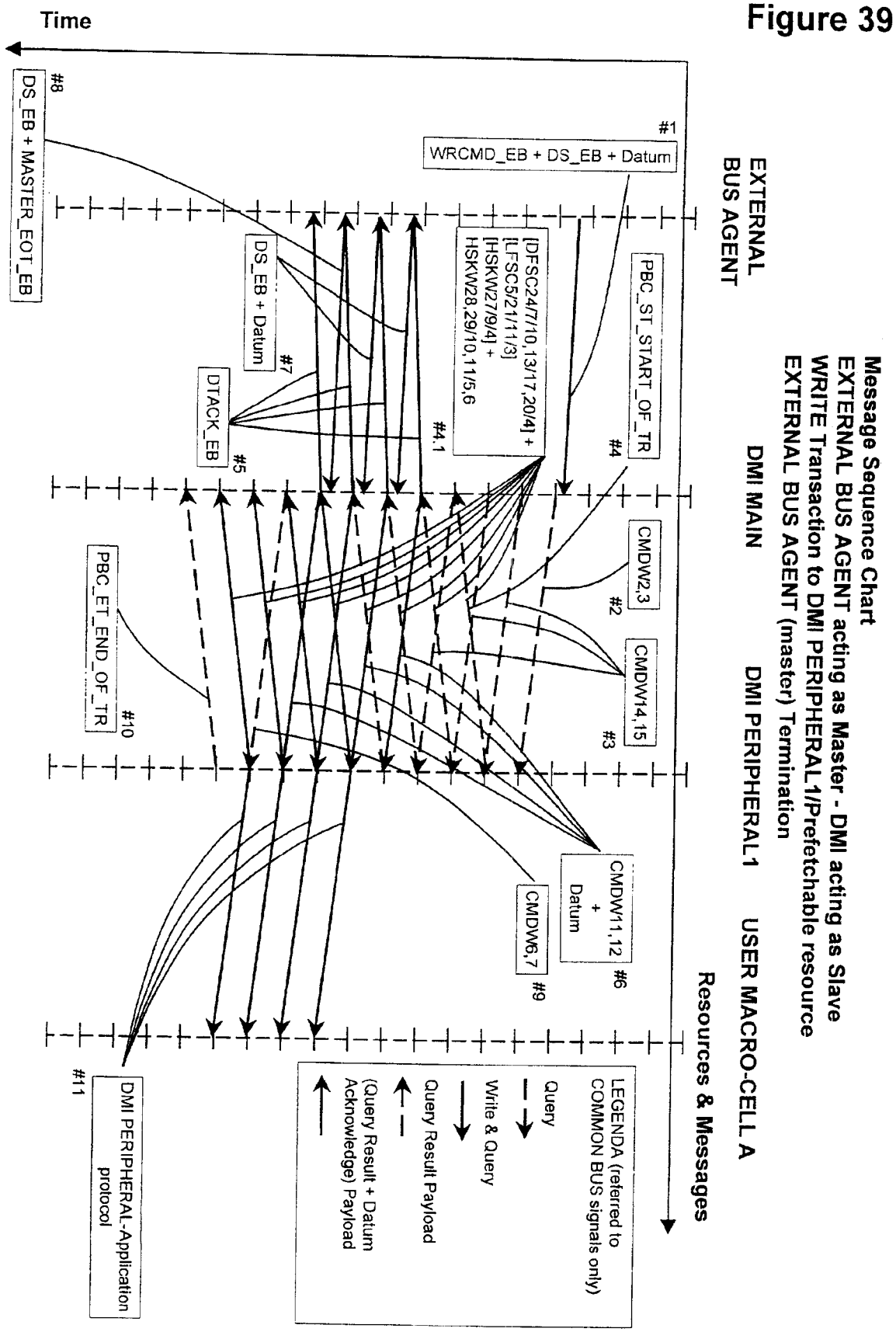
FIG. 39 indicates a message sequence chart related to the transactions of the preceding FIG. 38 in the case where the transaction is terminated by the EBA.

In FIG. 39 a message sequence chart is shown. It represents a write transaction initiated by an EXTERNAL BUS AGENT of FIG. 29 acting as a master toward a DMI MAIN block acting as a slave to interface a prefetchable resource (i.e. a STATUS REGISTER) embedded into DMI PERIPHERAL1. The DMI PERIPHERAL1 on its turn is connected to the MACRO-CELL A. Transactions take place on EXTERNAL-BUS, COMMON-BUS and POINT2POINT bus. The master terminates the transaction after having written 4 words. The slave terminates said transaction after the master (EXTERNAL BUS AGENT) has written 4 words.

The message sequence chart of FIG. 39 shows a "run" of the cooperating algorithms whose relationships have been illustrated in FIG. 38. In FIG. 39, callout #1, the EXTERNAL BUS AGENT issues a write command. The DMI MAIN receives it and starts a write transaction on the COMMON-BUS in callout #2 issuing a WaitWrite&Query (N) commands. Then, in callout #3, other WaitWrite&Query (N) commands are issued. Then, the selected DMI PERIPHERAL (DMI PERIPHERAL1) replies to said commands with PMC, first reply is characterized by a start of transaction flag in callout #4. Said codes are evaluated (callout #4.1) in clause at steps CMDW10 and 13 of algorithm CMDW to decide which further command have to be issued. Namely, the filling status and other fields of PMC are evaluated in clause at step DFSC7 (current reply is the $1^{st}$ reply of current transaction) of algorithm DFSC and in clause at steps LFSC5 (current reply is the $1^{st}$ reply of current write transaction) of algorithm LFSC. Replies different from $1^{st}$ causes the evaluation of step DFSC13 of algorithm DFSC and 21 of algorithm LFSC. The local filling status LFS so calculated is put at HSKW and CMDW algorithms disposal. The HSKW algorithm until PMC is not received evaluates clause at step HSKW27 and executes steps HSKW28 and 29, as a consequence bubble EBS inserts wait states on the EXTERNAL-BUS by not asserting DTACK_EB. Then, when HSKW algorithm detect a LFS value different from zero (clause at step HSKW9) it assert READY and keeps TERMINATE negated (steps HSKW10 and HSKW11). Here terminates the description of events referenced by callout #4.1. Assertion of READY causes the bubble EBS to declare the availability of room to write a datum. The EXTERNAL BUS AGENT puts a valid datum onto the EXTERNAL-BUS. Then it waits for the bubble EBS to acknowledge it. When the bubble EBS acknowledges it (by asserting DTACK_EB) the signal DATA TRANSFERRED is asserted. Said events are those referenced by callout #5. Then, in callout #6, as soon as, algorithm CMDW detects a local filling status LFS different from zero and DATA_TRANSFERRED asserted, it issues a Write&Query(N) command on the COMMON-BUS. Callout #7 indicates, other write commands issued by the EXTERNAL BUS AGENT. Concurrently, as soon as, the replies corresponding to write into the DMI PERIPHERAL1, which replies are identified by having PMC.TRANSACTION_PAYLOAD field set to PBC_TP_DATA_AND_QUERY_RESULT, arrives to block DMI MAIN the algorithm DFSC evaluates true clause at step DFSC17. At the same time, algorithm LFSC evaluates true clauses at step LFSC11. After having written four words the EXTERNAL BUS AGENT terminates (master termination). It signals its will to terminate the transaction when, writing fourth datum, it asserts signal MASTER_EOT_EB (callout #8). The bubble ESRL senses the termination of the EXTERNAL BUS AGENT by probing the TMC signals. When this event is detected the bubble ESRL asserts the TERMINATE_TRANSACTION signal that is sent to both algorithms HSKW and CMDW. Algorithm CMDW sends an end of transaction flag to DMI PERIPHERAL1 (callout #9) executing steps CMDW6 and CMDW7 of algorithm CMDW. DMI PERIPHERAL1 stops sending PMC to block DMI MAIN acknowledging to issued WaitWrite&Query(N) commands only after having received the Clear command from block DMI MAIN. In callout #10 the DMI PERIPHERAL1, after having received the Clear command from block DMI MAIN, replies with an End of Transaction PMC. In general, block DMI MAIN does not need to receive this PMC to terminate, this depends on implementation. In the presented case the termination of algorithm CMDW and HSKW is caused by the TERMINATE_TRANSACTION signal asserted by bubble ESRL. Finally, callout #11 illustrates the transaction between the resource embedded into DMI PERIPHERAL1 and interfaced to MACRO CELL A and MACRO CELL A itself. If the selected resource is a CONFIGURATION REGISTER it is evident that MACRO CELL A, which is supposed to be connected with that register, can read the CONFIGURATION REGISTER at any moment without any relationship to the moment at which the CONFIGURATION REGISTER is written from the DMI MAIN.

Figure 40:
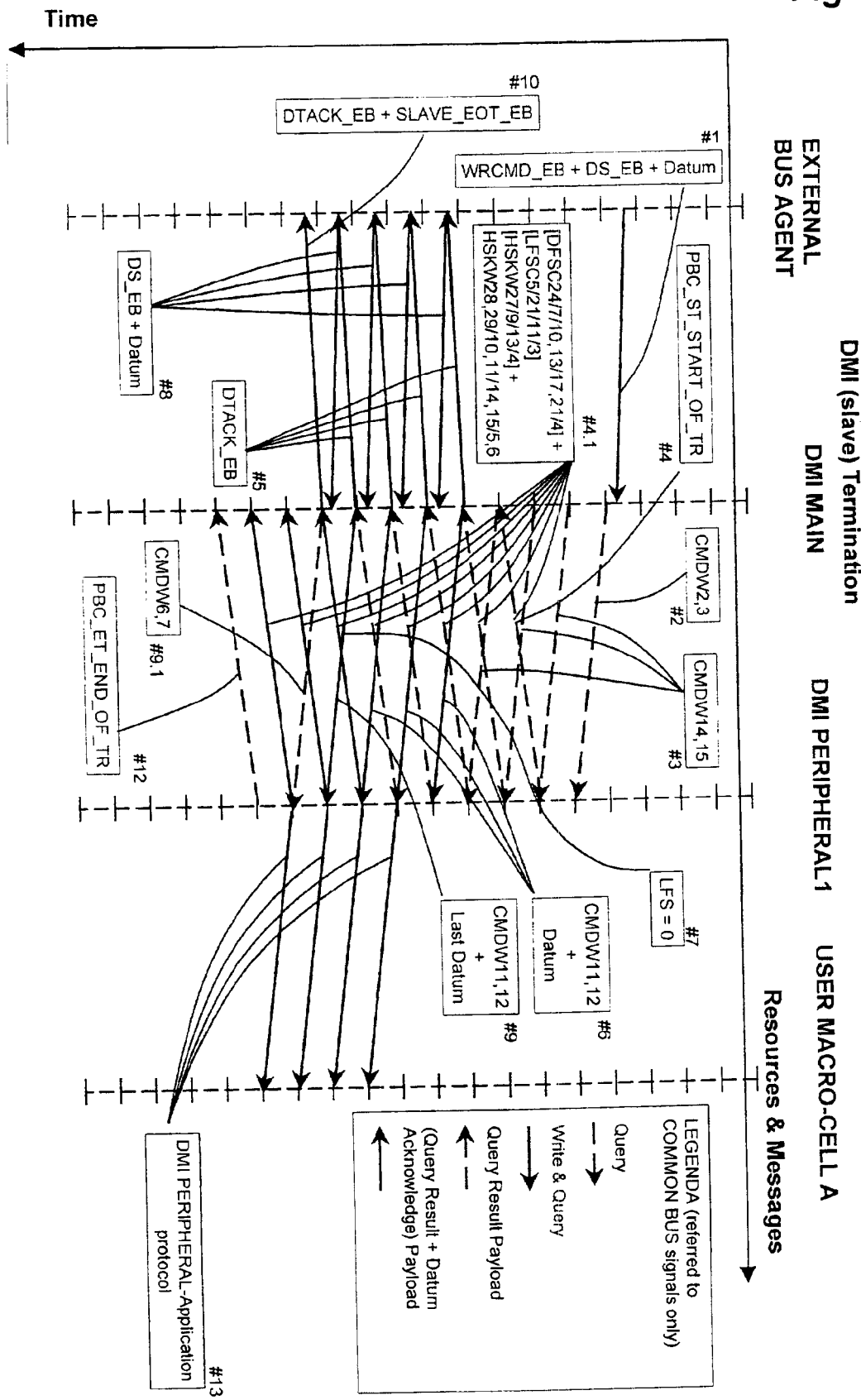
FIG. 40 indicates a message sequence chart related to the transactions of the preceding FIG. 38 in the case where the transaction is terminated by the DMI.

FIG. 40 differs from the preceding FIG. 39 in that the slave block DMI MAIN terminates the write transaction after that the master EXTERNAL BUS AGENT has write 4 words. In FIG. 40, operations specified from callout #1 to #8 are the same as those specified in FIG. 39 by the identical callout. In this "run", differently from case of FIG. 39, we suppose be the DMI MAIN block to terminate the write transaction, so the termination mechanism is analog to the one explained in FIG. 37 talking about a read transaction.

FIG. 41 shows the relationship among the different protocols when DMI is in master mode and the protocols cooperates in a read transaction from a selected DMI PERIPHERAL towards DMI MAIN coupled to a write transaction towards the EBA. The figure may be seen as a graphical illustration of the protocol MA (step MA14) when this type of transaction is executed, omitting aspects connected to arbitration and focussing those aspects connected to interactions between involved protocols. The bubble diagram of FIG. 41 differs from the one of FIG. 35 or from one of FIG. 38 mainly because in the bubble representation of the algorithms, bubble HSKW is coupled to the pair CMDR/CMDRF instead of CMDW. This combination of algorithms combines the relevant aspects of the combinations of cooperating algorithms presented in both FIG. 35 and FIG. 38. This is evident observing that, despite to the write transaction towards the EBA in FIG. 41 the interactions among bubbles ESRL, DFSC, LFSC and CMDR/CMDRF are the same shown in FIG. 35. Moreover, as in FIG. 35 block ESRL embeds block DATA TRANSFERRED CNT and as in a write transaction (FIG. 35) the RX BUFFER (FIG. 14), and its relevant signals, namely RX_BUFFER_STATUS, RX_BUFFER_CLEAR, RX_BUFFER_FS[3:0], are present. Each bubble is interfaced with the same signals used in previous cases (HSKW as in FIG. 38, and CMDR/CMDRF as in FIG. 35), as a consequence each bubble continues to work in the same manner. Bubble HSKW works like in a write transaction while bubbles CMDR/CMDRF, LFSC and DFSC work like in a read transaction. By the reasons above the working of the set of cooperating algorithms shown in FIG. 41 can be immediately derived from the cases of FIG. 35 and FIG. 38.

This is valid in case of prefetchable resources. The case of not prefetchable resources will be discussed after having introduced the PREFETCHABLE FIFO.

PREFETCHABLE FIFO

As described above, the basic COMMON BUS PROTOCOL (the one not embedding CMDRF algorithm) can only work with high efficiency in read if the read operation involves prefetchable resources, that is resources characterized by not destructive read. If not prefetchable resources, which are characterized by destructive read are involved, either the efficiency is highly reduced or data may be lost. Resources to interface cannot be changed because are inputs of the problem, that are part of the application logic; if a source of data is not prefetchable it cannot be changed into a prefetchable one. Usually that kind of data sources is interfaced with fifo that decouple from the application logic acting as an elastic buffer. Unfortunately this does not solve the problem of not prefetchability.

To face this problem the present invention provides the special macro-cell of FIG. 23 named PREFETCHABLE FIFO inside the TOPFIFO HOST MODULE. This macrocell is a special kind of fifo with synchronous interfaces, which has the property of making not destructive the read accessed attempted to it; in other words is special fifo allowing not destructive read operation. When a PREFETCHABLE FIFO is used to interface a resource with a DMI PERIPHERAL the view of the resource from the DMI PERIPHERAL is modified in a way that a not prefetchable resource will be seen as a prefetchable one.

The PREFETCHABLE FIFO eliminates the side effect connected with the read operation (destructive read) by simultaneously exploiting of its internal algorithms and the external CMDRF algorithm defined in a preferred form of the COMMON BUS PROTOCOL of the invention (best mode—the one embedding the CMDRF algorithm).

To exploit CMDRF algorithm the PREFETCHABLE FIFO supports both the Flush(I) command (opcode MBC_OPCODE_FLUSH in APPENDIX C—Table C1) and the Clear&Flush(I) command (opcode MBC_OPCODE_CLR_FLUSH in APPENDIX C—Table C1) added to the basic COMMON BUS PROTOCOL by the CMDRF algorithm. In particular, command Flush(I) command (opcode MBC_OPCODE_FLUSH) causes the PREFETCHABLE FIFO to flush out a certain amount of data specified by number I which is carried by the COMMAND.FLUSH field (APPENDIX C—Table C3) and equals the value of the parameter DATA_TRANSF_CNT_THR. Command Flush (I) is issued as soon as the number of data transferred to the EBA equals the value of the parameter DATA_TRANSF_CNT_THR. Command Clear&Flush(I) (opcode MBC_OPCODE_CLR_FLUSH) causes the PREFETCHABLE FIFO to flush out a certain amount I of data and prepares the PREFETCHABLE FIFO for a next transaction by adjusting its internal pointers in a way that will be explained describing the internal architecture of the PREFETCHABLE FIFO. Number I, carried by the COMMAND.FLUSH field (APPENDIX C—Table C3), is set to the final value of the DATA_TRANSFERRED_CNT counter. This command is issued as a last command of a transaction. The effect of a flush can be also seen as a rewind into PREFETCHABLE FIFO of data read from the PREFETCHABLE FIFO, stored into RX_BUFFER (FIG. 14), but not transferred to the EBA in such a way they are considered unread.

A FIFO (First-In-First-Out) is a data storing structure characterized two access ports: a WRITE PORT and a READ PORT. Data are handled in such a way that justifies the name fifo: first data written into the fifo (from the WRITE PORT) is the first data outputted (from the READ PORT) as a consequence of a read. We consider a pointer based fifo that is a fifo in which the access to data is handled by pointers. Pointer to a datum: is the address of the memory location hosting that datum. Access via pointers is very efficient and widely used in applications.

The presented PREFETCHABLE FIFO is synchronous, that is, signals at its read and write ports have to be synchronous with the same clock. The asynchronous version of the PREFETCHABLE FIFO can be obtained from the synchronous one adopting known techniques used for asynchronous fifos, so without any limitation, the description of the invention can be done on the synchronous PREFETCHABLE FIFO.

FIG. 42 shown the PREFETCHABLE FIFO is a pointer based fifo allowing not destructive read operation. In figure the PREFETCHABLE FIFO is composed of two main blocks named PREFETCHABLE FIFO CTRL and DUAL PORT RAM. The PREFETCHABLE FIFO CTRL embeds seven main blocks respectively named READ PORT, FLUSH2REWIND, CTRL OP, WRITE PORT, RDPTR, WRPTR, UP DOWN COUNTER and DUAL PORT RAM INTERFACE. Block RDPTR embeds blocks RDPTR ALIGNED and RDPTR MISALIGNED. Block UP DOWN COUNTER embeds blocks WR UP DOWN CNT, RD_UP_DOWN_CNT_MISALIGNED and RD_UP_DOWN_CNT_ALIGNED. The signals exchanged among these blocks are described in APPENDIX E, Table E1. By the used naming convention name of blocks are in upper case with no underscore, conversely signal names are in lower case (possibly with upper case initials) with underscore. Signals described in Table E1 and reported in FIG. 42, in APPENDIX E from Table E2 to Table E9 and in the following description have no associated width, even if they are buses; bus width is left not specified because the proposed architecture works for every bus width.

Main characteristics on PREFETCHABLE FIFO are:
1. READ PORT supporting either rewind(I) or flush(I) and clear commands;
2. Write Pointer (wrptr) and Read Pointer (rdptr) mimic is such that read data are protected from being overwritten. Read data locations are considered unavailable for write until their availability is decided as a consequence of the issuing of a Rewind(I)/Flush(I)/Clear command;
3. Data can be flushed out of the PREFETCHABLE FIFO (with the flush(I) command) or rewind into the PREFETCHABLE FIFO READ PORT (with the rewind (I) command);
4. Rewind(I), flush(I) and clear operations operating on pointers can be executed in a single clock cycle. That is, operating on pointers, to rewind1 data PREFETCHABLE FIFO takes only a single clock cycle instead of I clock cycles;
5. READ PORT makes available filling status information required by PERIPHERAL MONITORING CODE. At READ PORT rd_nword_avail bus gives the number of words available for read. Optionally, at WRITE PORT, wr_nword_avail bus gives the number of words available for write.

Figure 43:
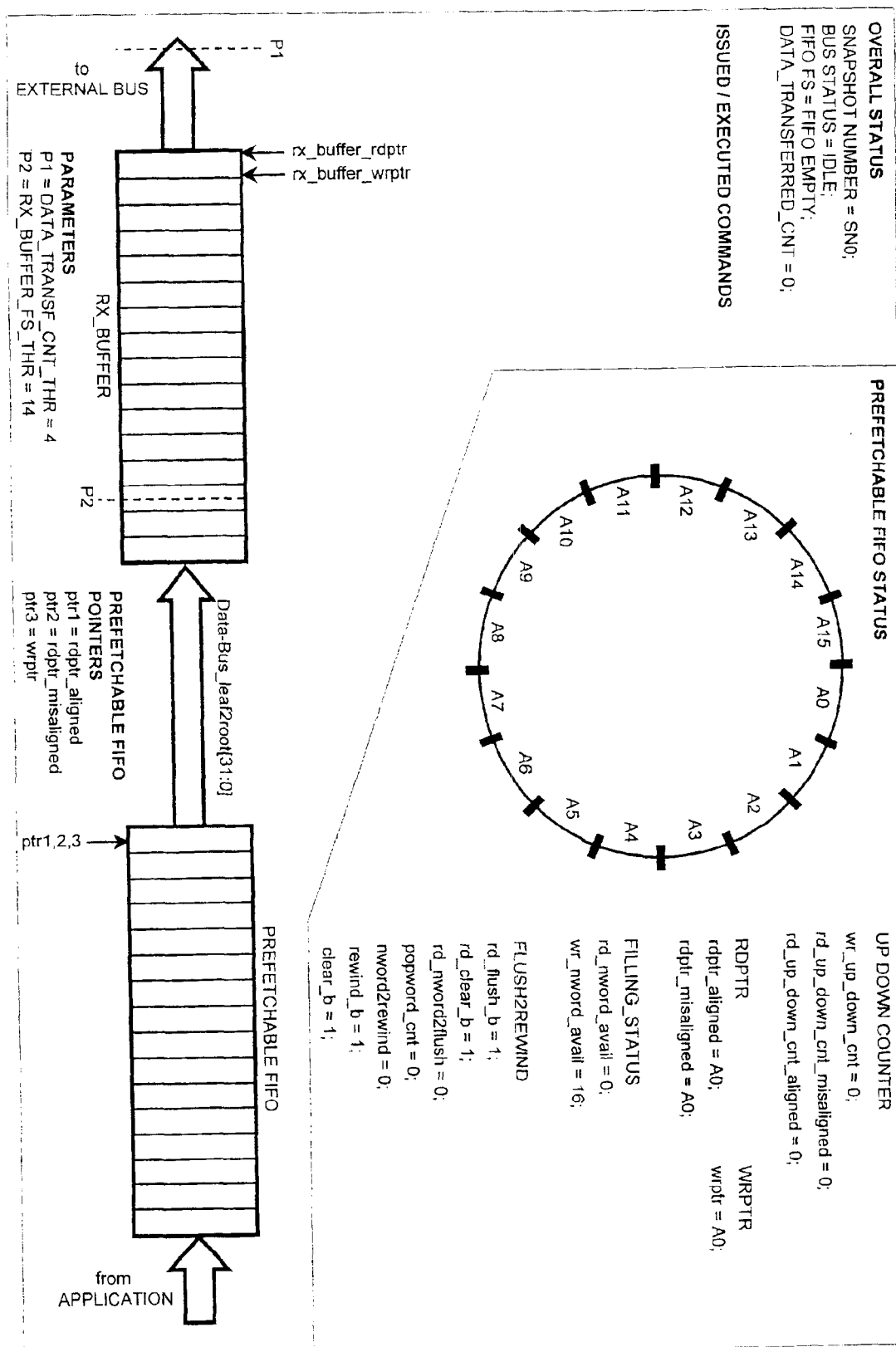
FIGS. 43 to 50 illustrate both the working principles of the PREFETCHABLE FIFO and of the protocol interfacing said PREFETCHABLE FIFO with the RX BUFFER in order to allow anticipative read of not prefetchable resources. A transaction is illustrated a set of snapshots of the system composed from the PREFETCHABLE FIFO and the RX BUFFER.

The architecture of the PREFETCHABLE FIFO presented in FIG. 43 is suitable to implement both a fifo able to rewind back to the sender a certain amount of data or a fifo able to flush out from the fifo a certain amount of data. The function used depends on the changes performed on the basic COMMON BUS PROTOCOL. In particular is possible to use either the rewind(I) command or the flush(I) and clear commands. The improved COMMON BUS PROTOCOL of present invention uses flush(I) and clear commands. The architecture makes available at the READ PORT the rewind(I) command if the block FLUSH2REWIND is not implemented. On the contrary, if the FLUSH2REWIND block is present, at the READ PORT both inputs for flush(I) and clear commands are available. flush(I) is specified by asserting the signal inputted to the rd_flush_b input port and, at the same time, keeping stable the value I at the rd_nword2flush input port (which is a bus).

The architecture of the PREFETCHABLE FIFO, presented in FIG. 43, is structured in term of blocks. Each block is interfaced with other blocks with a set of signal; said set of signal constitutes the interface of each block and can be obtained from FIG. 43. Arrows specify directions of signals. For each block the algorithm carried out is specified on a separate table (from E2 to E9).

In operation, the PREFETCHABLE FIFO is described as a set of concurrent combinatorial and sequential processes. For each block, except for the simplest ones that are described in natural language, a combinatorial process and a sequential one are defined. All the processes communicate via signals specified by the interfaces defined above. Moreover, all the different sequential processes are synchronized by the edge (either rising or falling) of a synchronization signal named clock (which is not shown in FIG. 42) that beat the time (t, t+1, t+2, t+3, . . . , t+i, . . . , t+N). All processes are written in a pseudo-code that is similar to the so-called "Register Transfer Level" or RTL description used in Hardware Description Languages (HDL) like VHDL. This kind of description has been chosen because it is very accurate and closed to the real implementation. In the pseudo code a process is identified by the syntax: <process_name>: PROCESS(sensitivity list). PROCESS is a keyword of the pseudo-code, <process_name> is the name of the process, while the sensitivity list represents a set of signals constituting the inputs of the process. The statements belonging to the process are bounded between the process declaration and the END PROCESS <process_name> declaration. The statements belonging to the process are decision branch and assignment. The signals at the right hand side of the assignment are the output signals of the process while the signal at the left hand side plus the signals in the decision branch are the inputs.

A process is defined combinatorial if the clock is not in the sensitivity list, sequential otherwise. We will name combinatorial all the combinatorial processes. In combinatorial processes an assignment named combinatorial assignment is used and is represented with the symbol ":=". An assignment like sout:=sin means that sout takes the value of sin as soon as sin changes. In combinatorial assignment the signals resulting from the elaboration are characterized by the prefix "nx_". The combinatorial processes can be implemented with combinatorial logic (logic gates without memory). In implementation the combinatorial assignment is performed with a combinatorial delay.

A process is defined sequential if the clock is in the sensitivity list, in such a case the presence of input signals different from clock in the sensitivity list is unnecessary. We will name sequential all the sequential processes. In sequential processes an assignment named sequential assignment is used and is represented with the symbol "<=". An assignment like sout<=sin means that sin evaluated at the active edge of clock and its value is memorized and transferred to sout. Then, even if sin changes, sout is not updated until a new active edge of clock takes place. In the meanwhile, sout is held. Moreover, some special sequential assignment, like sout<=(sstrobe=0) sin, are used. This assignment means that sin is evaluated at the active edge of clock and, if signal sstrobe equals 0, the sin value is memorized and transferred to sout. Then, even if sin changes, sout is not updated until a new active edge of clock on which signal sstrobe takes the value 0 takes place. In the meanwhile, sout is held. The sequential processes can be implemented with sequential logic (logic memory devices, like Flip-Flops). In particular, said implementation can use D type Flip-Flops that sample the sin signal on the active clock edge and memorize it as signal sout.

Summarizing, each block can be seen as a combinatorial logic processing input signals and producing outputs (according to a combinatorial process) that are memorized by a sequential logic (according to a sequential process), the output of said sequential logic constitutes the primary output of each block. In some cases some combinatorial processes have combinatorial inputs (characterized by names "nx_<signal_name>") but, to simplify the drawings, also in that cases signal names at interfaces reported in FIG. 42 have the name <signal_name> without the "nx_" prefix.

The blocks described in FIG. 42 are:
READ PORT
The READ PORT is the interface with the reader. It receives commands:
1. rd_popword_b: read (pop) a word from PREFETCHABLE FIFO. This signal corresponds to the signal RD_POPWORD_B$_{R1}$ in the PREFETCHABLE FIFO lodged by the TOPFIFO HOST MODULE of FIG. 23;
2. rd_flush_b: flush out of PREFETCHABLE FIFO a number of already read words specified by rd_nword2flush. These are the commands implemented in the command bus. This signal corresponds to the signal RD_FLUSH_B$_{R1}$ in the PREFETCHABLE FIFO lodged by the TOPFIFO HOST MODULE of FIG. 23;
3. rd_nword2flush: number of already read words to flush out of PREFETCHABLE FIFO when a rd_flush_b command is issued. This signal corresponds to the signal RD_NWORD2FLUSH$_{R1}$[3:0] in the PREFETCHABLE FIFO lodged by the TOPFIFO HOST MODULE of FIG. 23;
4. rd_clear_b: command issued in parallel with rd_flush_b when a read transaction with PREFETCHABLE FIFO is ended. This align the read pointer in such a way that data read from PREFETCHABLE FIFO but not flushed out with a rd_flush_b command are considered not read. This signal corresponds to the signal RD_CLEAR_B$_{R1}$ in the PREFETCHABLE FIFO lodged by the TOPFIFO HOST MODULE of FIG. 23;
To flush out I words means to make the memory locations used by those words available for writing. Regarding commands: rd_flush_b and popword_b commands are mutually exclusive; rd_clear_b command implies rd_flush_b command, vice-versa is not true.
The READ PORT makes available:
1. rd_nword_avail: number of words available to read before PREFETCHABLE FIFO become empty. This signal corresponds to the signal RD_NWORD_AVAIL$_{R1}$[3:0] in the PREFETCHABLE FIFO lodged by the TOPFIFO HOST MODULE of FIG. 23;
2. rddata: data read (popped) from PREFETCHABLE FIFO. Rddata is coupled to a data valid signal. This signal corresponds to the signal RD_RDDATA$_{R1}$[31:0] in the PREFETCHABLE FIFO lodged by the TOPFIFO HOST MODULE of FIG. 23;
Signals RD_QUERY_B$_{R1}$ and RD_EMPTY$_{R1}$ and RD_RDTH$_{R1}$ are not present in this description because are not essential to illustrate the PREFETCHABLE FIFO operation.
WRITE PORT
The WRITE PORT is the interface with the writer. It receives commands and data:
1. wr_pushword_b: write (push) a word into PREFETCHABLE FIFO. This signal corresponds to the signal WR_PUSHWORD_B$_{W1}$ in the PREFETCHABLE FIFO lodged by the TOPFIFO HOST MODULE of FIG. 23;
2. wrdata: data to write (to push) to PREFETCHABLE FIFO. This signal corresponds to the signal WR_WRDATA$_{W1}$[31:0] in the PREFETCHABLE FIFO lodged by the TOPFIFO HOST MODULE of FIG. 23;
Signals WR_QUERY_B$_{W1}$ and RD_FULL$_{W1}$ and WR_WRTH$_{W1}$ are not present in this description because are not essential to illustrate the PREFETCHABLE FIFO operation.
FLUSH2REWIND
This block transform a Flush(I) command (rd_flush_b asserted and rd_nword2flush=I) into a Rewind(J) command. The number of popword_b command issued after the last Flush(I) command are counted and stored in popword_cnt. Be M the value of popword_cnt when a Flush(I) is issued. This block issues a Rewind(J) command with J=M−I. Referring to the figure the command issued is rewind_b with nword2rewind=J=M−I. In parallel with the rewind_b assertion popword_cnt is reset to zero. The rd_clear_b is copied to clear_b. The detailed algorithm is described in Table E2 of APPENDIX E.
CTRL OP
This block enables the execution of commands issued at READ PORT and WRITE PORT depending on the PREFETCHABLE FIFO status.
CTRL OP receives commands from: WRITE PORT, READ PORT or FLUSH2REWIND if implemented and wr_up_down_cnt and rd_up_down_cnt_aligned from UP_DOWN_COUNTER. The counters from UP DOWN COUNTER gives information about the possibility of executing the commands issued from READ PORT and WRITE PORT.
When a pushword_b is issued if there is still room to write (this depends on wr_up_down_cnt) then up_cmd, wrptr_inc_cmd and write_cmd are issued. When a popword_b is issued if there are still data to read (pop) (this depends on rd_up_down cnt_aligned) then down_cmd, rdptr_inc_cmd and read_cmd are issued. Similar tests are performed in case of simoultaneous popword_b and pushword_b commands. The detailed algorithm is described in Table E3 of APPENDIX E.
UP DOWN COUNTER
This block is charged to:
1. trace the number of writeable locations on the dual port memory used to implement the PREFETCHABLE FIFO. This number is memorized in wr_up_down_cnt counter. Said information is used by CTRL OP for enabling pushword_b commands. This counter is incremented when a pushword_b is executed. When a rewind_b is executed this counter is aligned to rd_up_down_cnt_aligned plus nword2rewind (and plus 1 if a simoultaneous up_cmd is executed). By this algorithm the popword_b issued at READ PORT are not visible until a rewind_b (consequence of a rd_flush_b) is not executed. This protects read data from being overwritten with write data. The detailed algorithm is described in Table E4 of APPENDIX E.
2. trace the number of readable locations on the dual port memory used to implement the PREFETCHABLE FIFO by a counter named rd_up_down_cnt_aligned. This counter does not consider readable data flushed out (they are considered discarded) while it considers readable data already read from DMI MAIN and not yet flushed out. The resulting number is memorized in rd_up_down_cnt_aligned counter. This counter counts the number of data really present in the PREFETCHABLE FIFO (only flushed data are considered discarded) so this information is used by CTRL_OP to enable popword_b commands. The detailed algorithm is described in Table E5 of APPENDIX E. The rd_up_down_cnt_aligned counter is associated to a pointer named rdptr_aligned that will be introduced later.
3. trace the number of readable locations on the dual port memory used to implement the PREFETCHABLE FIFO by a counter named up_downt_cnt_misaligned. This counter does not consider readable data flushed out (they are considered discarded) and not even data already read from DMI MAIN and not yet flushed out. The resulting number is memorized in rd_up_down_cnt_misaligned counter. This counter counts the number of unread data present in the PREFETCHABLE FIFO so its value is used to calculate rd_nword_avail at READ_PORT. The rd_up_down_cnt_misaligned counter is updated only with up and down signals and the Rewind(I) command is considered only if accompanied by a Clear command. The counter is aligned to rd_up_down_cnt_aligned when a Clear command is issued. The detailed algorithm is described in Table E6 of APPENDIX E. The rd_up_down_cnt_misaligned counter is associated to a pointer named rdptr_misaligned that will be introduced later.

The above-described counters can be loaded with a given value in a single clock pulse.

RDPTR

This block embeds the read pointers. There are two read pointers: the aligned read pointer (rdptr_aligned) and the misaligned read pointer (rdptr_misaligned).

1. rdptr_aligned is used to create and preserve a safe area (set of no writeable memory locations) containing data already read from PREFETCHABLE FIFO but not yet flushed out via a Flush(I) (Rewind(J)) command. Data in this safe area are protected from being overwritten. Data in this area can be seen as a backup of data already read from the RX BUFFER but not yet flushed out from the PREFETCHABLE FIFO via a Flush(I) (Rewind(J)) command. Portions of this safe area can only be released by issuing Flush(I) (Rewind(J)) commands. The size of the portion of safe area released for writing new data (data in the released area are lost) is determined by the parameter I (J), argument of the Flush(I) (Rewind(J)) command. Differently from a traditional fifo, the PREFETCHABLE FIFO does not release a datum after it is popped out but, due to rdptr_aligned pointer, keeps the datum inside the fifo. The locations used for keeping data read but not yet flushed out are subtracted to the ones used for writing new data, so that this mechanism does not imply a larger fifo. The size of the safe area can change dynamically depending on both the writer, the reader and can be optimized adjusting the frequency and size (the parameter I (J)) of the issued Flush(I) (Rewind(J)) commands. In the DMI the reader is the EBA and the writer is the application, while the access to the PREFETCHABLE FIFO (Flush(I) commands and so on) is regulated by the CMDRF Algorithm. The rdptr_aligned pointer is affected by: pop commands, Flush(I)/Rewind(J) commands and Flush(I)/Rewind(J) command accompanied by Clear command. This pointer is not charged to point to first data to read but after the execution of a Flush(I) (Rewind(I)) it traces the position of the datum adjacent to the last flushed datum. By this point of view only flushed data are considered read from DMI MAIN while the others, read by DMI MAIN but not flushed, are still present in PREFETCHABLE FIFO and considered unread. This backup is useful when DMI MAIN terminates the transaction without consuming all the read data. The detailed algorithm is described in Table E7 of APPENDIX E.

2. rdptr_misaligned is charged to point first data to read in such a way that in the same transaction no data are read more than once. It is the "classic" read pointer of a pointer based fifo. It considers read all data read from DMI MAIN: the flushed ones and the not flushed ones. This pointer is modified by pop commands. It is not affected by the Rewind(I) command unless the Rewind(I) is accompanied by a Clear command. When a transaction is ended this pointer has to be aligned to rdptr_aligned because data read by DMI MAIN but not flushed are considered lost, so the backup made possible by rdptr_aligned has to be retrieved. This is possible by the simultaneous issuing of both Flush(I)/Rewind(J) and Clear commands; this command is characterized by the opcode MBC_OPCODE_CLR_FLUSH (APPENDIX C—Table C1) which is generated at line CMDRF6 of CMDRF Algorithm (Table D7—APPENDIX D). The detailed algorithm is described in Table E8 of APPENDIX E.

WRPTR

This block embeds the write pointer named wrptr. Only one write pointer is needed because the Write Port is not involved with Rewind(I) or Flush(I)/Clear. The wrptr always points to the first position to write. The detailed algorithm is described in Table E9 of APPENDIX E.

Having cleared up the architecture and the working principle of the PREFETCHABLE FIFO is possible to illustrate how the PREFETCHABLE FIFO works with the COMMON BUS PROTOCOL, in particular with the CMDRF algorithm which has been implemented to exploit the PREFETCHABLE FIFO. The CMDRF algorithm differs from the CMDR for the use of both the flush(I) command (opcode MBC_OPCODE_FLUSH) and the related clear (MBC_OPCODE_CLR_FLUSH). Thus, is not useful to explain the overall flow using the method of message sequence chart.

In this case is very expressive to trace the status of the PREFETCHABLE FIFO and the RX BUFFER in a read operation. The trace is composed by eight "snapshots" of the system composed by the PREFETCHABLE FIFO and the RX BUFFER during the read operations. In each "snapshot" are shown: the contents of the PREFETCHABLE FIFO, the PREFETCHABLE FIFO status, the contents of the RX BUFFER and the overall status of the system. The overall status of the system is represented by a set of different objects. A label identifying the snapshot of the described system (SNAPSHOT NUMBER). The status of the COMMON_BUS (BUS STATUS that can be either IDLE or WORKING). The filling status of the PREFETCHABLE FIFO (FIFO FS). The number of data transferred to the EXTERNAL_BUS (DATA_TRANSFERRED_COUNT). The executed/issued command on the COMMON BUS (EXECUTED/ISSUED COMMANDS).

A read burst is issued from the EXTERNAL BUS AGENT to read a PREFETCHABLE FIFO connected to a certain DMI PERIPHERAL. The PREFETCHABLE FIFO receives data from an APPLICATION.

For the particular purposes of this section, with reference to FIG. 14, will be defined a block named COMMON BUS CONTROLLER which is an aggregate block composed by the MAIN HANDSHAKE SEQUNECER, the DMI MAIN CONTROLLER, the MAIN COMMON BUS SEQUENCER and the EVENT&STATUS REGISTER LOGIC. In particular the EVENT&STATUS REGISTER LOGIC embeds the DATA TRANSFERRED COUNTER which is traced in this read burst.

The figures are reduced to the essential and do not show the COMMON BUS CONTROLLER, the PERIPHERAL COMMON BUS CONTROLLER and the buses between them with the only exception of the Data-Bus-leaf2root. The EXTERNAL BUS SEQUENCER communicates with the EXTERNAL BUS AGENT and with COMMON BUS CONTROLLER that translates this read burst to the COMMON BUS.

Without describing the algorithm again the flow between the DMI MAIN and the DMI PERIPHERAL is regulated by two main parameters: DATA_TRANSF_CNT_THR and RX_BUFFER_FS_THR. The first parameter has to deal with the DATA TRANSFERRED COUNTER, while the second has to deal with the RX BUFFER. Parameter DATA_TRANSF_CNT_THR is indicated with a hatched line named P1 in Figures from 43 to 50 while parameter RX_BUFFER_FS_THR is indicated with an hatched line named P2 in Figures from 43 to 50.

The DATA TRANSFERRED COUNTER counts the number of words exchanged with the EXTERNAL BUS AGENT. The handshake to transfer these data takes place between the EXTERNAL BUS AGENT and the EXTERNAL BUS SEQUENCER. The algorithm CMDRF differs from the CMDR because when the number of data transferred in read between the RX BUFFER and the EXTERNAL BUS AGENT reaches the parameter DATA_TRANSF_CNT_THR a flush(I) command is issued towards the PREFETCHABLE FIFO. In the same way, when the transaction is ended a clear and flush(I) command is issued towards the PREFETCHABLE FIFO.

The RX BUFFER is the buffer charged to receive read data from COMMON_BUS. First data to read from RX BUFFER is pointed by rx_buffer_rdptr while first empty location to write of RX BUFFER is pointerd by rx_buffer_wrptr. Both rx_buffer_rdptr and rx_buffer_wrptr are traced in this read burst. Data are read from COMMON BUS (Data-Bus-leaf2root), written into the RX BUFFER, read from the opposite port of the RX BUFFER and finally read from EXTERNAL BUS AGENT. Read data are sent to the EXTERNAL BUS AGENT via the EXTERNAL-BUS. An important parameter that regulates the access to the RX BUFFER is the DATA_TRANSF_CNT_THR parameter. This parameter represents a threshold on RX BUFFER. The read policy consists in an anticipative read burst from the selected remote resource (the PREFETCHABLE FIFO in the present case). When the rx_buffer_wrptr pointer reaches RX_BUFFER_FS_THR no more read commands are sent towards DMI PERIPHERAL. This happens because if the EXTERNAL BUS AGENT does not read from the RX BUFFER (this can happen by several reasons) RX BUFFER can overflow and data read from the remote resource can be lost.

Figure 50:
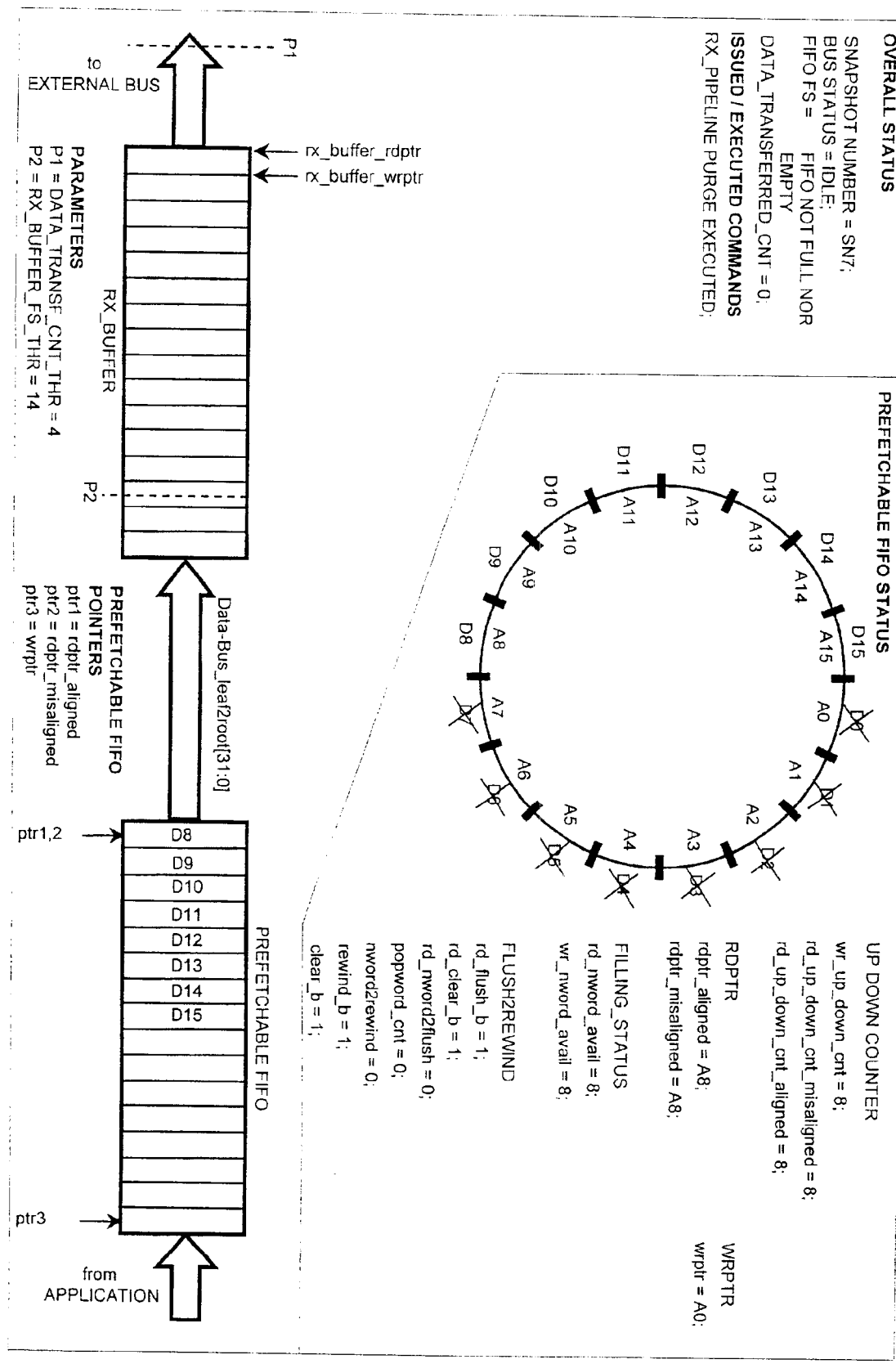

Transaction starts at FIG. 43 and ends at FIG. 50. FIG. 43 shown the described system in idle state. The BUS STATUS is IDLE, The SNAPSHOT NUMBER takes the value SN0, The filling status of the fifo (FIFO FS) signals FIFO EMPTY and DATA_TRANSFERRED_CNT has the value 0. All the counters and pointers of the PREFETCHABLE FIFO are in idle state. The rd_nword_avail signal signals 0 and this means that there are no data to read. On the contrary wr_nword_avail signals 16, which means that there are 16 empty positions into write data.

Figure 44:
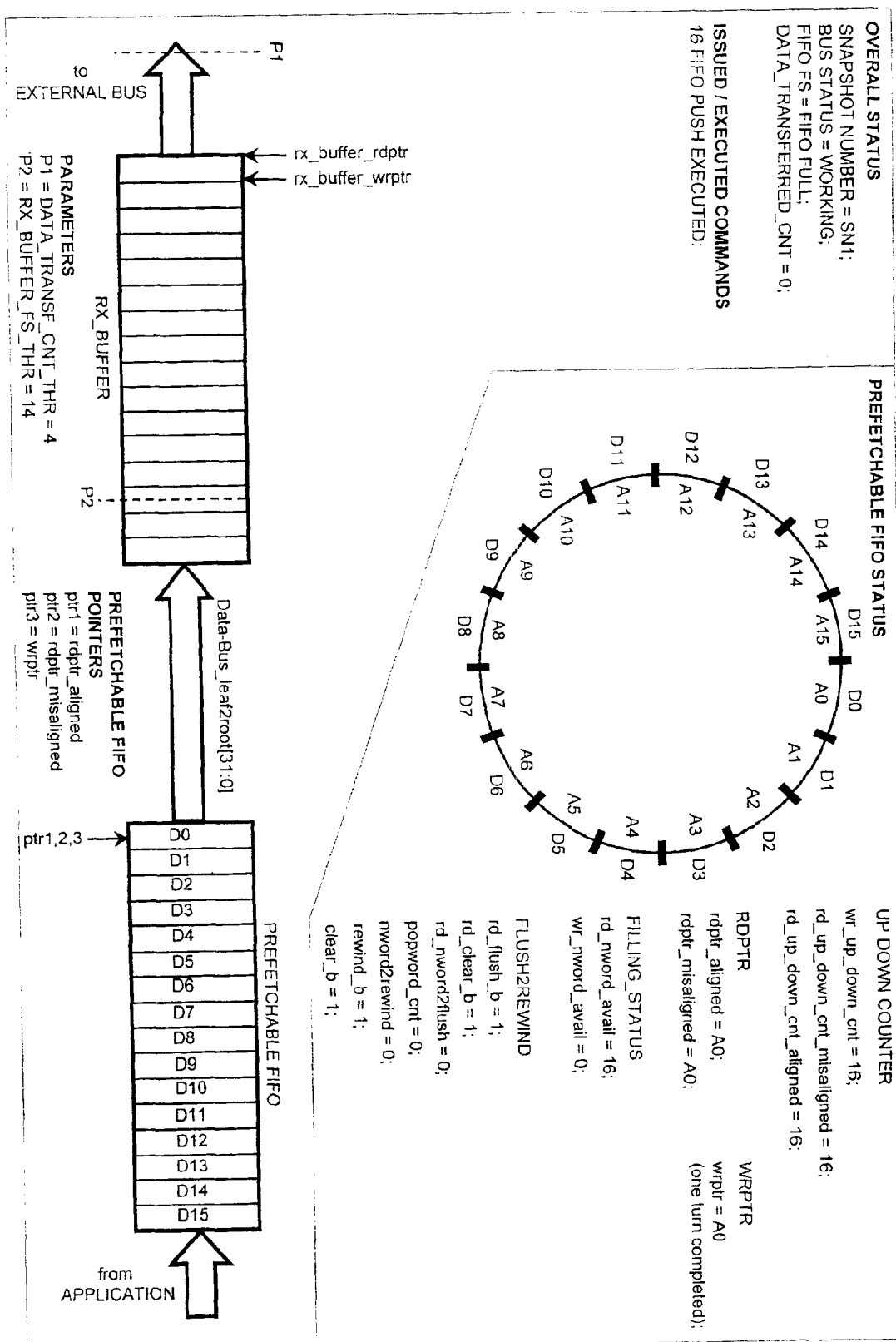

FIG. 44 shown the system after the execution of 16 push into the PREFETCHABLE FIFO from the application. The SNAPSHOT NUMBER takes the value SN1 and the BUS STATUS is WORKING. The filling status of the PREFETCHABLE FIFO (FIFO FS) signals FIFO FULL and DATA_TRANSFERRED_CNT has the value 0. The PREFETCHABLE FIFO is filled of data from D0 to D15 and this is signaled by rd_nword_avail that takes the value 16, which means that there are 16 values available for reading. On the contrary wr_nword_avail signals 0, which means that there are no more room to write new data. Counters wr_up_down_cnt, rd_up_down_cnt_misaligned and rd_up_down_cnt_aligned have the value 16. The write pointer wrptr (ptr3 in Figure) starts pointing to the location A0 in idle state. After the 16 pushes it completes one turn of the circular buffer and ends pointing to the same starting location A0.

Figure 45:
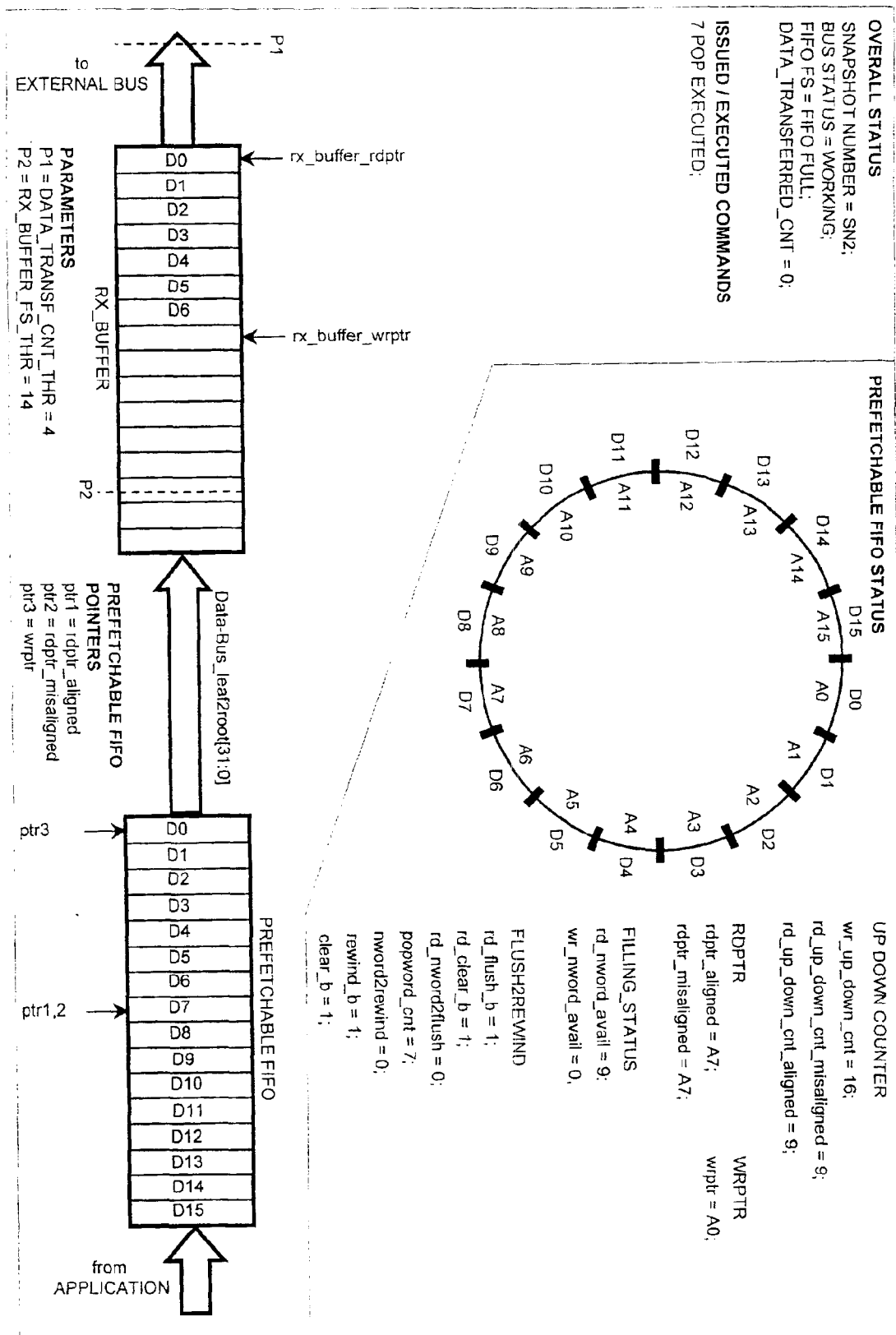

FIG. 45, SNAPSHOT NUMBER SN2, shown the system after the execution of 7 pop from the PREFETCHABLE FIFO from the EBA. The EBA starts a read transaction with the DMI MAIN and the snapshot of FIG. 45 is taken after the execution of 7 pop. Data are supposed to be transferred from the PREFETCHABLE FIFO to the RX BUFFER via the COMMON-BUS using the described protocol, so that the BUS STATUS is WORKING. At this point no data have been exchanged with the EBA. The pointer rx_buffer_rdptr points to datum D0, that is the first to exchange while the pointer rx_buffer_wr_ptr points to the next location with respect to the one occupied by datum D6, that is to the next location to write. As a consequence, DATA_TRANSFERRED_CNT has the value 0 (data have not been exchanged yet with the EBA). The filling status of the PREFETCHABLE FIFO (FIFO FS) signals FIFO FULL because the PREFETCHABLE FIFO is still filled of data from D0 to D15. This happens because the PREFETCHABLE FIFO, differently from usual fifos is prefetchable, that is it supports not destructive read. The counter wr_nword_avail signals 0, which means that there is no more room to write new data and this is consistent with the fact that the PREFETCHABLE FIFO is still filled of data from D0 to D15. On the contrary rd_nword_avail takes the value 9, which means that there are 9 unread values available for reading (from D7 to D15); this prevents the logic embedded into the DMI MAIN from reading more than once the same data. Consistently with the description above, counters wr_up_down_cnt, rd_up_down_cnt_misaligned and rd_up_down_cnt_aligned respectively take the values 16, 9, 9. The number of popped words is registered by the counter signal popword_cnt that takes the value 7. The write pointer wrptr keeps the value A0 since no more data are written. On the contrary, having popped 7 data, the 2 pointers rdptr_aligned and rdptr_misaligned (respectively ptr1 and ptr2 in Figure) point to the location A7, indicating that the next data to read is D7.

Figure 46:
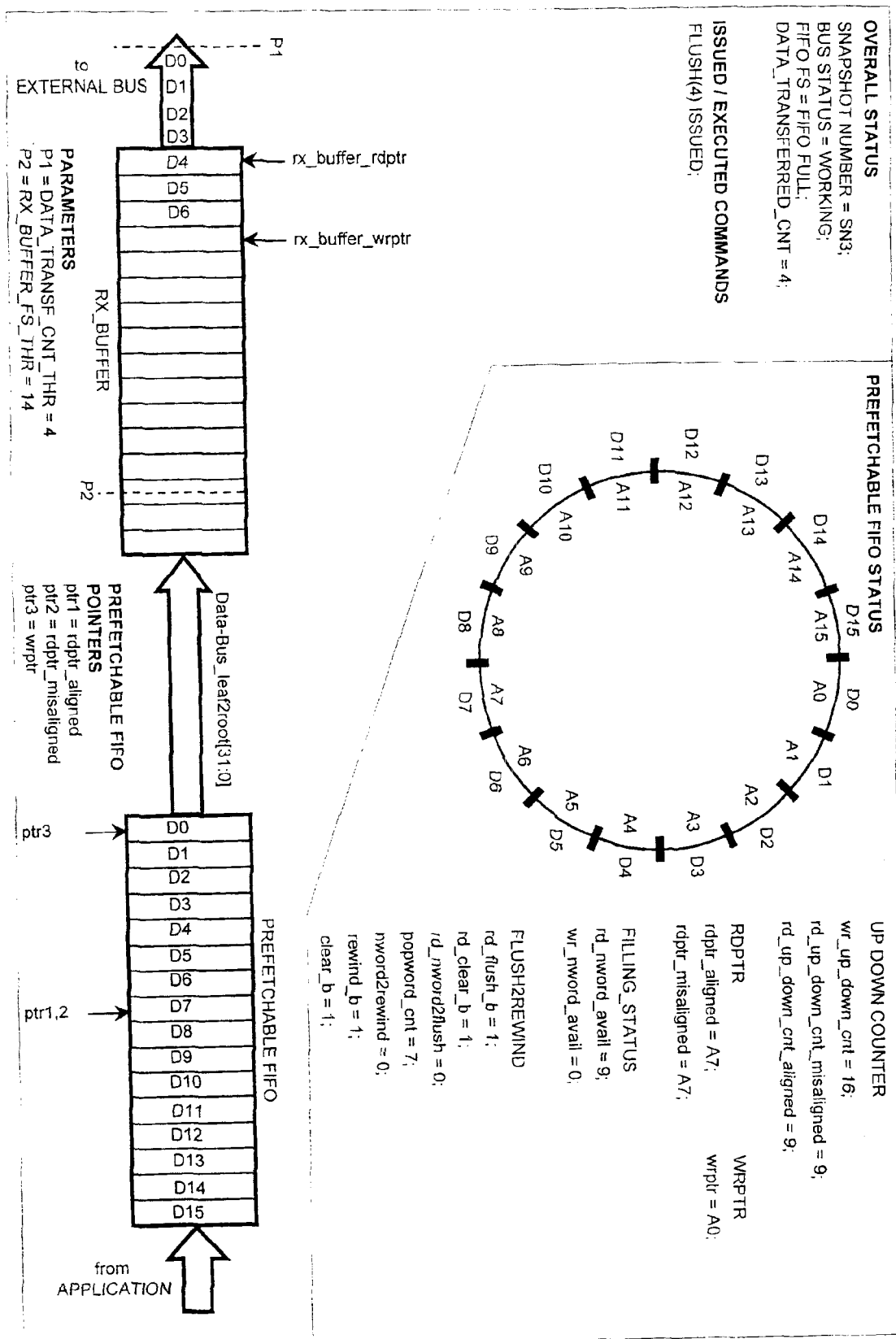

In the snapshot of FIG. 46, which takes the SNAPSHOT NUMBER SN3, the system is shown after the transferring of 4 data to the EBA. As a consequence, the DATA_TRANSFERRED_CNT takes the value 4 (4 data have been exchanged to the EBA). In FIG. 46 the transferring is represented by having the 4 transferred data (D0 to D3) embedded into the arrow representing the EXTERNAL-BUS. The pointer rx_buffer_rdptr points to the cell embedding datum D4, while the pointer rx_buffer_wrptr points to the next location available for writing, that is the location next to the one occupied by D6. The filling status of the PREFETCHABLE FIFO (FIFO FS) signals FIFO FULL because the PREFETCHABLE FIFO is still filled of data from D0 to D15. Again this happens because the PREFETCHABLE FIFO, differently from usual fifos is prefetchable, that is it supports not destructive read. At this point the differences between the algorithm CMDR and CMDRF start to play. The CMDRF used with the PREFETCHABLE FIFO, when the interfaced resource belongs to the class of not prefetchable resources (actually the resource connected from the write side of the PREFETCHABLE FIFO, into the application, is not prefetchable), monitors the DATA_TRANSFERRED_CNT (lines CMDRF21) and when it becomes greater or equal to the parameter DATA_TRANSF_CNT_THR it issues a flush(I) command towards the PREFETCHABLE FIFO involved in the transaction via the COMMON-BUS. This command is characterized by the opcode MBC_OPCODE_FLUSH (fine CMDRF22), simultaneously onto the Control-Bus-root2leaf portion indicated as COMMAND.FLUSH in Table C3 of APPENDIX C the value of DATA_TRANSFERRED_CNT, so that the Flush(I) command could be written as Flush(I) with I equals to current value of DATA_TRANSFERRED_CNT. The status of the PREFETCHABLE FIFO does not change with respect to the one of the previous figure.

Figure 47:
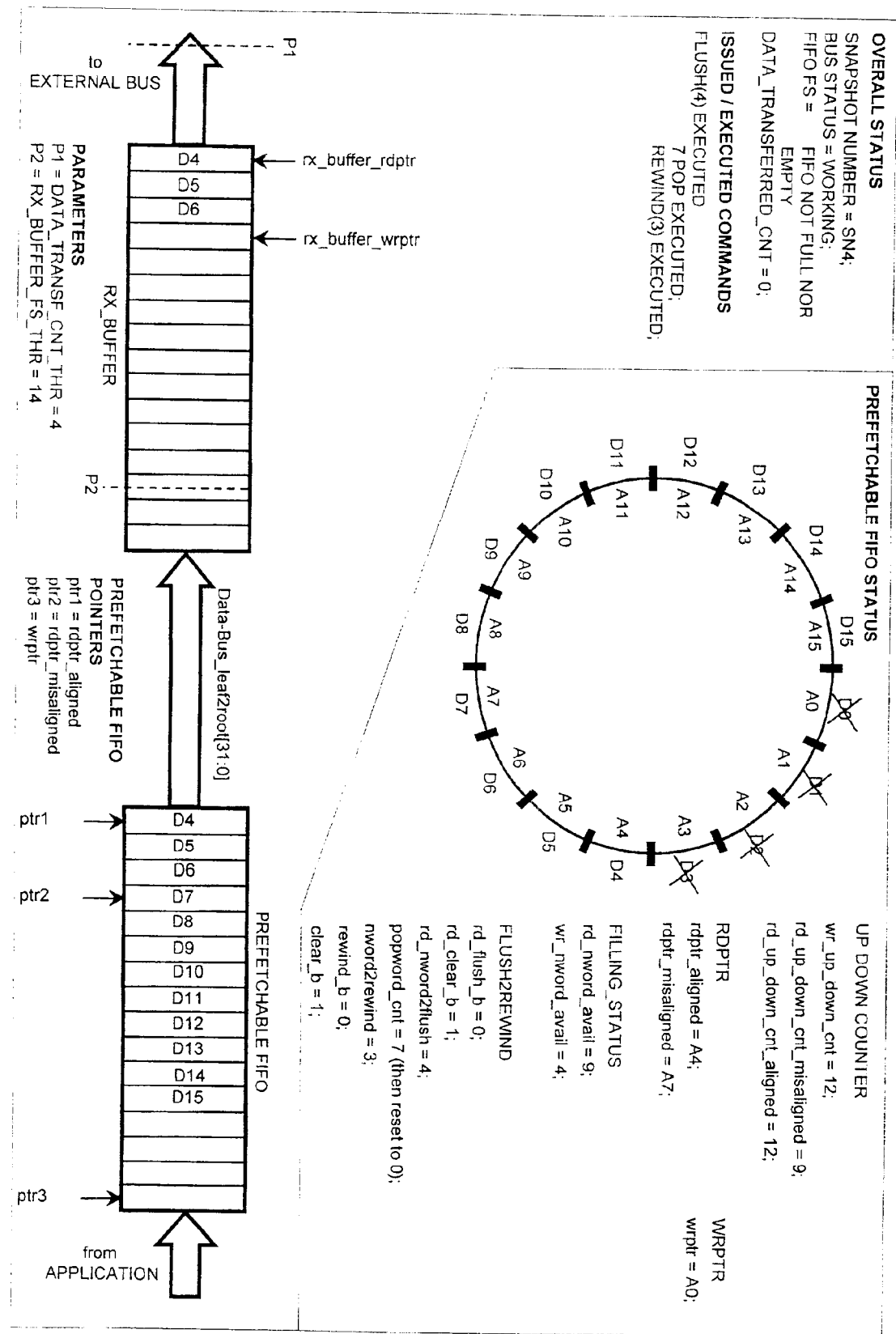

In the snapshot in FIG. 47, SNAPSHOT NUMBER SN4, the system is shown after the execution of the Flush(I), with I equals to 4, issued at the previous snapshot of FIG. 46. The DATA_TRANSFERRED_CNT is reset to the value 0 because data have been already exchanged to the EBA and the status of the RX BUFFER does not change. In FIG. 47 the occurred transferring is represented by having flushed out of the arrow the 4 transferred data (D0 to D3). Pointer rx_buffer_rdptr and rx_buffer_wrptr hold the same values of previous figure. When the Flush(I) (Flush(4)) command reaches the PREFETCHABLE FIFO the block FLUSH2REWIND transforms it into an equivalent Rewind (popword_cnt-I) command, where popword_cnt in the number of pop executed from the last executed flush(I) command. In the present case this means Rewind(7-4) equals to Rewind(3); a rewind(3) will be executed. Internally to the PREFETCHABLE FIFO the number of words to rewind is represented by the signal rd_nword2rewind that takes the value 3, at the same time after the update of rd_nword2rewind the counter signal is reset to 0. Explaining in terms of Flush, as a consequence of the issued Flush(4) command, 4 data from D0 to D3 (the ones already read from the EBA) are flushed out from the PREFETCHABLE FIFO and free room for writing, so that the filling status FIFO FS takes the label FIFO NOT FULL NOR EMPTY. Explaining in terms of Rewind, as a consequence of the issued Rewind(3) command, of the total 7 data popped out from the PREFETCHABLE FIFO, from D0 to D6, 3, from D6 to D4 are rewind into the PREFETCHABLE FIFO. This is clear observing the read pointers. The pointer rdptr_misaligned still points to location A7 which contains datum D7, this is consistent because this pointer has to point to read data in such a way that data cannot be read more than once from RX BUFFER. On the contrary pointer rdptr_aligned is charged to point to the actual first data to read from the RX BUFFER, that cause to the execution of the Flush(4)/Rewind(3) command is now D4 that is contained into location A4. Data from D0 to D3 are not physically cancelled but the locations occupied by them are made available for writing new data. This is represented in the snapshot erasing with an X data from D0 to D3 in the circular buffer fifo representation (the circular one). The "shift register like" representation (in the bottom of the Figure) even if not rigorous is very meaningful and shown that data from D0 to D3 are flushed out from the PREFETCHABLE FIFO while 4 locations are made available for writing. The FIFO FS takes the label FIFO NOT FULL NOR EMPTY. The 4 new locations available for write are registered by the signal wr_up_down_cnt that takes the value 12, indicating that 12 locations are occupied by data. As a consequence wr_nword_avail takes the value 4 indicating that 4 positions are available for writing. Moreover, as a consequence of the execution of the Flush(4)/Rewind(3) command, the counter signal rd_up_down_cnt_aligned takes the value 12 indicating that 12 positions are occupied by data. At the same time the counter rd_up_down_cnt_misaligned keeps the value 9 indicating that, of the 12 data, from D4 to D15, contained into the PREFETCHABLE FIFO, only those from D7 to D15 are unread from RX BUFFER. In fact data from D4 to D6 are already present into RX BUFFER. This prevents the DMI MAIN from reading the same data more than once. As a last remark relative to this Figure is to point out that the write pointer wrptr (ptr3 in Figure), that still holds the value A0, in the "shift register like" representation of the circular buffer has been moved to the first empty location of PREFETCHABLE FIFO. This has been done only for graphical convenience.

Figure 48:
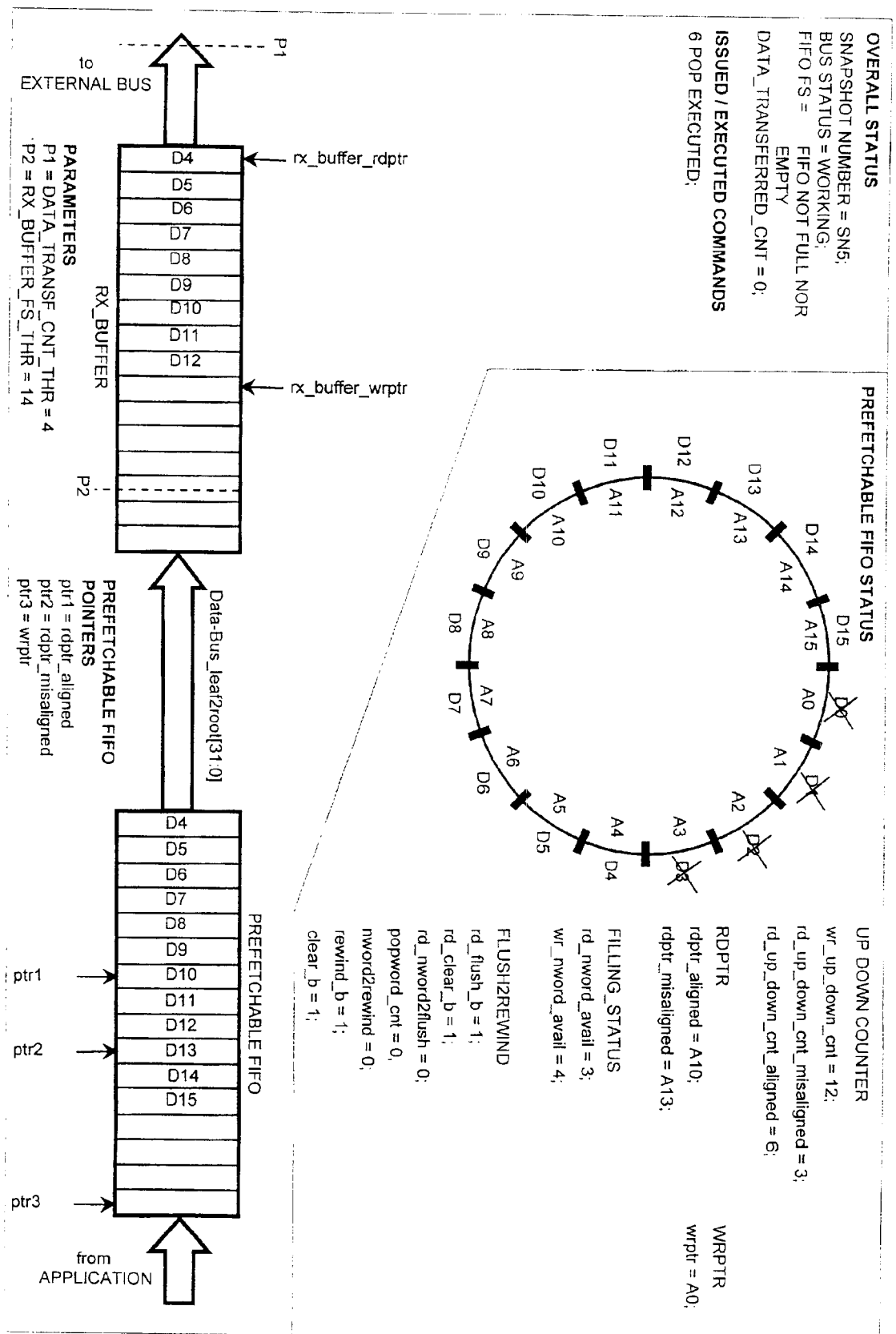

In FIG. 48, SNAPSHOT NUMBER SN5, the system is shown after the execution of 6 pops from the PREFETCHABLE FIFO. Popped data are then pushed into the RX BUFFER. The DATA_TRANSFERRED_CNT still holds the value 0 because data have not been exchanged yet with the EBA. The RX BUFFER contains now 9 data from D4 to D12 and the pointer rx_buffer_rdptr and rx_buffer_wrptr are arranged in consistent way. In the PREFETCHABLE FIFO the wr_up_down_cnt holds the value 12 to indicate that there are still 12 data into the PREFETCHABLE FIFO. The rd_up_down_cnt_misaligned takes the value 3 indicating that, of the 12 data present into the PREFETCHABLE FIFO, only 3 are unread by the PREFETCHABLE FIFO (those from D13 to D15), the others (those from D4 to D12) are already present into the RX BUFFER. The counter rd_up_down_cnt_aligned takes the value 6 because it traces the number of data available for reading from the RX BUFFER taking in account also the Rewind(I) operations executed. As an example, at the beginning of the reads from the RX BUFFER, 16 data were available in the PREFETCHABLE FIFO. Then, 13 data have been read, but 3 of them have been rewind into the PREFETCHABLE FIFO. Summarizing, 16 minus 13 plus 3 equals 6 which is the value of the rd_up_down_cnt_ aligned counter. The value of rd_up_down_cnt_misaligned reflects into the rd_nword_avail counter that takes the value 3 indicating that the unread data from RX BUFFER are 3. The write pointer holds its value A0 while rdptr_aligned takes the value A10 and rdptr_misaligned takes the value A13 pointing to the datum D13 which is the next datum to read from the RX BUFFER.

Figure 49:
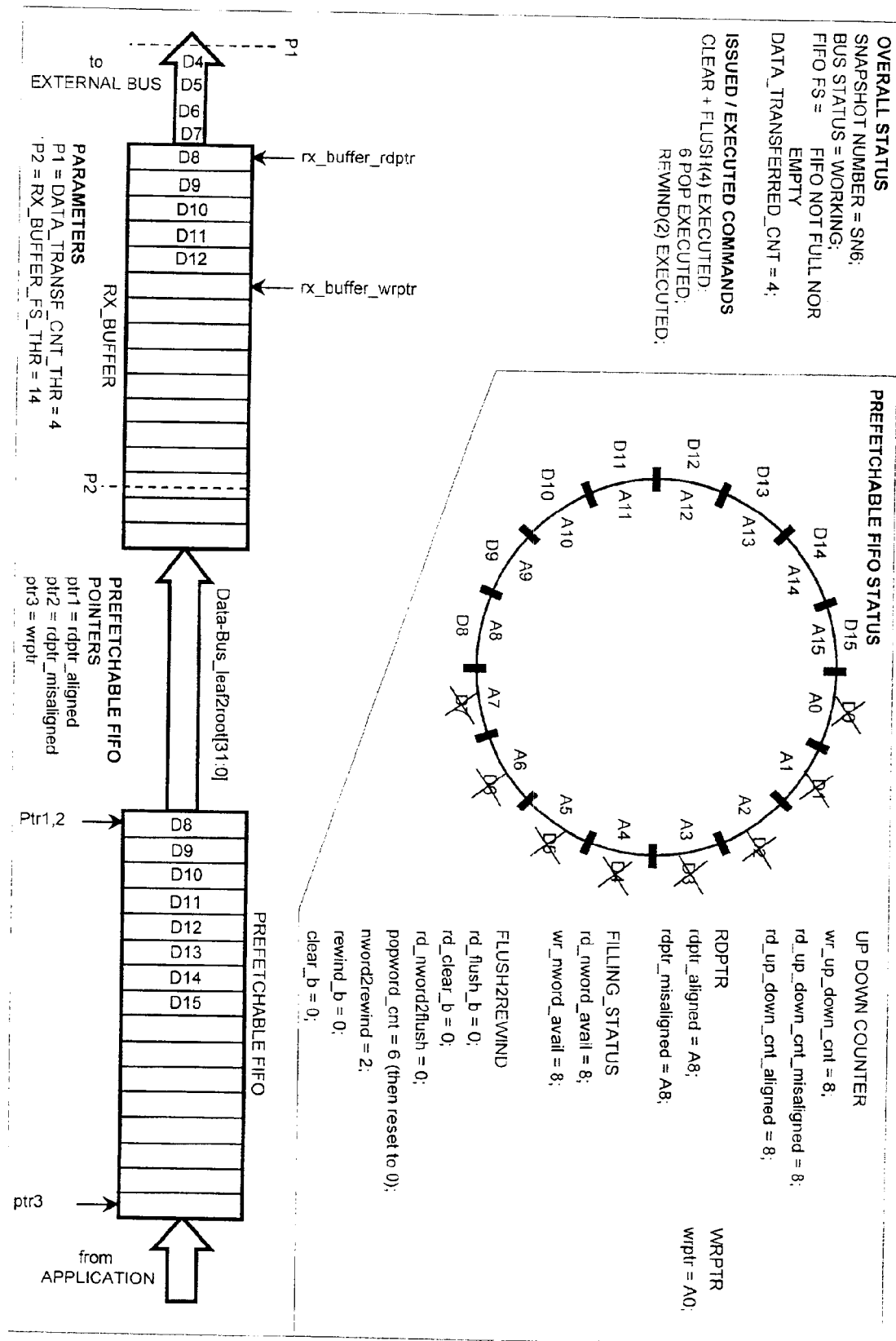

In FIG. 49, SNAPSHOT NUMBER SN6, the EBA read 4 data and signals the end of the issued transaction. The data read from the EBA are D4, D5, D6 and D7 and graphically are shown enclosed into the arrow representing the EXTERNAL-BUS; as a consequence of such data transfer DATA_TRANSFERRED_CNT takes the value 4. In the RX BUFFER are still present data from D8 to D12 that will not be read in current transaction. The end of transaction, according to the algorithm CMDRF, is signaled to the PREFETCHABLE FIFO, via the COMMON-BUS, issuing commands Clear and Flush(I). This is specified at lines from CMDRF6 to CMDRF8 of the CMDRF algorithm. This command is characterized by the opcode MBC_OPCODE_CLR_FLUSH (line CMDRF6), simultaneously onto the Control-Bus-root2leaf portion, indicated as COMMAND.FLUSH in Table C3 of APPENDIX C, the value of DATA_TRANSFERRED_CNT is written (line CMDRF8), so that the Flush(I) command could be written as Flush(I) with I equals to current value of DATA_TRANSFERRED_CNT. This means that the COMMAND.FLUSH flush field takes the value 4. When both Flush(I) (Flush(4)) and Clear commands reach the PREFETCHABLE FIFO the block FLUSH2REWIND transforms Flush(I) into and equivalent Rewind(popword_cnt-I) command, where popword_cnt in the number of pop executed from the last executed flush(I) command. In the present case this means Rewind(6-4) equals to Rewind(2); a rewind(2) will be executed. Internally to the PREFETCHABLE FIFO the number of words to rewind is represented by the signal rd_nword2rewind that takes the value 2, at the same time after the update of rd_nword2rewind the counter signal is reset to 0. Explaining in terms of Flush, as a consequence of the issued Flush(4) command, 4 data from D4 to D7 (the ones already read from the EBA) are flushed out from the PREFETCHABLE FIFO. Explaining in terms of Rewind, as a consequence of the issued Rewind(2) command, of the total 6 data popped out from the PREFETCHABLE FIFO, from D7 to D12, 2, from D9 to D8 are rewind into the PREFETCHABLE FIFO. Data from D4 to D7 are not physically cancelled but the locations occupied by them are made available for writing new data. This is represented in the snapshot erasing with an X data from D4 to D7 in the circular buffer representation (the circular one) of the PREFETCHABLE FIFO. This is clear observing the read pointers. The pointer rdptr_aligned is charged to point to the actual first data to read from the RX BUFFER, that cause to the execution of the Flush(4)/Rewind(2) command is now D8 that is contained into location A8, so rdptr_aligned points to location A8. As a consequence of the issuing of Clear command, the pointer rdptr_misaligned is updated with the value of rdptr_aligned of the previous step taking in account the possible Rewind(I) command. In the current case this means that rdptr_misaligned takes the value A8 which results from the value of the rdptr_aligned at the previous step (A10) minus rd_nword2rewind (2 positions). The write pointer holds its value A0. The "shift register like" representation (in the bottom of the Figure) even if not rigorous is very meaningful and shown that data from D4 to D7 are flushed out from the PREFETCHABLE FIFO while 4 locations are made available for writing. The FIFO FS takes the label FIFO NOT FULL NOR EMPTY. The 4 new locations available for write are registered by the signal wr_up_down_cnt that takes the value 8, indicating that 8 locations are occupied by data. At the same time wr_nword_avail takes the value 8 indicating that 8 positions are available for writing. The counter rd_up_down_cnt_aligned takes the value 8 because it traces the number of data available for reading from the RX BUFFER taking in account also the Rewind(I) operations executed. Its previous value was 6, now as a consequence, of Rewind(2), it takes the value 8 (6 plus 2 equals 8). The rd_up down_cnt_misaligned counter, when a Clear operation is issued, is updated with the value of the of the rd_up down_cnt_aligned counter of the previous step taking in account the possible Rewind(I) command. In the current case this means that rd_up_down_cnt_misaligned takes the value 8 which results from the value of the rd_up_down_cnt_aligned at the previous step (6) plus rd_nword2rewind (2). The value of rd_up_down_cnt_misaligned reflects into the rd_nword_avail counter that takes the value 8 indicating that the unread data from RX BUFFER are 8.

In FIG. 50, SNAPSHOT NUMBER SN7, data still contained in the RX BUFFER are purged away while the whole system returns to idle conditions.

Extensions on Common Bus Protocol

Some variants of the basic DMI MAIN of the invention allow great improvements in term of initial latency of data transfers. These variants are particularly useful when the DMI has to operate as a master in a strong multi master environment.

To make a clear example of the advantages obtained with such variants is useful to define a test environment with the following characteristics:

Multi master environment (DMI, EBA1 and EBA2 all of master type);

Two macro-cell (macro-cell A and macro-cell B) embedding each one a transaction requester accordingly to FIG. 34 (respectively named TRANSACTION REQUESTER A and TRANSACTION REQUESTER B);

Macro-cell A interfaced via DMI PERIPHERAL1, macro-cell B interfaced via DMI PERIPHERAL2;

Macro cell A provided of a data source "burst capable" connected the FIFOBLOCK layer of DMI PERIPHERAL1 via a TOPFIFO HOST MODULE embedding a PREFETCHABLE FIFO named PREFETCHABLE FIFO A;

Macro cell B provided of a data source "burst capable" connected the FIFOBLOCK layer of DMI PERIPHERAL2 via a TOPFIFO HOST MODULE embedding a PREFETCHABLE FIFO named PREFETCHABLE FIFO B;

The TRB signal of each transaction requester block is triggered by the number of data in the respective PREFETCHABLE FIFO crossing of a certain threshold;

Both transaction requesters are programmed to write data to the EBA1.

Without any loose of generality the EXTERNAL-BUS is supposed to be a PCI bus.

Regarding the "basic" DMI MAIN is clear observing algorithm MA (APPENDIX B) that the grant cycle (characterized by opcode MBC_OPCODE_GRANT) is executed, as a consequence of the assertion of GRANT(i), only after the DMI MAIN has been granted by the EXTERNAL ARBITER (BUS_GRANT asserted as a consequence of the assertion of EB_GRANT). The grant cycle, in general, takes a few clock cycles to retrieve from the DMI PERIPHERAL connected to the Transaction Requester who requested the transaction the parameters governing the DMA. Let's indicate the initial latency of this operation (expressed in clock cycles) with TLi_p. Moreover, let's indicate the total time spent in retrieving such parameters (expressed in clock cycles) with TLt_p. Finally, let's indicated the initial latency of the anticipative read to load the RX BUFFER with TLi_ar.

It is clear that the time TLt_p+TLi_ar is wasted because the bus is idle waiting for DMI to transfer data but, on the other hands, all other agents connected to the EXTERNAL-BUS cannot use the bus because the granted agent is the DMI. Note that, in general, TLt_p>TLi_ar.

A serious improvement can be made anticipating the grant cycle. This means to change the MA algorithm so that GRANT(i) is asserted just after selection among asserted TR(i) (step MA4) before or simultaneously with BUS_REQUEST. This skip wasting the time TLt_p. Moreover the benefits may be greater because in the meanwhile EB_GRANT is provided the initial latency TLi_ar necessary to retrieve data (anticipative read) elapses.

A first example of working (Example1) embedding this policy is the following:

1. TRANSACTION REQUESTER A raises its request TRB (FIG. 34) because the amount of data inside PREFETCHABLE FIFO A has exceeded a defined threshold;
2. With the mechanism shown with the DMI MAIN of FIG. 14 the signal TR(1) is asserted. The INTERNAL ARBITER, selects basing on priority and assert GRANT (1); let's suppose that TR(1) and GRANT(1) are associated with DMI PERIPHERAL1. At the same time it assert BUS_REQUEST, which on its turn, cause the assertion of EB_REQUEST;
3. Basing on GRANT(1) a grant cycle (MBC_OPCODE_GRANT) is executed on the COMMON-BUS. All DMA parameters are retrieved from TRANSACTION REQUESTER A and stored by specific blocks of the enhanced DMI MAIN (the mechanism is the same used in the basic DMI MAIN);
4. After that an "anticipative read" from PREFETCHABLE FIFO A starts and read data are stored inside the RX BUFFER;

5. When finally EB_GRANT is asserted DMI MAIN became master (that is it gains the control of the EXTERNAL-BUS) data are transferred towards EBA1 and simultaneously are read from PREFETCHABLE FIFO A.

A second example (Example2) makes evident a situation that is very common in real applications:
1. All steps from 1 to 4 are executed as in the previous case. So at the end of step 4 the RX BUFFER is filled (up to a certain threshold) with data read from PREFETCHABLE FIFO A. DMI request the EXTERNAL-BUS but is not granted;
2. The request for the EXTERNAL-BUS issued from the DMI is not granted from the EXTERNAL ARBITER that on the contrary grants EBA2 that became master of the EXTERNAL-BUS and try to access DMI to read PREFETCHABLE FIFO B;
3. As a consequence the DMI, which has the RX BUFFER filled with data for EBA1, answer with a RETRY (where RETRY has the meaning it has in the PCI bus). The EBA2, or whatever other EBA, is RETRIED until DMI is granted;
4. When finally DMI is granted data stored in RX BUFFER are transferred to EBA1 and this goes on until completion of the transaction.

This approach, characterized by both the anticipation of the grant cycle and the RETRY of transactions directed toward the DMI when the DMI is competing for the mastership of the EXTERNAL-BUS, is indicated as first variant of the COMMON BUS PROTOCOL. It is feasible and very efficient but has a minor drawback. When more agents connected to the EXTERNAL-BUS implement the RETRY a deadlock can results. This is a well-known technical problem.

A further variant of the COMMON BUS PROTOCOL solves this problem. This second variant of the COMMON BUS PROTOCOL is characterized by the same policy of anticipation of the grant cycle introduced with the first variant of the COMMON BUS PROTOCOL. Moreover a trick is used to avoid the RETRY when a transaction is directed toward the DMI and the DMI is competing for the mastership of the EXTERNAL-BUS. A third example (Example3) illustrates the strategy of this second variant of the COMMON BUS PROTOCOL:
1. All steps from 1 to 4 are executed as in the previous case. So at the end of step 4 the RX BUFFER is filled (up to a certain threshold) with data read from PREFETCHABLE FIFO A. DMI request the EXTERNAL-BUS but is not granted;
2. The request for the EXTERNAL-BUS issued from the DMI is not granted from the EXTERNAL ARBITER that on the contrary grants EBA2 that became master of the EXTERNAL-BUS and try to access DMI to read PREFETCHABLE FIFO B;
3. At this point, should EBA2 read data from PREFETCHABLE FIFO B data stored in RX BUFFER for EBA1 would be lost. To avoid this DMI MAIN execute a Clear+Flush (characterized by the opcode MBC_OPCODE_CLR_FLUSH) of all data stored inside RX BUFFER. This prevents to loose data read from PREFETCHABLE FIFO A. Retrieved parameters governing the DMA are not lost but memorized in the various block using them. This fact is signaled by asserting a flag DMA_PAR_SET.
4. Then EBA2 access DMI and starts reading PREFETCHABLE FIFO B. As a consequence data from PREFETCHABLE FIFO B are temporarily stored inside RX BUFFER.
5. As soon as EBA2 ends, DMI is granted by the EXTERNAL AGENT. As a consequence GRANT(i) is asserted. Due to the assertion of the DMA_PAR_SET flag a new grant cycle is skipped and previously stored parameters are used instead. This saves TLt_p clock cycles. An "anticipative read" from PREFETCHABLE FIFO A starts and read data are stored inside the RX BUFFER. Data are transferred towards EBA1 and simultaneously are read from PREFETCHABLE FIFO A.

It is important to underline that, at step 2, every access not directed towards DMI does not cause the Clear+Flush operation. In that case the DMI simply waits for the EB_GRANT from the EXTERNAL ARBITER.

A third variant of the COMMON BUS PROTOCOL which can be combined with first or second variant of the COMMON BUS PROTOCOL further reduce the initial latency in is based on a different anticipative read policy. The read algorithm CMDRF, applied to not prefetchable resources is modified. In the basic CMDRF algorithm of Table D7 of APPENDIX D the transaction is started with a series of WaitRead&Query (MBC_OPCODE_WTRD_QR issued at steps of CMDRF2 and CMDRF12 of CMDRF algorithm) commands until a PMC.START_OF_TRANSACTION different from the PBC_ST_NULL is received. The new policy consists in starting the transaction with a series of Read&Query (MBC_OPCODE_RD_QR issued at step of CMDRF12 of CMDRF algorithm) commands until a PMC.START_OF_TRANSACTION different from the PBC_ST_NULL is received. This implies substituting the opcode MBC_OPCODE_WTRD_QR at steps CMDRF2 and CMDRF12 with the opcode MBC_OPCODE_RD_QR. This requires also a minor change in the PERIPHERAL COMMON BUS CONTROLLER of FIG. 17. Such a change consists in adding to the PERIPHERAL COMMON BUS SEQUENCER block embedded into the PERIPHERAL COMMON BUS CONTROLLER of FIG. 17 the capability of transforming issued WaitRead&Query commands (opcode MBC_OPCODE_WTRD_QR) into corresponding Read&Query (opcode MBC_QPCODE_RD_QR) commands. To do this the PERIPHERAL COMMON BUS SEQUENCER block needs the filling status information; thus it has to be connected to the FILLING_STATUS[3:0] outputted by the FILLING STATUS&DATA SELECTOR of FIG. 17; this is shown in FIG. 17 with an hatched line connecting block FILLING STATUS&DATA SELECTOR to the block PERIPHERAL COMMON BUS SEQUENCER. A consequence of the above changes is that the check (LFS>0) performed at steps CMDRF16, CMDRF21 and CMDRF26 is no more necessary. Regarding the test (LFS>0) executed at steps CMDRF16, CMDRF21 and CMDRF26 of CMDRF algorithm of Table D7—APPENDIX D is important to underline that is it equivalent to the test (LFS≠0) because LFS cannot be less than zero.

The same different anticipative read policy can be applied to CMDR algorithm that is used with prefetchable resources. In the basic CMDR algorithm of Table D6 of APPENDIX D the transaction is started with a series of WaitRead&Query (MBC_OPCODE_WTRD_QR issued at steps of CMDR2 and CMDR22 of CMDR algorithm) commands until a PMC.START_OF_TRANSACTION different from the PBC_ST_NULL is received. The new policy consists in starting the transaction with a series of Read&Query (MBC_OPCODE_RD_QR issued at step of CMDR2 and CMDR22 of CMDR algorithm) commands until a PMC.START_OF_TRANSACTION different from the PBC_ST_NULL is received. This implies substituting the opcode MBC_OPCODE_WTRD_QR at steps CMDR2 and CMDRF22 with the opcode MBC_OPCODE_RD_QR. This requires the same changes required by the variant of CMDRF algorithm in the PERIPHERAL COMMON BUS CONTROLLER of FIG. 17. Also in this case a consequence of the above changes is that the check (LFS>0) performed at steps CMDR11 and CMDR16 and is no more necessary.

The CMDRF of the third variant of the COMMON BUS PROTOCOL is shown in APPENDIX G. The LFS is no more checked in this third variant of the CM DRF algorithm, This is no more done because with the CMDRF algorithm of the third variant is used a version of the PERIPHERAL COMMON BUS SEQUENCER that, for each command with opcode MBC_OPCODE_RD_QR received, tests if the filling status of the interfaced resource (that is the FILLING_STATUS[3:0] outputted by the FILLING STATUS&DATA SELECTOR of FIG. 17 represented with the hatched line connecting block FILLING STATUS&DATA SELECTOR to block PERIPHERAL COMMON BUS SEQUENCER) is greater of zero. In case the test is true the field PMC.TRANSACTION_PAYLOAD is set to PBC_TP_DATA_AND_QUERY_RESULT; otherwise is set to PBC_TP_QUERY_RESULT. In any case the correct filling status is provided to the field PMC.RESOURCE_FILLING_STATUS. It can be proved that this change does not affect algorithms DFSC and LFSC under certain conditions. In particular LFSC algorithm is not affected if any calculation of the new value for LFS[3:0] is bounded to be greater or equal to zero. LSF is greater than zero by definition; in any case this can be simply enforced against transient wrong conditions due to spikes etc. by using a proper arithmetic unit.

As stated introducing CMDR and CMDRF algorithm when PREFETCHABLE FIFO is available and therefore CM DRF is used there is no reason to keep on using CMDR. This is true also for third variant of the COMMON BUS PROTOCOL.

A measure of the advantages of the introduced variants (evident from introduced examples) is given by the Efficiency defined by previously introduced equation (1):

$$\text{Efficiency} = N/(N + TLi + TLs) \tag{1}$$

It is important to underline that in equation (1), as a consequence of described algorithms, in both the basic and the variants of DMI the term TLs is zero, so the Efficiency completely depends on N and TLi.

In both Example2 and Example3 with the variants of DMI the initial latency TLi is greatly reduced. It is evident that by reducing the term TLi the Efficiency is greatly increased for short and medium length bursts (up to 100% in short bursts cases). The case of short and medium length bursts is very often present in multi-master environment where more masters compete for the access to the bus (EXTERNAL-BUS). As an example this is the case of a Personal Computer where fast and smart peripheral (e.g. video, disks) are "bus master capable".

Drivers

Now with reference to the FIGS. 51, 52, 53, 54 and 55 a new structured software approach for design device drivers based on macro-cells is duly discussed. As anticipated in the introduction, drivers for application devices offer a well-specified interface to the Operating System loaded on the processor. The philosophy of this interface does not depend on the operating system and is commonly based on five basic functions:

| | |
|---|---|
| OPEN( . . . ) | device drivers initiate and configure the controlled devices. |
| CLOSE( . . . ) | device drivers shut the controlled devices. |
| READ( . . . ) | device drivers read data from the controlled devices. |
| WRITE( . . . ) | device drivers write data to the controlled devices. |
| IOCTRL( . . . ) | device driver provide heterogeneous commands. |

A generically known driver maps these functions in sequences of proper read and write data addressing registers located in the microprocessor interface of the controlled device. Execution of a single call to function can generate several reads and writes.

Figure 51:
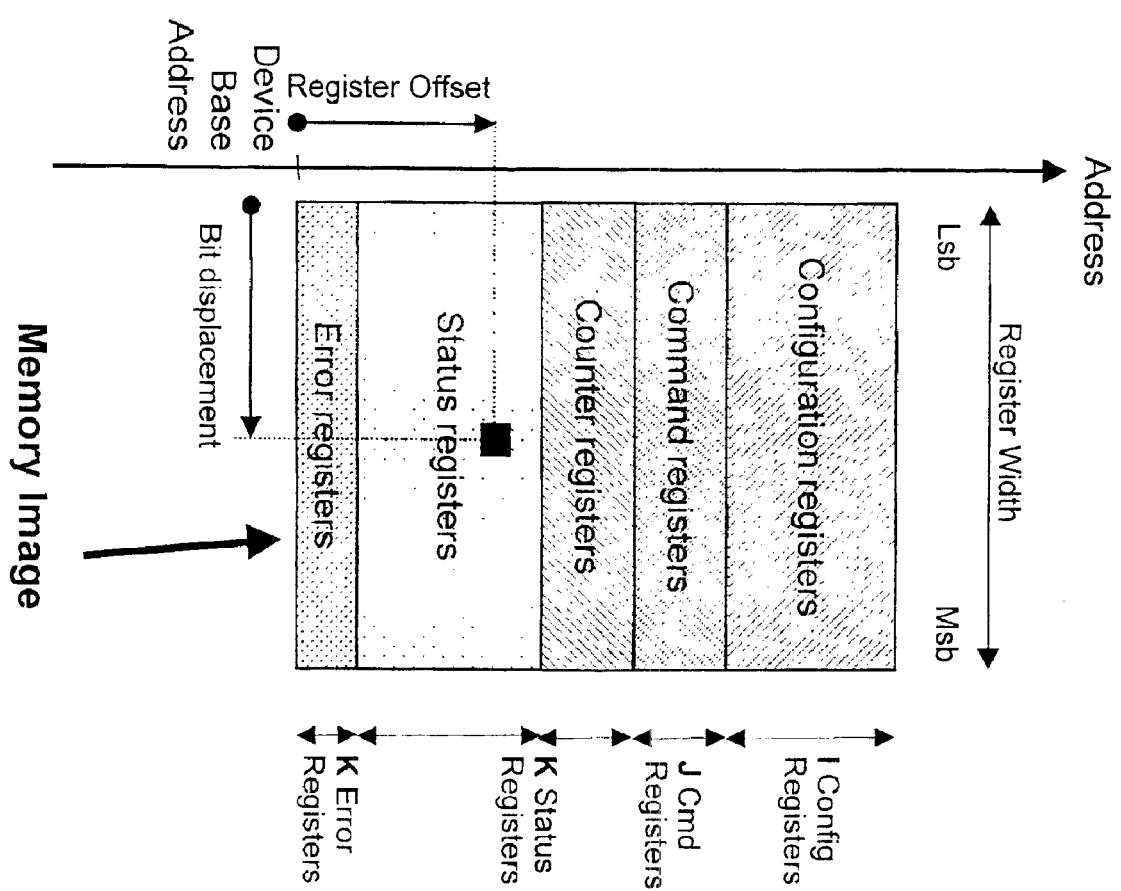
FIGS. 51 to 55 are referred to the software architecture of drivers associated to the macro-cells belonging to the microprocessor/local bus interfaces of FIGS. 9 to 11 of the invention.

In FIG. 51 a block of registers appears as an "image" in the microprocessor memory space. FIG. 51 shows a classical CMI architecture, providing I CONFIGURATION REGISTERS, J COMMAND REGISTERS, K COUNTER REGISTERS, H STATUS REGISTERS, E ERROR (polled interrupt) REGISTERS. A specific bit belonging to a specific register can be selected giving its address and its displacement in the register. A write operation at the address where the physical flip-flop is located in CMI image modifies the value stored in it.

Common way to provide the address is the sum of the Device Base Address and the Register Offset:

ADDRESS=DEVICE BASE ADDRESS+REGISTER OFFSET.

While the application specific device is designed by a team of hardware engineers, the device driver is written by a team of software engineers. Main problem during device driver implementation is communication lack between hardware designers (that have provided the microprocessor interface and that know exactly the meaning of each bit in each register) and the software ones (that have to learn this information). Macro-cells are becoming very complex so it is highly recommended that each macro-cell is delivered with its own drivers, that because it could be very difficult to write a driver without the support of the designer of the macro-cell. In the introduction had been outlined that the unstructured code of known devices software makes difficult to split it into a plurality of macro-cell related drivers. That because there is not an equivalent splitting in the memory space.

Figure 52:
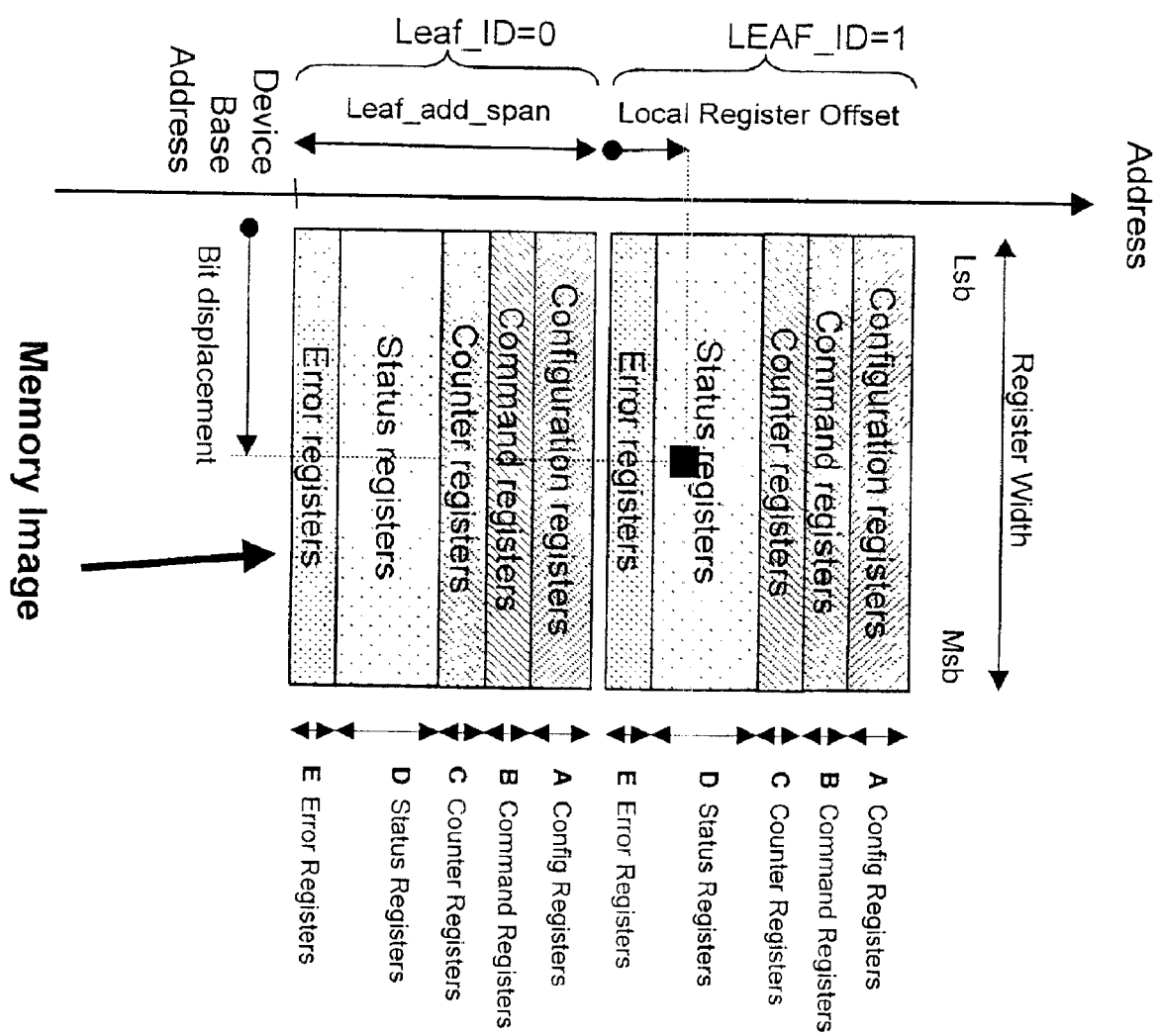

On the contrary the structured DMI architecture of the invention disclosed in the claim 1, highly impacts on the structure of the memory image. As shown in FIG. 52, the overall memory image of two layers REGBLOCK (FIG. 17) consecutive in the space address is composed by two smaller images, one for each DMI LEAF embedding a layer. The argument can be generalized for N layers REGBLOCK. Each DMI LEAF is identified by a number, the LEAF_ID: the DMI LEAF that starts at the Device Base Address has LEAF_ID equal to 0, the next equal to 1, and so on.

As already explained a DMI LEAF provides (at maximum utilization and in a non-limiting way) 14 CONFIGURATION REGISTERS, 2 COMMAND REGISTERS, 2 COUNTER REGISTERS, 13 STATUS REGISTERS, and 1 READ&RESET REGISTER. This way, the maximum number of STATUS REGISTERS for an application specific device is given by the number of DMI LEAFs (LEAF_N) interfacing the device, multiplied by the amount of STATUS REGISTERS available in a single leaf. For the device mapped in FIG. 52 the number is 26. The argument can be generalized to all the register types.

Profitable way to calculate a particular address within the image of FIG. 52 is given from the following expression:

ADDRESS=DEVICE_BASE_ADDRESS+(LEAF_ID×LEAF_ADD_SPAN)+LOCAL_REGISTER_OFFSET.

where: the descriptor DEVICE_BASE_ADDRESS indicates a reference point for addressing drivers for different devices; LEAF_ID is the leaf indicator number; LEAF_ADD_SPAN is a constant leaf size; LOCAL_REGISTER_OFFSET is the displacement of the considered register from the starting address of the leaf.
The LOCAL_REGISTER_OFFSET for each resource embedded into the REGBLOCK layer is shown in Table F1—APPENDIX F. Each resource is indicated with a symbolic RESOURCE_ID (in first column), in third column (named HEXDECIMAL ADDRESS OFFSET) the LOCAL REGISTER_OFFSET is shown.

Design style for device drivers shall reach the same modularity of the hardware design based on macro-cells. This goal can be achieved by means of appropriate software organization, providing each hardware macro-cell with small and specific software. This software is a named MPI (Macro-cell Programming Interface), and has the following properties:
each macro-cell has its own MPI;
each MPI is composed by a set of functions/procedures (the terms function and procedure are considered equivalent) operating on said macro-cell only;
each MPI is O.S. (Operating System) independent;
each MPI is portable/relocable (the portability of these MPIs is ensured by a specific organization of the variables).

By the above definitions is clear that an MPI is an O.S. independent relocable "low level driver" specific of each macro-cell.

The complete set of MPIs (for all the macro-cells embedded into the applications constitutes the DPI (Device Program Interface). The DPI has the following properties:
DPI is O.S. (Operating System) independent;
DPI is portable/relocable (the portability of these MPIs is ensured by a specific organization of the variables).

Taking in account the previous definitions the complete device driver of the application or API (Application Programming Interface) results composed of:
DPI (Design Program Interface);
a set of translation functions to the Operating System calls.

The API, obviously, is specific to the particular "prototypes" (where the term prototype has the same meaning as in C) of the five basic functions (OPEN( . . . ), CLOSE( . . . ), READ( . . . ), WRITE( . . . ), IOCTRL( . . . )) that in their turn depend on the particular operating system.

The way to operate is referred to the ASIC of FIG. 9 embedding the distributed interface of the present invention connected to an interfaced ATM Adaptation Layer (AAL5); the ensemble being composed of four CLUSTER OF MACRO-CELLS. For the sake of simplicity a subset of those macro-cells are considered to promote a sufficient description, namely the ATMU TX macro-cell connected to the leaf DMI PERIPHERAL 1 located at the ATM transmission side, and the ATMU RX macro-cell connected to the leaf DMI PERIPHERAL 4 located at the ATM reception side.

The host (either a PC or a dedicated system with embeds the board BOARD of FIG. 9) provide packets via the local bus LB. On its turn the DMI MAIN forwards such packets to the COMMON-BUS. The AAL TX PROTOCOL CORE receives packets and calculates the AAL5 protocol fields. Then packets are forwarded to the ATMU TX macro-cell which processes the AAL5 segments and provides them to the primary output DATA TX via the series of ALIGNER TX and UTOPIA TX macro-cells. In this description, without loosing generality, the function of macro-cells AAL TX MEMORY MANAGER and SHAPER are not considered because are not important for this aim.

Now some basic concepts of ATM will be introduced to illustrate a real example of drivers in the ASIC of FIG. 9. ATM (Asynchronous Transmit Mode) is a cell-switching technology. When a user wants to communicate some data to another user using this technology he subdivide data in small size segments and add to each segment an header containing routing information. The blocks of data so obtained are named ATM cells. An ATM cell has fixed size (53 bytes) and is subdivided in one header (5 bytes) and one payload (48 bytes); the payload contains user data while the header contains routing information. In particular the header is subdivided in a fixed and standardized number and type of fields (see "ITU-T Recommendation I.361" of February 1999).

All the cells characterized by the same end-to-end path are said to belong to the same flow. In particular flows are subdivided in user flows and control flows: user flows carry information among different users while control flows carry information useful to control and monitor the network status.

It is important to underline that, in an ATM data link, cells belonging to different flows can be interleaved while keeping the ordering inside each flow. As an example cells belonging to different user flows and control flows can be interleaved each other.

For test and maintenance purposes a particular type of control cells named OAM (Operation And Maintenance—see standard) cells are interleaved with the user flow.

OAM cells can belong to different flows from F1 to F5 (as defined by the standard). For the purposes of this example we will consider flow F4 which is charged of operation and maintenance at Virtual Path level. Inside each flow cells are classified basing on "OAM type" and inside each selected "OAM type" with the "Function type". In particular we will consider "Fault Management" as OAM type and "Loopback" as Function type. The loopback cells are committed to support the loopback capability at ATM layer that consists in allowing operation related information to be inserted at one location along a virtual path and returned (or looped back) at a different location, without having to take the connection out of service. This capability is performed by non-intrusively inserting a loopback OAM cell at a downstream point following either an instruction from the system management, or the information contained in its information field.

For OAM definition and detailed operation description see "ITU-T Recommendation 1.610" of November 1995.

In our example will suppose that the ATMU TX macro-cell will insert a OAM loopback cell according to the "Access line loopback" application, while the ATMU RX macro-cell will wait to capture the same cell looped back by the first ATM node found inside the network.

Registers belonging to the REGBLOCK layer of DMI PERIPHERAL 1 and DMI PERIPHERAL 4 will be used to configure, control and retrieve status and alarms related to loopback cells operation.

In the presented not limiting example will be defined four different functions belonging to two different MPIs (each one belonging to a different macro-cell according to the MPI definition). With first function we will generate an OAM loopback cell belonging to the F4 flow by sending via COMMON-BUS proper configuration and commands to ATMU TX macro-cell interfaced by DMI PERIPHERAL 1; the loopback cell generation and insertion is driven by the software running on the host. With second function we will program ATMU RX macro-cell to trap a predefined loopback cell coming from the network (the one inserted by means of the ATMU TX macro-cell). With third function the capture of the cell is signaled to the microprocessor via a polled interrupt. With fourth function a meaningful subset of the fields of the trapped cell is read from the microprocessor. ATMU RX macro-cell interfacing is done by means of DMI PERIPHERAL 4.

The format of generic OAM cells is the following:
Header: 5 octets;
OAM type: 4 bits;
Function type: 4 bits;
Function specific field: 45 octets;
Reserved for future use: 6 bits;
EDC (CRC-10): 10 bits.

OAM cells belonging to the F4 flow are recognized basing on their VCI (Virtual Channel Identifier). In particular VCI "3" (decimal) identify "Segment OAM F4 flow cell" and VCI "4" (decimal) identify "End-to-end OAM F4 flow cell". Once an OAM F4 cell has been recognized OAM type and Function type are recognized in their turn by looking inside specific fields. For a loopback cell OAM type must take value "0001" (binary) and Function type must take value "1000" (binary).

For loopback cells the format of Function specific field is the following:
Loopback indication field: 1 octet. The least significant bit of this field as to whether or not the cell has already been looped back. The field confirms that the loopback has been occurred at the ATM layer and avoids the problem of infinite loopback that would occour when the default (all 1's) loopback location ID fields is used. The source point encodes this filed as "00000001" (binary). The loopback point change this encoding to "00000000";
Correlation tag field: 4 octets. This field is used to correlate the transmitted OAM cell with the received OAM cell;
Loopback indication ID: 16 octets. This field identifies as an option the connecting point along the virtual connection or connection segment where the loopback is to occour. The value of this field is not subject to standardization. Default is all 1's, and represents the end point of the connection or connection segment, depending on the flow.
Source ID field: 16 octets. The use of this field is optional and identifies the source originating the loopback cell. The value of this field is not subject to standardization. Default is all 1's.

Loopback cell will be generated assigning its fields to the following values. VPI (Virtual Path Identifier) will take value "3" (decimal). Regarding the Function specific field its fields will be assigned as in the following. Loopback indication field will be assigned to "00000001" (binary). Correlation tag field will be assigned to all 0's except the two lower octets that take the value "AAAAAA00" (hex) for first loopback cell while corresponding field of next loopback cells will be incremented by 1 for each new loopback cell. Loopback indication ID is supposed to be all 1's except the lower octet that takes the value "BBBB" (hex). Source ID field is supposed to be all 1's except the lower octet that takes the value "CCCC" (hex). For each field, only the minimum number of bits is made programmable to save logic; others bits are hardwired inside ATMU TX macro-cell.

So, to be properly operated the macro-cell ATMU TX of FIG. 9, renamed with α in the following, requires among other things to be supplied with the five OEM cell fields named VPI, VCI, OAM type, Function type and Function specific field of the loopback cell to be inserted. Fields VPI, VCI, OAM type and Function type can be concatenated into a single word (4 octets total length) that is named α_HEADER_INSERT_PAR. Defined portions of sub-fields of the Function specific field, that is Fields Correlation tag, Loopback indication ID and Source ID can be concatenated into a single word (4 octets total length) that is named α_FNSP_INSERT_PAR. Field portions not defined by registers are hardwired to default values inside ATMU TX. Moreover the loopback cell generation is supposed to be triggered from an α_INSERTCELL_PAR signal. So, ATMU TX macro-cell is supposed to be provided with an α_HEADER_INSERT_PI[31:0] input port, an α_FNSP_INSERT_PI[31:0] input port and an α_INSERTCELL_PI input port where PI stands for Primary Input of the macro-cell.

Such specified ATMU TX macro-cell ports have to be connected to corresponding registers belonging to DMI PERIPHERAL 1. In particular a CONFIGURATION REGISTER of DMI PERIPHERAL 1 connected to α_HEADER_INSERT_PI[31:0] input port will provide the α_HEADER_INSERT_PAR configuration word of 4 octets, another CONFIGURATION REGISTER of DMI PERIPHERAL 1 connected to α_FNSP_INSERT_PI[31:0] input port will provide the α_FNSP_INSERT_PAR configuration word of 4 octets while the α_INSERTCELL_PI input port is connected to a single bit of a COMMAND REGISTER of DMI PERIPERAL 1 that will provide the α_INSERTCELL_PAR signal. Totally two CONFIGURATION REGISTERS plus a single bit of a COMMAND REGISTER are needed.

The software running on the host drives the "F4 loopback cell generation and insertion" performing some writing α_HEADER_INSERT_PAR, α_FNSP_INSERT_PAR, α_INSERTCELL_PAR) to the addresses of the above defined registers connected to the ATMU TX macro-cell. The part of code that implement this feature can be organized as a function named F4_LOOPBACK_INSERT_α (α_HEADER_INSERT_PAR, α_FNSP_INSERT_PAR, α_INSERTCELL_PAR).

The ATMU RX macro-cell, renamed with β in the following, must be programmed to trap the same loopback cell previously inserted by the ATMU TX macro-cell (second function). When the loopback cell is trapped an alarm must be generated (a polled interrupt) and this constitutes the third function. Moreover some meaningful portions of the trapped cell have to be saved in a status register to be read from the software running on the host. The function that reads this STATUS REGISTER is the fourth function.

Thus ATMU RX macro-cell is supposed to be provided with a β_HEADER_TRAP_PI[31:0] input port, an β_FNSP_TRA_PI[31:0] input port and an β_TRAPCELL_PI input port. Moreover ATMU RX macro-cell is supposed to be provided with a β_TRAPALARM_PO output port (the "_PO" stands for Primary Output of the macro-cell) to signal to the microprocessor the trapping of the programmed loopback cell. Finally ATMU RX macro-cell is supposed to be provided with a β_TRAPSTATUS_PO[31:0] output port.

The β_FNSP_TRAP_PI[31:0] input port has to be provided with the same β_FNSP_TRAP word provided to the β_FNSP_INSERT_PI[31:0] input port of macro-cell ATMU TX except for the loopback indication field (1 octet) that takes the value "00000000" (binary). In fact while source point encodes this filed as "00000001" (binary), the loopback point change this encoding to "00000000" (binary); so the expected loopback cell should have this field set to "00000000" (binary).

Such specified ATMU RX macro-cell ports have to be connected to corresponding registers belonging to DMI PERIPHERAL 4. In particular a CONFIGURATION REGISTER of DMI PERIPHERAL 4 connected to β_HEADER_TRAP_PI[31:0] input port will provide the β_HEADER_TRAP_PAR configuration word of 4 octets, another CONFIGURATION REGISTER of DMI PERIPHERAL 4 connected to β_FNSP_TRAP_PI[31:0] input port will provide the β_FNSP_TRAP_PAR configuration word of 4 octets while the β_TRAPCELL_PI input port is connected to a single bit of a COMMAND REGISTER of DMI PERIPERAL 4 providing β_TRAPCELL_PAR. The β_TRAPALARM_PO output port providing β_TRAPALARM_PAR is connected to a single bit of the READ&RESET REGISTER of DMI PERIPHERAL 4. Finally the β_TRAPSTATUS_PO[31:0] output port providing β_TRAPSTATUS_PAR is connected to a STATUS REGISTER belonging to DMI PERIPHERAL 4. Totally two CONFIGURATION REGISTERS plus a single bit of a COMMAND REGISTER, a single bit of a READ&RESET REGISTER and a STATUS REGISTER are needed.

The software running on the host drives the "F4 loopback cell trap setup" performing some writing (β_HEADER_TRAP_PAR, β_FNSP_TRAP_PAR) to the addresses of the above defined registers connected to the ATMU RX macro-cell. The part of code that implement this feature can be organized as a function named F4_LOOPBACK_

All the implemented code of functions belonging to a macro-cell have to be located in a single file (possibly taking the name of the macro-cell), the macro-cell implementation part.

Following a "C language" convention these are the ".C files" (e.g. <macro-cell>.C). General declarations useful to all macro-cells are located inside a single Design Map File. Following a "C language" convention these are the ".H files", so this Design Map File is named MAP.H. All the declarations belonging to a macro-cell are located too in a single file (possibly taking the name of the macro-cell), the macro-cell declaration part (e.g. <macro-cell>_MAP.H).

According to this model both macro-cell α and β will provide a specific declaration part respectively named α_MAP.H and β_MAP.H while general declarations, useful to all macro-cells are given in file MAP.H. Functions handling macro-cells α and β are respectively named α.C and β.C.

The two declarations α_MAP.H and β_MAP.H regard parameters required by functions embedded in α.C and β.C. Said parameters are basically constituted by register names recurring in functions, macro-cell base address and function prototype declarations. All the necessary parameters are declared but no value is assigned. Moreover name of the parameters has to be univocal in the entire system and has to permit to identify the correct physical register.

The α_MAP.H file embeds a set of declarations specific to macro-cell α (register names recurring in functions, macro-cell base address and function prototype declarations).

```
/*----- α_MAP.H -----*/
/*---------- Declarations specific to macro-cell α ---------*/
/* macro-cell α is connected to leaf DMI PERIPHERAL 1 */
CONSTANT α_LEAF : BIT_VECTOR(31:0) : = 0x0;
CONSTANT α_LEAF_BASE_ADDRESS : BIT_VECTOR(31:0) : = DEVICE_BASE_ADDRESS + α_LEAF * LEAF_ADDR_SPAN;
/* α_HEADER_INSERT is connected and mapped to CONFIGURATION 0 */
CONSTANT α_HEADER_INSERT_REG : BIT_VECTOR(31:0) := α_LEAF_BASE_ADDRESS + CONFIGURATION 0;
/* α_FNSP_INSERT is connected and mapped to CONFIGURATION 1 */
CONSTANT α_FNSP_INSERT_REG : BIT_VECTOR(31:0) := α_LEAF_BASE_ADDRESS + CONFIGURATION 1;
/* α_INSERTCELL is connected and mapped to COMMAND 0 */
CONSTANT α_INSERTCELL_REG : BIT_VECTOR(31:0) := α_LEAF_BASE_ADDRESS + COMMAND 0;
CONSTANT α_INSERTCELL_REG_OFFSET : INTEGER := 0d0;
PROCEDURE F4_LOOPBACK_INSERT_α(α_HEADER_INSERT_PAR, α_FNSP_INSERT_PAR, α_INSERTCELL_PAR)
```

TRAP_β(β_HEADER_TRAP_PAR, β_FNSP_TRAP_PAR, β_TRAPCELL_PAR). The part of code polling the READ&RESET REGISTER organized as a function named F4_LOOPBACK_POLL_ALARM_β(β_TRAPALARM_PAR). The part of code reading the status register where some meaningful fields of the trapped cell are saved is named F4_LOOPBACK_STATUS_β(β_TRAPSTATUS_PAR).

This way each macro-cell belongs to one's own Macro-cell Program Interface (MPI) composed by the set of functions and variables that refer to the macro-cell itself. The goal is to make functions belonging to the MPI reusable in different context.

A different application specific device that makes use of a same macro-cell will probably map the macro-cell registers in different locations of the memory image. For this reason the implementation of the functions has to be done in relocating way, operating as in the following.

In the example we will use the file organization typical of C language (.H files and .C files) while the keywords inside the pseudo-code are similar to the ones of the VHDL language.

Parameters α_HEADER_INSERT_PAR, α_FNSP_INSERT_PAR, and α_INSERTCELL_PAR are put in correspondence of as many ports of macro-cell α connected to the leaf DMI PERIPHERAL 1. The ports have to be mapped in the memory image REGBLOCK of the leaf DMI PERIPHERAL 1. Variable definition and allocation has to reflect the physical connections between the LEAFs and the macro-cells, as indicated in the upper part of FIG. 53. Declaration part also contains the prototype function F4_LOOPBACK_INSERT_α(α_HEADER_INSERT_PAR, α_FNSP_INSERT_PAR, α_INSERTCELL_PAR). It is important to note that no value has been assigned to the declared variables. Constant α_INSERTCELL_REG_OFFSET is used to identify the bit on which the command "insert cell" is sent among the 32 of the COMMAND REGISTER; this is done with techniques belonging to the known art.

The β_MAP.H file embeds a set of declarations specific to macro-cell β (register names recurring in functions, macro-cell base address function prototype declarations).

```
/*----- β_MAP.H -----*/
/*---------- Constants specific to macro-cell β ----------*/
/* macro-cell β is connected to leaf DMI PERIPHERAL 3 */
CONSTANT β_LEAF = 0x2;
CONSTANT β_LEAF_BASE_ADDRESS : BIT_VECTOR(31:0) : = DEVICE_BASE_ADDRESS + β_LEAF * LEAF_ADDR_SPAN;
/* β_HEADER_TRAP is connected and mapped to CONFIGURATION 0 */
CONSTANT β_HEADER_TRAP_REG : BIT_VECTOR(31:0) := α_LEAF_BASE_ADDRESS + CONFIGURATION 0;
/* β_FNSP_TRAP is connected and mapped to CONFIGURATION 1 */
CONSTANT β_FNSP_TRAP_REG : BIT_VECTOR(31:0) := α_LEAF_BASE_ADDRESS + CONFIGURATION 1;
/* β_TRAPCELL is connected and mapped to COMMAND 0 */
CONSTANT β_TRAPCELL_REG : BIT_VECTOR(31:0) := α_LEAF_BASE_ADDRESS + COMMAND 0;
CONSTANT β_TRAPCELL_REG_OFFSET : INTEGER := 0d0
/* β_TRAPALARM is connected and mapped to READ&RESET */
CONSTANT β_TRAPALARM_REG : BIT_VECTOR(31:0) := α_LEAF_BASE_ADDRESS + READ_AND_RESET;
CONSTANT β_TRAPALARM_REG_OFFSET : INTEGER := 0d0
/* β_TRAPSTATUS is connected and mapped to STATUS 0 */
CONSTANT β_TRAPSTATUS_REG : BIT_VECTOR(31:0) := α_LEAF_BASE_ADDRESS + STATUS 0;
PROCEDURE F4_LOOPBACK_TRAP_β(β_HEADER_TRAP_PAR, β_FNSP_TRAP_PAR, β_TRAPCELL_PAR);
PROCEDURE F4_LOOPBACK_POLL_ALARM_β(β_TRAPALARM_PAR);
PROCEDURE F4_LOOPBACK_STATUS_β(β_TRAPSTATUS_PAR);
```

Figure 53:
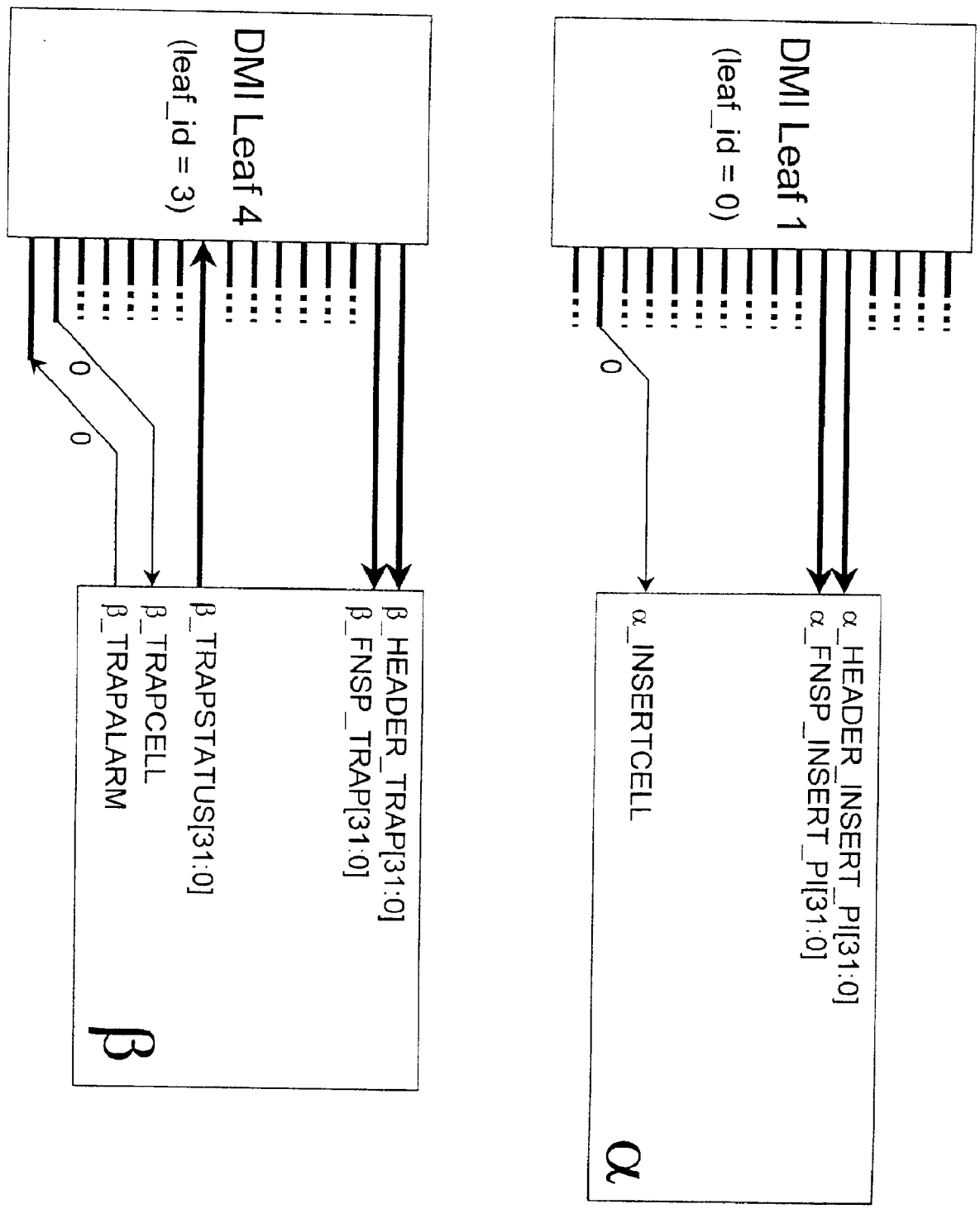

Parameters (β_HEADER_TRAP_PAR, β_FNSP_TRAP_PAR, β_TRAPCELL_PAR, β_TRAPALARM_PAR and β_TRAPSTATUS_PAR are put in correspondence of as many ports of macro-cell β connected to the leaf DMI PERIPHERAL 4. The ports have to be mapped in the memory image REGBLOCK of the leaf DMI PERIPHERAL 4. The lower part of FIG. 53 shows this connection. Declaration part also contains function prototypes F4_LOOPBACK_TRAP_β(β_HEADER_TRAP_PAR, β_FNSP_TRAP_PAR, β_TRAPCELL_PAR). F4_LOOPBACK_POLL_ALARM_β(β_TRAPALARM_PAR) and F4_LOOPBACK_STATUS_β (β_TRAPSTATUS_PAR). It is important to note that no value has been assigned to the declared variables. Constant β_TRAPCELL_REG_OFFSET is used to identify the bit on which the command "trap cell" is sent among the 32 of the COMMAND REGISTER; this is done with techniques belonging to the known art. Constant β_TRAPALARM_REG_OFFSET is used to identify the bit on which the "trapped alarm" is polled among the 32 of the READ_AND_RESET REGISTER; this is done with techniques belonging to the known art.

If register names is known by the declaration part, register locations are application specific and depends on register mapping. Due this reason, a Design Map File common to the entire application has to be provided: it assigns the physical address value to the arguments declared in different functions. All the general declarations helping in this task are embedded into the MAP.H file. The MAP.H file locates the overall design resources, macro-cell by macro-cell. In the example number 0x indicates that the number written in hexadecimal format. The symbol 0d indicates that the number is written in decimal format.

```
/*----- MAP.H -----*/
/*-------- Declarations depending on specific device ----------*/
CONSTANT DEVICE_BASE_ADDRESS: BIT_VECTOR(31:0) := 0x80000
CONSTANT LEAF_ADD_SPAN: BIT_VECTOR (31:0) = 0x100
/*---------- General Declarations ----------*/
CONSTANT CONFIGURATION 0: BIT_VECTOR (31:0) = 0x00;
```

-continued

```
CONSTANT CONFIGURATION 1: BIT_VECTOR (31:0) = 0x04;
CONSTANT CONFIGURATION 2: BIT_VECTOR (31:0) = 0x08;
CONSTANT CONFIGURATION 3: BIT_VECTOR (31:0) = 0x0C;
CONSTANT CONFIGURATION 4: BIT_VECTOR (31:0) = 0x10;
CONSTANT CONFIGURATION 5: BIT_VECTOR (31:0) = 0x14;
CONSTANT CONFIGURATION 6: BIT_VECTOR (31:0) = 0x18;
CONSTANT CONFIGURATION 7: BIT_VECTOR (31:0) = 0x1C;
CONSTANT CONFIGURATION 8: BIT_VECTOR (31:0) = 0x20;
CONSTANT CONFIGURATION 9: BIT_VECTOR (31:0) = 0x24;
CONSTANT CONFIGURATION 10: BIT_VECTOR (31:0) = 0x28;
CONSTANT CONFIGURATION 11: BIT_VECTOR (31:0) = 0x2C;
CONSTANT CONFIGURATION 12: BIT_VECTOR (31:0) = 0x30;
CONSTANT CONFIGURATION 13: BIT_VECTOR (31:0) = 0x34;
CONSTANT COMMAND 0: BIT_VECTOR (31:0) = 0x38;
CONSTANT COMMAND 1: BIT_VECTOR (31:0) = 0x3C;
CONSTANT COUNTER 0: BIT_VECTOR (31:0) = 0x40;
CONSTANT COUNTER 1: BIT_VECTOR (31:0) = 0x44;
CONSTANT STATUS 0: BIT_VECTOR (31:0) = 0x48;
CONSTANT STATUS 1: BIT_VECTOR (31:0) = 0x4C;
CONSTANT STATUS 2: BIT_VECTOR (31:0) = 0x50;
CONSTANT STATUS 3: BIT_VECTOR (31:0) = 0x54;
CONSTANT STATUS 4: BIT_VECTOR (31:0) = 0x58;
CONSTANT STATUS 5: BIT_VECTOR (31:0) = 0x5C;
CONSTANT STATUS 6: BIT_VECTOR (31:0) = 0x60;
CONSTANT STATUS 7: BIT_VECTOR (31:0) = 0x64;
CONSTANT STATUS 8: BIT_VECTOR (31:0) = 0x68;
CONSTANT STATUS 9: BIT_VECTOR (31:0) = 0x6C;
CONSTANT STATUS 10: BIT_VECTOR (31.0) = 0x70;
CONSTANT STATUS 11: BIT_VECTOR (31:0) = 0x74;
CONSTANT STATUS 12: BIT_VECTOR (31:0) = 0x78;
CONSTANT READ_AND_RESET: BIT_VECTOR (31:0) = 0x7C;
```

Code implementation has to be written in order to depend only on the constants declared in the declaration part. So, the implementation of F4_LOOPBACK_INSERT_α(α_HEADER_INSERT_PAR, α_FNSP_INSERT_PAR, α_INSERTCELL_PAR) function becomes:

```
|PROCEDURE F4_LOOPBACK_INSERT_α(α_HEADER_INSERT_PAR, α_FNSP_INSERT_PAR, α_INSERTCELL_PAR)
|{
|write α_HEADER_INSERT_PAR at address α_HEADER_INSERT_REG;
|write α_FNSP_INSERT_PAR at address α_FNSP_INSERT_REG;
|write α_INSERTCELL_PAR at address α_INSERTCELL_REG;
|}
In the same way, the implementation of
F4_LOOPBACK_TRAP_β(β_HEADER_TRAP_REG    β_FNSP_TRAP_REG,
β_TRAPCELL_REG) function becomes:
|PROCEDURE F4_LOOPBACK_TRAP_β(β_HEADER_TRAP_PAR, β_FNSP_TRAP_PAR, β_TRAPCELL_PAR);
|{
|write β_HEADER_TRAP_PAR at address β_HEADER_TRAP_REG;
|write β_FNSP_TRAP_PAR at address β_FNSP_TRAP_REG;
|write β_TRAPCELL_PAR at address β_TRAPCELL_REG;
|}
In the same way, the implementation of
F4_LOOPBACK_POLL_ALARM_β(β_TRAPALARM_REG) function becomes:
|PROCEDURE F4_LOOPBACK_POLL_ALARM_β(β_TRAPALARM_PAR);
|{
|read β_TRAPALARM_PAR at address β_TRAPALARM_REG;
|}
In the same way, the implementation of
F4_LOOPBACK_STATUS_β(β_TRAPSTATUS_REG) function becomes:
|PROCEDURE F4_LOOPBACK_STATUS_β(β_TRAPSTATUS_PAR);
|{
|read β_TRAPSTATUS_PAR at address β_TRAPSTATUS_REG;
|}
```

The implemented code depends on the behavior of the specific macro-cells. For this reasons these functions have to be written by the people has designed the macro-cell itself. These people are however exempted to complete the functions with physical address of the variable and may profitable deliver the driver written in symbolic code, contrary the today's habit, on condition that the meaning of every variable is declared together with the type of registers involved, but this is usual.

Figure 54:
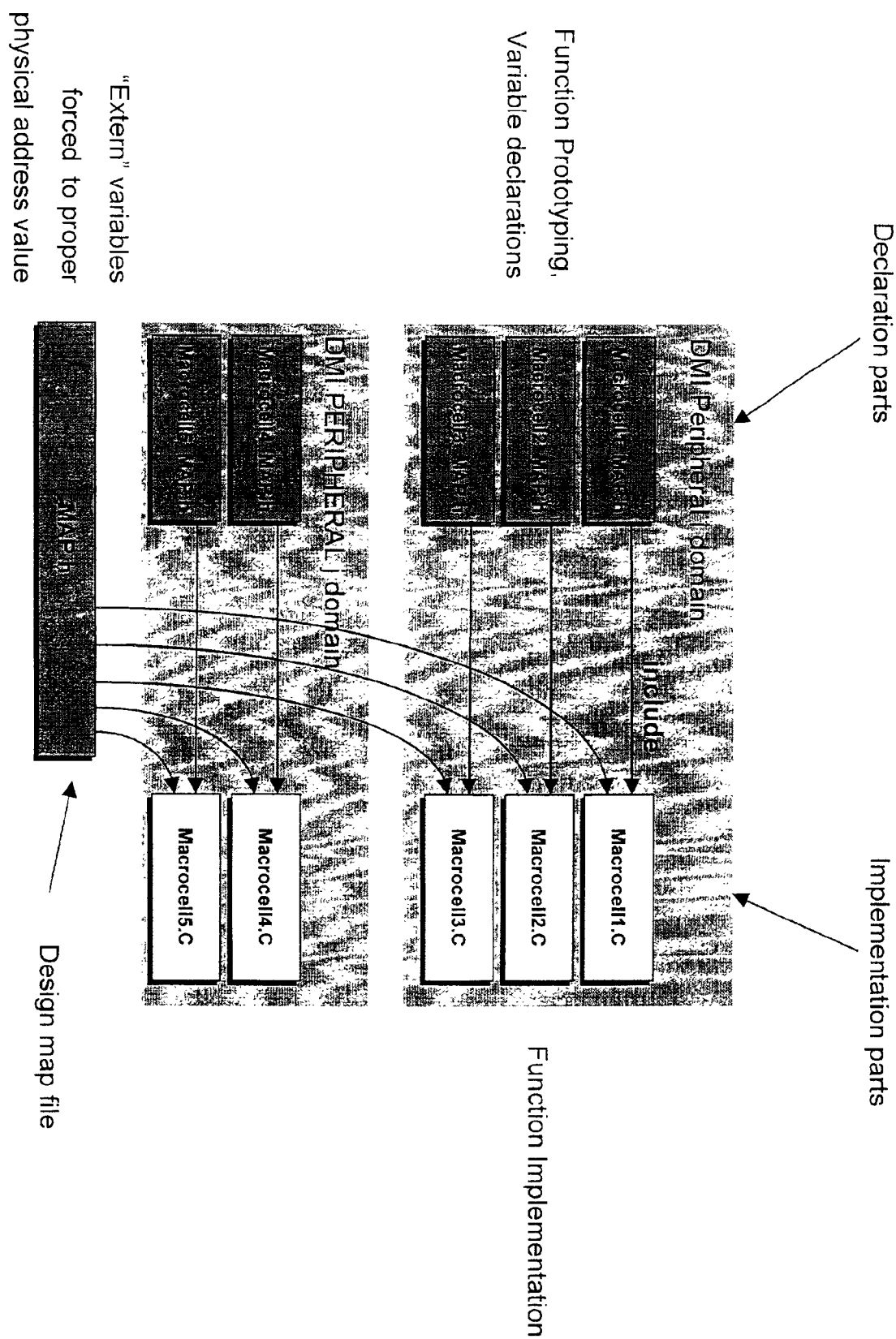

FIG. 54 sums up the code translation procedure from symbolic code of the various <macro-cell>_MAP.H files and <macro-cell>.C files into absolute code of the application, through the MAP.H file. It is important to underline that the case shown in FIG. 54 is relative to the situation where more than one macro-cell is connected to a single DMI LEAF. The write of this file is preferably charged to the software engineer who has an overall knowledge of the system. The trace for producing this file is the memory image of the distributed interface, like FIG. 52. Some aspects and advantages deriving from this modular space address are outlined in connection with the translation procedures of symbolic into absolute code.

The above technical features are not immediately applicable in the design of drivers of the prior art because the address space, as indicated in FIG. 51, is not modular at all.

But the advantages are not confined in using symbolic variable thanks to the use of a MAP.H file, it is useful to remind that the modular structure of the address space comes from the novel idea to opportunely group universal resources into a plurality of standardizable peripheral modules. This greatly simplifies the hardware design of macro-cells, but equally simplifies the driver design. In fact when a driver has been designed and tested for the ensemble of its macro-cell sub-driver components, it can be promptly reused from another device which maps register resources in a different memory space. Rewrite MAP.H file is the only thing to undertake and not driver re-testing is more necessary because the modularity of the involved resources (registers) guarantees that in the new address space identical resources are allocated. This greatly increases the portability of the novel drivers. A similar feature is not found in the drivers of the prior art.

Being completed the Macro-cell Program Interface MPI of all macro-cells composing the design, it is convenient to group said set of functions (all the function of all MPIs) according to a couple of principles:

Group the functions in homogeneous classes. This in general makes sense for all the functions that performs initialization and enabling of macro-cells, namely INITIALIZATION( . . . ) and all the functions that performs disabling of macro-cells, namely DISABLE( . . . ).

Group the functions (in general belonging to different MPIs) according to tasks to be performed as collective work of several macro-cells (more than one).

The set of functions resulting from such grouping constitutes the DPI of the device build assembling all macro-cells. According to previous definitions, it is important to remark that the DPI is O.S. independent.

An example of first class is the following:

```
|PROCEDURE INITIALIZE(α_A1_PAR, α_A2_PAR, β_B1_PAR, β_B2_PAR, γ_C1_PAR, γ_C2_PAR)
|{
|INITIALIZE_α(α_A1_PAR, α_A2_PAR)
|INITIALIZE_β(β_B1_PAR, β_B2_PAR);
|INITIALIZE_γ(γ_C1_PAR, γC2_PAR);
|{
```

All the INITIALIZE_<macro-cell>( . . . ) functions concern macro-cells of the ASIC shown in FIG. 9. Each one initializes its own macro-cell. This function call in sequence all the initialization function of all the macro-cells; thus the function INITIALIZE( . . . ) defined above when called initialize the whole device. The function INITIALIZE(α_A1_PAR, α_A2_PAR, β_B1_PAR, β_B2_PAR, γ_C1_PAR, γ_C2_PAR) is part of the DPI of the device of FIG. 9.

An example of the second class is constituted by a "continuity check function" that insert an OAM F4 loopback cell by means of ATMU TX macro-cell (α macro-cell) and try to trap it by means of ATMU RX macro-cell (β macro-cell). This function will be named F4_CONTINUITY_CHECK( . . . ).

The OPEN( . . . ) call of the specific O.S. is supposed to accept N parameters (from O1 to O6). The function INITIALIZE( . . . ) of the DPI accept the 6 parameters α_A1_PAR, α_A2_PAR, β_B1_PAR, β_B2_PAR, γ_C1_PAR, γ_C2_PAR. So a set of translation function from F1( . . . ) to F6( . . . ) is required. Each Fi function accomplishes to a translation of a specific parameter. In the example only translation from the API domain to the DPI domain are shown; without any loose of generality also the opposite or the combination of the two cases is possible.

According to previous definitions, the set of DPI functions translated into specific O.S. function calls constitutes the API of the device.

Figure 55:
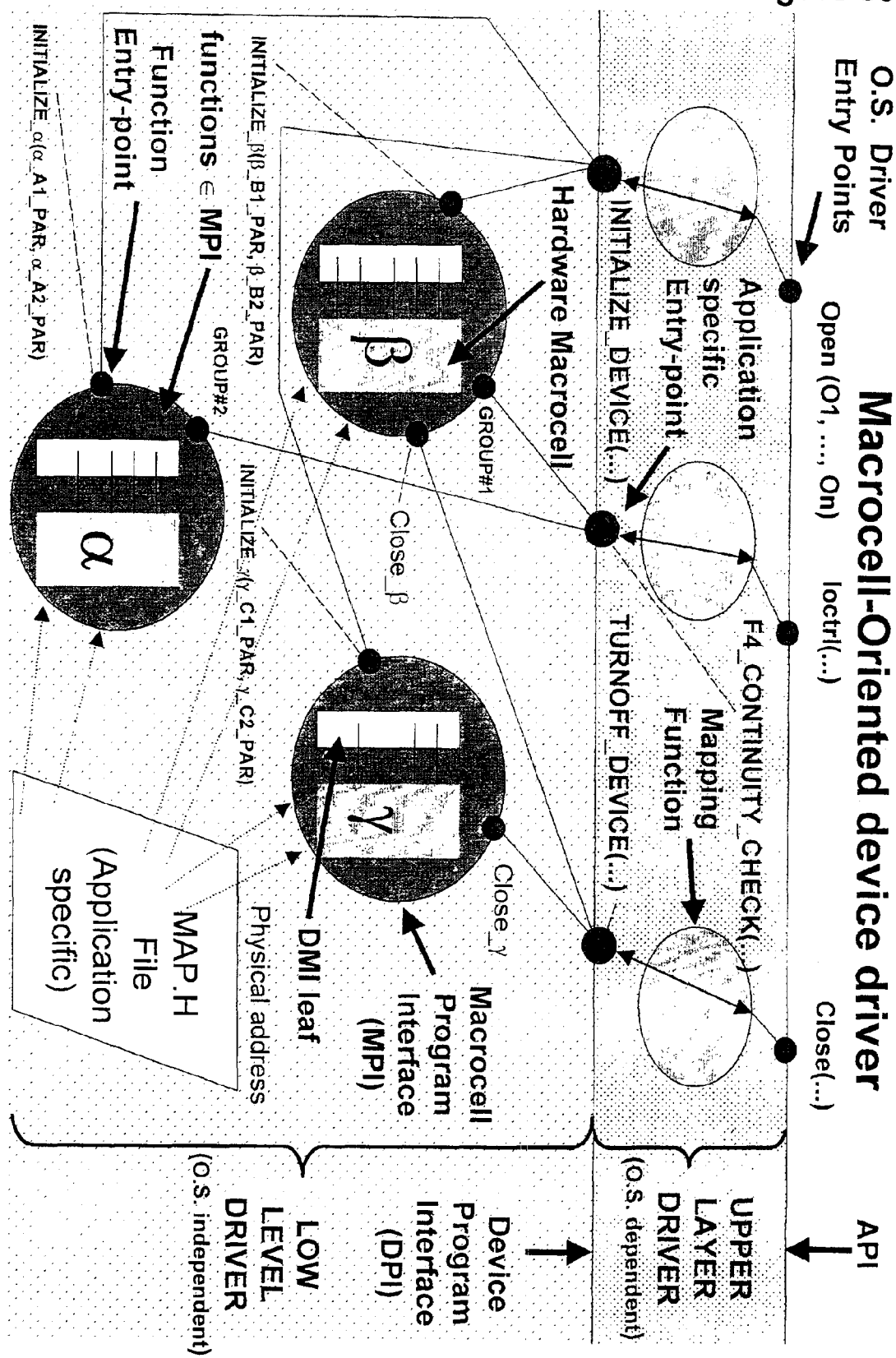

FIG. 55 offers a visual support to the arguments concerning drivers illustrating how a device driver has to be orga-

```
|PROCEDURE F4_CONTINUITY_CHECK    (α_HEADER_INSERT_PAR, α_FNSP_INSERT_PAR, α_INSERTCELL_PAR,
|                                  β_HEADER_TRAP_PAR, β_FNSP_TRAP_PAR, β_TRAPCELL_PAR,
|                                  β_TRAPALARM_PAR,
|                                  β_TRAPSTATUS_PAR)
|{
|F4_LOOPBACK_INSERT_α(α_HEADER_INSERT_PAR, α_FNSP_INSERT_PAR, α_INSERTCELL_PAR)
|F4_LOOPBACK_TRAP_β(β_HEADER_TRAP_PAR, β_FNSP_TRAP_PAR, β_TRAPCELL_PAR);
|F4_LOOPBACK_POLL_ALARM_β(β_TRAPALARM_PAR);
|F4_LOOPBACK_STATUS_β(β_TRAPSTATUS_PAR);
|}
```

The function F4_CONTINUITY_CHECK( . . . ) is part of the DPI of the device of FIG. 9.

It is important to underline that, in general, the order of call only depends on the behavior of the various macro-cells. For this reason these functions have to be written again by the people have thought the design.

The defined set of functions belonging to the Device Program Interface (DPI) makes able to operate at device level. The DPI interface typically does not correspond exactly to an Application Program Interface API offered at operating system level. In this case a simple "translation" layer has to be written to link the DPI with the API interface. The "translation" layer consists in a code that maps the functions belonging to the DPI interface with the calls coming from the API interface. Software engineers can easy write this code, because it needs system knowledge only: no details regarding the behavior of the hardware parts is required.

An example of translation function is given for the INITIALIZE(α_A1_PAR, α_A2_PAR, β_B1_PAR, β_B2-PAR, γ_C1_PAR, γ_C2_PAR) function. In such a case the DPI function can be translated into an OPEN( . . . ) function that belongs to a specific O.S. The resulting call can be:

nized. In the example three application specific macro-cells, which support the single device driver of the example, are shown: the two macro-cells α and β and a third γ. Two layers, respectively named UPPER LAYER DRIVER (Translation Layer) and LOWER LAYER DRIVER, are visible in the Figure. The first layer is bound by an uppermost line representing the Application Program Interface API and by a lower line, representing the Device Program Interface DPI, which demarcates the border with the second layer. On the uppermost line three circles indicate as many Entry-points for calls to the driver of the example executed by the Operative System. The calls are for the following three DPI functions: INITIALIZE_DEVICE( . . . ), F4_CONTINUITY_CHECK( . . . ) and TURNOFF_DEVICE( . . . ). These class of function cross the UPPER LAYER DRIVER (Translation Layer) where are singularly mapped (translated) into the following O.S. specific classes: OPEN(O1, . . . , On), IOCTRL( . . . ), and CLOSE( . . . ) present at as many application specific Entry-points on the Device Program Interface DPI, and vice versa. From each of this Entry-points the respective class of function is subdivided into singular functions each charged to an MPI of a macro-cell included in the LOWER LAYER DRIVER. Macro-cell α is linked with the following two MPI functions: INITIALIZE_α( . . . ) and GROUP#2. GROUP#2 indicates the function F4_LOOPBACK_INSERT_

```
|PROCEDURE OPEN(01, 02, 03, 02, 03, 04, 05, 06, . . . , On)
|{
|α_A1_PAR = F1(01);
|α_A2_PAR = F2(02);
|β_B1_PAR = F3(03);
|β_B2_PAR = F4(04)
|γ_C1_PAR = F5(05);
|γ_C2_PAR = F6(06);
|PROCEDURE INITIALIZE(α_A1_PAR, α_A2_PAR, β_B1_PAR, β_B2_PAR, γ_C1_PAR, γ_C2_PAR);
|}
```

α( . . . ). Macro-cell β is linked with the following three MPI functions: INITIALIZE_β( . . . ), CLOSE_β, and GROUP#1. GROUP#1 collectively indicates the following set of functions: F4_LOOPBACK_TRAP_β( . . . ) and F4_LOOPBACK_POLL_ALARM_β( . . . ). Macro-cell γ is linked with the following two MPI functions: INITIALIZE_γ( . . . ) and CLOSE_γ. Arguments of the functions are not indicated for brevity where there is no possibility of misunderstanding. The circumference that bounds a macro-cell constitutes the Macro-cell Program Interface MPI supporting Function Entry-points for the functions belonging to the MPI of each macro-cell.

APPENDIX A

TABLE A1

MAX BURST LENGTH TABLE

| RESOURCE_ID | OPERATIONS ALLOWED ON COMMON BUS | MAX_READ_BURST_LENGTH (Number of DATA) | MAX_WRITE_BUST_LENGTH (Number of DATA) |
|---|---|---|---|
| CONFIGURATION 0 | RD/WR | 32 | 18 |
| CONFIGURATION 1 | RD/WR | 31 | 17 |
| CONFIGURATION 2 | RD/WR | 30 | 16 |
| CONFIGURATION 3 | RD/WR | 29 | 15 |
| CONFIGURATION 4 | RD/WR | 28 | 14 |
| CONFIGURATION 5 | RD/WR | 27 | 13 |
| CONFIGURATION 6 | RD/WR | 26 | 12 |
| CONFIGURATION 7 | RD/WR | 25 | 11 |
| CONFIGURATION 8 | RD/WR | 24 | 10 |
| CONFIGURATION 9 | RD/WR | 23 | 9 |
| CONFIGURATION 10 | RD/WR | 22 | 8 |
| CONFIGURATION 11 | RD/WR | 21 | 7 |
| CONFIGURATION 12 | RD/WR | 20 | 6 |
| CONFIGURATION 13 | RD/WR | 19 | 5 |
| COMMAND 0 | RD | 18 | 4 |
| COMMAND 1 | RD | 17 | 3 |
| COUNTER 0 | RD | 16 | 2 |
| COUNTER 1 | RD | 15 | 1 |
| STATUS 0 | RD | 14 | 0 |
| STATUS 1 | RD | 13 | 0 |
| STATUS 2 | RD | 12 | 0 |
| STATUS 3 | RD | 11 | 0 |
| STATUS 4 | RD | 10 | 0 |
| STATUS 5 | RD | 9 | 0 |
| STATUS 6 | RD | 8 | 0 |
| STATUS 7 | RD | 7 | 0 |
| STATUS 8 | RD | 6 | 0 |
| STATUS 9 | RD | 5 | 0 |
| STATUS 10 | RD | 4 | 0 |
| STATUS 11 | RD | 3 | 0 |
| STATUS 12 | RD | 2 | 0 |
| READ_AND_RESET | RD | 1 | 0 |

TABLE A2

LEGENDA OF SIGNAL SYMBOLS

| SYMBOL | MEANING |
|---|---|
| <Signal name>(Pfi) | Signal <Signal name> is a pulse (one clock period duration) associated to a clock of frequency fi and phase Phi |
| <Signal name>(fi) | Signal <Signal name> is a level signal associated to a clock of frequency fi and phase Phi |

TABLE A3

| DMI TYPE (*) | TRANSACTION INITIATOR (**) | OPERATION ALLOWED on COMMON BUS | TRANSACTION REQUESTER |
|---|---|---|---|
| MASTER | DMI MAIN | READ from DMI PERIPHERAL RESOURCE | DMI PERIPHERAL RESOURCE |
| MASTER | EXTERNAL BUS AGENT | READ from DMI PERIPHERAL RESOURCE WRITE to DMI PERIPHERAL RESOURCE | EXTERNAL BUS AGENT |
| SLAVE | EXTERNAL BUS AGENT | READ from DMI PERIPHERAL RESOURCE WRITE to DMI PERIPHERAL RESOURCE | EXTERNAL BUS AGENT |

(*) In respect of the EXTERNAL BUS.
(**) On EXTERNAL BUS.

TABLE A4

OVERALL SIGNALS HANDLED BY THE ASYNCHRONOUS TWO PHASE HANDSHAKE PROTOCOL

| SIGNAL NAME | DRIVER | VALUE | DESCRIPTION |
| --- | --- | --- | --- |
| RD_WRN | Master | High/Low | ReaD Write Negated<br>It is the command issued by the master. Allow R_WRN stands for write while a high RD_WRN stands for read. Burst length is one. |
| DS | Master | Asserted/Negated | Data Strobe<br>It is a strobe signal controlled by the master. During a write it means that the master has put a stable datum onto the data bus. During a read it means that the master is ready to latch a datum. The datum is latched during the rising edge of DS (Asserted to Negated). |
| DTACK | Slave | Asserted/Negated | DaTa ACKnowledge<br>It is an acknowledge signal controlled by the slave. During a write it means that the slave has latched the datum supplied by the master. The datum is latched during the falling edge of DTACK (Negated to Asserted). During a read it means that the slave has put a stable datum onto the data bus. |
| ADDRBUS | Master | Bit pattern | ADDRESS BUS<br>Bus carrying addresses. |
| DATABUS | 1) Master in write<br>2) Slave in read | Bit pattern | DATA BUS<br>Bus carrying data. |

TABLE A5

OVERALL SIGNALS HANDLED BY THE SYNCHRONOUS EXTERNAL BUS PROTOCOL

| SIGNAL NAME | DRIVER | VALUE | DESCRIPTION |
| --- | --- | --- | --- |
| CLK_EB | Clock generator | Clock | ClocK<br>It is the synchronization signal to which all other signals are referred. All signals have to be meaningful and stable in the setup/hold window across the rising edge of CLK_EB. |
| COMMAND_EB | Master | WRCMD_EB<br>RDCMD_EB | COMMAND<br>It is the command issued by the master. WRCMD_EB stands for write while RDCMD_EB stands for read. Burst length is not specified. |
| DS_EB | Master | Asserted/Negated | Data Strobe<br>It is a strobe signal controlled by the master. During a write it means that the master has put a stable datum onto the data bus. During a read it means that the master is ready to latch a datum. The datum is transferred when both DS_EB and DTACK_EB are asserted on the same rising clock edge. When both DS_EB is negated and DTACK_EB is asserted on the same rising clock edge it means that a wait state has been introduced by the master. |

TABLE A5-continued

OVERALL SIGNALS HANDLED BY THE SYNCHRONOUS EXTERNAL BUS PROTOCOL

| SIGNAL NAME | DRIVER | VALUE | DESCRIPTION |
|---|---|---|---|
| DTACK_EB | Slave | Asserted/Negated | DaTa ACKnowledge It is an acknowledge signal controlled by the slave. During a write it means that the slave is ready to latch the datum supplied by the master. During a read it means that the slave has put a stable datum onto the data bus. The datum is transferred when both DS_EB and DTACK_EB are asserted on the same rising clock edge. When both DTACK_EB is negated and DS_EB is asserted on th same rising clock edge it means that a wait state has been introduced by the slave. |
| MASTER_EOT_EB | Master | Asserted/Negated | MASTER End Of Transaction When asserted, it signals the will of the master to terminate the transaction. |
| SLAVE_EOT_EB | Slave | Asserted/Negated | SLAVE End Of Transaction When asserted, it signals the will of the slave to terminate the transaction. |
| ADDR_EB | Master | Bit pattern | ADDRess bus Bus carrying addresses. |
| DATA_EB | 1) Master in write 2) Slave in read | Bit pattern | DATA bus Bus carrying data. |

APPENDIX B

MAIN ALGORITHM MA

| STEPS (EVENTS) | MAIN ALGORITHM MA (NOTE: In each clause unassigned signals supposed to be held) |
|---|---|
| MA1 | PROCESS(TR(i), BUS_GRANT, BUS_GRANT_ACK) |
| MA2 | LOOP |
| MA3 | "INTERNAL ARBITER selection among asserted TR(i) for granting the corresponding DMI PERIPHERAL"; (NOTE: i identifies DMI PERIPHERAL originating selected Transaction Request) |
| MA4 | IF ("one of the asserted TR(i) selected") THEN |
| MA5 | "Assert BUS_REQUEST; (NOTE: the EXTERNAL BUS SEQUENCER is requested to assert EB_REQUEST to indicated its will to become master of EXTERNAL-BUS) |
| MA6 | END IF; |
| EA1 | (NOTE: this phase do not belongs to the MAIN algorithm but to the EXTERNAL ARBITER) "EXTERNAL ARBITER arbitration"; |
| MA7 | WAIT ON(BUS_GRANT, BUS_GRANT_ACK); |
| MA8 | IF (BUS_GRANT asserted) THEN |
| MA9 | Assert GRANT(i); |
| MA10 | "Start TIME SLICE COUNTER"; |
| MA11 | WAIT ON("Grant cycle terminated"); |
| MA12 | LOOP UNTIL (BUS_GRANT asserted) AND ((TIME SLICE COUNTER /= PRIORITY TABLE (i)) OR ("the programmed burst has been completed")) (NOTE: thIs means that EXTERNAL BUS SEQUENCER Is the master of EXTERNAL BUS) |
| MA13 | (NOTE: all tasks between brackets ([ ])are executed concurrently) (NOTE: Start Read Algorithm from selected DMI PERIPHERAL and Write Algorithm to EXTERNAL-BUS") ["execute CMDR" or "execute CMDRF", "execute HSKW", "EXTERNAL BUS SEQUENCER in master mode issuing write commands"] |
| MA14 | END LOOP; |
| MA15 | Negate GRANT(i); |
| MA16 | Negate BUS_REQUEST: |

-continued

MAIN ALGORITHM MA

| STEPS (EVENTS) | MAIN ALGORITHM MA (NOTE: In each clause unassigned signals supposed to be held) |
|---|---|
| MA17 | "Reset TIME SLICE COUNTER"; |
| MA18 | ELSIF ("BUS_GRANT_ACK asserted") THEN |
| MA19 | LOOP UNTIL ("BUS_GRANT_ACK asserted") (NOTE: this means that EXTERNAL BUS AGENT is master of EXTERNAL BUS) |
| MA20 | IF ("Write Command issued") THEN |
| MA21 | (NOTE: Start Write Algorithm) (NOTE: all tasks between brackets ([ ])are executed concurrently) ["execute HSKW", "execute CMDW", "External Bus Sequencer in stave mode executing write commands"] |
| MA22 | ELSIF ("Read Command issued") |
| MA23 | (NOTE: Start Read Algorithm) (NOTE: all tasks between brackets ([ ])are executed concurrently) ["execute HSKR", "execute CMDR" or "execute CMDRF", "External Bus Sequencer in slave mode executing read commands"] |
| MA24 | END IF; |
| MA25 | END LOOP: |
| MA26 | END IF; |
| MA27 | END LOOP; |

APPENDIX C

TABLE C1

COMMAND.OPCODE

| OPCODE SYMBOL | MEANING |
|---|---|
| MBC_OPCODE_NOP | No Operation |
| MBC_OPCODE_RD_QR | Read&Query(N) |
| MBC_OPCODE_WTRD_QR | WaitRead&Query(N) |
| MBC_OPCODE_WR_QR | Write&Query(N) |
| MBC_OPCODE_WTWR_QR | WaitWrite&Query(N) |
| MBC_OPCODE_CLR | Clear |
| MBC_OPCODE_CLR_RESET_RAR | Clear&Reset(Read-and-Reset) |
| MBC_OPCODE_GRANT | Grant |
| MBC_OPOODE_FLUSH | Flush(I) |
| MBC_OPOODE_CLR_FLUSH | Clear&Flush(I) |

TABLE C2

COMMAND.FLAG

| FLAG SYMBOL | MEANING |
|---|---|
| MBC_FLAG_NULL | Null Command Flag |
| MBC_FLAG_START_OF_TR | Start of Transaction |
| MBC_FLAG_END_OF_TR | End of Transaction |

TABLE C3

COMMAND.FLUSH

| FLUSH SYMBOL | MEANING |
|---|---|
| MBC_FLUSH_NULL | No data to Flush |
| MBC_FLUSH(I) | I Data to Flush |

TABLE C4

PERIPHERAL_MONITORING_CODE.RESOURCE_TYPE

| RESOURCE_TYPE SYMBOL | MEANING |
|---|---|
| PBC_RT_NULL | Null |
| PBC_RT_PREFETCHABLE | Prefetchable resource |
| PBC_RT_NOT_PREFETCHABLE | Not refetchable resource |

TABLE C5

PERIPHERAL_MONITORING_CODE.START_OF_TRANSACTION

| START_OF_TRANSACTION SYMBOL | MEANING |
|---|---|
| PBC_ST_NULL | Idle/Wait |
| PBC_ST_START_OF_TR | Start of Transaction |

TABLE C6

PERIPHERAL_MONITORING_CODE.END_OF_TRANSACTION

| END_OF_TRANSACTION SYMBOL | MEANING |
|---|---|
| PBC_ET_NULL | Idle/Wait |
| PBC_ET_END_OF_TR | End of Transaction |

TABLE C7

PERIPHERAL_MONITORING_CODE.TRANSACTION_PAYLOAD

| TRANSACTION_PAYLOAD_SYMBOL | MEANING |
|---|---|
| PBC_TP_NULL | No Payload |
| PBC_TP_QUERY_RESULT | Query-Result(N) Payload |
| PBC_TP_DATA_AND_QUERY_RESULT | Query-Result(N) with Data Payload |

TABLE C7-continued

PERIPHERAL_MONITORING_CODE.TRANSACTION_PAYLOAD

| TRANSACTION_PAYLOAD_SYMBOL | MEANING |
|---|---|
| PBC_TP_READ_AND_RESET | Query-Result(N) with Data Payload from a Read-and-Reset Resource |
| PBC_TP_GRANT_REPLY | Parameters for Read Burst |

TABLE C8

PERIPHERAL_MONITORING_CODE_TRANSACTION_TYPE

| TRANSACTION_TYPE SYMBOL | MEANING |
|---|---|
| PBC_TT_NULL | Null |
| PBC_TT_READ | Read Transaction |
| PBC_TT_WRITE | Write Transaction |
| PBC_TT_GRANT_SFA | Specify Fixed Source Address Read Burst |
| PBC_TT_GRANT_SLI | Specify Linear Increment Source Address Read Burst |
| PBC_TT_GRANT_DFA | Specify Fixed Destination Address Read Burst |
| PBC_TT_GRANT_DLI | Specify Linear Increment Destination Address Read Burst |
| PBC_TT_GRANT_VDBL | Specify that Data-Bus-leaf2root[31:0] is currently carrying a Valid DBL |
| PBC_TT_GRANT_IDBL | Specify that Data-Bus-leaf2root[31:0] is currently carrying a Invalid DBL |

TABLE C9

PERIPHERAL_CODE.TRANSACTION EXCEPTION

| TRANSACTION EXCEPTION SYMBOL | MEANING |
|---|---|
| PBC_TE_NULL | Null |
| PBC_TE_ABORT | Unrecoverable Error |
| PBC_TE_OUT_OF_ADDR_SPACE | Supplied Address Steps Out of Address Space |

TABLE C10

PERIPHERAL_MONITORING_CODE.RESOURCE FILLING STATUS

| FILLING STATUS SYMBOL | MEANING |
|---|---|
| PBC_FILLING_STATUS_NULL | No Room to Write/No Data to Read |
| PBC_FILLING_STATUS_(I) | Positions for Data to Write/I Data to Read |

APPENDIX D

TABLE D1

OVERALL SIGNALS HANDLED BY THE ALGORITHMS

| SIGNAL NAME | MEANING |
|---|---|
| PMC.FILLING_STATUS | Filling Status<br>It is the filling status received from DMI MAIN on Control-Status-leaf2root[15:0] bus which carries the PERIPHERAL MONITORING CODE (PMC) at clock pulse i. The FILLING_STATUS field is composed by the 4 lower bits of PMC (PMC[3:0]). This filling status it is not current filling status of selected resource (the one at clock pulse i) but is the filling status of selected resource at clock pulse i - N_leaf2root, where N_leaf2root is the latency of communication between DMI PERIPHERAL and DMI MAIN. |
| RFS[3:0] | Remote Filling Status<br>It is an image (local to DMI MAIN and remote with respect to the selected resource) at clock period i - 1 of the PMC.FILLING_STATUS at clock period i. It is the filling status of selected resource at clock pulse i - N_leaf2root - 1. |
| DFS[3:0] | Delta Filling Status<br>It is the variation at dock period i with respect of the filling status (PMC.FILLING_STATUS) received at clock period i - 1 detected at clock period i by DMI MAIN. This variation does not depend on commands issued by the DMI MAIN. Conversely, it traces net variations, due the events occurred on the selected resource, which are independent by command issued by DMI MAIN. DFS represent the net variation of filling status at clock period i - N_leaf2root in the selected resource. As an example, for prefetchable resources (like register banks and memories), DFS is always zero. On the contrary, for Non-prefetchable resources, like fifos, DFS can assume values greater or equal to zero. To give an example belonging to the described architecture let's consider a DOWNFIFO HOST MODULE. DMI MAIN is writing data to DOWNFIFO HOST MODULE and the fifo is getting full. The evolution of the filling status under the action of commands issued by DMI MAIN is traced without DFS. But, if DOWNFIFO HOST MODULE is read by the application connected to it, the filling status changes because the room available for writing (number of words) increases. This variation is reported by DFS. |

TABLE D1-continued

OVERALL SIGNALS HANDLED BY THE ALGORITHMS

| SIGNAL NAME | MEANING |
|---|---|
| LFS[3:0] | Local Filling Status<br>It is the image of filling status of selected resource built locally to DMI MAIN. It exactly traces (it is coincident) the filling status local to selected resource but is delayed of i - N_leaf2root clock pulses. This delay is managed in a transparent way by using a filling status expressed by a number of bits greater or equals to the logarithm base two of the round trip latency between DMI PERIPHERAL and DMI MAIN expressed in clock cycles. The round trip latency is the time elapsing from issuing of a generic operation (e.g. addressing, granting, command, etc.) from the MAIN COMMON BUS SEQUENCER block on the COMMON BUS to the receiving of the acknowledge/reply/read datum to this operation from the block MAIN COMMON BUS SEQUENCER. This delay is measured in clock cycles. |
| CLEAR | CLEAR<br>It clear RX BUFFER and resets all control machines to idle state when the transaction is ended. |
| DATA_TRANSFERRED | DATA_TRANSFERRED<br>When asserted it signals that a valid datum present on the EXTERNAL-BUS has been exchanged between the EXTERNAL-BUS and the External Bus Sequencer. |
| TRANSACTION_TERMINATION | TRANSACTION_TERMINATION<br>When asserted, it signals that a transaction termination message has been detected on the EXTERNAL-BUS. Issued by algorithm ESRLA. |
| READY | READY<br>When asserted during a read transaction, it signals that, at least a valid datum is available for reading to the EXTERNAL-BUS. If it is negated, this means that a wait state has to be inserted. When asserted during a write transaction, it signals that, room for writing at least a datum is available to the EXTERNAL-BUS. If it is negated it means that a wait state has to be inserted. |
| TERMINATE | TERMINATE<br>When asserted, either during a read or a write transaction, it signals that no more data can be exchanged and transaction has to be terminated. Issued by algorithms HSKR and HSKW. |
| TIMEOUT_WR_CNT | TIMEOUT_WR_CNT<br>It is a timeout counter, used in write transactions, that starts when at the beginning or during an access to a not prefetchable resource a sustained burst In Interrupted by a wait state. If a new datum is not exchanged before the counter reaches a certain terminal count value the TERMINATE signal is asserted. |
| TIMEOUT_RD_CNT | TIMEOUT_RD_CNT<br>It is a timeout counter, used in read transactions, that starts when at the beginning or during an access to a not prefetchable resource a sustained burst in interrupted by a wait state. If a new datum is not exchanged before the counter reaches a certain terminal count value the TERMINATE signal is asserted. |

TABLE D2

Delta Filling Status Calculator Algorithm (DFSC Algorithm)

| STEPS<br>(EVENTS) | DELTA FILLING STATUS CALCULATOR ALGORITHM<br>(NOTE: in each clause unassigned signals are supposed to be hold) |
|---|---|
| DFSC1 | PROCESS(PMCP[3:0]: IN, DFS: OUT, CLEAR: IN) |
| DFSC2 | LOCAL SIGNAL: RFS[3:0]; |
| DFSC3 | LOOP |
| DFSC4 |     IF (CLEAR asserted) THEN |
| DFSC5 |         RFS = 0; |
| DFSC6 |         DFS = 0; |
| DFSC7 |     ELSIF (PMC.START_OF_TR = PBC_ST_START_OF_TR) THEN |
| DFSC8 |         RFS =PMC.RESOURCE_FILLING_STATUS; |
| DFSC9 |         DFS = 0; |
| DFSC10 |     ELSIF (PMC.TRANSACTION_PAYLOAD = PBC_TP_QUERY_RESULT) THEN |
| DFSC11 |         IF (PMC.RESOURCE_FILLING_STATUS > RFS) THEN |
| DFSC12 |             DFS = PMC.RESOURCE_FILLING_STATUS - RFS; |

TABLE D2-continued

Delta Filling Status Calculator Algorithm (DFSC Algorithm)

| STEPS (EVENTS) | DELTA FILLING STATUS CALCULATOR ALGORITHM (NOTE: in each clause unassigned signals are supposed to be hold) |
|---|---|
| DFSC13 | ELSE |
| DFSC14 | DFS = 0; |
| DFSC15 | END IF; |
| DFSC16 | RFS = PMC.RESOURCE_FILLING_STATUS; |
| DFSC17 | ELSIF ((PMC.TRANSACTION_PAYLOAD = PBC_TP_DATA_AND_QUERY_RESULT) OR (PMC.TRANSACTION_PAYLOAD = PBC_TP_READ_AND_RESET)) THEN |
| DFSC18 | IF (PMC.RESOURCE_FILLING_STATUS >= RFS) THEN |
| DFSC19 | DFS = PMC.RESOURCE_FILLING_STATUS = RFD + 1; |
| DFSC20 | ELSE |
| DFSC21 | DFS = 0; |
| DFSC22 | END IF; |
| DFSC23 | RFS = PMC.RESOURCE_FILLING_STATUS; |
| DFSC24 | ELSE |
| DFSC25 | RFS = RFS; |
| DFSC26 | DFS = 0; |
| DFSC27 | END IF; |
| DFSC28 | END LOOP: |

TABLE D3

Local Filling Status Calculator Algorithm (LFSC Algorithm)

| STEPS (EVENTS) | LOCAL FILLIG STATUS CALCULATOR ALGORITHM (NOTE: in each clause unassigned signals are supposed to be hold) |
|---|---|
| LFSC1 | PROCESS(PMC: IN, DFS[3:0]: IN, LFS[3:0]: OUT, COMMAND: IN, DATA_TRANSFERRED: IN, CLEAR IN) |
| LFSC2 | LOOP |
| LFSC3 | IF (CLEAR asserted) THEN |
| LFSC4 | LFS = 0; |
| LFSC5 | ELSIF (PMC.START_OF_TR = PBC_ST_START_OF_TR) AND (PMC.TRANSACTION_TYPE = PBC_TT_WRITE) THEN |
| LFSC6 | LFS = PMC.RESOURCE_FILLING_STATUS |
| LFSC7 | ELSIF (PMC.START_OF_TR = PBC_ST_START_OF_TR) AND (PMC.TRANSACTION_TYPE = PBC_TT_READ) THEN |
| LFSC8 | LFS = PMC.RESOURCE_FILLING_STATUS; |
| LFSC9 | ELSIF (PMC.TRANSACTION_TYPE = PBC_TT_WRITE) AND (DFS > 0) AND (DATA_TRANSFERRED asserted) THEN |
| LFSC10 | LFS = LFS + DPS − 1; |
| LFSC11 | ELSIF (PMC.TRANSACTION_TYPE = PBC_TT_WRITE) AND (DFS = 0) AND (DATA_TRANSFERRED asserted) THEN |
| LFSC12 | LFS = LFS + DFS: |
| LFSC13 | ELSIF (PMC.TRANSACTION_TYPE = PBC_TT_WRITE) AND (DFS > 0) AND (DATA_TRANSFERRED not asserted) THEN |
| LFSC14 | LFS = LFS + DFS: |
| LFSC15 | ELSIF (PMC.TRANSACTION_TYPE = PBC_TT_READ) AND (DFS > 0) AND (COMMAND.OPCODE = LBC_OPCODE_RD_QR) THEN |
| LFSC16 | LSF = LFS + DFS − 1; |
| LFSC17 | ELSIF (PMC.TRANSACTION_TYPE = PBC_TT_READ) AND (DFS = 0) AND (COMMAND.OPCODE = LBC_OPCODE_RD_QR) THEN |
| LFSC18 | LSF = LFS − 1; |
| LFSC19 | ELSIF (PMC.TRANSACTION_TYPE = PBC_TT_READ) AND (DFS > 0) AND (COMMAND.OPCODE = LBC_OPCODE_WTRD_QR) THEN |
| LFSC20 | LSF = LFS +DFS; |
| LFSC21 | ELSE |
| LFSC22 | LSF = LFS; |
| LFSC23 | END IF; |
| LFSC24 | END LOOP; |

TABLE D4

Command Write Algorithm (CMDW Algorithm)

| STEPS (EVENTS) | COMMAND WRITE ALGORITHM (NOTE: in each clause unassigned signals a supposed to be hold) |
|---|---|
| CMDW1 | PROCESS(TRANSACTION_TERMINATION: IN, DATA_TRANSFERRED: IN, CLEAR: IN/OUT, COMMAND: OUT) |
| CMDW2 | COMMAND.OPCODE = MBC_OPCODE_WTWR_QR; |
| CMDW3 | COMMAND.FLAGS = MBC_FLAG_START_OF_TR; |
| CMDW4 | LOOP UNTIL (CLEAR negated) |
| CMDW5 |    IF (TRANSACTION_TERMINATION asserted) THEN |
| CMDW6 |       COMMAND.OPCODE = MBC_OPCODE_CLR; |
| CMDW7 |       COMMAND.FLAGS = MBC_FLAG_END_OF_TR; |
| CMDW8 |       Assert CLEAR; |
| CMDW9 |       EXIT LOOP; |
| CMDW10 |    ELSIF (DATA_TRANSFERRED asserted) AND (LFS > 0) THEN |
| CMDW11 |       COMMAND.OPCODE = MBC_OPCODE_WR_QR; |
| CMDW12 |       COMMAND.FLAGS = MBC_FLAG_NULL; |
| CMDW13 |    ELSE |
| CMDW14 |       COMMAND.OPCODE = MBC_OPCODE_WTWR_QR; |
| CMDW15 |       COMMAND.FLAGS = MBC_FLAG_NULL; |
| CMDW16 |    END IF; |
| CMDW17 | END LOOP |
| CMDW18 | COMMAND.OPCODE = MBC_OPCODE_NOP; |
| CMDW19 | COMMAND.FLAGS = MBC_FLAG_NULL; |
| CMDW20 | Negate CLEAR; |

TABLE D5

Handshake Write Algorithm (HSKW Algorithm)

| STEPS (EVENTS) | HANDSHAKE WRITE ALGORITHM (NOTE: in each clause unassigned signals are supposed to be hold) |
|---|---|
| HSKW1 | PROCESS(PMC: IN, LFS: IN, TRANSACTION_TERMINATION: IN, READY: OUT, TERMINATE: OUT) |
| HSKW2 | LOCAL SIGNAL: TIMEOUT_WR_CNT[3:0]; |
| HSKW3 | LOOP |
| HSKW4 |    IF (TRANSACTION_TERMINATION asserted) THEN |
| HSKW5 |       Negate READY; |
| HSKW6 |       Negate TERMINATE |
| HSKW7 |       TIMEOUT_WR_CNT = 0; |
| HSKW8 |       EXIT LOOP; |
| HSKW9 |    ELSIF (LFS > 0) THEN |
| HSKW10 |       Assert READY; |
| HSKW11 |       Negate TERMINATE; |
| HSKW12 |       TIMEOUT_WR_CNT = 0; |
| HSKW13 |    ELSIF (LFS = 0) AND (PMC.RESOURCE_TYPE = PBC_RT_PREFETCHABLE) THEN |
| HSKW14 |       Negate READY; |
| HSKW15 |       Assert TERMINATE; (NOTE: The assertion of TERMINATE cause the assertion of TRANSACTION_TERMINATION) |
| HSKW16 |       TIMEOUT_WR_CNT = TIMEOUT_WR_CNT; |
| HSKW17 |    ELSIF (LFS = 0) AND (PMC.RESOURCE_TYPE = PBC_RT_NOT PREFETCHABLE) THEN |
| HSKW18 |       IF (TIMEOUT_WR_CNT = N) THEN |
| HSKW19 |          Negate READY: |
| HSKW20 |          Assert TERMINATE: (NOTE: The assertion of TERMINATE cause the assertion of TRANSACTION TERMINATION) |
| HSKW21 |          TIMEOUT_WR_CNT = TIMEOUT_WR_CNT; |
| HSKW22 |       ELSE |
| HSKW23 |          TIMEOUT_WR_CNT = TIMEOUT_WR_CNT + 1; |
| HSKW24 |          Negate READY; |
| HSKW25 |          Negate TERMINATE; |
| HSKW26 |       END IF; |
| HSKW27 |    ELSE |
| HSKW28 |       Negate READY; |
| HSKW29 |       Negate TERMINATE; |
| HSKW30 |    END IF; |
| HSKW31 | END LOOP; |

TABLE D6

Command Read Algorithm (CMDR Algorithm)

| STEPS (EVENTS) | COMMAND READ ALGORITHM (NOTE: In each, clause unassigned signals are supposed to be hold) |
|---|---|
| CMDR1 | PROCESS(PMC: IN, TRANSACTION_TERMINATION: IN, RX_BUFFER_FS: IN, DATA_TRANSFERRED: IN, RRBL: IN/OUT, CLEAR: IN/OUT, COMMAND: OUT) |
| CMDR2 | COMMAND.OPCODE = MBC_OPCODE_WTRD_QR; |
| CMDR3 | COMMAND.FLAGS = MBC_FLAG_START_OF_TR; |
| CMOR4 | LOOP UNTIL (CLEAR negated) |
| CMDR5 |    IF (TRANSACTION_TERMINATION asserted) THEN |
| CMDR6 |       COMMAND.OPCODE = MBC_OPCODE_CLR; |
| CMDR7 |       COMMAND.FLAGS = MBC_FLAG_END_OF_TR; |
| CMDR8 |       RRBL = 0; |
| CMDR9 |       Assert CLEAR; |
| CMDR10 |       EXIT LOOP; |
| CMCR11 |    ELSIF (PMC.RESOURCE_TYPE = PBC_RT_PREFETCHABLE) AND (LFS > 0) AND (RX_BUFFER_FS < RX_BUFFER FS_THR) THEN |
| CMDR12 |       COMMAND.OPCODE = MBC_OPCODE_RD_QR; |
| CMDR13 |       COMMAND.FLAGS = MBC_FLAG_NULL; |
| CMDR14 |       RRBL = RRBL; |
| CMDR15 |       Hold CLEAR; |
| CMDR16 |    ELSIF (PMC.RESOURCE_TYPE = PBC_RT_NOT_PREFETCHABLE) AND (LFS > 0) AND (RX_BUFFER_FS < RX_BUFFER_FS_THR) AND (RRBL > 0) THEN |
| CMDR17 |       COMMAND.OPCODE = MBC_OPCODE_RD_QR; |
| CMDR18 |       COMMAND.FLAGS = MBC_FLAG_NULL; |
| CMDR19 |       RRBL = RRBL - 1; |
| CMDR20 |       Hold CLEAR; |
| CMDR21 |    ELSE |
| CMDR22 |       COMMAND.OPCODE = MBC_OPCODE_WTRD_QR; |
| CMDR23 |       COMMAND.FLAGS = MBC_FLAG_NULL; |
| CMDR24 |       RRBL = RRBL; |
| CMDR25 |       Hold CLEAR; |
| CMDR26 |    END IF: |
| CMDR27 | END LOOP; |
| CMDR28 | COMMAND.OPCODE = MBC_OPCODE_NOP; |
| CMDR29 | COMMAND.FLAGS = MBC_FLAG_NULL; |
| CMDR30 | RRBL = 0; |
| CMDR31 | Negate CLEAR; |

TABLE D7

Command Read Flush Algorithm (CMDRF Algorithm)

| STEPS (EVENTS) | COMMAND READ FLUSH ALGORITHM (NOTE: in each clause unassigned signals pro supposed to be held) |
|---|---|
| CMDRF1 | PROCESS(PMC: IN, TRANSACTION_TERMINATION: IN, RX_BUFFER_FS: IN, DATA_TRANSFERRED: IN, CLEAR: IN/OUT, COMMAND: OUT, DATA_TRANSFERRED_CNT: IN) |
| CMDRF2 | COMMAND.OPCODE = MBC_OPCODE_WTRD_QR; |
| CMDRF3 | COMMAND.FLAGS = MBC_FLAG_START_OF_TR; |
| CMDRF4 | LOOP UNTIL (CLEAR negated) |
| CMDRF5 |    IF (TRANSACTION_TERMINATION asserted) THEN |
| CMDRF6 |       COMMAND.OPCODE = MBC_OPCODE_CLR_FLUSH;; |
| CMDRF7 |       COMMAND.FLAGS = MBC_FLAG_END_OF_TR, |
| CMDRF8 |       COMMAND.FLUSH = DATA_TRANSFERRED_CNT; |
| CMDRF9 |       Assert CLEAR; |
| CMDRF10 |       EXIT LOOP; |
| CMDRF11 |    ELSIF (PMC.START_OF_TRANSACTION = PBC_ST_NULL) THEN |
| CMDRF12 |       COMMAND.OPCODE = MBC_OPCODE_WTRD_QR; |
| CMDRF13 |       COMMAND.FLAGS = MBC_FLAG_NULL; |
| CMDRF14 |       COMMAND.FLUSH = MBC_FLUSH_NULL; |
| CMDRF15 |       Hold CLEAR; |
| CMDRF16 |    ELSIF (PMC.RESOURCE_TYPE = PBC_RT_PREFETCHABLE) AND (LFS > 0) AND (RX_BUFFER_FS < RX_BUFFER_FS_THR) THEN |
| CMDRF17 |       COMMAND.OPCODE = MBC_OPCODE_RD_QR; |
| CMDRF18 |       COMMAND.FLAGS = MBC_FLAG_NULL; |
| CMCRF19 |       COMMAND.FLUSH = MBC_FLUSH_NULL; |
| CMDRF20 |       Hold CLEAR: |
| CMDRF21 |    ELSIF (PMC.RESOURCE_TYPE = PBC_RT_PREFETCHABLE) AND . . . (LFS > 0) AND (DATA_TRANSFERRED_CNT >= DATA_TRANSF_CNT_THR) THEN |
| CMDRF22 |       COMMAND.OPCODE = MDC_OPCODE_FLUSH; |
| CMDRF23 |       COMMAND.FLAGS = MBC_FLAG_NULL; |
| CMDRF24 |       COMMAND.FLUSH = DATA_TRANSFERRED_CNT; |
| CMDRF25 |       Hold CLEAR; |

TABLE D7-continued

Command Read Flush Algorithm (CMDRF Algorithm)

| STEPS (EVENTS) | COMMAND READ FLUSH ALGORITHM (NOTE: in each clause unassigned signals pro supposed to be held) |
|---|---|
| CMDRF26 | ELSIF (PMC.RESOURCE_TYPE = PBC_RT_NOT_PREFETCHABLE) AND (LFS > 0) AND (RX_BUFFER_FS < RX_BUFFER_FS_THR) THEN |
| CMDRF27 | COMMAND.OPCODE = MBC_OPCODE_RD_QR |
| CMDRF28 | COMMAND.FLAGS = MBC_FLAG_NULL; |
| CMDRF29 | COMMAND.FLUSH = MBC_FLUSH_NULL; |
| CMDRF30 | Hold CLEAR; |
| CMDRF31 | ELSE |
| CMDRF32 | COMMAND.OPCODE = MBC_OPCODE_WTRD_QR; |
| CMDRF33 | COMMAND.FLAGS = MBC_FLAG_NULL; |
| CMDRF34 | COMMAND.FLUSH = MBC_FLUSH_NULL; |
| CMDRF35 | Hold CLEAR; |
| CMDRF36 | END IF; |
| CMDRF37 | END LOOP; |
| CMDRF38 | COMMAND.OPCODE = MBC_OPCODE_NOP; |
| CMDRF39 | COMMAND.FLAGS = MBC_FLAG_NULL; |
| CMDRF40 | COMMAND.NWORD2FLUSH = MBC_FLUSH_NULL; |
| CMDRF41 | Negate CLEAR; |

TABLE D8

Handshake Read Algorithm (HSKR Algorithm)

| STEPS (EVENTS) | HANDSHAKE READ ALGORITHM (NOTE: in each clause unassigned signals are supposed to be hold) |
|---|---|
| HSKR1 | PROCEESS(PMC: IN, TRANSACTION_TERMINATION: IN, RX_BUFFER_FS: IN, LFS: IN, READY: OUT, TERMINATE: OUT) |
| HSKR2 | LOCAL SIGNAL: TIMEOUT_RD_CNT[3:0]; |
| HSKR3 | LOOP |
| HSKR4 | IF (TRANSACTION_TERMINATION asserted) THEN |
| HSKR5 | Negate READY; |
| HSKR6 | Negate TERMINATE; |
| HSKR7 | TIME_OUT_RD_CNT = 0; |
| HSKR8 | EXIT LOOP; |
| HSKR9 | ELSIF (RX_BUFFER_FS > 0) THEN |
| HSKR10 | Assert READY; |
| HSKR11 | Negate TERMINATE; |
| HSKR12 | TIMEOUT_RD_CNT = 0; |
| HSKR13 | ELSIF (RX_BUFFER_FS = 0) AND (LFS = 0) AND (PMC.RESOURCE_TYPE = PBC_RT_PREFETCHABLE) THEN |
| HSKR14 | Negate READY; |
| HSKR15 | Assert TERMINATE; (NOTE: The assertion of TERMINATE cause the assertion of TRANSACTION_TERMINATION) |
| HSKR16 | TIMEOUT_RD_CNT = TIMEOUT_RD_CNT; |
| HSKR17 | ELSIF (RX_BUFFER_FS = 0) AND (LFS = 0) AND (PMC.RESOURCE_TYPE = PBC_RT_NOT_PREFETCHABLE) THEN |
| HSKR18 | IF (TIMEOUT_CNT = N) THEN |
| HSKR19 | Negate READY; |
| HSKR20 | Assert TERMINATE; (NOTE: The assertion of TERMINATE cause the assertion TRANSACTION_TERMINATION |
| HSKR21 | TIMEOUT_RD_CNT = TIMEOUT_RD_CNT |
| HSKR22 | ELSE |
| HSKR23 | TIMEOUT_RD_CNT = TIMEOUT_RD_CNT + 1; |
| HSKR24 | Negate READY; |
| HSKR25 | Negate TERMINATE; |
| HSKR26 | END IF; |
| HSKR27 | ELSE |
| HSKR28 | Negate READY; |
| HSKR29 | Negate TERMINATE; |
| HSKR30 | END IF; |
| HSKR31 | END LOOP; |

TABLE E1

OVERALL SIGNALS AND BLOCKS OF THE PREFETCHABLE FIFO VISIBLE IN FIGURE 42

| SIGNAL NAME | TYPE (PI is Primary Input, PO is Primary Output) and physical DRIVER block | VALUE/MIMIC | DESCRIPTION |
|---|---|---|---|
| rd_popword_b | PI<br>DMI LEAF | Asserted/Negated (active low, one clock pulse duration) | ReaD POPWORD Bar Pop commanad. It pops (reads) a single word from the PREFETCHABLE FIFO. |
| rd_clear_b | PI<br>DMI LEAF | Asserted/Negated (active low, one clock pulse duration) | ReaD CLEAR Bar Clear command issued in parallel with rd_flush_b when a read transaction is ended. It aligns read pointers in such a way that data read from PREFETCHABLE FIFO but not flushed out with a rd_flush_b command are considered not read. |
| rd_flush_b | PI<br>DMI LEAF | Asserted/Negated (active low, one clock pulse duration) | ReaD FLUSH Bar Flush Commad. It flushes out of PREFETCHABLE FIFO a number of already read words (read at PREFETCHABLE FIFO read port) specified by rd_nword2flush. |
| rd_nword2flush | PI<br>DMI LEAF | Bit pattern (one clock pulse duration) | ReaD NWORD to FLUSH Number of already read (read at PREFETCHABLE FIFO read port) words to flush out from PREFETCHABLE FIFO when a rd_flush_b command is issued. |
| rd_nword_avail | PO<br>PREFETCHABLE FIFO CONTROLLER (READ PORT) | Bit pattern | ReaD NWORD AVAILable Number of words available to read before PREFETCHABLE FIFO become empty. |
| rd_rddata | PO<br>PREFETCHABLE FIFO CONTROLLER (READ PORT) | Bit pattern | ReaD DATA Data read (popped) from PREFETCHABLE FIFO. |
| rd_rddata_str_b | PO<br>PREFETCHABLE FIFO CONTROLLER (READ PORT) | Asserted/Negated (active low, one clock pulse duration) | ReaD DATA STRobe Bar Data strobe signal to validate rddata. |
| wr_pushword_b | PI<br>APPLICATION | Asserted/Negated (active low, one clock pulse duration) | WRite PUSHWORD Bar Push commanad. It pushes (writes) a single word into the PREFETCHABLE FIFO. |
| wr_wrdata | PI<br>APPLICATION | Bit pattern | WRite DATA Data to push (write) into the PREFETCHABLE FIFO. |
| wr_nword_avail | PO<br>PREFETCHABLE FIFO CONTROLLER (WRITE PORT) | Bit pattern | WRite NWORD AVAILable Number of free positions available for writing words before PREFETCHABLE FIFO become full. |
| rdaddr | PO<br>PREFETCHABLE FIFO CONTROLLER (RDPTR MISALIGNED) | Bit pattern | ReaD ADDRess Read address provided to DUAL PORT RAM. |
| rddata_dpram | PI<br>DUAL PORT RAM | Bit patten | ReaD DATA Dual Port RAM Read data from DUAL PORT RAM. |
| wraddr | PO<br>PREFETCHABLE FIFO CONTROLLER (WRPTR) | Bit pattern | WRite ADDRess Write address provided to DUAL PORT RAM. |

TABLE E1-continued

OVERALL SIGNALS AND BLOCKS OF THE PREFETCHABLE FIFO VISIBLE IN FIGURE 42

| SIGNAL NAME | TYPE (PI is Primary Input, PO is Primary Output) and physical DRIVER block | VALUE/MIMIC | DESCRIPTION |
|---|---|---|---|
| wrdata_dpram | PO PREFETCHABLE FIFO CONTROLLER (WRITE PORT) | Bit pattern | WRite DATA Dual Port RAM Data to write provided to DUAL PORT RAM. |
| csn | PO PREFETCHABLE FIFO CONTROLLER (RD UP DOWN CNT ALIGNED) | Asserted/Negated active low, one clock pulse duration) | Chip Select Negated Chip select provided to DUAL PORT RAM. The DUAL PORT RAM is supposed to be selected when csn is asserted (low). |
| wen | PO PREFETCHABLE FIFO CONTROLLER | Asserted/Negated (active low, one clock pulse duration) | Write Enable Negated Write enable provided to DUAL PORT RAM. To write into DUAL PORT RAM wen must be asserted (low). |
| popword_b | Internal READ PORT | Asserted/Negated (active low, one clock pulse duration) | POPWORD Bar Internal copy of rd_popword_b. |
| clear_b | Internal READ PORT | Asserted/Negated (active low, one clock pulse duration) | CLEAR Bar Internal copy of rd_clear_b. |
| rewind_b | Internal FLUSH2REWIND | Asserted/Negated (active low, one clock pulse duration) | REWIND Bar Rewind Command. It rewinds into PREFETCHABLE FIFO a number of already read (read at PREFETCHABLE FIFO read port) words specified by rd_nword2rewind. This command is derived from rd_flush_b command. |
| pushword_b | Internal WRITE PORT | Asserted/Negated (active low, one clock pulse duration) | PUSHWORD Bar Internal copy of wr_pushword_b |
| nword2rewind | Internal FLUSH2REWIND | Bit pattern | NWORD to RWIND Number of already read words (read at PREFETCHABLE FIFO read port) to rewind into PREFETCHABLE FIFO when a rd_rewind_b command is issued. |
| rdptr_inc_cmd | Internal CTRL OP | Asserted/Negated (active high, one clock pulse duration) | ReaDPoinTeR INCrement CoMmanD Command issued by CTRL_OP to increment both rdptr_aligned and rdptr_misaligned. |
| wrptr_inc_cmd | Internal CTRL OP | Asserted/Negated (active high, one clock pulse duration) | WritePoinTeR INCrement CoMmanD Command issued by CTRL_OP to increment wrptr. |
| rewind_cmd | Internal CTRL OP | Asserted/Negated (active high, one clock pulse duration) | REWIND CoMmanD Rewind command issued by CTRLOP. The action of rewind_cmd is the same described for rewind_b. |
| clear_cmd | Internal CTRL OP | Asserted/Negated (active high, one clock pulse duration) | CLEAR CoMmanD Clear command issued by CTRL_OP. The action of clear_cmd is the same described for clear_b. |
| up_cmd | Internal CTRL OP | Asserted/Negated (active high, one clock pulse duration) | UP CoMmanD Up command issued by CTRL_OP to increment wr_up_down_cnt, rd_up_down_cnt_aligned and rd_up_down_cnt_misaligned. |

TABLE E1-continued

OVERALL SIGNALS AND BLOCKS OF THE PREFETCHABLE FIFO VISIBLE IN FIGURE 42

| SIGNAL NAME | TYPE (PI is Primary Input, PO is Primary Output) and physical DRIVER block | VALUE/MIMIC | DESCRIPTION |
|---|---|---|---|
| down_cmd | Internal CTRL OP | Asserted/Negated (active high, one clock pulse duration) | DOWN CoMmanD Down command issued by CTRL_OP to decrement wr_up_down_cnt, rd_up_down_cnt_aligned and rd_up_down_cnt_misaligned. |
| read_cmd | Internal CTRL OP | Asserted/Negated (active high, one clock pulse duration) | READ CoMmanD Read command issued by CTRL_OP to generate a |
| write_cmd | Internal CTRL OP | Asserted/Negated (active high, one clock pulse duration) | WRite CoMmanD |
| rdptr_aligned | Internal/status | Bit pattern | ReaD PoinTeR ALIGNED Rdptr_aligned is used to create and preserve a safe area (set of no writeable memory locations) containing data already read from PREFETCHABLE FIFO but not yet flushed out via a Flush(I) (Rewind(J)) command. Data in this safe area are protected from being overwritten. Data in this area can be seen as a backup of data already read from the RX BUFFER but not yet flushed out from the PREFETCHABLE FIFO via a Flush(I) (Rewind(J)) command. |
| rdptr_misaligned | Internal/status | Bit pattern | ReaD PoinTeR MISALIGNED Rdptr_misaligned is charged to point first data to read in such a way that in the same transaction no data are read more than once. It is the "classic" read pointer of a pointer based fifo. It considers read all data read from RX BUFFER: the flushed ones and the not flushed ones. |
| wr_up_down_cnt | Internal/status | Bit pattern | WRIte UP DOWN CouNTer Counter which traces the number of writeable locations free locations) in the PREFETCHABLE FIFO. |
| rd_up_down_cnt_misaligned | Internal/status | Bit pattern | ReaD UP DOWN CouNTer MISALIGNED Counter which traces the number of readable locations (written locations) in the PREFETCHABLE FIFO from the RX BUFFER avoiding that a datum may be read more than once. Data flushed out and data already read at read port but not yet flushed out are not considered readable. |
| rd_up_down_cnt_aligned | Internal/status | Bit pattern | ReaD UP DOWN CouNTer ALIGNED Counter which traces the number of data really present in the PREFETCHABLE FIFO comprised the ones already read by the RX BUFFER but not yet flushed out from |

TABLE E1-continued

OVERALL SIGNALS AND BLOCKS OF THE PREFETCHABLE FIFO VISIBLE IN FIGURE 42

| SIGNAL NAME | TYPE (PI is Primary Input, PO is Primary Output) and physical DRIVER block | VALUE/MIMIC | DESCRIPTION |
|---|---|---|---|
| | | | PREFETCHABLE FIFO. Data flushed out are not considered readable while data already read at read port but not yet flushed out are considered readable. |
| wrptr | Internal/status | Bit pattern | Write PoinTeR Wrptr points to the first free location to write. |

APPENDIX E

TABLE E2

FLUSH2REWIND

```
Combinatorial: PROCESS (rd_flush_b, popword_b, popword_cnt, rd_nword2flush)
/* popword counter */
/* count number of popword_b pulses between two adjacent rd_flush_b commands */
IF (rd_flush_b = 0) THEN
    /* assert rewind_b, calculate (popword_cnt − nword2 flush) */
    /* and reset popword_cnt */
    nx_rewind_b := rd_flush_b;
    nx_nword2rewind := popword_cnt − rd_nword2flush;
    nx_popword_cnt := 0;
ELSIF (popword_b = 0) THEN
/* increment popword_cnt */
nx_rewind_b = 1;
nx_nword2rewind := 0;
nx_popword_cnt := popword_cnt + 1;
ELSE
    /* hold popword_cnt */
    nx_rewind_b := 1;
    nx_nword2rewind := 0;
    nx_popword_cnt := popword_cnt;
END IF;
rewind_b := nx_rewind_b;
Sequential: PROCESS(clock, rewind, nx_nword2rewind, nx_popword_cnt)
nword2rewind <= (rewind = 0) nx_nword2rewind;
popword_cnt <= nx_popword_cnt;
```

TABLE E3

CTRL OP

```
Combinatorial: PROCESS (rewind_b, pushword_b, popword_b, rd_up_down_cnt_aligned, wr_up_down_cnt, clear_b)
/* CTRL_OP */
/* GOAL: ENABLING THE EXECUTION OF COMMANDS ISSUED AT */
/* READ PORT AND WRITE PORT DEPENDING ON STATUS */
IF (((rewind_b = 1) AND (pushword_b = 0) AND (popword_b = 0)) AND
    ((rd_up_down_cnt_aligned /= up_down_cnt_init) AND
    (wr_up_down_cnt /= depth_gen))) THEN
    /* PUSH OPERATION MUST EVALUATE THE FILLING LEVEL BY */
    /* wr_up_down_cnt */
    /* POP OPERATION MUST EVALUATE THE FILLING LEVEL BY */
    /* rd_up_down_cnt_aligned */
    /* simoultaneous push+pop commands with fifo not full nor empty: */
    /* perform both pop and push */
    nx_up_cmd := 0;
    nx_down_cmd := 0;
    nx_wrptr_inc_cmd := 1;
    nx_rdptr_inc_cmd := 1;
```

TABLE E3-continued

CTRL OP

```
        nx_write_cmd := 1;
        nx_read_cmd := 1;
        nx_rewind_cmd := 0;
        nx_clear_cmd := 0;
ELSIF (((rewind_b = 1) AND (pushword_b = 0) AND (popword_b = 0)) AND
    (wr_up_down_cnt = depth_gen)) THEN
        /* PUSH OPERATION MUST EVALUATE THE FILLING LEVEL BY */
        /* wr_up_down_cnt */
        /* simoultaneous push+pop commands with fifo full: skip push and perform pop */
        /* (write-thru not allowed) */
        nx_up_cmd := 0;
        nx_down_cmd := 1;
        nx_wrptr_inc_cmd := 0;
        nx_rdptr_inc_cmd := 1;
        nx_write_cmd := 0;
        nx_read_cmd := 1;
        nx_rewind_cmd := 0;
        nx_clear_cmd := 0;
ELSIF (((rewind_b = 1) AND (pushword_b = 0) AND (popword_b = 0)) AND
    (rd_up_down_cnt_aligned = up_down_cnt_init)) THEN
        /* POP OPERATION MUST EVALUATE THE FILLING LEVEL BY */
        /* (rd_up_down_cnt_aligned */
        /* simoultaneous push+pop commands with fifo empty: */
        /* skip pop and perform push */
        /* (write-thru not allowed) */
        nx_upcmd := 1;
        nx_down_cmd := 0;
        nx_wrptr_inc_cmd := 1;
        nx_rdptr_inc_cmd 0;
        nx_write_cmd := 1;
        nx_read_cmd := 0;
        nx_rewind_cmd := 0;
        nx_clear_cmd := 0;
ELSIF ((pushword_b = '0') AND (wr_up_down_cnt /= depth_gen)) THEN
        /* PUSH OPERATION MUST EVALUATE THE FILLING LEVEL BY */
        /* wr_up_down_cnt */
        /* push command with fifo not full */
        /* do rewind if command issued */
        nx_up_cmd := 1;
        nx_down_cmd := 0;
        nx_wrptr_inc_cmd := 1;
        nx_rdptr_inc_cmd := 0;
        nx_write_cmd := 1;
        nx_read_cmd := 0;
        nx_rewind_cmd NOT(rewind_b);
        nx_clear_cmd :=NOT(clear_b);
ELSIF ((pushword_b = 0) AND (wr_up_down_cnt = depth_gen)) THEN
        /* PUSH OPERATION MUST EVALUATE THE FILLING LEVEL BY */
        /* wr_up_down_cnt */
        /* push command with fifo full: skip push */
        /* do rewind if command issued */
        nx_up_cmd := 0;
        nx_down_cmd := 0;
        nx_wrptr_inc_cmd := 0;
        nx_rdptr_inc_cmd := 0;
        nx_write_cmd := 0;
        nx_read_cmd := 0;
        nx_rewind_cmd := NOT(rewind_b);
        nx_clear_cmd := NOT(clear_b);
ELSIF ((rewind_b = 1) AND (popword_b = 0) AND
    (rd_up_down_cnt_aligned /= up_down_cnt_init)) THEN
        /* POP OPERATION MUST EVALUATE THE FILLING LEVEL BY*/
        /* rd_up_down_cnt_aligned */
        /* pop command with fifo not empty */
        nx_up_cmd := 0;
        nx_down_cmd := 1;
        nx_wrptr_inc_cmd := 0;
        nx_rdptr_inc_cmd := 1;
        nx_write_cmd := 0;
        nx_read_cmd := 1;
        nx_rewind_cmd := 0;
        nx_clear_cmd := 0;
```

TABLE E3-continued

CTRL OP

```
ELSIF ((rewind_b = 1) AND (popword_b = 0) AND
        (rd_up_down_cnt_aligned /= up_down_cnt_init)) THEN
    /* POP OPERATION MUST EVALUATE THE FILLING LEVEL BY */
    /* rd_up_down_cnt_aligned */
    /* pop command with fifo empty: skip pop */
    nx_up_cmd := 0;
    nx_down_cmd := 0;
    nx_wrptrinccmd := 0;
    nx_rdptr inccmd := 0;
    nx_write_cmd := 0;
    nx_read_cmd := 0;
    nx_rewind_cmd := 0;
    nx_clear_cmd := 0;
ELSIF ((rewind_b = 0) AND (popword_b = 1)) THEN
    /* rewind command with no simultaneous push command: do rewind */
    nx_up_cmd := 0;
    nx_down_cmd := 0;
    nx_wrptr__inc_cmd := 0;
    nx_rdptr_inc_cmd := 0;
    nx_write_cmd := 0;
    nx_read_cmd := 0;
    nx_rd_rewind_cmd := 1;
    nx_clear_cmd := NOT(clear_b);
ELSE
    /* hold signals deasserted */
    nx_up cmd := 0;
    nx_down_cmd = 0;
    nx_wrptr_inc_cmd = 0;
    nx_rdptr_inc_cmd = 0;
    nx_write_cmd = 0;
    nx_read_cmd = 0;
    nx_rewind_cmd = 0;
    nx_clear_cmd = 0;
END IF;
Sequential: PROCESS(clock, nx_up_cmd, nx_down_cmd, nx_wrptr_inc_cmd,
nx_rdptr_inc_cmd, nx_write_cmd, nx_read_cmd, nx_rewind_cmd, nx_clear_cmd)
up_cmd <= nx_up_cmd;
down_cmd <= nx_down_cmd;
wrptr_inc_cmd <= nx_wrptr_inc_cmd;
rdptr_inc_cmd <= nx_rdptr_inc_cmd;
write_cmd <= nx_write_cmd;
read_cmd <= nx_read_cmd;
rewind_cmd <= nx_rewind_cmd;
clear_cmd <= nx_clear_cmd;
```

NOTE:
up_down_cnt_init and depth_gen are parameters representing respectively the initialization value of the wr_up_down_cnt, rd_up_down_cnt_aligned, and rd_up_down_cnt_misaligned counters (which is 0) and the depth of the memory used to implement the fifo.

TABLE E4

WRITE UP DOWN COUNTER

```
Combinatorial: PROCESS (nx_rewind_cmd, nx_up_cmd, rd_up_down_cnt_aligned,
nword2rewind, wr_up_down_cnt)
/* WRITE UP_DOWN COUNTER */
/* GOAL: ENABLING WRITE OPERATIONS IN CTRL_OP */
/* SENSITIVE TO: UP/DOWN/REWIND */
IF ((nx_rewind_cmd = 1) AND (nx_up_cmd = 1)) THEN
    /* align_wr_up_down_cnt to rd_up_downt_cnt_aligned + */
    /* number of read pointer position to rewind + */
    /* 1 position due to current write */
    wr_up_down_cnt := rd_up_down_cnt_aligned + nword2rewind + 1;
ELSIF ((nx rewind_cmd =1) AND (nx upcmd =0)) THEN
    /* align_wr_up_down_cnt to rd_up_downt_cnt_aligned + number of read */
    /* pointer position to rewind */
    wr_up_down_cnt := rd_up_down_cnt_aligned + nword2rewind;
ELSIF (nx_up_cmd = 1) THEN
    /* increment wr_up down cnt */
    wr_up_down_cnt := wr_up_down_cnt +1;
ELSE
    /* hold wr_up_down_cnt */
    wrup_down_cnt := wr_up_down_cnt;
```

TABLE E4-continued

WRITE UP DOWN COUNTER

END IF;
Sequential: PROCESS(clock, nx_wr_up_down_cnt)
wr_up_down_cnt >= nx_wr_up_down_cnt;

TABLE E5

READ UP DOWN COUNTER ALIGNED

Combinatorial: PROCESS (nx_rewind_cmd, nx_up_cmd, nx_down_cmd,
rd_up_down_cnt_aligned, rd_nword2 rewind)
/* READ UP-DOWN COUNTER ALIGNED */
/* GOAL: ENABLING READ OPERATIONS IN CTRL_OP */
/* SENSITIVE TO: UP/DOWN/REWIND */
IF ((nx_rewind_cmd = 1) AND (nx_up_cmd = 1)) THEN
    /* align rd_up_down_cnt_aligned to rd_up_downt_cnt_aligned + */
    /* number of read pointer position to rewind + */
    /* 1 position due to current write */
    nx_rd_up_down_cnt_aligned := rd_up_down_cnt_aligned+nword2rewind + 1;
ELSIF ((nx_rewind_cmd = 1) AND (nx_up_cmd = 0)) THEN
    /* align rd_up_down_cnt_aligned to rd_up_downt_cnt_aligned +*/
    /* number of read pointer position to rewind */
    nx_rd_up_down_cnt_aligned := rd_up_down_cnt_aligned + nword2rewind;
ELSIF ((nx_up_cmd = 1) AND (nx_down_cmd = 1)) THEN
    /* simultaneous word write and word read → hold */
    /* rd_up_down_cnt_aligned */
    nx_rd_up_down_cnt_aligned := rd_up_down_cnt_aligned;
ELSIF (nx_up_cmd = 1) THEN
    /* increment rd_up_down_cnt_aligned */
    nx_rd_up_down_cnt_aligned := rd_up_down_cnt_aligned + 1;
ELSIF (nx_down_cmd = 1) THEN
    /* decrement rd_up_down_cnt_aligned */
    nx_rd_up_down_cnt_aligned := rd_up_down_cnt_aligned − 1;
ELSE
    /* hold rd_up_down_cnt_aligned */
    nx_rd_up_down_cnt_aligned := rd_up_down_cnt_aligned;
END IF;
Sequential: PROCESS(clock, nx_rd_up_down_cnt_aligned)
rd_up_down_cnt_aligned >= nx_rd_up_down_cnt_aligned;

TABLE E6

READ UP DOWN COUNTER MISALIGNED

Combinatorial: PROCESS (nx_clear_cmd, nx_rewind_cmd, nx_up_cmd, nx_down_cmd,
rd_up_down_cnt_aligned, rd_up_down_cnt_misaligned, nword2rewind)
/* READ UP-DOWN COUNTER MISALIGNED */
/* GOAL: REPORTING FILING STATUS (DO NOT TAKE IN ACCOUNT */
/* DATA ALREADY READ FROM DMI_ROOT) */
/* SENSITIVE TO: clear_cmd/rewind_cmd/up_cmd/down_cmd */
/* NOTE: ALIGNED TO up_down_cnt_aligned WHEN a clear_cmd + */
/* rewind_cmd ISSUED */
IF ((nx_clear_cmd = 1) AND (nx_rewind_cmd = 1) AND (nx_up_cmd = 1)) THEN
    /* align rd_up_down_cnt_misaligned to rd_up_downt_cnt_aligned + */
    /* number of read pointer position to rewind + 1 position due to current */
    /* writ e*/
    nx_rd_up_down_cnt_misaligned :=    rd_up_down_cnt_aligned +
                                       nword2rewind + 1;
ELSIF ((nx clear_cmd = 1) AND (nx_rewind_cmd = 1) AND (nx_up_cmd = 0)) THEN
    /* align_rd_up_down_cnt_misaligned to rd_up_downt_cnt_aligned + */
    /* number of read pointer position to rewind */
    nx_rd_up_down_cnt_misaligned :=    rd_up_down_cnt_aligned +
                                       nword2rewind;
ELSIF ((nx_up_cmd = 1) AND (nx_down_cmd = 1)) THEN
    /* simultaneous word write and word read → hold */
    /* rd_up_down_cnt_misaligned */
    nx_rd_up_down_cnt_misaligned := rd_up_down_cnt_misaligned;
ELSIF (nx_up_cmd = 1) THEN
    /* increment rd_up_down_cnt_misaligned */
    nx_rd_up_down_cnt_misaligned := rd_up_down_cnt_misaligned + 1;
ELSIF (nx down_cmd = 1) THEN
    /* decrement rd_up_down_cnt_misaligned */
    nx_rd_up_down_cnt_misaligned := rd_up_down_cnt_misaligned − 1;

TABLE E6-continued

READ UP DOWN COUNTER MISALIGNED

ELSE
    /* hold rd_up_down_cnt_misaligned */
    nx_rd_up_down_cnt_misaligned := rd_up_down_cnt_misaligned;
END IF;
Sequential: PROCESS(clock, nx_rd_up_down_cnt_misaligned)
rd_up_down_cnt_misaligned <= nx_rd_up_down_cnt_misaligned;

TABLE E7

ALIGNED READ POINTER

Combinatorial: PROCESS (rdptr_inc_cmd, rewind_cmd, rdptr_aligned, nword2rewind)
/* ALIGNED READ POINTER */
/* SENSITIVE TO: rdptr_Inc_cmdlrewind_cmd */
/* NOTE: ALIGNED WITH REWIND OPERATION */
IF (rdptr_inc_cmd = 1) THEN
    nx_rdptr_aligned := rdptr_aligned + 1;
ELSIF (rewind_cmd = 1) THEN
    /* align_rdptr_aligned to (rdptr_aligned − nword2rewind) */
    IF (rdptr_aligned >= nword2rewind) THEN
        nx_rdptr_aligned := rdptr_aligned − nword2rewind;
    ELSE
        nx_rdptr_aligned := rdptr_module − nword2rewind + rdptr_aligned;
    END IF;
ELSE
    /* hold rdptr_aligned */
    nx_rdptr_aligned := rdptr_aligned;
END IF;
Sequential: PROCESS(clock, nx_rdptr_aligned)
rdptr_aligned <= nx_rdptr_aligned;

NOTE:
rdptr_module is a parameter representing the module on which the addition/subtraction has to be performed.

TABLE E8

MISALIGNED READ POINTER

Combinatorial: PROCESS (rdptr_inc_cmd, clear_cmd, rdptr_aligned, nword2rewind, rdptr_misaligned)
/* MISALIGNED READ POINTER */
/* GOAL: GENERATING READ ADDRESS (TO AVOID TO READING TWICE THE */
/* SAME DATA (FROM DMI_ROOT)) */
/* SENSITIVE TO: rdptr_inc_cmd/clear_cmd */
/* NOTE: NOT ALIGNED WITH rewind_cmd OPERATION */
IF (rdptr_inc_cmd = 1) THEN
    nx_rdptr_misaligned := rdptr_misaligned + 1;
ELSIF (clear_cmd = '1') THEN
    /* align rdptr_misaligned to (rdptr_wide_aligned − nward2rewind) */
    IF (rdptr_aligned >= nword2rewind) THEN
        nx_rdptr_misaligned := rdptr_aligned − nword2rewind;
    ELSE
        nxrdptr_misaligned := rdptr_module − nword2rewind + rdptr_aligned;
    END IF;
ELSE
    /* hold rdptr_misaligned */
    nx_rdptr_misaligned := rdptr_misaligned;
END IF;
Sequential: PROCESS(clock, nx_rdptr_misaligned)
rdptr_misaligned <= nx_rdptr_misaligned;

NOTE:
rdptr_module is a parameter representing the module on which the addition/subtraction has to be performed.

TABLE E9

WRPTR

Combinatorial: PROCESS (wrptr_inc_cmd, wrptr)
/* WRITE POINTER */
/* GOAL GENERATING WRITE ADDRESS */
/* SENSITIVE TO: wrptr_inc_cmd */
IF (wrptr_inc_cmd = 1) THEN
    nx_wrptr := wrptr + 1;
ELSE
    /* hold wrptr */
    nx_wrptr := wrptr;
END IF;
Sequential: PROCESS (clock, nxnx_wrptr)
wrptr >= nxnx_wrptr;

APPENDIX F

TABLE F1

| RESOURCE_ID | OPERATION | HEXIDECIMAL ADDRESS OFFSET |
|---|---|---|
| CONFIGURATION 0 | RD/WR | 0x00 |
| CONFIGURATION 1 | RD/WR | 0x04 |
| CONFIGURATION 2 | RD/WR | 0x08 |
| CONFIGURATION 3 | RD/WR | 0x0C |
| CONFIGURATION 4 | RD/WR | 0x10 |
| CONFIGURATION 5 | RD/WR | 0x14 |
| CONFIGURATION 6 | RD/WR | 0x18 |
| CONFIGURATION 7 | RD/WR | 0x1C |
| CONFIGURATION 8 | RD/WR | 0x20 |
| CONFIGURATION 9 | RD/WR | 0x24 |
| CONFIGURATION 10 | RD/WR | 0x28 |
| CONFIGURATION 11 | RD/WR | 0x2C |
| CONFIGURATION 12 | RD/WR | 0x30 |
| CONFIGURATION 13 | RD/WR | 0x34 |
| COMMAND 0 | RD | 0x38 |
| COMMAND 1 | RD | 0x3C |
| COUNTER 0 | RD | 0x40 |
| COUNTER 1 | RD | 0x44 |
| STATUS 0 | RD | 0x48 |
| STATUS 1 | RD | 0x4C |
| STATUS 2 | RD | 0x50 |
| STATUS 3 | RD | 0x54 |
| STATUS 4 | RD | 0x58 |
| STATUS 5 | RD | 0x5C |
| STATUS 6 | RD | 0x60 |
| STATUS 7 | RD | 0x64 |
| STATUS 8 | RD | 0x68 |
| STATUS 9 | RD | 0x6C |
| STATUS 10 | RD | 0x70 |
| STATUS 11 | RD | 0x74 |
| STATUS 12 | RD | 0x78 |
| RESET_AND_RESET | RD | 0x7C |

APPENDIX G

Variant of Command Read Flush Algorithm (CMDRF Algorithm)

| STEPS (EVENTS) | COMMAND READ FLUSH ALGORITHM (NOTE: in each clause unassigned signals are supposed to be held) | |
|---|---|---|
| CMDRF1 | PROCESS(PMC: IN, TRANSACTION_TERMINATION: IN, RX_BUFFER_FS: IN, DATA_TRANSFERRED: IN, CLEAR: IN/OUT, COMMAND: OUT, DATA_TRANSFERRED_CNT: IN) | |
| CMDRF2 | COMMAND.OPCODE = MBC_OPCODE_RD_QR; | |
| CMDRF3 | COMMAND.FLAGS = MBC_FLAG_START_OF_TR; | |
| CMDRF4 | LOOP UNTIL (CLEAR negated) | |
| CMDRF5 |     IF (TRANSACTION_TERMINATION asserted) THEN | |
| CMDRF6 |         COMMAND.OPCOD = MBC_OPCODE_CLR_FLUSH;; | |
| CMDRF7 |         COMMAND.FLAGS = MBC_FLAG_END_OF_TR; | |
| CMDRF8 |         COMMAND.FLUSH = DATA_TRANSFERRED CNT; | |
| CMDRF9 |         Assert CLEAR; | |
| CMDRF10 |         EXIT LOOP; | |
| CMDRF11 | ELSIF (PMC.START_OF_TRANSACTION = PBC_ST_NULL) THEN | |
| CMDRF12 |         COMMAND.OPCOD = MBC_OPCODE_RD_QR | |
| CMDRF13 |         COMMAND.FLAGS = MBC_FLAG_NULL; | |
| CMDRF14 |         CDMMAND.FLUSH = MBC_FLUSH_NULL; | |
| CMDRF15 |         Hold CLEAR; | |
| CMDRF16 | ELSIF | (PMC.RESOURCE_TYPE = PBC_RT_PREFETCHABLE) AND (RX_BUFFER_FS > RX_BUFFER_FS_THR) THEN |
| CMDRF17 | |     COMMAND.OPCODE = MBC_OPCODE_RD_QR |
| CMDRF18 | |     COMMAND.FLAGS = MBC_FLAG_NULL; |
| CMDRF19 | |     COMMAND.FLUSH = MBC_FLUSH_NULL; |
| CMDRF20 | |     Hold CLEAR; |
| CMDRF21 | ELSIF | (PMC.RESOURCE_TYPE = PBC_RT_NOT_PREFETCHABLE) AND (DATA_TRANSFERRED_CNT >= DATA_TRANSF_CNT_THR) THEN |
| CMDRF22 | |     COMMAND.OPCODE = MBC_OPCODE_FLUSH; |
| CMDRF23 | |     COMMAND.FLAGS = MBC_FLAG_NULL; |
| CMDRF24 | |     COMMAND.FLUSH = DATA_TRANSFERRED_CNT; |
| CMDRF25 | |     Hold CLEAR; |
| CMDRF26 | ELSIF | (PMC.RESOURCE_TYPE = PBC_RT_NOT_PREFETCHABLE) AND (RX_BUFFER_PS > RX_BUFFER_FS_THR) THEN |
| CMDRF27 | |     COMMAND.OPCODE = MBC_OPCODE_RD_QR |
| CMDRF28 | |     COMMAND.FLAGS = MBC_FLAG_NULL; |
| CMDRF29 | |     COMMAND.FLUSH = MBC_FLUSH_NULL; |
| CMDRP30 | |     Hold CLEAR; |
| CMDRF31 | ELSE | |

-continued

Variant of Command Read Flush Algorithm (CMDRF Algorithm)

| STEPS (EVENTS) | COMMAND READ FLUSH ALGORITHM (NOTE: in each clause unassigned signals are supposed to be held) |
|---|---|
| CMDRF32 | COMMAND.OPCODE = MBC_OPCODE_WTRD_QR; |
| CMDRF33 | COMMAND.FLAGS = MBC_FLAG_NULL; |
| CMDRF34 | COMMAND.FLUSH =MBC_FLUSH_NULL; |
| CMDRF35 | Hold CLEAR; |
| CMDRF36 | END IF; |
| CMDRF37 | END LOOP; |
| CMDRF38 | COMMANO.OPCODE = MBC_OPCODE_NOP; |
| CMDRF39 | COMMAND.FLAGS = MBC_FLAG_NULL; |
| CMDRF40 | COMMAND.NWORD2FLUSH = MBC_FLUSH NULL; |
| CMDRF41 | Negate CLEAR; |

What is claimed is:

1. An interface between a microprocessor, or a local bus, and user macro-cells, being a macro-cell a self-consistent and pre-verified set of logic elements, generally designed with Hardware Description Languages, and transposed into silicon devices, the interface including a unique module connected between an external bus corresponding to the bus of said microprocessor, or being the local bus, and the remaining part of the interface, via an internal bus of the interface, said remaining part of the interface including peripheral resources, connected to the internal bus, named hereinafter common bus, and controlled by the unique module, named hereinafter main module, for the execution of read/write commands of the microprocessor towards a selected peripheral resource, wherein said peripheral resources are clustered in standardizable peripheral modules located externally to the interfaced macro-cells and connected to the macro-cells through point-to-point buses, being each peripheral module in its turn constituted of a pre-defined set of hardware and firmware resources comprehensive of the most popular needs in interfacing user macro-cells, including:
configuration registers, command registers, status registers, not prefetchable registers for trapping events signalled by macro-cells, event counter registers, register synchronizers, dual port memories and FIFO either synchronous or asynchronous with respect to the clock that synchronizes the macro-cells.

2. Microprocessor, or local bus, interface in accordance with claim 1, wherein the pre-defined set of resources are partitioned inside each peripheral module into subsets of homogeneous resources, being each subset optionally equipped in accordance with specific needs of respective interconnected user macro-cells.

3. A microprocessor, or local bus, interface in accordance with claim 2, wherein said subsets of pre-defined set of resources include means for calculating a remote filling status of the associated resources expressed as a number of read/write individual transactions before a resource either becomes empty in a read transaction or full in a write transaction, said means for calculating the remote filling status being arranged to limit the calculated value at an integer greater than or preferably equal to the maximum round-trip delay of the transactions through the common bus expressed in number of master clock cycles.

4. A microprocessor, or local bus, interface in accordance with claim 3, wherein said main module includes means for currently tracing the remote filling status received from a selected peripheral resource in order to compensate locally to the main module the subsequent latency other than the initial delay, and signalling on the external bus either the existence of room for transferring data or the opposite condition to terminate a current transaction.

5. A microprocessor, or local bus, interface in accordance with claim 4, wherein said means for currently tracing the remote filling status received from a selected resource includes in its turn:
means for memorizing the received filling status for two consecutive master clock cycles;
means for calculating a delta filling status between the received filling status at the current master clock cycle and the previously memorized filling status value, in so detecting variation of residual room either for write or read a datum in/from a not prefetchable peripheral resource;
means for calculating a local filling status by summing up the received filling status at the actual master clock cycle with the delta filling status and further subtracting a unity value in case a datum has been transferred from the external bus to the main module during a write or when the acknowledge to a read operation has been received from the common-bus;
arithmetic means for saturating the local filling status at the number that can be represented with that bus width; and
means for detecting either a positive or null value of the local filling status as conditions for respectively enabling or terminating a current data transfer to/from the external bus.

6. A microprocessor, or local bus, interface in accordance with claim 2, wherein a first subset of said pre-defined set of resources includes a bank of memory registers comprising:
configuration registers, command registers, event counter registers, status registers, read-and-reset registers.

7. A microprocessor, or local bus, interface in accordance with claim 6, wherein said first subset of resources further includes:
multiplexing and demultiplexing means for selecting a specific register inside the bank of registers and transmitting towards said peripheral controller the register bank's filling status concerning read/write transactions, taken alone, or either accompanied with read or write data word from/to the selected register; and
being a served user macro-cell connected to one or more registers of the bank through point-to-point buses for writing or reading the various registers autonomously from the peripheral controller.

8. A microprocessor interface in accordance with claim 7, wherein a not prefetchable read-and-reset register is written from the macro-cells and successively read and reset from the main module in two separate steps that turn the register into a prefetchable one, being a first step devoted to read the register content and transfer it inside the centralized FIFO memory without altering the content into the read-and-reset register, and a second step for clearing up the content previously written into the register upon a condition that the content has been definitely transferred to the external bus agent.

9. A microprocessor interface in accordance with claim 6, wherein when the clock of an interfaced macro-cell, named hereinafter appl_clk, is asynchronous with respect to the common bus clock, named hereinafter cbus_clk, the latter timing the subset of register resources, then suitable synchronization circuits are embedded in corresponding peripheral modules and cascaded to as many registers connected to the asynchronous macro-cells, in order to ensure reliable communication between the two asynchronous clock domains at the two sides of the synchronization circuits.

10. A microprocessor interface in accordance with claim 9, wherein a synchronized status register between two asynchronous clock domains includes:
    first select and hold means for the selection of either a status word incoming from a macro-cell belonging to the appl_clk clock domain, or a previous stored status word outputted from the same means in the same clock domain;
    first set-reset flip-flop means for the generation of a control signal of said first select and hold means both enabling the selection of one said incoming status word in presence of a write strobe accompanying the status word and blocking the selection of new status words until the reception of a release command;
    a first strobe synchronization circuit able to transfer a signal between two asynchronous clock domains for transferring said write strobe towards the cbus_clk clock domain;
    second select and hold means controlled by the write strobe transferred into the cbus_clk clock domain for selecting, storing, and forwarding towards the common bus either a status word outputted from said first select and hold means or the previous content of the same second select and hold means; and
    a release circuit for generating the release command for removing the blocked condition settled by said first flip-flop means allowing the acquisition of a new status word incoming from the macro-cell.

11. A microprocessor interface in accordance with claim 10, wherein said release circuit includes:
    first D flip-flop means for sampling the write strobe transferred into the cbus_clk clock domain; and
    a second strobe synchronization circuit identical to the first one to transfer the sampled write strobe towards the appl_clk clock domain and obtain said release command.

12. A microprocessor interface in accordance with claim 10, wherein said release circuit includes a second strobe synchronization circuit identical to the first one to transfer a read strobe incoming from the common bus towards the appl_clk clock domain, obtaining said release command.

13. A microprocessor interface in accordance with claim 10, wherein said release circuit includes:
    first D flip-flop means for sampling the write strobe transferred into the cbus_clk clock domain;
    a two-inputs select means for selecting either the sampled write strobe or a read strobe incoming from the common bus, obtaining a selected write strobe; and
    a second strobe synchronization circuit identical to the first one to transfer the selected write strobe towards the appl_clk clock domain, obtaining said release command.

14. A microprocessor interface in accordance with claim 10, wherein said synchronized status register further includes a two-inputs AND gate receiving at one input a signal indicating said blocked condition settled by said first set-reset flip-flop means and at the other input a bit mode for either send back the signal indicating the blocked condition towards macro-cell, or not.

15. A microprocessor, or local bus, interface in accordance with claim 2, wherein a second subset of said predefined set of resources includes prefetchable memory resources.

16. A microprocessor, or local bus, interface in accordance with claim 15, wherein said second subset of resources, constituted by prefetchable memory resources, includes a dual port memory having:
    a first read/write port connected to a read/write port of the peripheral controller for transmitting the filling status concerning read/write transactions and transferring data on the two directions of the common bus; and
    a second read/write port connected to a user macro-cell through an point-to-point bus for independently transfer data from/to the connected macro-cell.

17. A microprocessor, or local bus, interface in accordance with claim 2, wherein a third subset of said predefined set of resources includes not prefetchable memory resources.

18. A microprocessor, or local bus, interface in accordance with claim 17, wherein said not prefetchable memory resource includes:
    a first peripheral FIFO memory having a read port connected to a read port of said peripheral controller for transmitting the filling status and transferring read data on the common bus, and a write port for receiving write data originated from the user macro-cell through an interconnected point-to-point bus; and
    a second peripheral FIFO memory having a write port connected to a write port of said peripheral controller for transmitting the filling status and receiving write data from the common bus, and a read port for transfer read data to the user macro-cell through an interconnected point-to-point bus.

19. A microprocessor, or local bus, interface in accordance with claim 2, wherein a third subset of said predefined set of resources includes:
    a modified FIFO peripheral resource, either synchronous or asynchronous with respect to the clock that synchronizes the interconnected macro-cell, coupled to a logic for preventing the read data be overwritten inside the modified FIFO until they are definitely transferred to the external bus; and
    a not prefetchable memory resource.

20. A microprocessor, or local bus, interface in accordance with claim 19, wherein:
    said modified FIFO peripheral resource includes a read port connected to a read port of said peripheral controller for transmitting the filling status and read data on the common bus, and a write port for receiving write data originated from the user macro-cell through an interconnected point-to-point bus; and
    said not prefetchable memory resource includes a known peripheral FIFO memory having a write port connected to a write port of said peripheral controller for transmitting filling status and receiving write data from the common bus, and a read port for transfer read data to the user macro-cell through an interconnected point-to-point bus.

21. A microprocessor, or local bus, interface in accordance with claim 19, wherein said modified FIFO peripheral resource includes a synchronous dual port RAM for writing and reading data under control of an interconnected prefetchable FIFO controller capable to manage the dual port RAM as a circular buffer keeping stored in the RAM and conditionally not overwriteable said data popped out from the modified FIFO read port to be copied into said centralized FIFO memory, until the reception at the modified FIFO read port either a flush or clear-and-flush command, both accompanied with an associated value indicating the number of words to be flushed out because definitely transferred to the external bus, and the clear-and-flush command additionally indicating the end of the current transaction, in a way that the tandem of the modified FIFO and the centralized FIFO is suitable to allow anticipative reads for reducing subsequent latency in burst transactions without losing read data when the centralized buffer input is switched to service another peripheral subset.

22. A microprocessor interface in accordance with claim 21, wherein said prefetchable FIFO controller further includes a pointer-generating and handling logic prompted by said flush or clear-and-flush command and by additional pushword and popword commands to respectively write data into the modified FIFO write port and read data from the read port and consequently setting up:

an aligned read pointer for tracing a readable location in the circular buffer adjacent to the location of the last datum overwriteable by effect of said flush command, in such a way that the possible data overwriteable are the only data definitely transferred to the external bus; and a misaligned read pointer for tracing a readable location in the circular buffer adjacent to the location of the last datum copied into the centralized buffer by effect of multiple popword commands, in such a way that in the same transaction no data are read more than once; being the misaligned read pointer aligned to the aligned read pointer location at the reception of the clear-and-flush command; a write pointer for tracing the next writeable location into said circular buffer.

23. A microprocessor interface in accordance with claim 22, wherein said pointer-generating and handling logic includes the following means for generating a rewind command active on the aligned read pointer in concomitance with the execution of each flush command of the current transaction:

a popword counter incremented by the popword commands and reset by the flush command;

first subtracting means for subtracting the number of flushed out words from the value reached by the popword counting, obtaining a number of rewindable memory locations into the circular buffer whose content is prevented to be overwritten; and second subtracting means for subtracting the number of rewindable memory locations from the current value of the aligned read pointer, in a way to update the offset between aligned and misaligned read pointers.

24. A microprocessor interface in accordance with claim 23, wherein said pointer-generating and handling logic further includes:

a first presettable up/down counter for tracing the number of readable locations into said circular buffer, coupled to a supervisor control logic for generating an aligned counting value which counts data available for reading in the circular buffer considering readable data unread from the centralized buffer since last flush command and the rewinded data to the last flush, the aligned counting value being suitable for generating said aligned read pointer;

a second presettable up/down counter for tracing the number of readable locations into said circular buffer, coupled to the supervisor control logic for generating a misaligned counting value which counts data available for reading in the circular buffer considering readable only data not yet read from the centralized buffer, the misaligned counting value being suitable for generating said misaligned read pointer; and a third presettable up/down counter for tracing the number of writeable locations into said circular buffer, coupled to the supervisor control logic for generating a writing counting value suitable for generating said write pointer.

25. A microprocessor interface in accordance with claim 24, wherein said prefetchable FIFO controller further includes circular buffer interfacing means connected between said pointer-generating and handling logic and said dual port RAM for receiving both said misaligned read pointer and the write pointer and generate correspondent writing and reading addresses for the dual port RAM, and further to transmit write data and receive read data to/from the dual port RAM.

26. A microprocessor, or local bus, interface in accordance with claim 1, wherein said main module includes means for generating command on the common bus arranged in a way to generate a command consisting of a pure query issued to an selected peripheral resource to return a remote filling status value, or a read-and-query, or a write-and-query, whose argument is a datum coupled with said remote filling status.

27. A microprocessor, or local bus, interface in accordance with claim 1, wherein said main module further includes:

a centralized FIFO memory acting as a buffer shared among the peripheral modules for transitorily storing a burst of data read in advance from a peripheral selected subset of resources in correspondence of a command asserted to transfer data on the external bus;

centralized FIFO memory control means in its turn including: a) means for calculating the filling status of the centralized FIFO memory in order to verify room to accept new data; b) first counter and comparator means for counting the number of data words transferred from a selected subset of peripheral resources to the centralized FIFO memory and comparing a first counting value issued from said first counter means with a first prefixed threshold placed near the filling boundary of the centralized FIFO memory in order to avoid buffer overflow; c) means for purging the unread data from the centralized FIFO memory at the end of a current transaction towards the external bus in order to assign an empty buffer at the successive requester; and second counter and comparator means for counting the number of data words transferred from the centralized FIFO memory to the external bus and compare a second counting value issued from said second counter means with a parameter indicating the length of a read data burst, in order to detect equality as a condition to terminate a current read burst transaction from the centralized FIFO memory to the external bus.

28. Microprocessor, or local bus, interface in accordance with the claim 27, wherein each standardizable peripheral module, further includes a peripheral controller including in its turn:

first peripheral selector means for transferring towards the common bus either read data and the associated remote filling status, or the filling status only, returned from an addressed resource;

distributed address decoding means receiving said full-range and lower-range address buses of the common bus to complete the second address decoding step for the selection of a memory port or FIFO port or a register port inside the subset;

protocol command decoding and sequencing means connected to the common bus to decode and properly time and forwards commands issued by the main module, and generate for each decoded command a respective peripheral monitoring code suitable to inform the main module about the operational state of the addressed resources;

protocol control means cascaded to the preceding sequencing means for generating control and selection signals selectively forwarded to the subset of resources to address them for executing the decoded commands on the addressed resources;

second peripheral selector means to forward towards the common bus the transaction requests generated from the macro-cells and selected parameters required by a specific grant cycle involving burst transactions; and means for introducing a prefixed delay between its input signals constituted by the read data, the filling status and the burst transaction parameters, before transferring them on the common bus, being the delay equal to their known initial latency, in order to synchronize them with the peripheral monitoring codes.

29. A microprocessor interface in accordance with claim 28, wherein said protocol command decoding and sequencing means is further equipped with a peripheral partial flow-control-logic for receiving the remote filling status selected by said first peripheral selector means and decode it to return peripheral monitoring code to the main module either:

a datum coupled with the value of the remote filling status, the peripheral monitoring code indicating a data-and-query payload, in correspondence of both a read-and-query decoded command and a remote filling status greater than zero; or the only remote filling status null in correspondence of both a read-and-query decoded command and a remote filling status null coupled with the peripheral monitoring code indicating a pure query payload.

30. A microprocessor, or local bus, interface in accordance with claim 27, wherein said two-way transaction control means belonging to the main module includes centralized logic means for synchronizing the transactions between the external bus and the common bus by exploiting sub-means suitable for the following operations:

detecting start/end transactions on the two buses;

detecting the insertion of wait states on the two buses;

detecting availability of data on the two buses;

counting the data words transferred to the external bus;

sustaining a direct memory access originated by an transaction requester internal to a respective user macro-cell to transfer data from the macro-cell towards a device connected to the external bus, being the transaction requester connected to the remote register subset for transferring parameters suitable to sustain the DMA transaction;

storing said parameters suitable to sustain DMA burst transactions;

monitoring the number of data currently stored in the centralized FIFO memory;

monitoring the operations requested by an external bus protocol agent and promoting corresponding operations inside said main module of the interface;

receiving and interpreting peripheral monitoring codes transmitted from the remote peripheral resources; and receiving and interpreting a set of monitoring signals concerned transactions between the main module of the interface and the external bus.

31. A microprocessor, or local bus, interface in accordance with claim 30, wherein said two-way transaction control means belonging to the main module further includes the following control means for co-operating with said centralized logic means:

a main common bus sequencer for generating command on the common bus;

a main handshake sequencer for generating status signals and commands towards said plug-in means, directed to both the embedded address/command generator and the external bus sequencer; and a main module controller for generating control signals for all the means embedded in the main module of the interface other than the two-way transaction control means.

32. A microprocessor, or local bus, interface in accordance with claim 30, wherein the output of said centralized FIFO memory is further connected to:

said first interface circuit means to pop out a datum indicating the source starting address of the reading burst;

said address/command generator to pop out a datum indicating the destination starting address of the reading burst; and a direct memory access controller embedded in said centralized logic means to pop out a datum indicating the length of a read burst executed exploiting the centralized FIFO memory.

33. A microprocessor, or local bus, interface in accordance with claim 1, wherein said main module further includes:

first interfacing circuit means connected to the external bus for receiving, transmitting, buffering, sampling, or holding address, data and control signals from/to the external bus;

second interfacing circuit means connected to the common bus for receiving, transmitting, buffering, sampling, or holding address, data, and control signals from/to the common bus;

address translator means cascaded with centralized address decoder means the cascade being connected between said first and second interfacing circuit means to select a peripheral resource for enabling a communication path between the microprocessor, or local bus, and an interconnected macro-cell;

address space configuration means, active at the boot time after power up, to supply a granular memory map of the interface to said centralized address decoder means which is enabled consequently to translate the linear address space of the external bus into a structured address space of the common bus according to the physical topology and implemented by forwarding to the cluster of peripheral modules a full-range address bus accompanied with a lower-range sub-bus for the selection of said peripheral modules and embedded resources through a two-steps address decoding, being the first step charged to said centralized address decoder means;

internal arbitration means for receiving transaction requests from peripheral modules connected to transaction requesters internal to the respective user macro-cells, and generating a grant signal towards a selected requester to command the requester to transfer parameters suitable to sustain DMA burst transaction; and plug-in means for de-coupling the protocol active on the external bus from the protocol active on the common bus; two-way transaction control means connected to the preceding means and promoting a communication protocol active on the common bus for allowing ordinate transactions through the two directions of the interface.

34. A microprocessor, or local bus, interface in accordance with claim 33, wherein said internal arbitration means is arranged in a way to generate an authorisation signal to enable said plug-in means to compete before an external arbiter for gaining the main module master-ship of the external bus, upon condition that at least one of said transactions request is detected at the input during the current master clock cycle, and for enabling the issuing of said grant signal to a selected requester on the basis of the following two alternative embodiments:

at the only reception of said transaction requests; or upon detection of a back confirmation signal stating that the main module have gained the master-ship of the external bus.

35. A microprocessor, or local bus, interface in accordance with claim 34, wherein said internal arbitration means includes:

a time slice counter for measuring the duration of a granted service period;

a circular queue to push sequentially all service requests coming from user macro-cells;

a scheduler to pop out one first request for service in conformity to a policy First-Come-First-Served, being the popped request signaled through the assertion of a correspondent grant signal;

a priority ROM to store at the i-nth location a number of clock pulses that a peripheral resource i-nth shall keep the grant asserted; and a data comparator to compare, at every clock time, the counting of time slice counter with the contents of the i__nth row of the priority table corresponding to the actual granted request i, in order to stop the current data transfer in case of coincidence, and command the scheduler to pop out the next request for service at the i+1__nth row.

36. A microprocessor, or local bus, interface in accordance with claim 33, wherein said plug-in means includes the following means:

a command decoder for decoding commands received from the external bus and forward it to said two-way transaction control means;

an address/command generator for generating address and commands to be issued on the external bus for read/write data at external destination addresses; and an external bus sequencer connected to both the command decoder and the address/command generator suitable to implement the communication protocol active on the external bus and communicate with an external arbiter for requesting the main module master-ship of the external bus.

* * * * *